US012552984B2

(12) United States Patent
Park et al.

(10) Patent No.: US 12,552,984 B2
(45) Date of Patent: *Feb. 17, 2026

(54) ORGANIC ELECTROLUMINESCENT DEVICE

(71) Applicant: SFC CO., LTD., Cheongju-si (KR)

(72) Inventors: Seok-bae Park, Cheongju-si (KR); Yu-rim Lee, Cheongju-si (KR); Hee-dae Kim, Cheongju-si (KR); Seoungeun Woo, Cheongju-si (KR); Dong Myung Park, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 643 days.

This patent is subject to a terminal disclaimer.

(21) Appl. No.: 16/891,658

(22) Filed: Jun. 3, 2020

(65) Prior Publication Data

US 2020/0395553 A1 Dec. 17, 2020

(30) Foreign Application Priority Data

Jun. 12, 2019 (KR) ........................ 10-2019-0069499
Apr. 24, 2020 (KR) ........................ 10-2020-0050117

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 50/12* (2023.02); *H10K 85/626* (2023.02);
(Continued)

(58) Field of Classification Search
CPC ............. H01L 51/0073; H01L 51/0058; H01L 51/0071; H01L 51/0059; H01L 51/0072;
(Continued)

(56) References Cited

U.S. PATENT DOCUMENTS 10,981,938 B2 * 4/2021 Joo ........................ C07F 11/00
11,985,891 B2 * 5/2024 Joo ...................... C07B 59/004
(Continued)

FOREIGN PATENT DOCUMENTS

CN 106207000 A 12/2016
CN 107851724 A 3/2018
(Continued)

OTHER PUBLICATIONS

Extended European Search Report issued on Oct. 16, 2020 in counterpart European Patent Application No. 20179629.9 (6 pages in English).

(Continued)

*Primary Examiner* — Aaron J Gray
(74) *Attorney, Agent, or Firm* — NSIP Law

(57) ABSTRACT

Disclosed is an organic electroluminescent device that employs a compound represented by Formula A-1 or A-2:

(A-1)

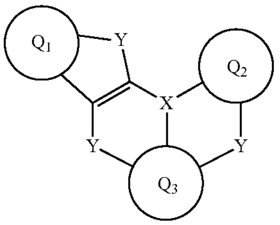

(A-2)

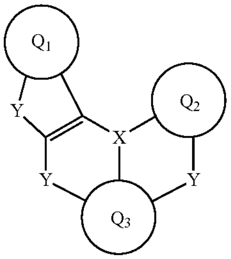

and a compound represented by Formula B:

(B)

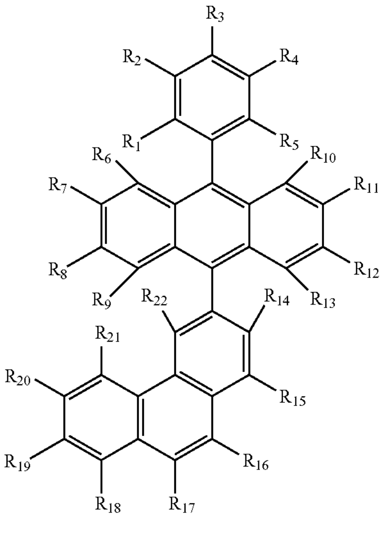

The organic electroluminescent device has excellent luminescent properties such as high color purity and long lifetime.

18 Claims, No Drawings

(51) Int. Cl.

| | |
|---|---|
| ***H10K 50/11*** | (2023.01) |
| ***H10K 50/12*** | (2023.01) |
| ***H10K 50/15*** | (2023.01) |
| ***H10K 50/18*** | (2023.01) |
| ***H10K 85/60*** | (2023.01) |

(52) U.S. Cl.
CPC ......... *H10K 85/631* (2023.02); *H10K 85/657* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/15* (2023.02); *H10K 50/181* (2023.02)

(58) Field of Classification Search
CPC ............... H01L 51/0074; H01L 51/008; H01L 51/5024; H01L 51/5012; C07F 5/027; C09K 11/06; H10K 50/12; H10K 85/658; H10K 85/626; H10K 85/631; H10K 85/6572; H10K 85/6574; H10K 85/6576; H10K 85/322
See application file for complete search history.

(56) References Cited

U.S. PATENT DOCUMENTS

| | | | | |
|---|---|---|---|---|
| 12,281,248 | B2 * | 4/2025 | Joo | H10K 85/6572 |
| 12,284,917 | B2 * | 4/2025 | Lee | C07D 307/91 |
| 2015/0243895 | A1 | 8/2015 | Lim et al. | |
| 2016/0351818 | A1 | 12/2016 | Kim et al. | |
| 2018/0301629 | A1 | 10/2018 | Hatakeyama et al. | |
| 2019/0214579 | A1 * | 7/2019 | Seda | C07F 5/02 |
| 2020/0172558 | A1 * | 6/2020 | Joo | H10K 85/658 |
| 2020/0194683 | A1 * | 6/2020 | Sim | H05B 33/14 |
| 2021/0167293 | A1 * | 6/2021 | Joo | C07B 59/004 |
| 2021/0184121 | A1 * | 6/2021 | Suh | C09K 11/06 |
| 2022/0173318 | A1 * | 6/2022 | Kim | C07F 5/027 |
| 2022/0216431 | A1 * | 7/2022 | Lee | C09K 11/06 |

FOREIGN PATENT DOCUMENTS

| | | | | |
|---|---|---|---|---|
| EP | 3 109 253 | A1 | 12/2016 | |
| EP | 3 660 024 | A1 | 6/2020 | |
| JP | 2017-126606 | A | 7/2017 | |
| JP | 2019-110305 | A | 7/2019 | |
| KR | 10-2016-0119683 | A | 10/2016 | |
| KR | 10-2017-0130434 | A | 11/2017 | |
| KR | 10-2018-0082124 | A | 7/2018 | |
| KR | 10-2018-0122298 | A | 11/2018 | |
| KR | 10-2018-0134331 | A | 12/2018 | |
| KR | 2094830 | B1 * | 3/2020 | C07B 59/004 |
| KR | 2020075986 | A * | 6/2020 | C07F 5/02 |
| WO | WO 2016/021923 | A2 | 2/2016 | |
| WO | WO 2016/152544 | A1 | 9/2016 | |
| WO | WO 2017/188111 | A1 | 11/2017 | |

OTHER PUBLICATIONS

Korean Notice of Allowance issued on Nov. 23, 2020 in counterpart Korean Patent Application No. 10-2020-0050117 (22 pages in Korean).
Japanese Office Action issued on Mar. 23, 2021 in counterpart Japanese Patent Application No. 2020-101921 (3 pages in Japanese).
Chinese Office Action issued on Aug. 19, 2023, in counterpart Chinese Patent Application No. 202010529263.7 (6 pages in English, 5 pages in Chinese).

* cited by examiner

ORGANIC ELECTROLUMINESCENT DEVICE

CROSS-REFERENCE TO RELATED APPLICATIONS

This application claims the benefit under 35 USC § 119(a) of Korean Patent Application No. 10-2019-0069499 filed on Jun. 12, 2019 and Korean Patent Application No. 10-2020-0050117 filed on Apr. 24, 2020, in the Korean Intellectual Property Office, the entire disclosure of which is incorporated herein by reference for all purposes.

BACKGROUND OF THE INVENTION

1. Field of the Invention

The present invention relates to an organic electroluminescent device, and more specifically to an organic electroluminescent device with high color purity and greatly improved lifetime which includes a light emitting layer employing an anthracene derivative as a host compound and a polycyclic aromatic derivative as a dopant compound.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

Particularly, for maximum efficiency in a light emitting layer, an appropriate combination of energy band gaps of a host and a dopant is required such that holes and electrons migrate to the dopant through stable electrochemical paths to form excitons.

SUMMARY OF THE INVENTION

Therefore, the present invention intends to provide an organic electroluminescent device with excellent luminescent properties such as high color purity and long lifetime which includes a light emitting layer employing characteristic host and dopant materials.

An aspect of the present invention provides an organic electroluminescent device including a first electrode, a second electrode opposite to the first electrode, and a light emitting layer interposed between the first and second electrodes wherein the light emitting layer includes a compound represented by Formula A-1 or A-2:

(A-1)

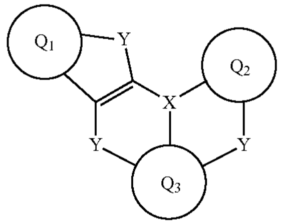

(A-2)

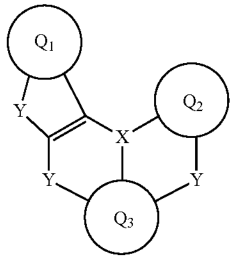

and a compound represented by Formula B:

(B)

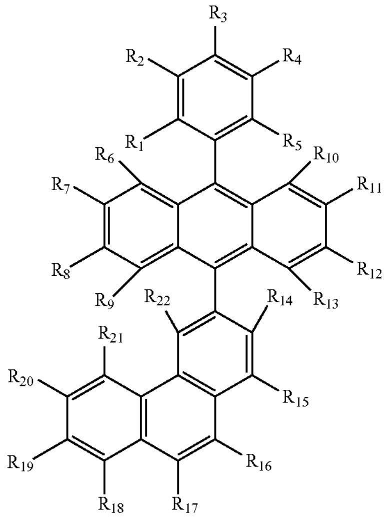

A description will be given concerning the structures of the compounds of Formulae A-1, A-2, and B, and the definitions of the substituents in the compounds.

The light emitting layer of the organic electroluminescent device according to the present invention employs the polycyclic aromatic derivative as a dopant and the anthracene derivative as a host. The use of the dopant and the host ensures high color purity and long lifetime of the device, making the device suitable for use in a variety of displays.

DETAILED DESCRIPTION OF THE INVENTION

The present invention will now be described in more detail.

The present invention is directed to an organic electroluminescent device including a light emitting layer employing a polycyclic aromatic derivative represented by Formula A-1 or A-2:

(A-1)

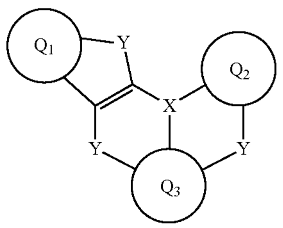

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ heteroaromatic ring, the linkers Y are identical to or different from each other and are each independently selected from N—$R_1$, $CR_2R_3$, O, S, Se, and $SiR_4R_5$, X is selected from B, P, and P═O, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_1$, $Q_2$ or $Q_3$ to form an alicyclic or aromatic monocyclic or polycyclic ring, $R_2$ and $R_3$ are optionally linked to each other to form an alicyclic or aromatic monocyclic or polycyclic ring, and $R_4$ and $R_5$ are optionally linked to each other to form an alicyclic or aromatic monocyclic or polycyclic ring, (A-2)

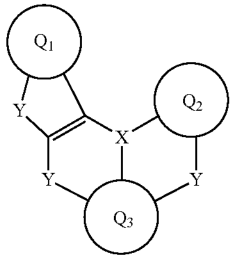

wherein $Q_1$, $Q_2$, $Q_3$, X, and Y are as defined in Formula A-1; and an anthracene derivative represented by Formula B:

(B)

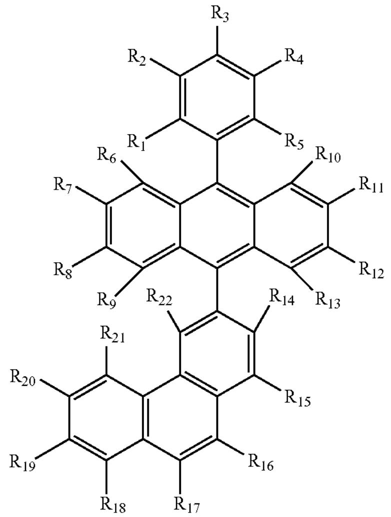

wherein $R_1$ to $R_5$ are each independently hydrogen, deuterium or $C_6$-$C_{24}$ aryl and $R_6$ to $R_{22}$ are each independently hydrogen or deuterium.

According to a preferred embodiment of the present invention, X in Formula A-1 or A-2 is preferably boron (B). The presence of boron (B) in the structure of the polycyclic aromatic derivative ensures high color purity and long lifetime of the organic electroluminescent device.

According to one embodiment of the present invention, the polycyclic aromatic derivative of Formula A-1 or A-2 may have a polycyclic aromatic skeletal structure represented by Formula A-3, A-4, A-5 or A-6:

(A-3)

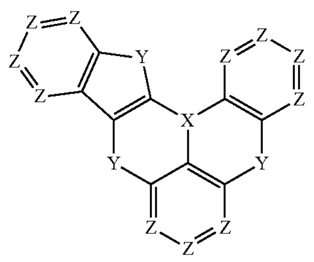

wherein each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms, and X and Y are as defined in Formulae A-1 and A-2, (A-4)

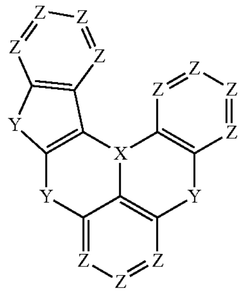

wherein X, Y, and Z are as defined in Formula A-3, (A-5)

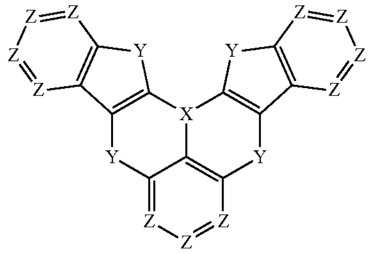

wherein X, Y, and Z are as defined in Formula A-3, (A-6)

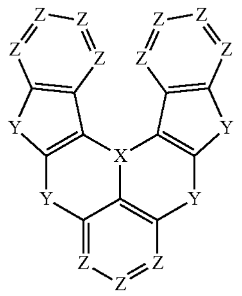

wherein X, Y, and Z are as defined in Formula A-3.

The use of the skeletal structure meets desired requirements of various organic layers of the organic electroluminescent device, achieving high color purity and long lifetime of the device.

According to one embodiment of the present invention, at least one of $R_6$ to $R_{13}$ in Formula B is deuterium.

According to one embodiment of the present invention, at least one of $R_1$ to $R_5$ in Formula B is deuterium and at least one of $R_6$ to $R_{13}$ in Formula B is deuterium.

As used herein, the term "substituted" in the definition of $Q_1$ to $Q_3$, R, and $R_1$ to $R_5$ indicates substitution with one or more substituents selected from the group consisting of deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and terphenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group, but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, and arylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl groups in the arylamine groups may be monocyclic or polycyclic ones. The arylamine groups may include two or more aryl groups. In this case, the aryl groups may be monocyclic aryl groups or polycyclic aryl groups. Alternatively, the aryl groups may consist of a monocyclic aryl group and a polycyclic aryl group. The aryl groups in the arylamine groups may be selected from those exemplified above.

The aryl groups in the aryloxy group and the arylthioxy group are the same as those described above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

The polycyclic aromatic derivative represented by Formula A-1 or A-2 as a dopant compound employed in the light emitting layer as an organic layer of the organic electroluminescent device according to the present invention may be selected from the compounds of Formulae A1 to A176:

(A1)

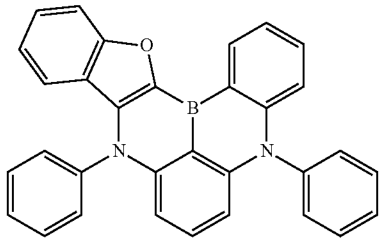

(A2)

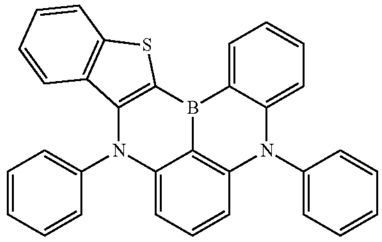

(A3)

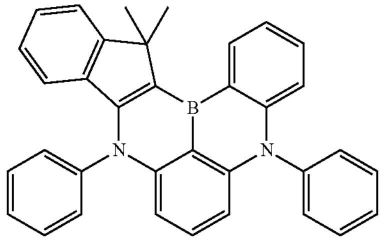

(A4)

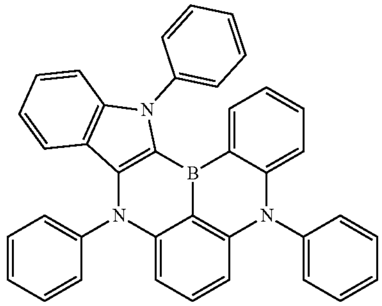

(A5)

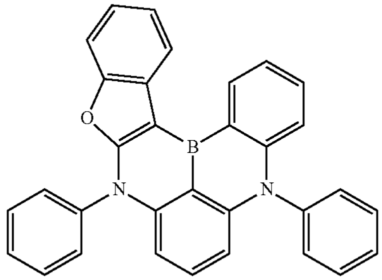

-continued
(A6)
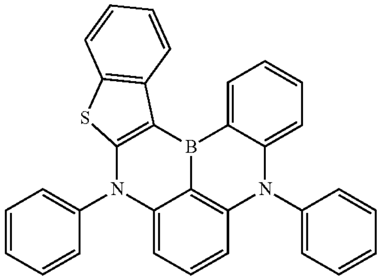
(A7)
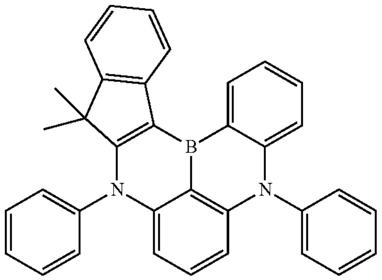
(A8)
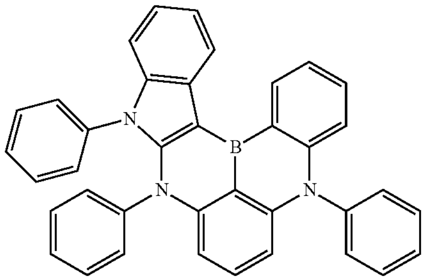
(A9)
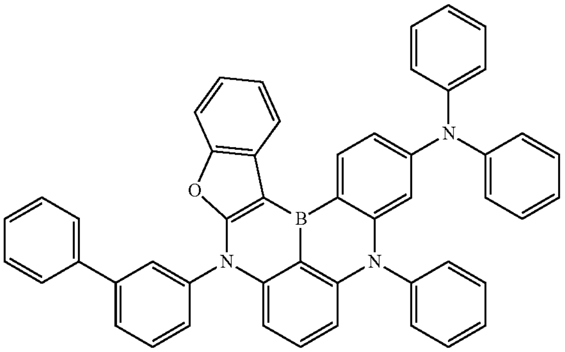
(A10)
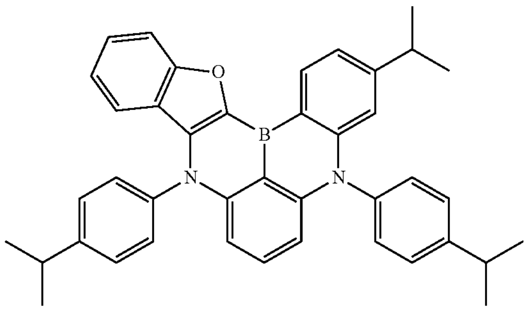
-continued
(A11)
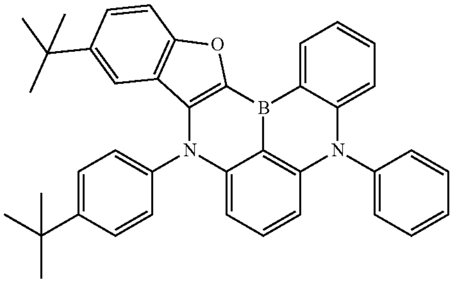
(A12)
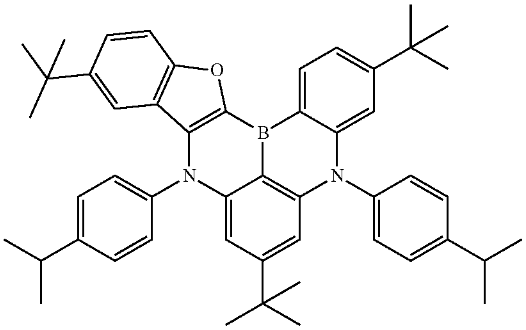
(A13)
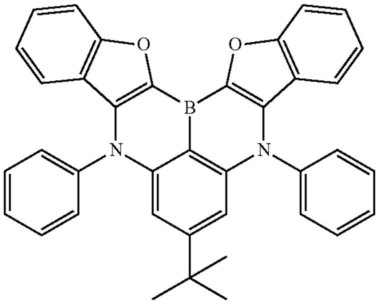
(A14)
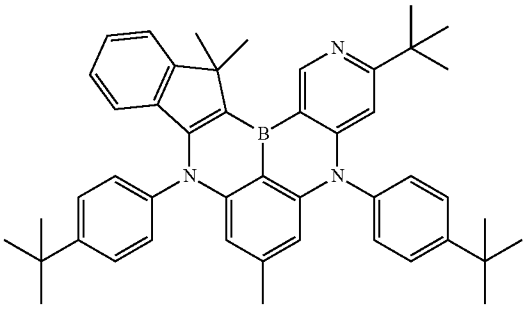

-continued
(A15)
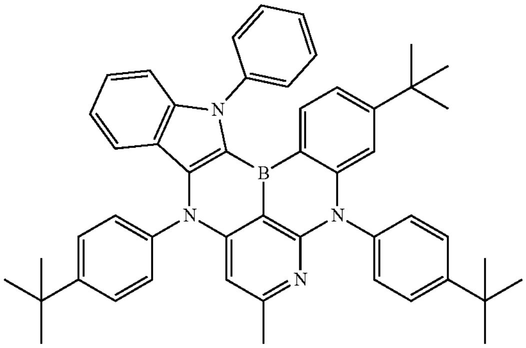
(A16)
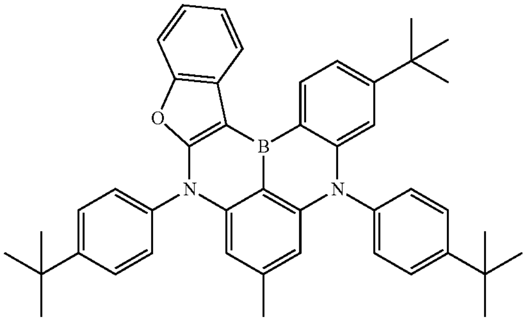
(A17)
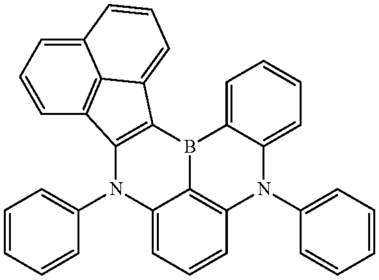
(A18)
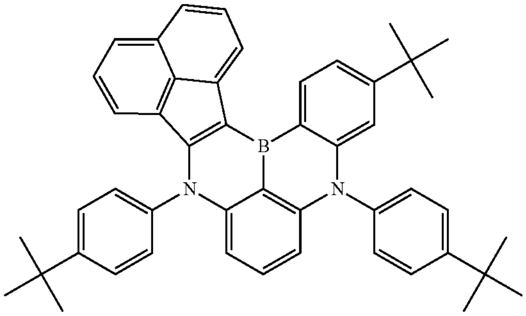
-continued
(A19)
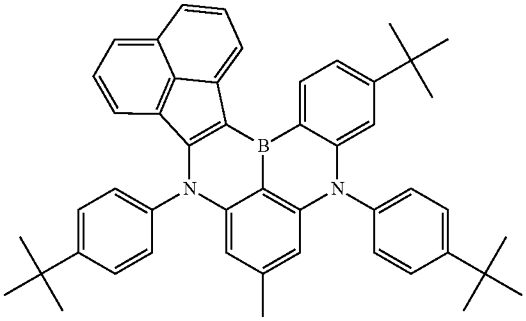
(A20)
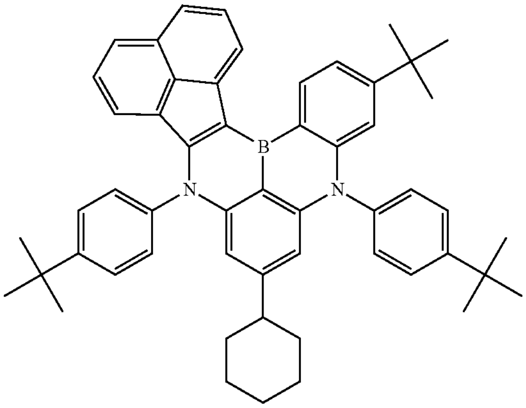
(A21)
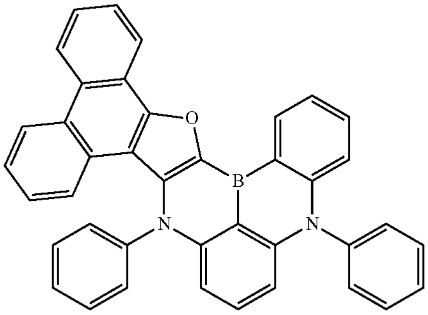
(A22)
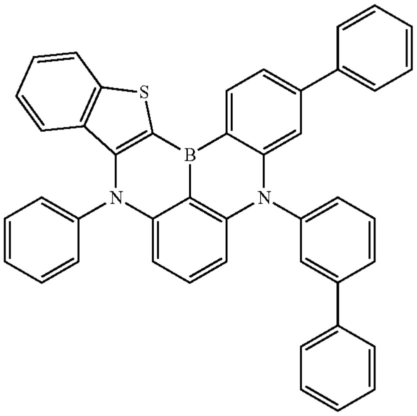

-continued
(A23)
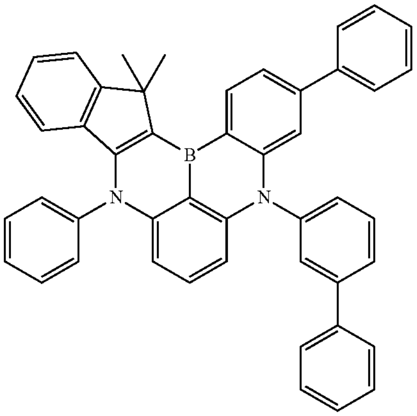
(A24)
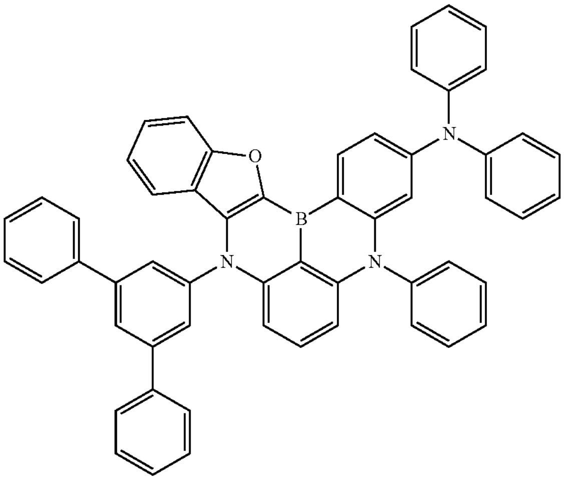
(A25)
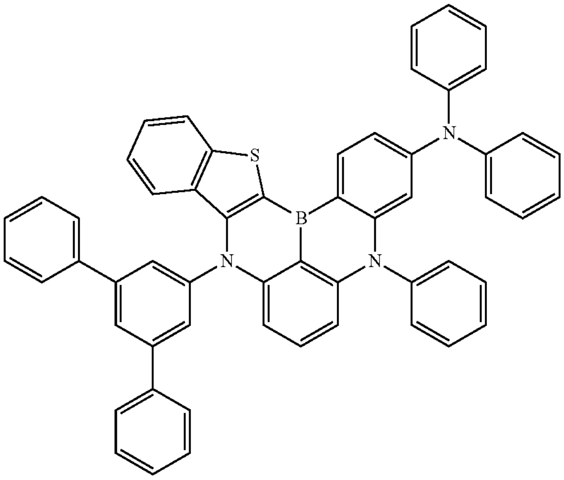
-continued
(A26)
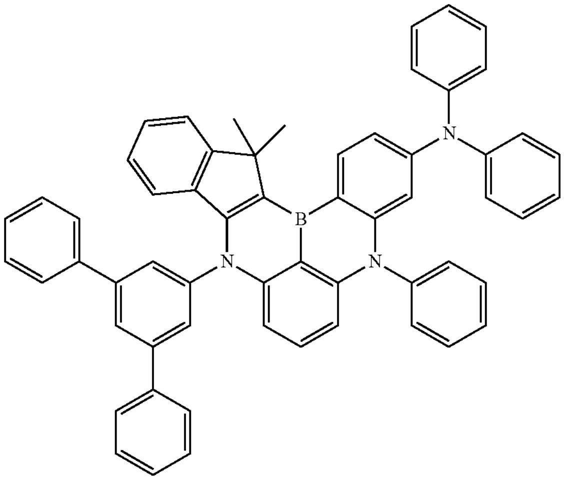
(A27)
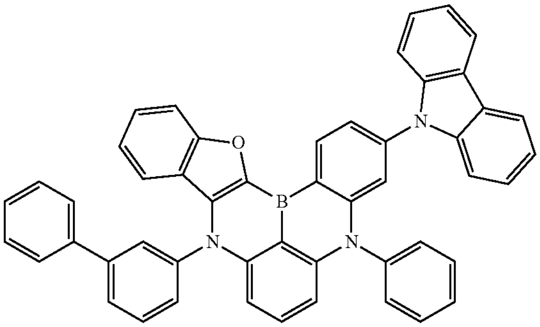
(A28)
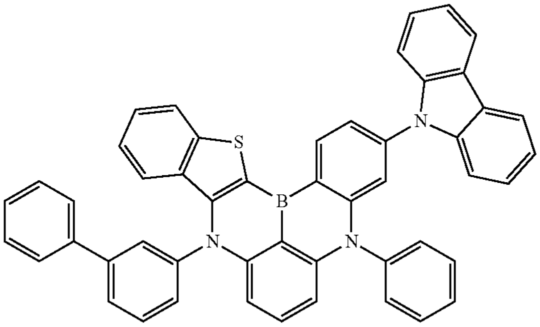
(A29)
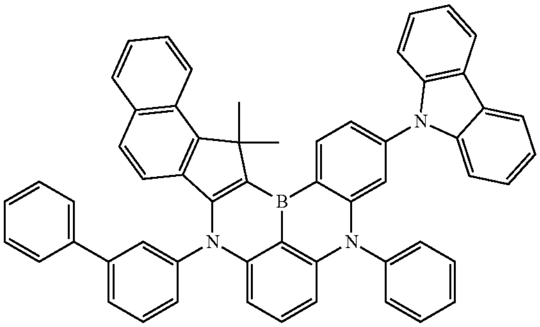

(A30)
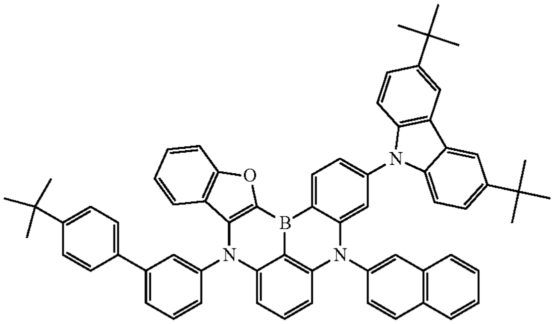
(A31)
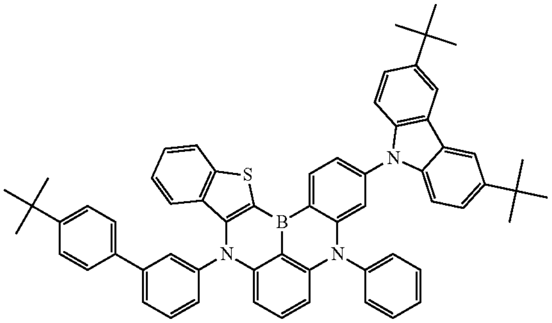
(A32)
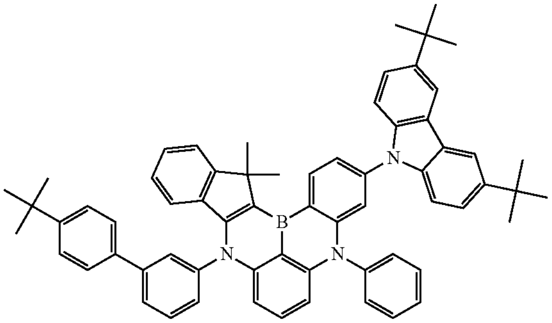
(A33)
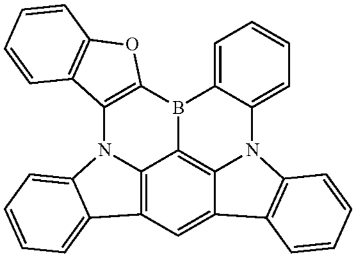
(A34)
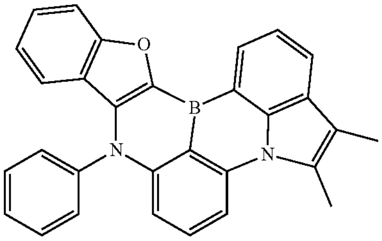
(A35)
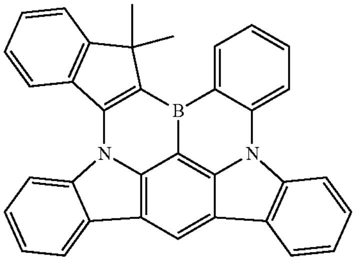
(A36)
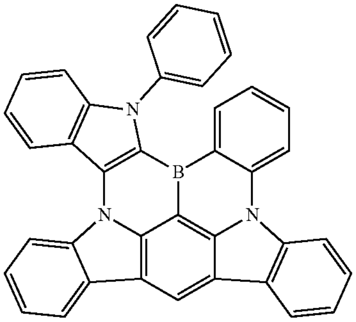
(A37)
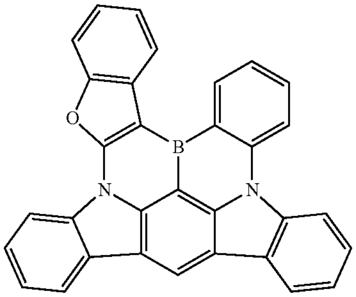
(A38)
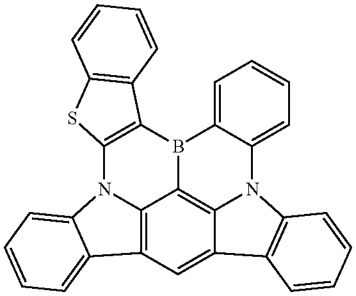
(A39)
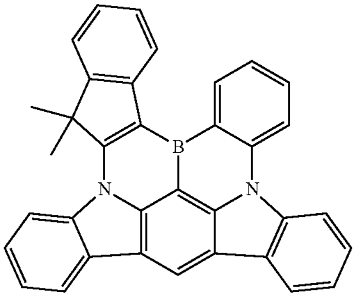

-continued
(A40)
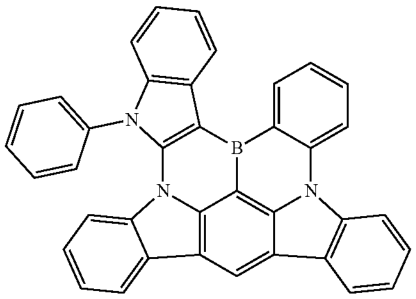
(A41)
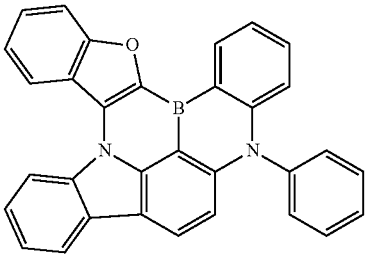
(A42)
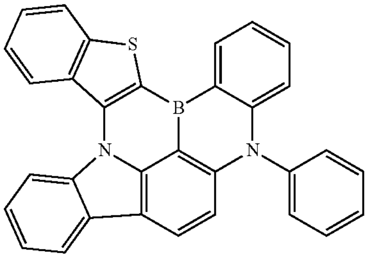
(A43)
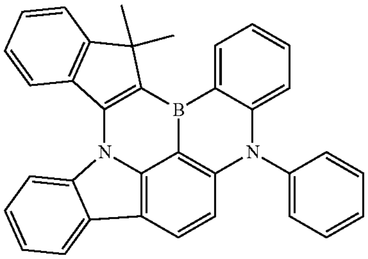
(A44)
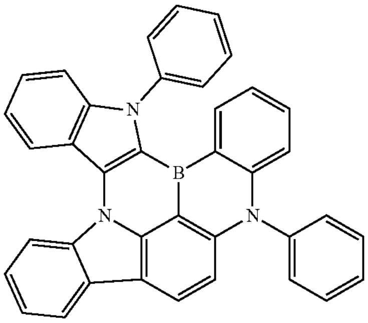
-continued
(A45)
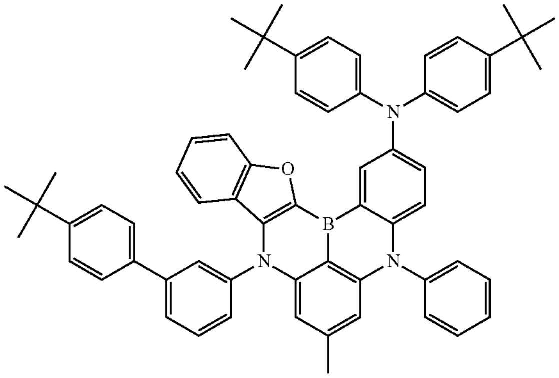
(A46)
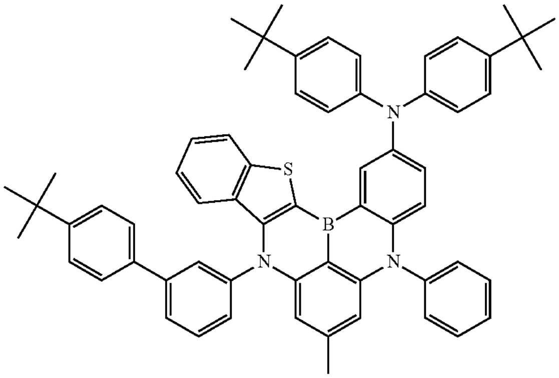
(A47)
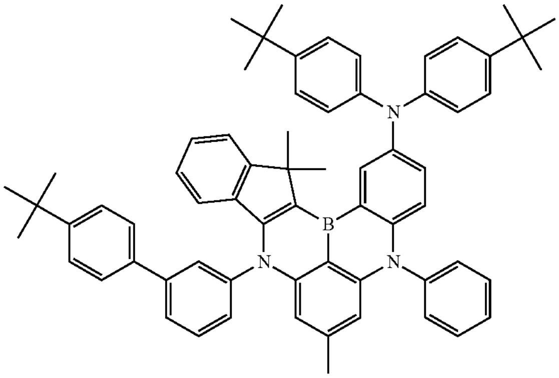
(A48)
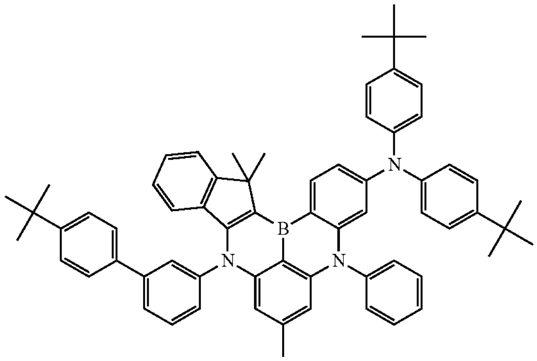

-continued
(A49)
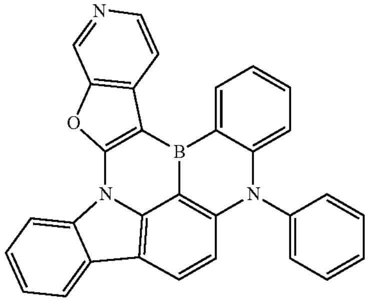
(A50)
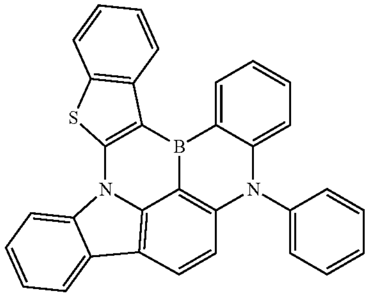
(A51)
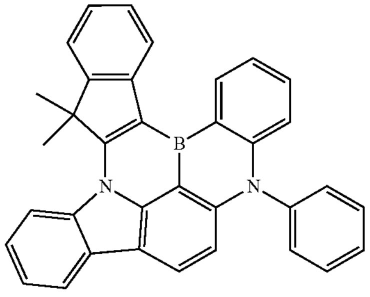
(A52)
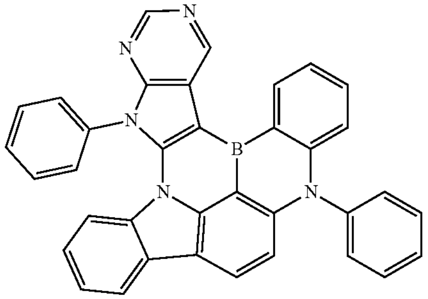
(A53)
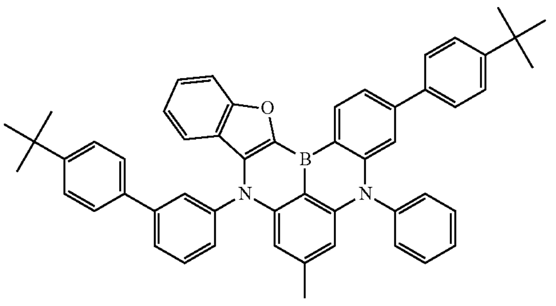
-continued
(A54)
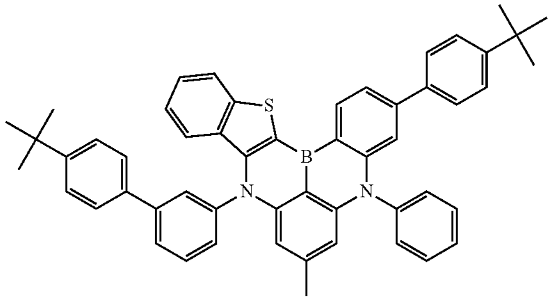
(A55)
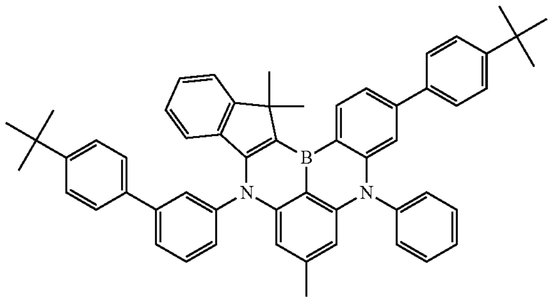
(A56)
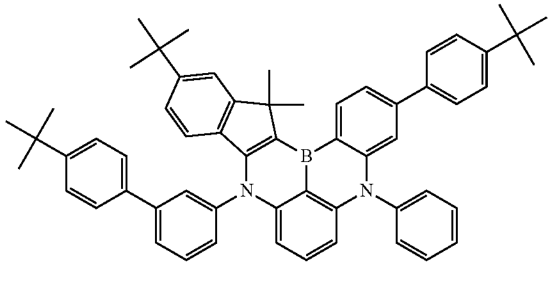
(A57)
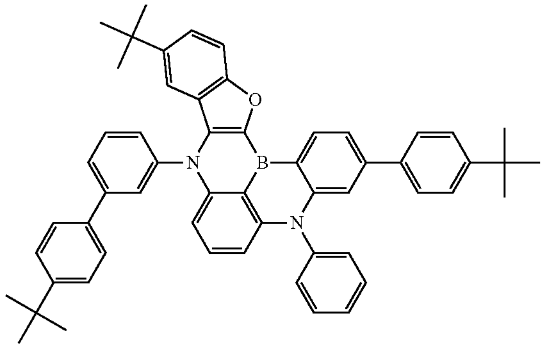

-continued
(A58)
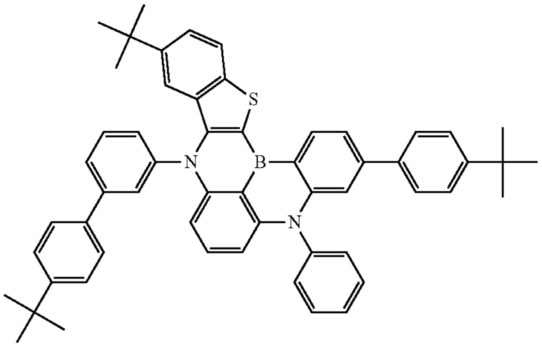
(A59)
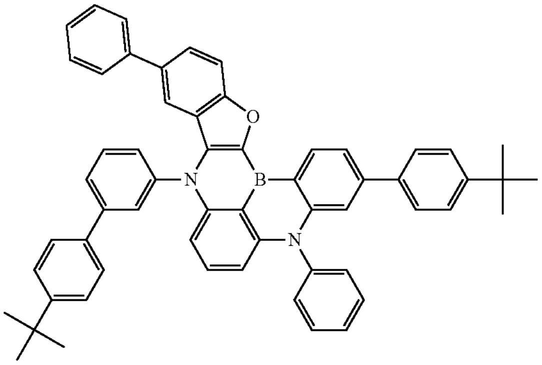
(A60)
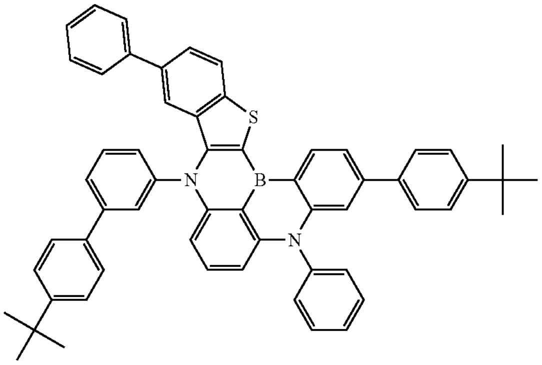
(A61)
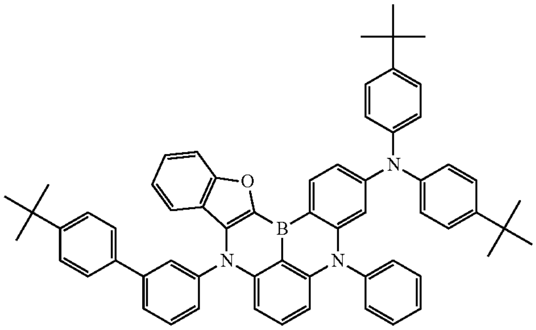
-continued
(A62)
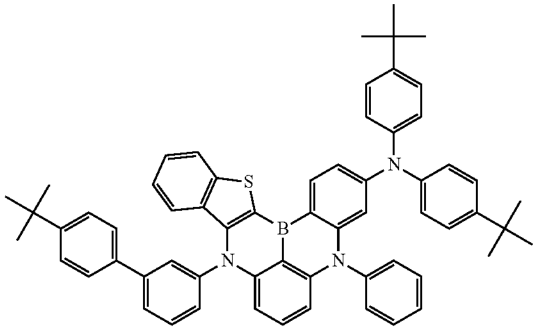
(A63)
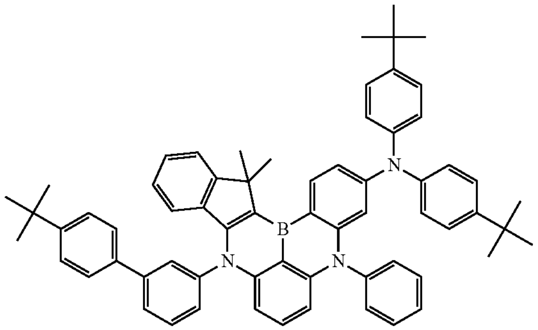
(A64)
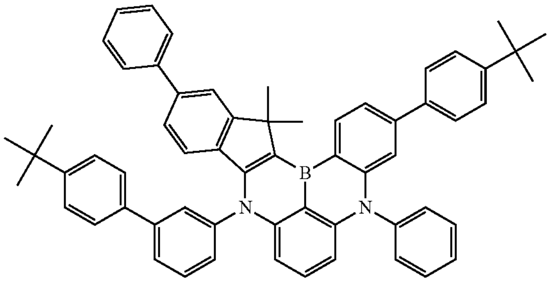
(A65)
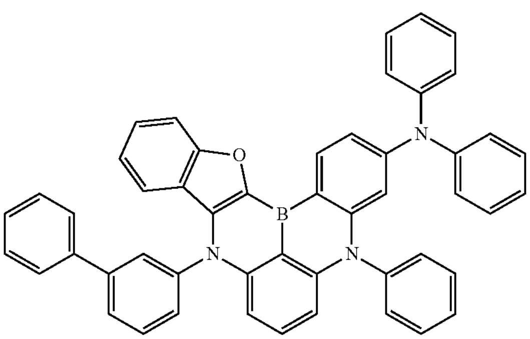

-continued
(A66)
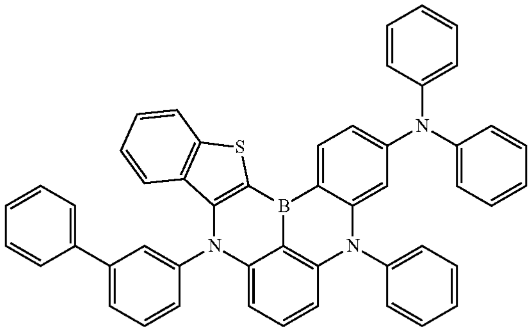
(A67)
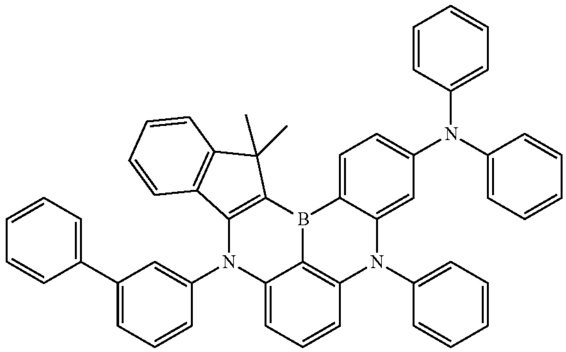
(A68)
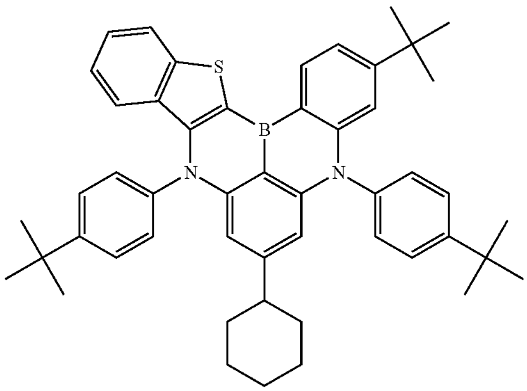
(A69)
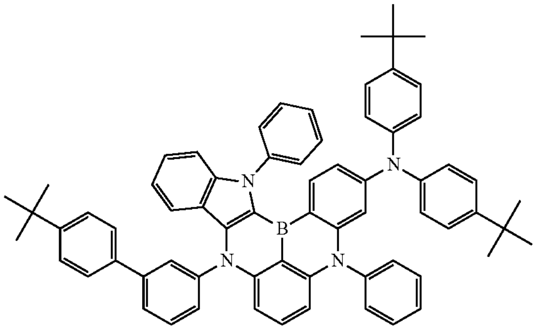
-continued
(A70)
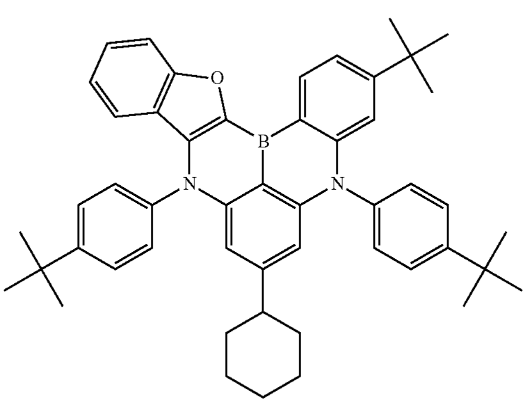
(A71)
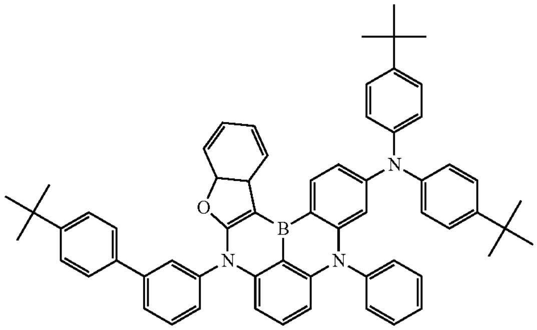
(A72)
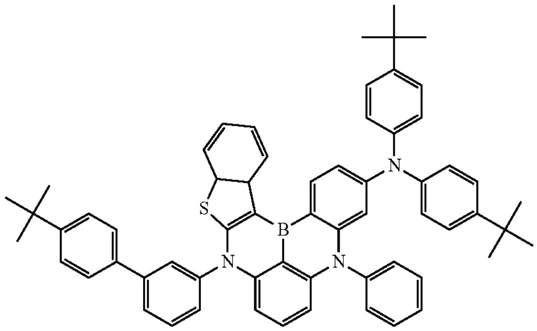
(A73)
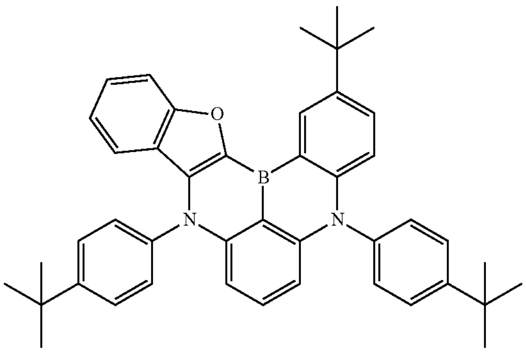

-continued
(A74)
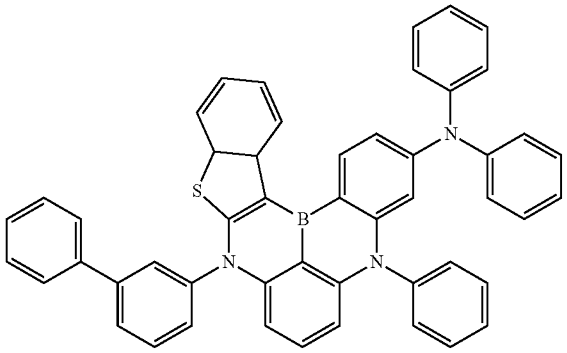
(A75)
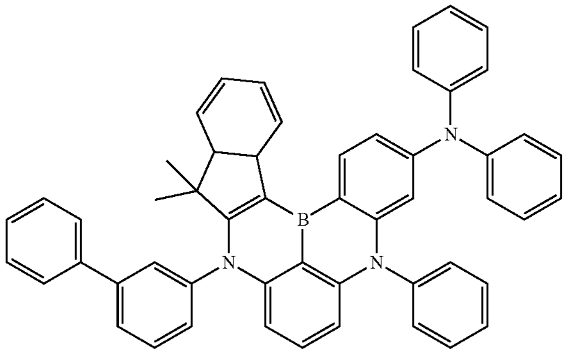
(A76)
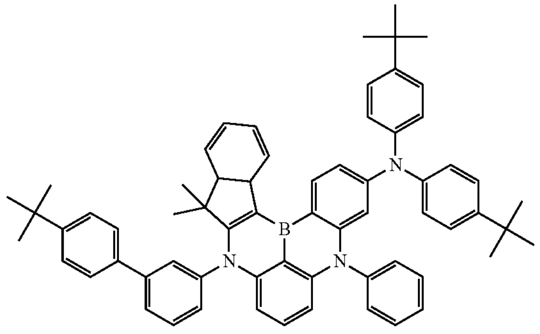
(A77)
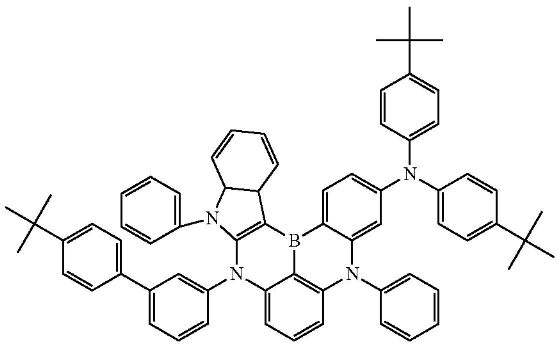
-continued
(A78)
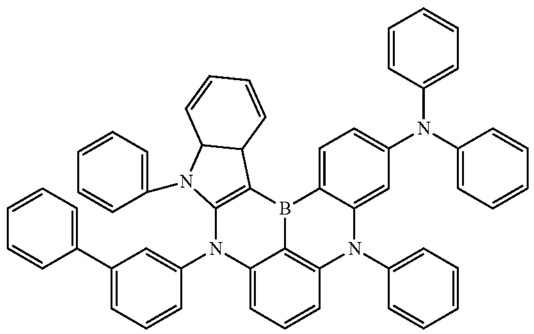
(A79)
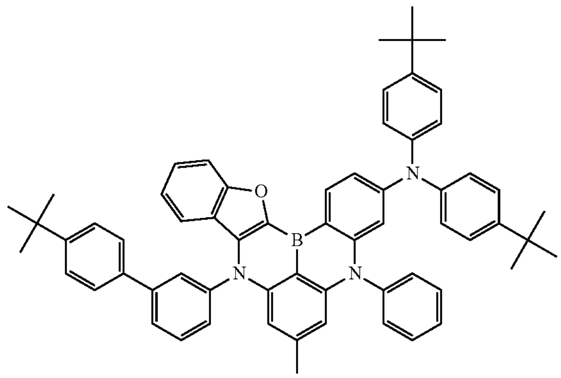
(A80)
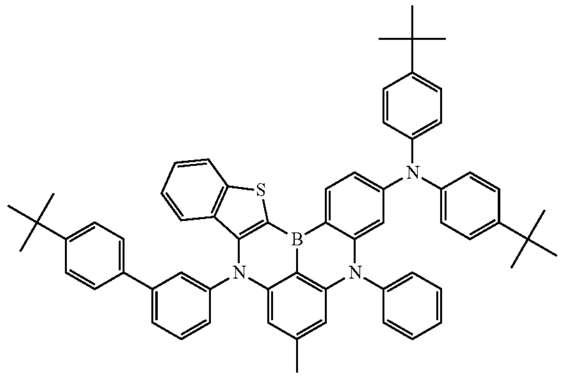
(A81)
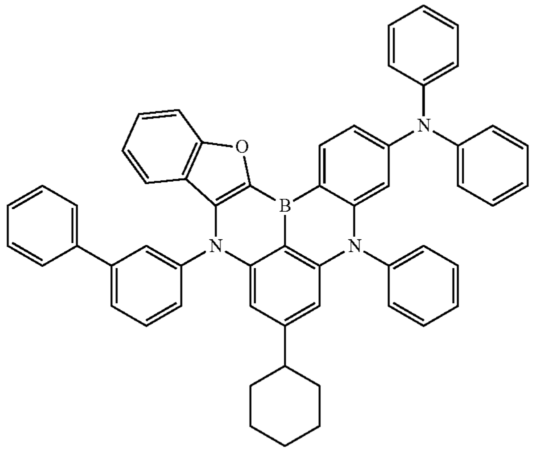

-continued
(A82)
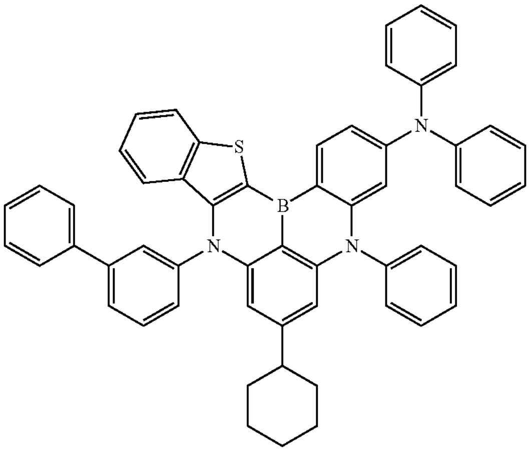
(A83)
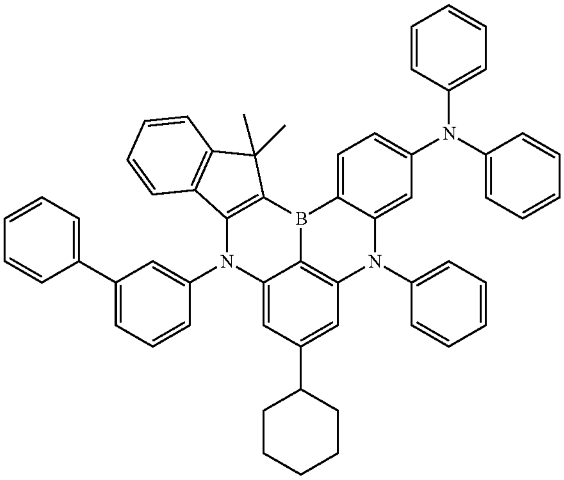
(A84)
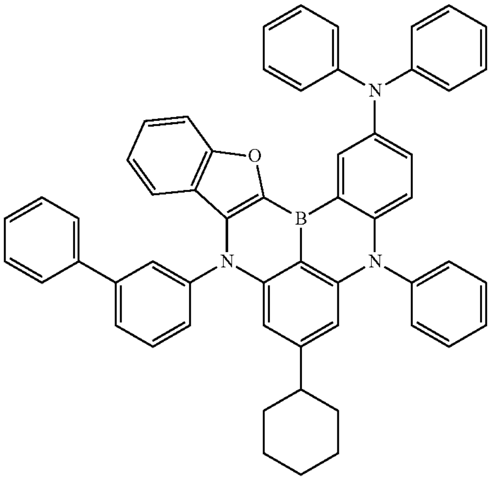
-continued
(A85)
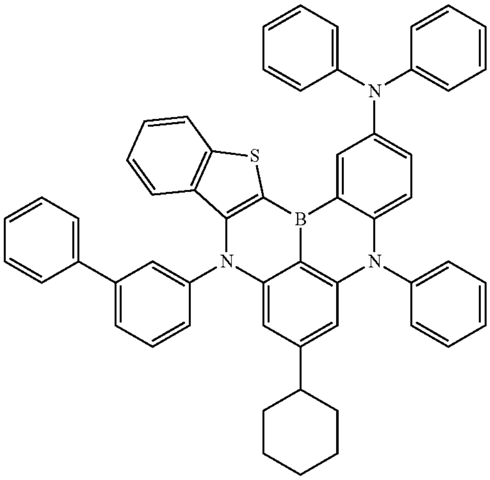
(A86)
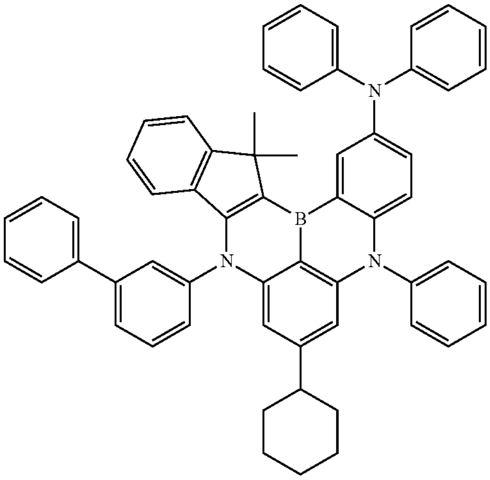
(A87)
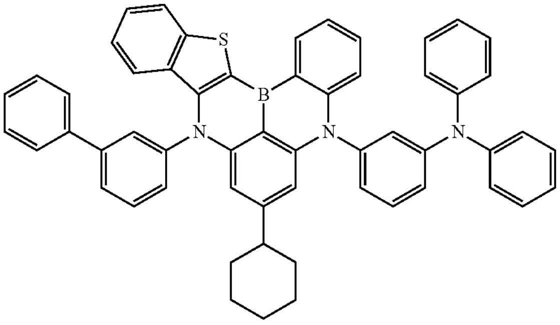

-continued
(A88)
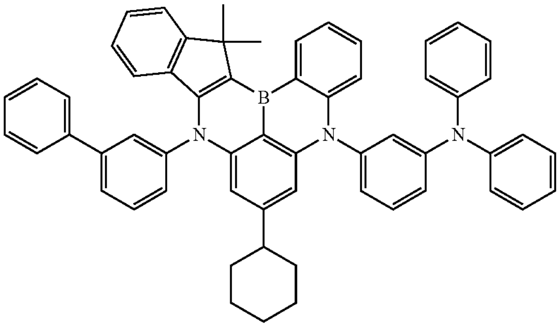
(A89)
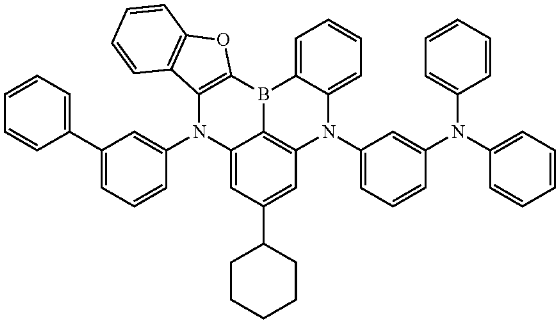
(A90)
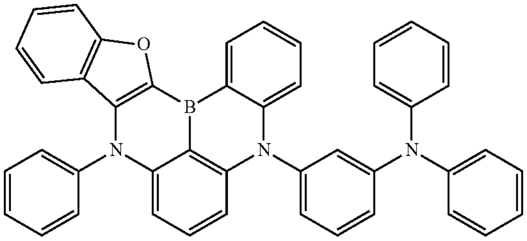
(A91)
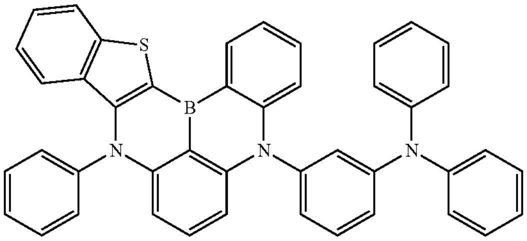
(A92)
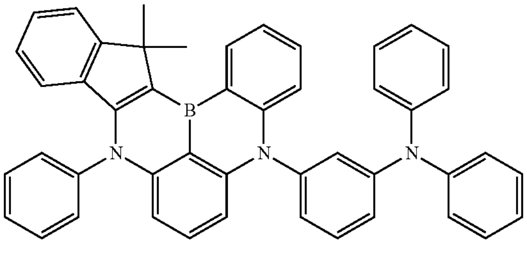
-continued
(A93)
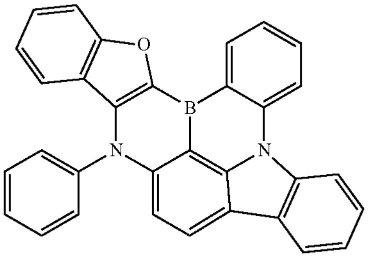
(A94)
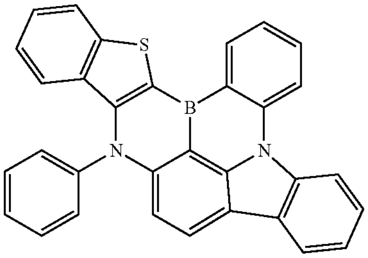
(A95)
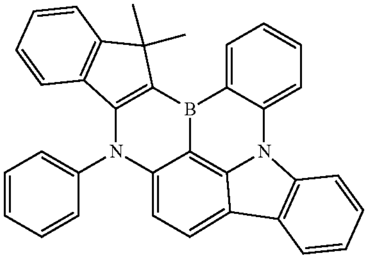
(A96)
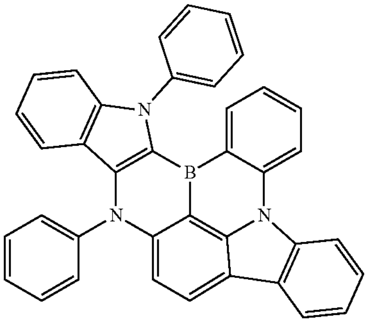
(A97)
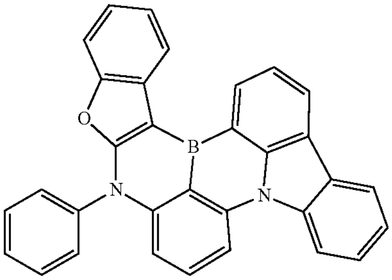

-continued
(A98)
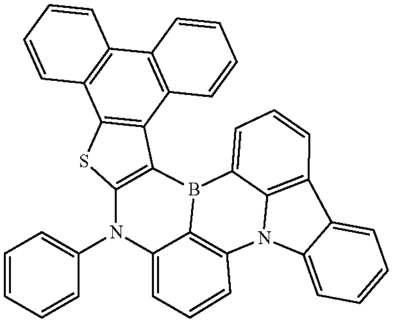
(A99)
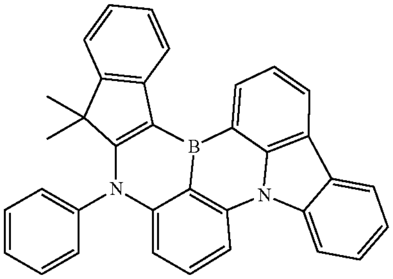
(A100)
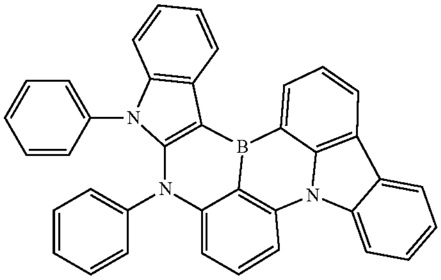
(A101)
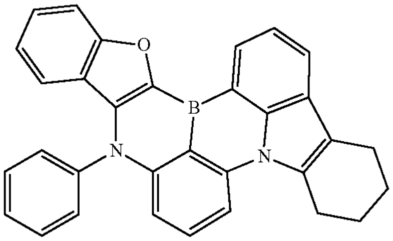
(A102)
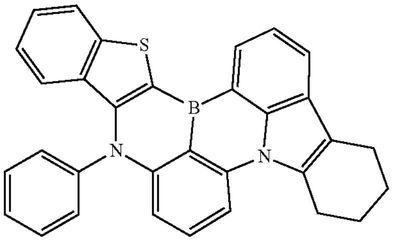
(A103)
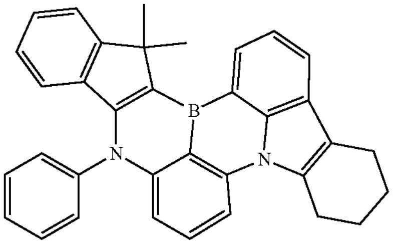
-continued
(A104)
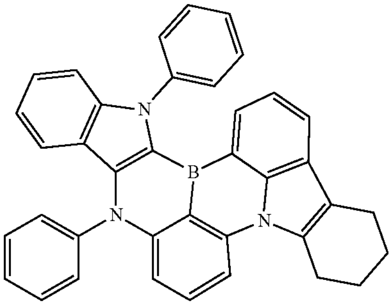
(A105)
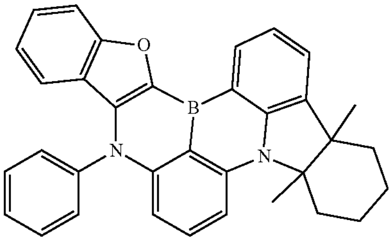
(A106)
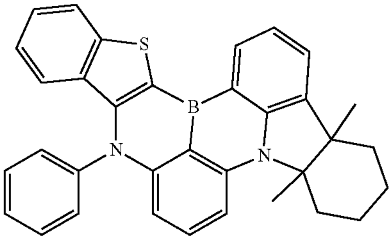
(A107)
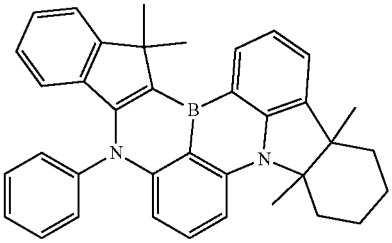
(A108)
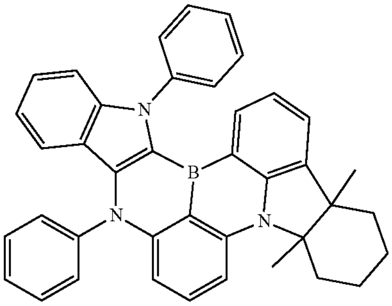
(A109)
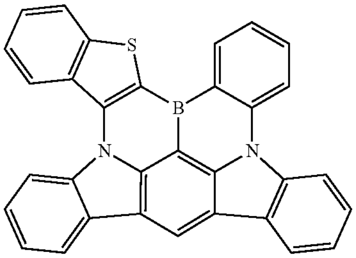

-continued
(A110)
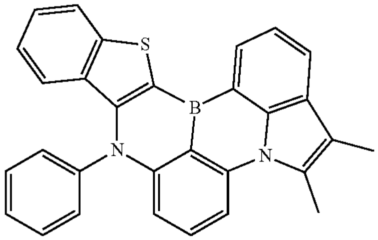
(A111)
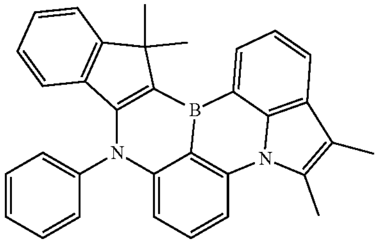
(A112)
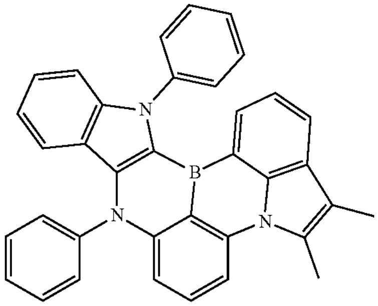
(A113)
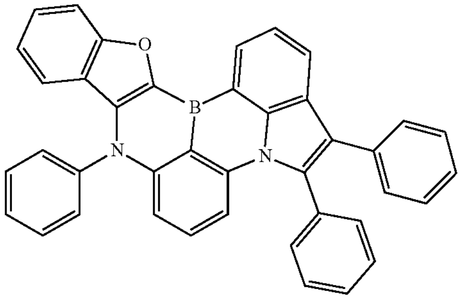
(A114)
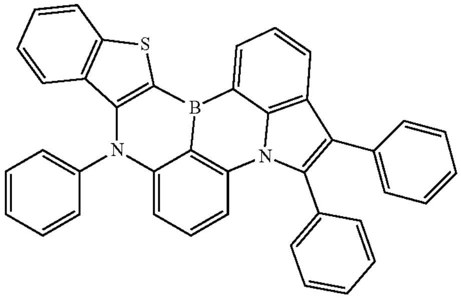
-continued
(A115)
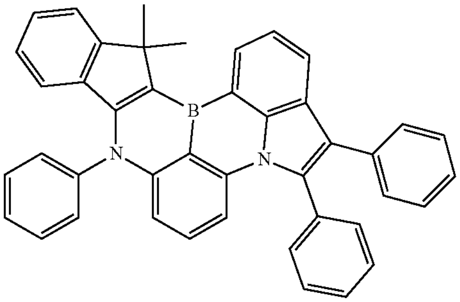
(A116)
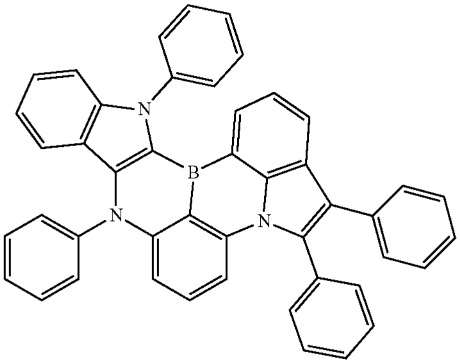
(A117)
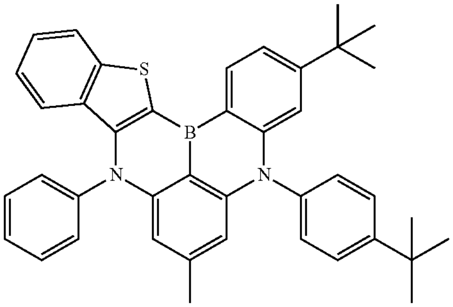
(A118)
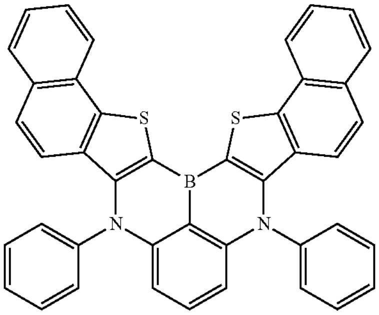
(A119)
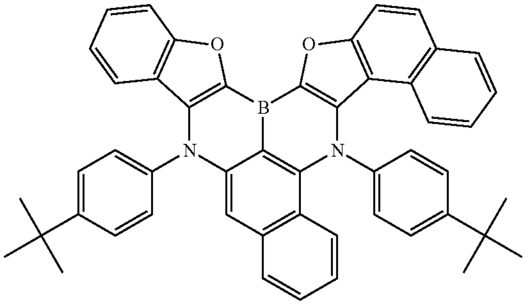

-continued
(A120)
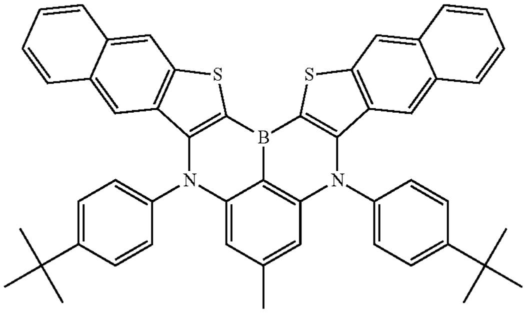
(A121)
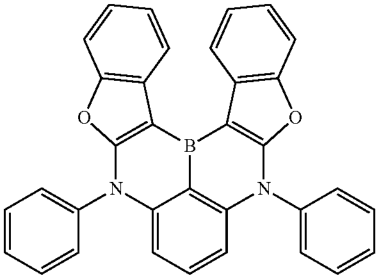
(A122)
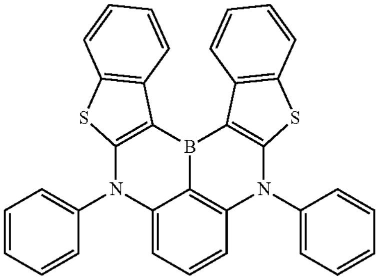
(A123)
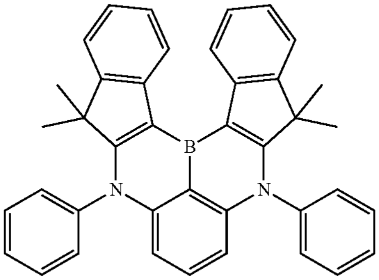
(A124)
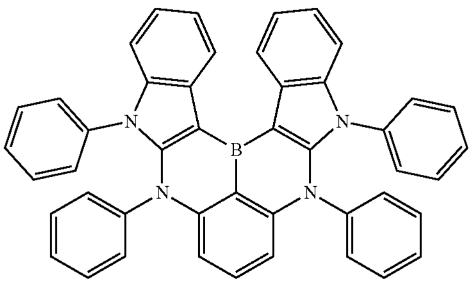
-continued
(A125)
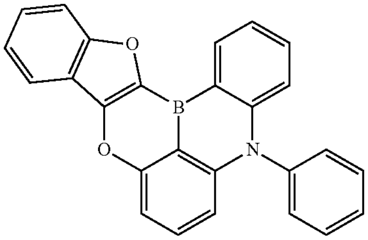
(A126)
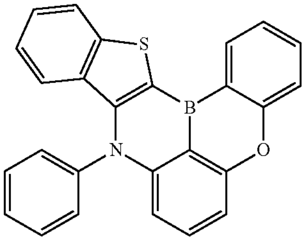
(A127)
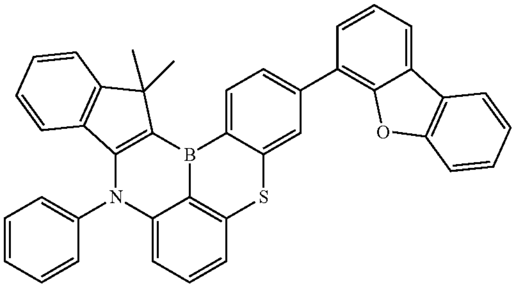
(A128)
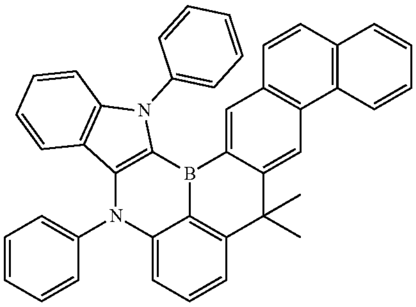
(A129)
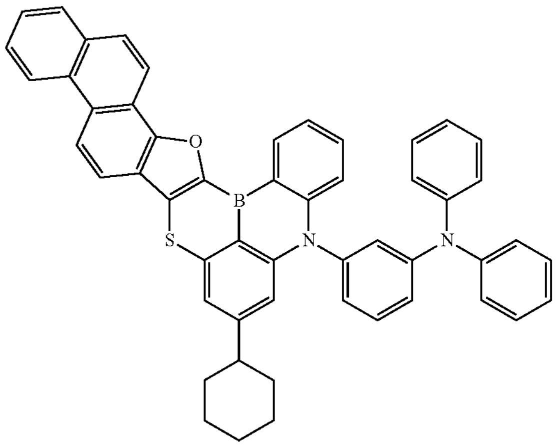

-continued
(A130)
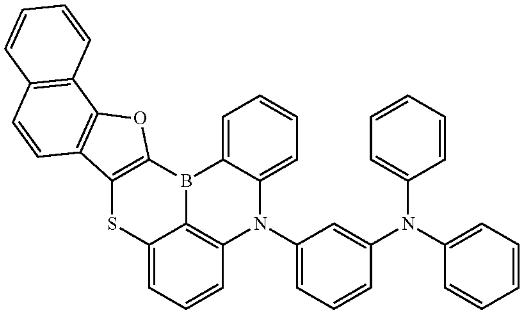
(A131)
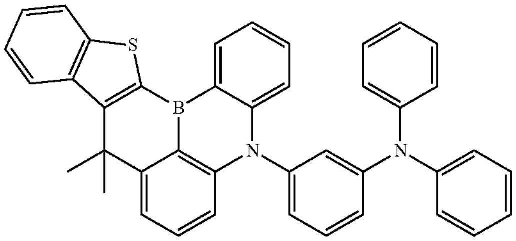
(A132)
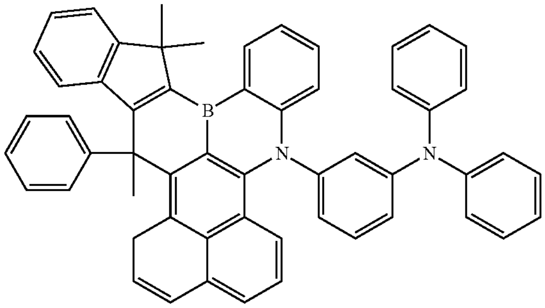
(A133)
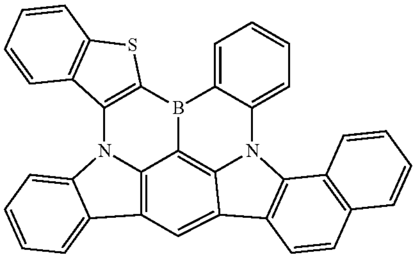
(A134)
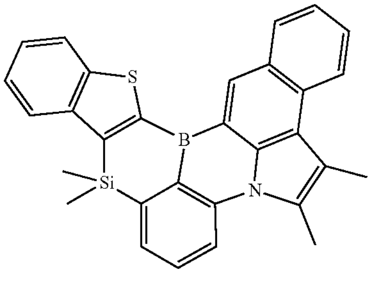
-continued
(A135)
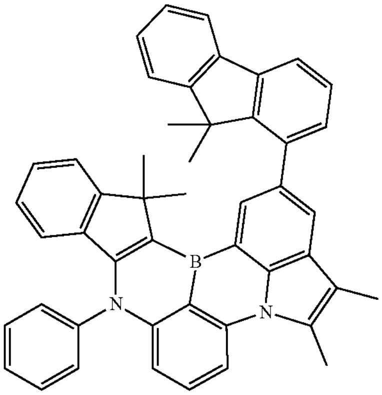
(A136)
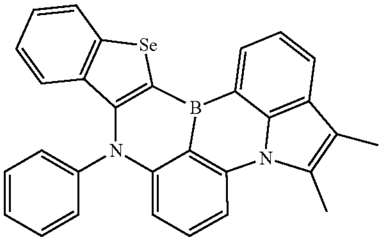
(A137)
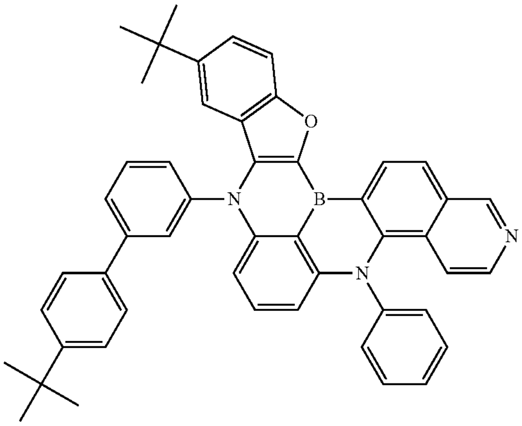
(A138)
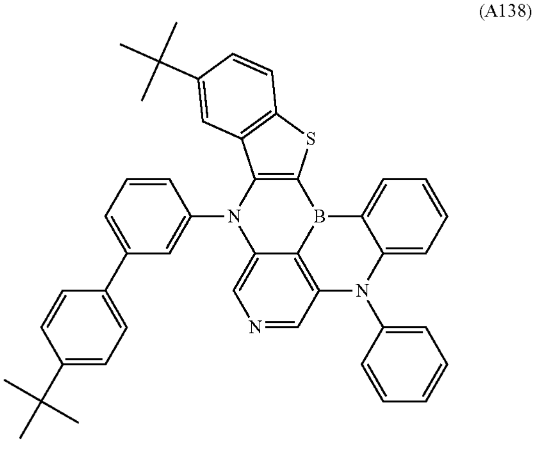

-continued
(A139)
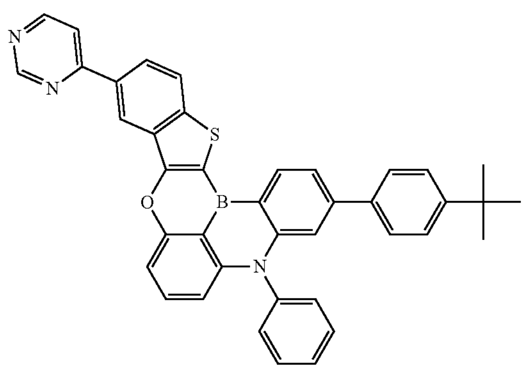
(A140)
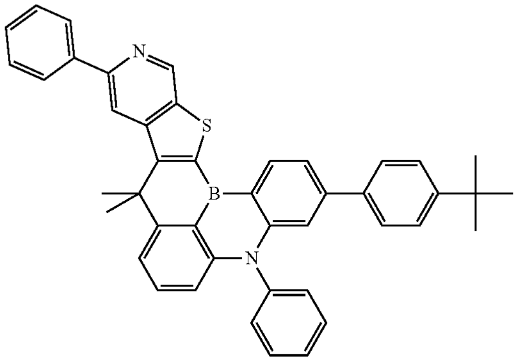
(A141)
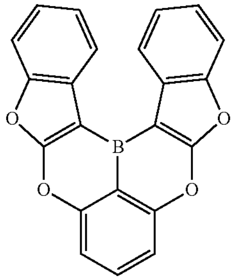
(A142)
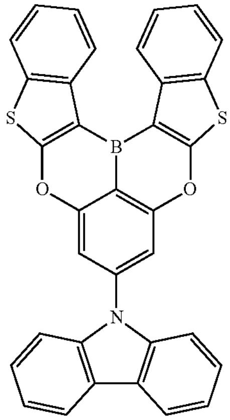
-continued
(A143)
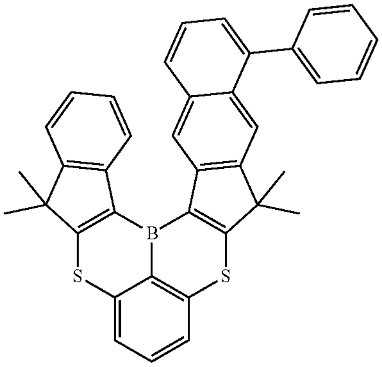
(A144)
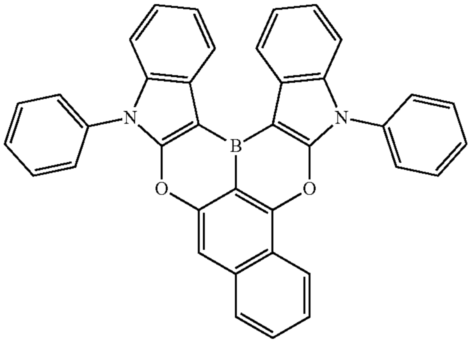
(A145)
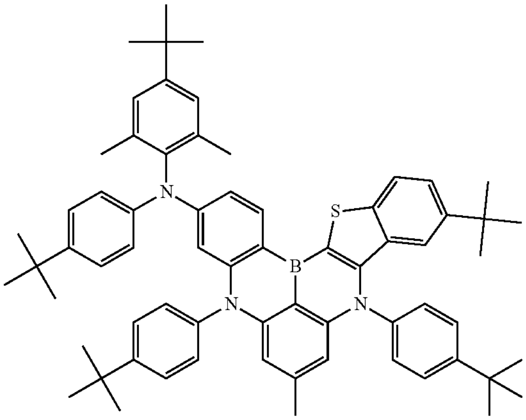
(A146)
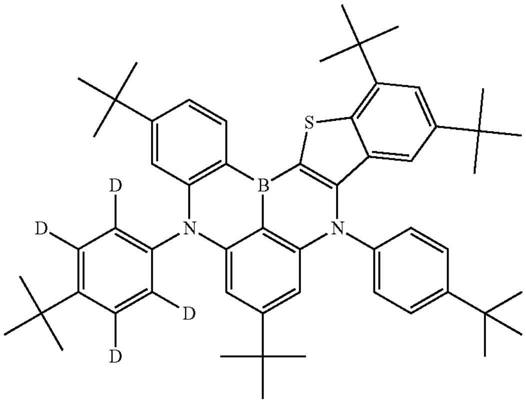

-continued
(A147)
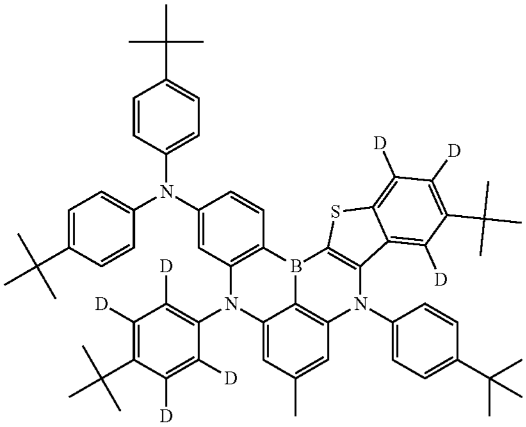
(A148)
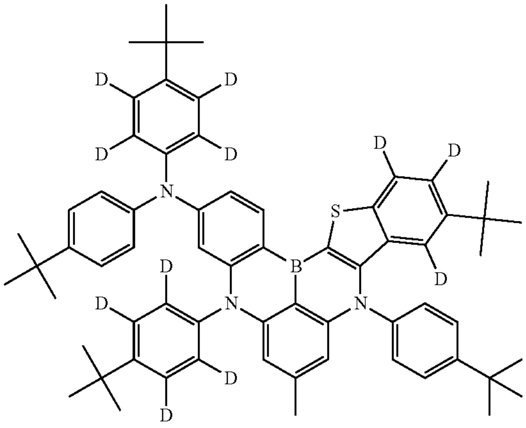
(A149)
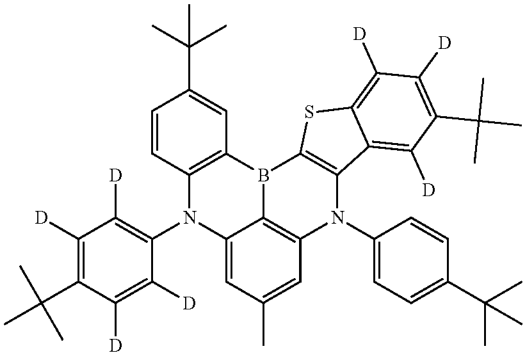
-continued
(A150)
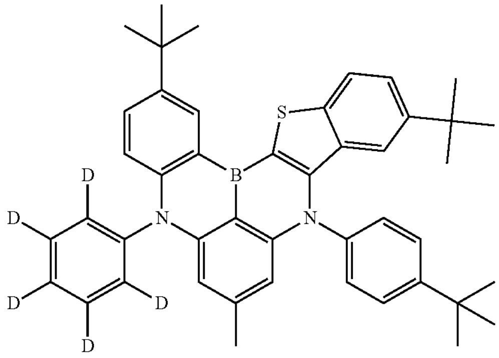
(A151)
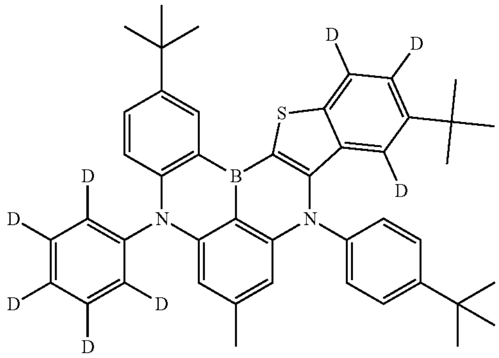
(A152)
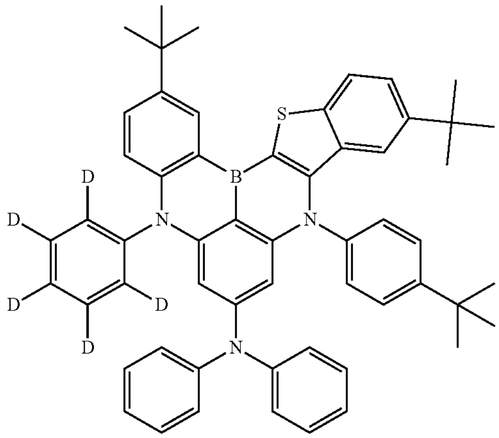
(A153)
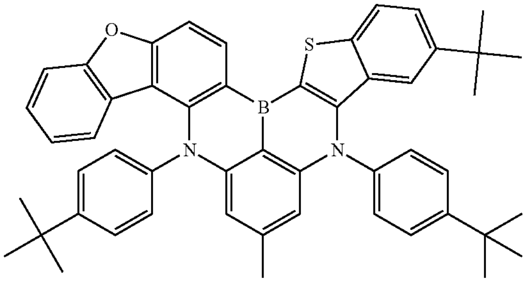

(A154)
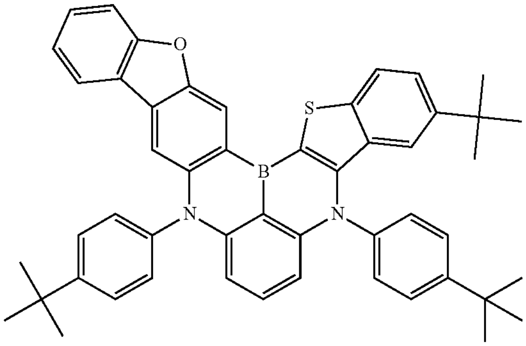
(A155)
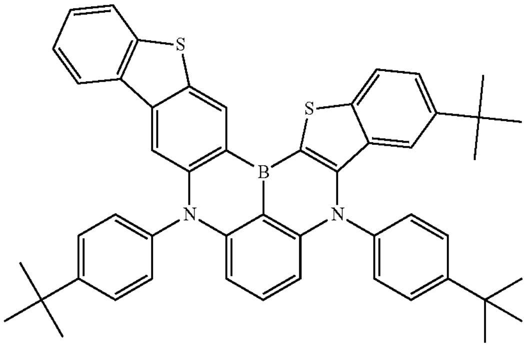
(A156)
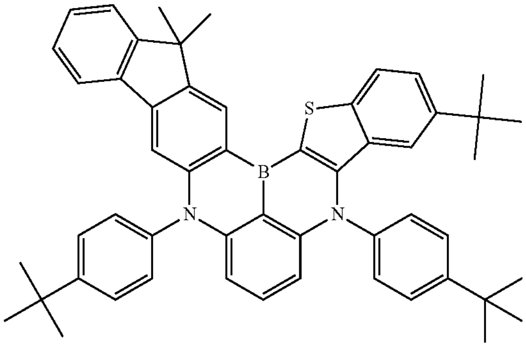
(A157)
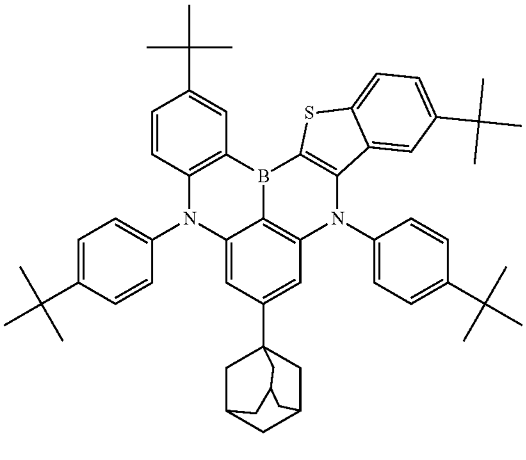
(A158)
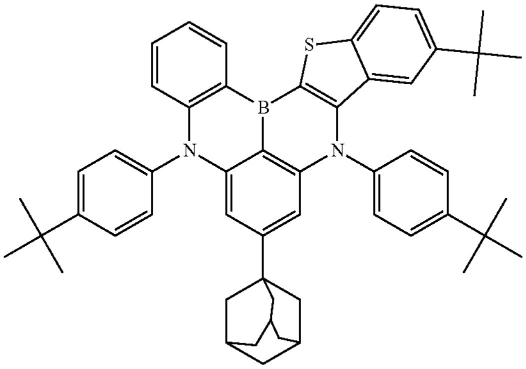
(A159)
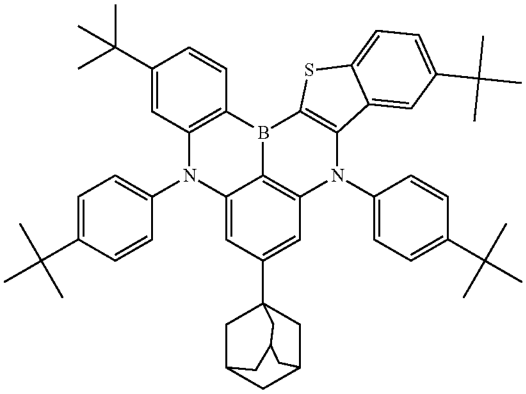
(A160)
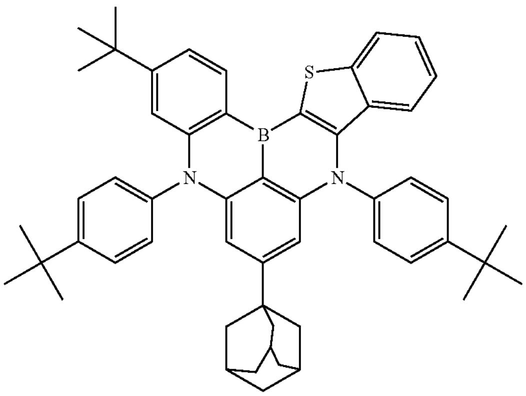
(A161)
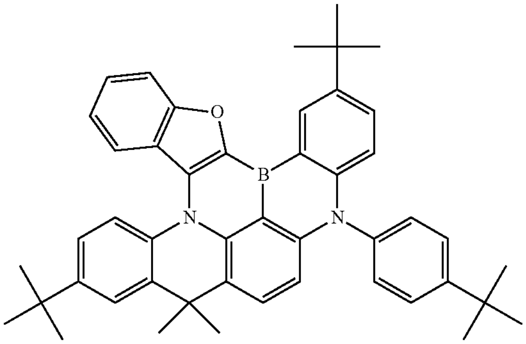

-continued
(A162)
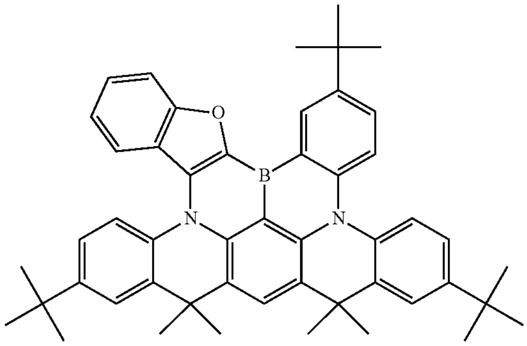
(A163)
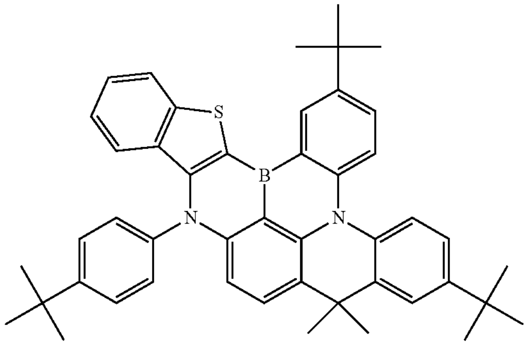
(A164)
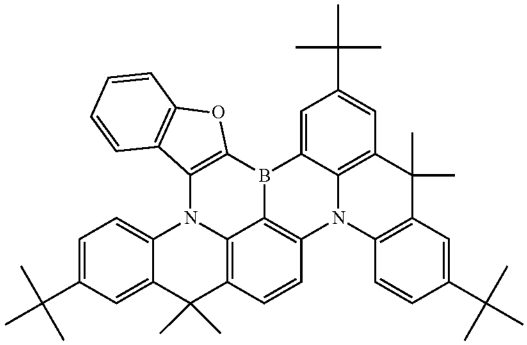
(A165)
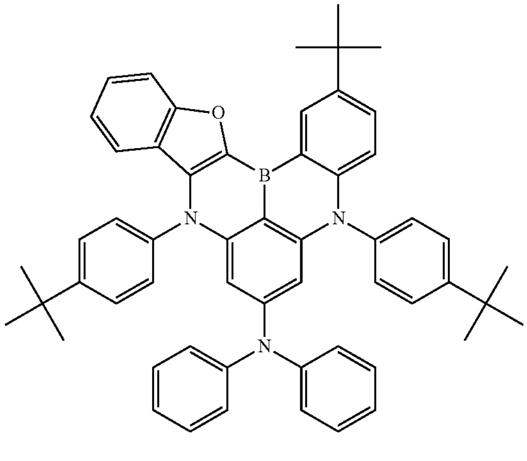
-continued
(A166)
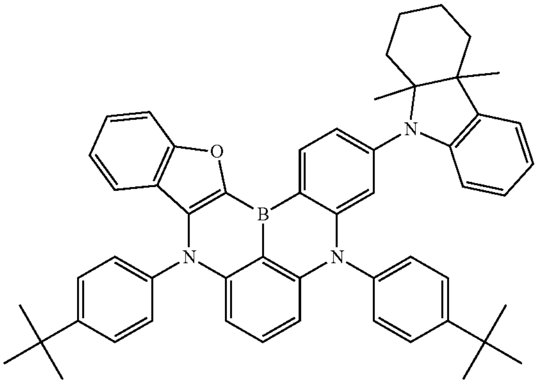
(A167)
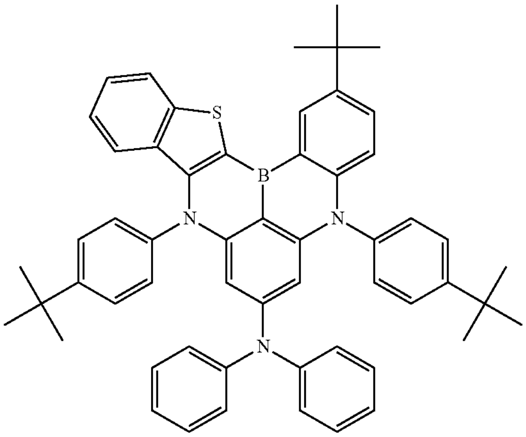
(A168)
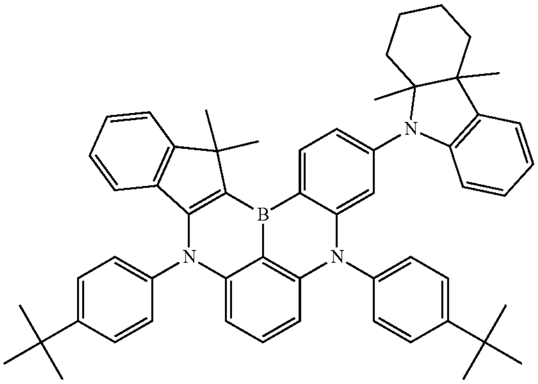
(A169)
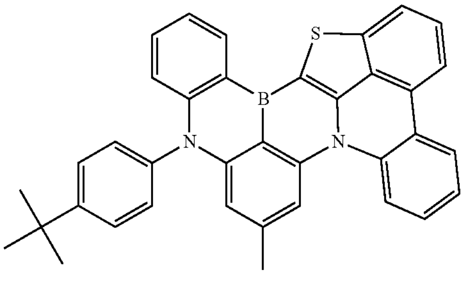

-continued (A170)

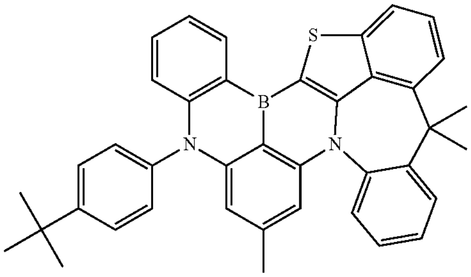

(A171)

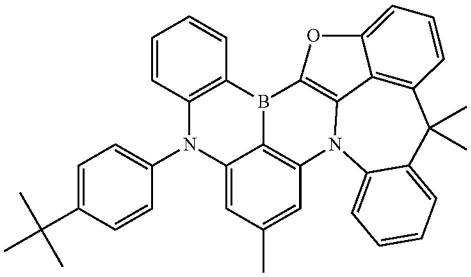

(A172)

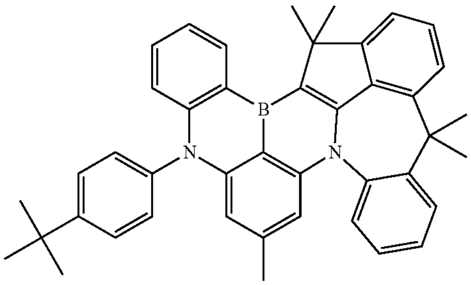

(A173)

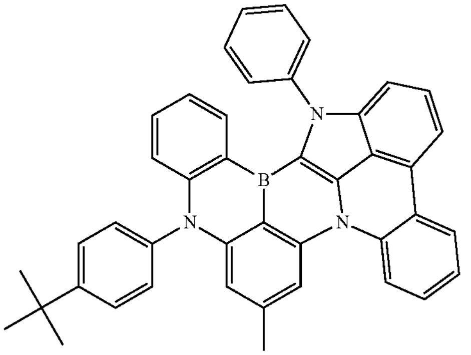

-continued (A174)

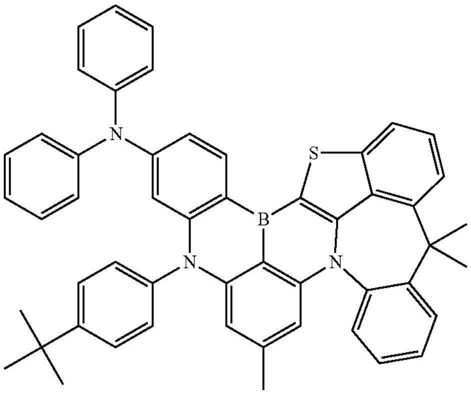

(A175)

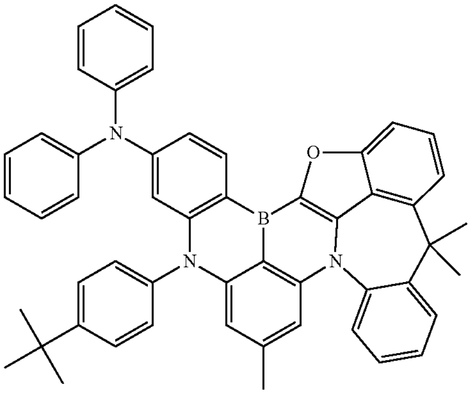

(A176)

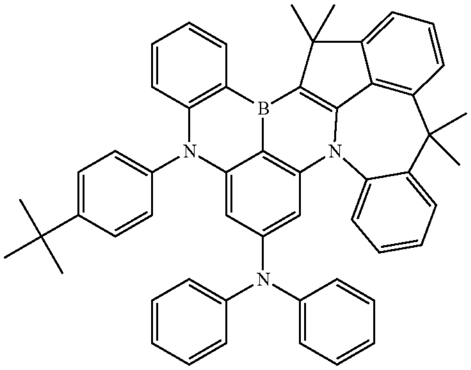

However, the scope of the compound represented by Formula A-1 or A-2 is not limited to the compounds A1 to A176.

The anthracene derivative represented by Formula B as a host compound employed in the light emitting layer as an organic layer of the organic electroluminescent device according to the present invention may be selected from the compounds of Formulae B1 to B16:

-continued
(B1)
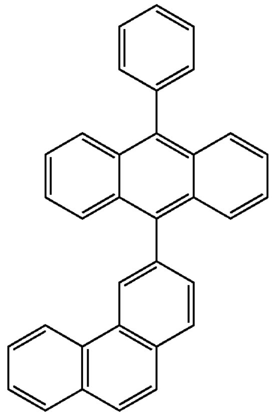
(B2)
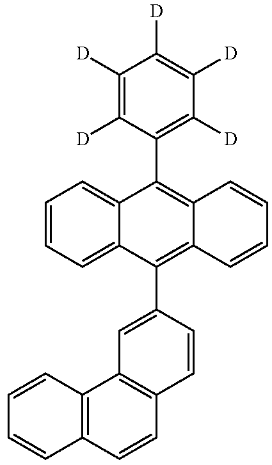
(B3)
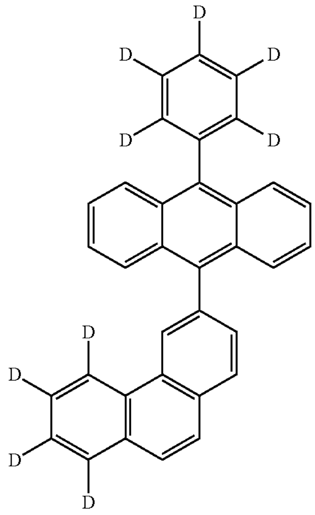
(B4)
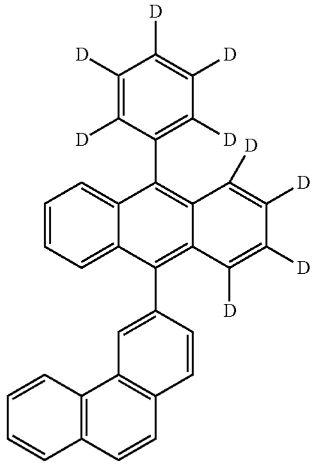
(B5)
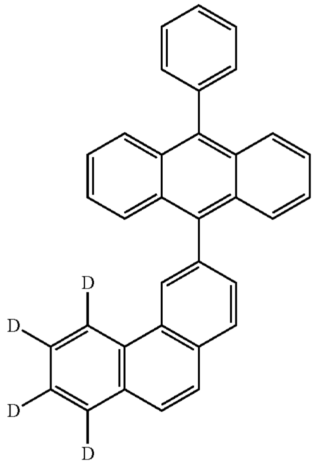
(B6)
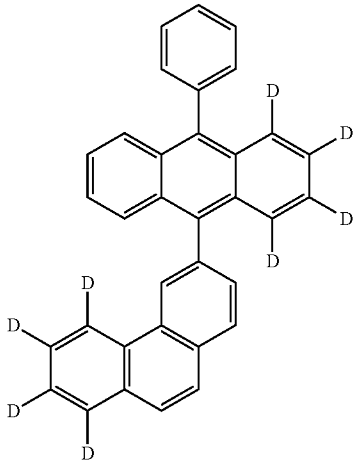

-continued
(B7)
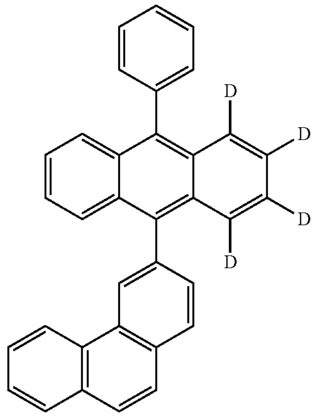
(B8)
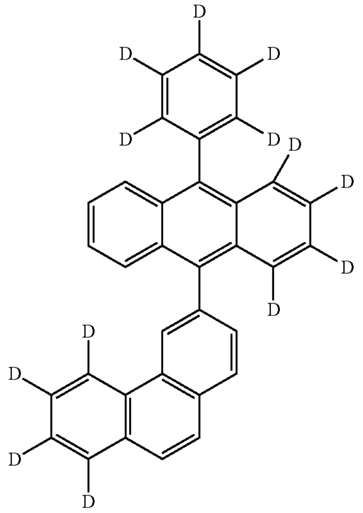
(B9)
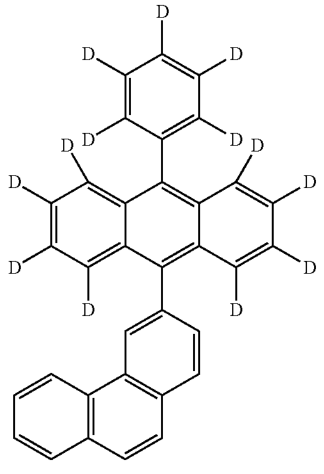
-continued
(B10)
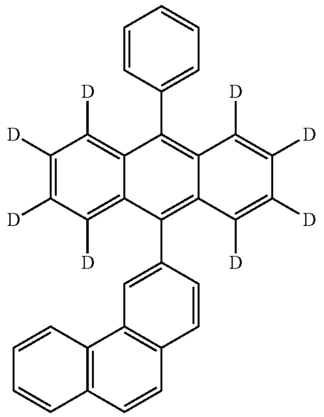
(B11)
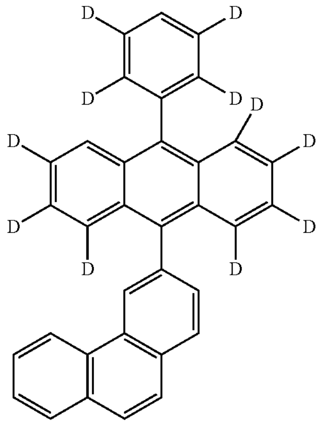
(B12)
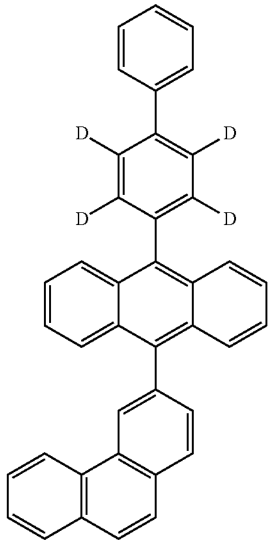

-continued (B13)

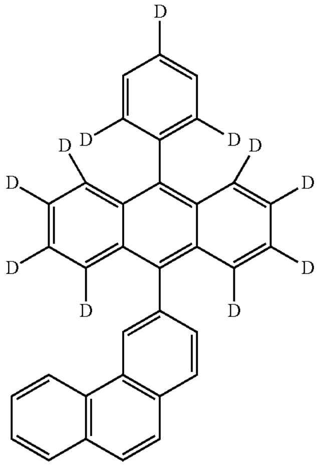

(B14)

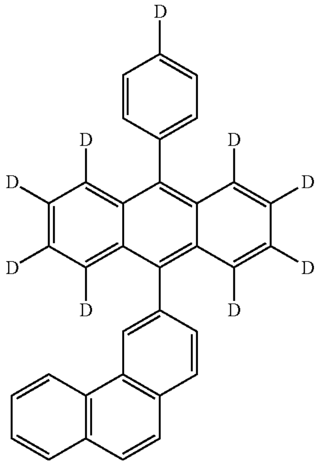

(B15)

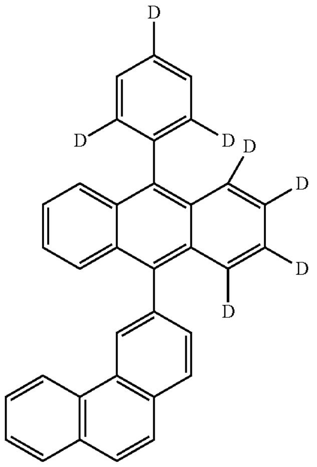

-continued (B16)

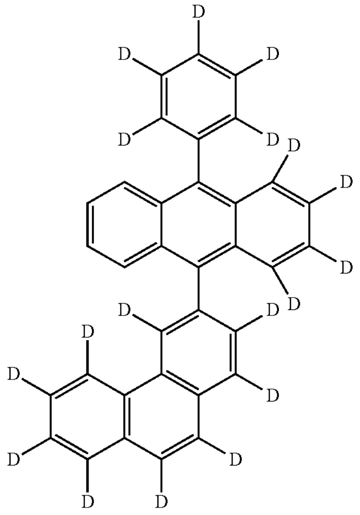

However, the scope of the compound represented by Formula B is not limited to the compounds B1 to B16.

The organic electroluminescent device of the present invention includes a first electrode, a second electrode, and one or more organic layers interposed between the first and second electrodes wherein at least one of the organic layers includes the compound represented by Formula A-1 or A-2 and the compound represented by Formula B. Preferably, the compound represented by Formula A-1 or A-2 and the compound represented by Formula B are used as a dopant and a host in a light emitting layer of the device.

The organic layers of the organic electroluminescent device according to the present invention may form a monolayer structure. Alternatively, the organic layers may have a multilayer laminate structure. For example, the structure of the organic layers may include a hole injecting layer, a hole transport layer, a hole blocking layer, a light emitting layer, an electron blocking layer, an electron transport layer, and an electron injecting layer, but is not limited thereto. The number of the organic layers is not limited and may be increased or decreased. Preferred structures of the organic layers of the organic electroluminescent device according to the present invention will be explained in more detail in the Examples section that follows.

According to one embodiment of the present invention, the organic electroluminescent device may include a substrate, a first electrode (anode), one or more organic layers, a second electrode (cathode), and a capping layer formed under the first electrode (bottom emission type) or on the second electrode (top emission type).

When the organic electroluminescent device is of a top emission type, light from the light emitting layer is emitted to the cathode and passes through the capping layer (CPL) formed using the compound of the present invention having a relatively high refractive index. The wavelength of the light is amplified in the capping layer, resulting in an increase in luminous efficiency. Also when the organic electroluminescent device is of a bottom emission type, the compound of the present invention can be employed in the capping layer to improve the luminous efficiency of the organic electroluminescent device based on the same principle.

A more detailed description will be given concerning exemplary embodiments of the organic electroluminescent device according to the present invention.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention further includes, as a host compound, an anthracene derivative represented by Formula C:

(C)

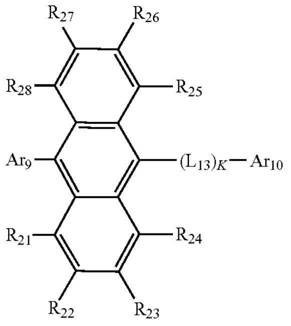

wherein $R_{21}$ to $R_{28}$ are identical to or different from each other and are as defined for $R_1$ to $R_4$ in Formula A-1 or A-2, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_2$ arylene, and k is an integer from 1 to 3, provided that when k is 2 or more, the linkers $L_{13}$ are identical to or different from each other.

$Ar_9$ in Formula C is represented by Formula C-1:

(C-1)

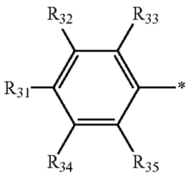

wherein $R_{31}$ to $R_{35}$ are identical to or different from each other and are as defined for $R_1$ to $R_4$ in Formula A-1 or A-2, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C48:

C1

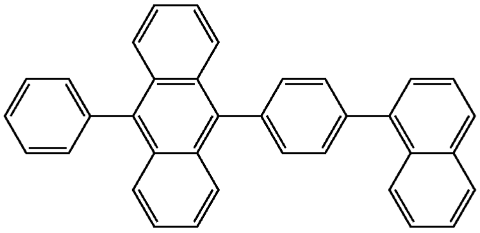

C2

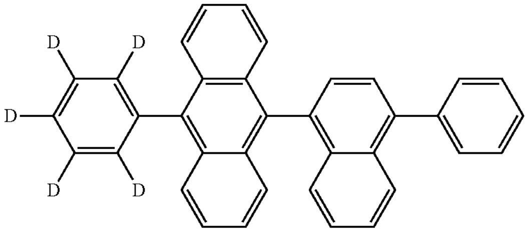

C3

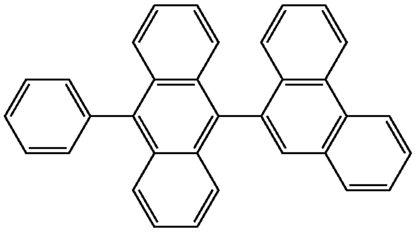

C4

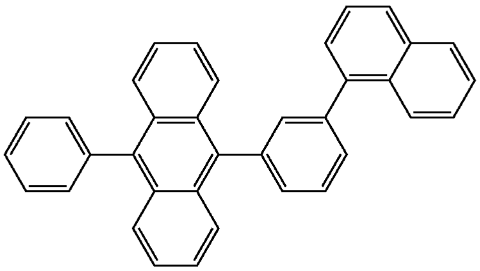

-continued
C5
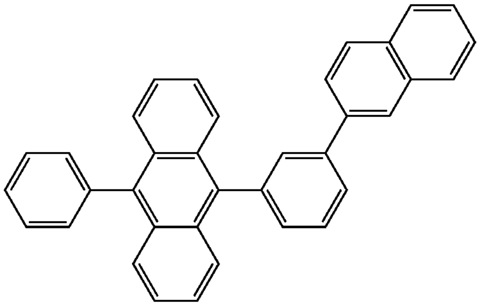
C6
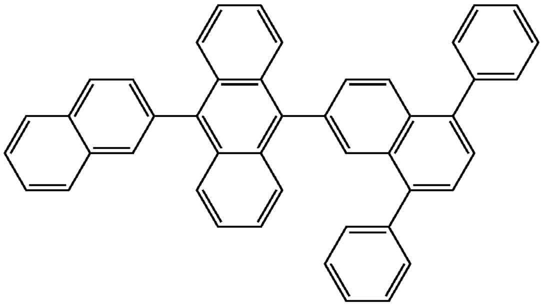
C7
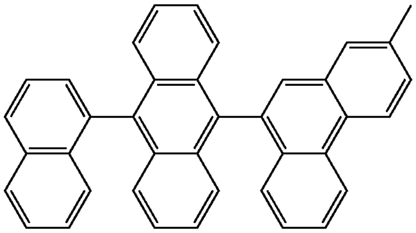
C8
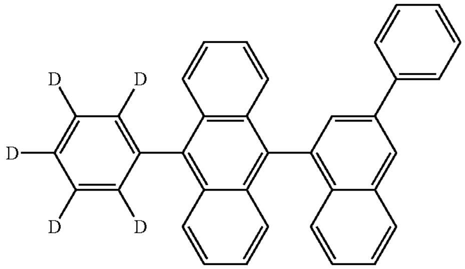
C9
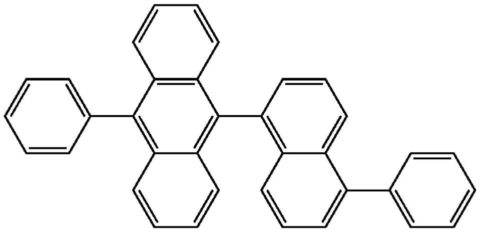
C10
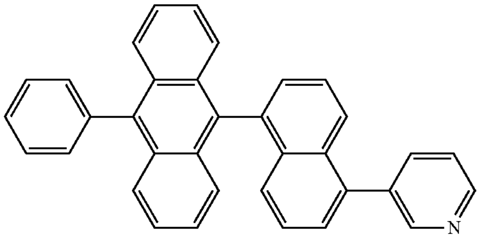
-continued
C11
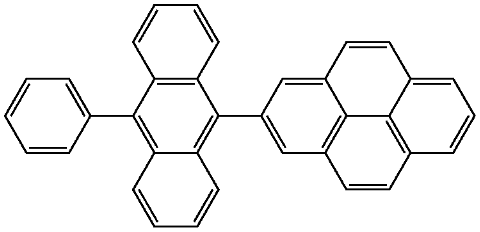
C12
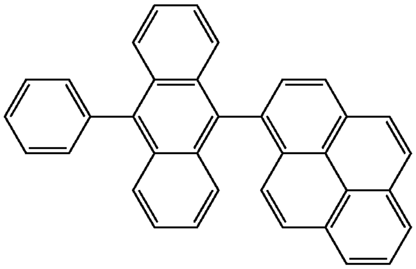
C13
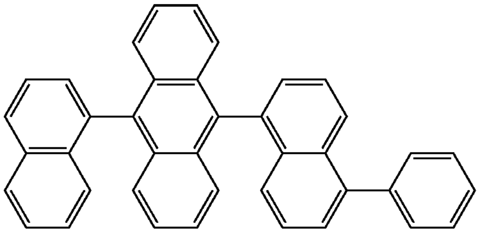
C14
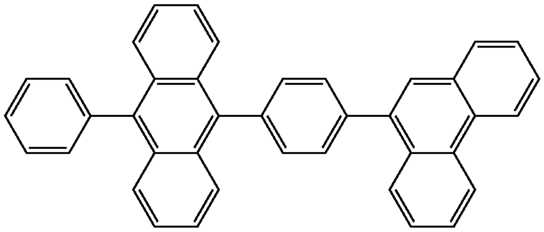
C15
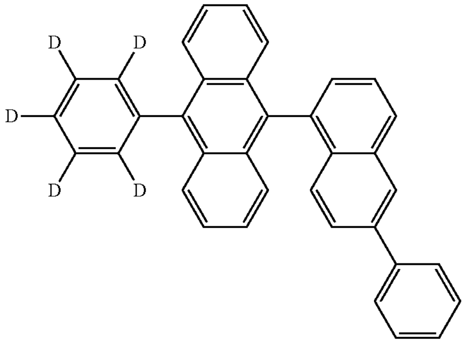
C16
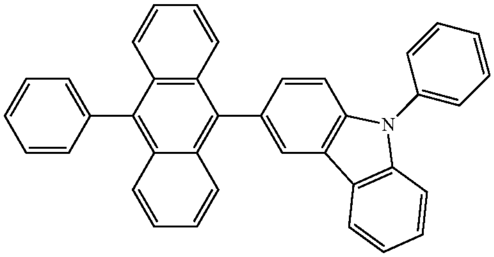

-continued
C17
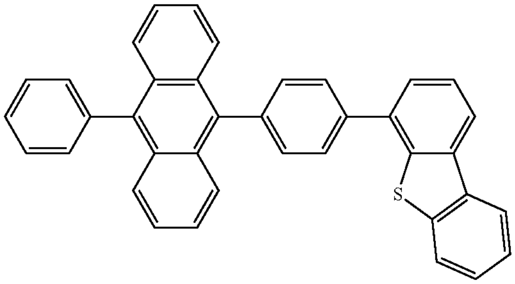
C18
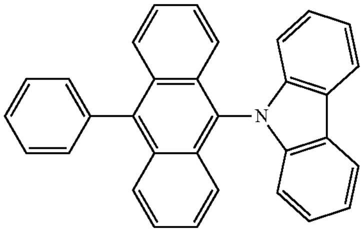
C19
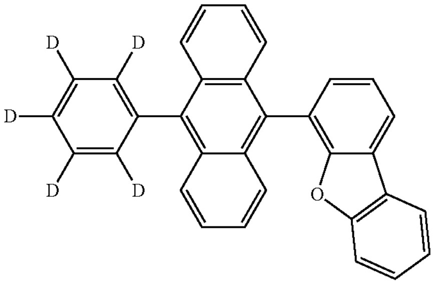
C20
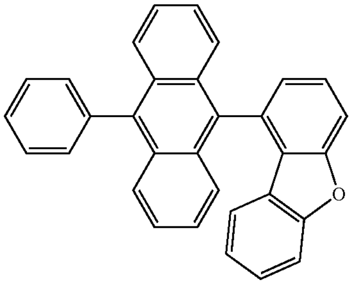
C21
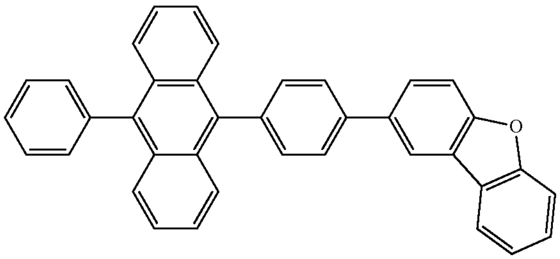
-continued
C22
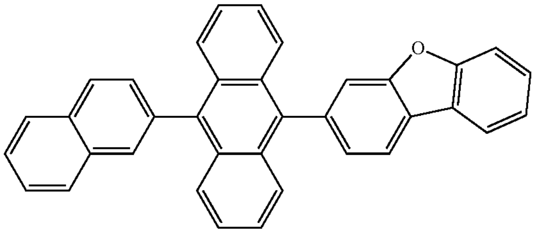
C23
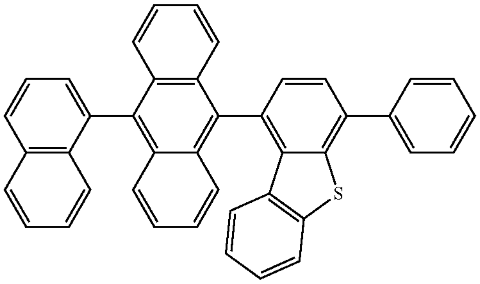
C24
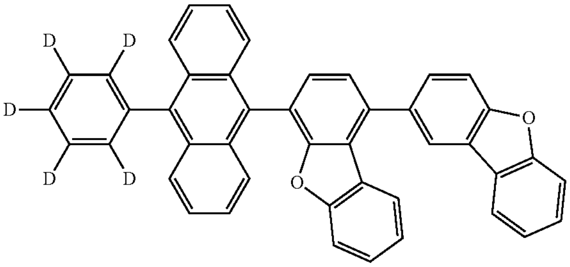
C25
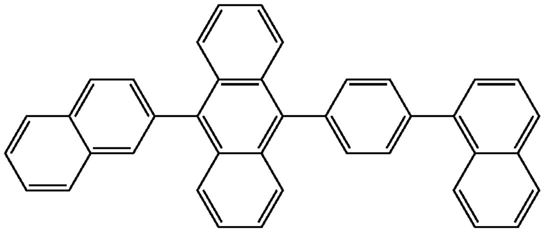
C26
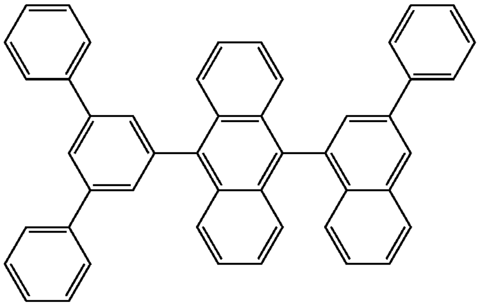

-continued
C27
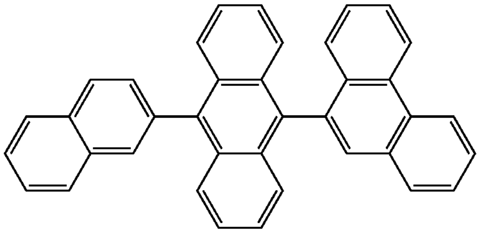
C28
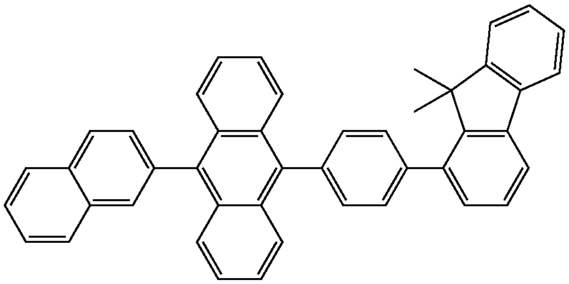
C29
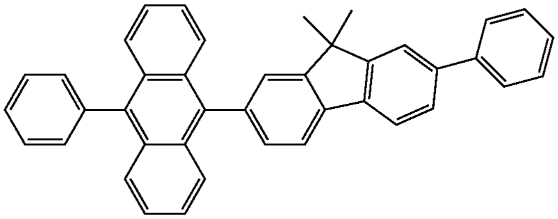
C30
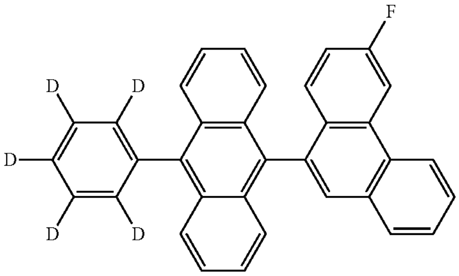
C31
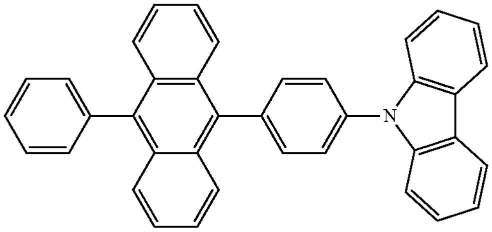
C32
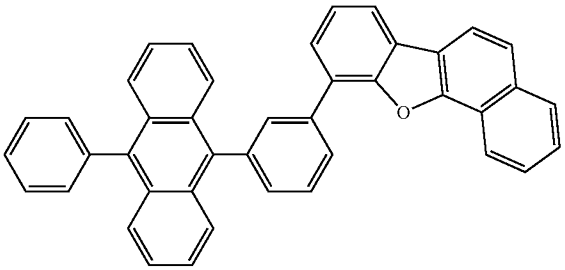
-continued
C33
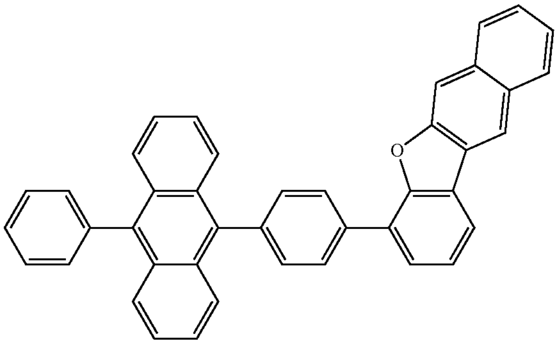
C34
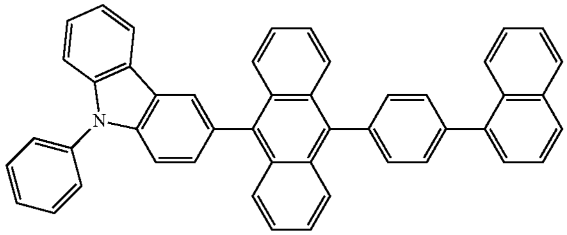
C35
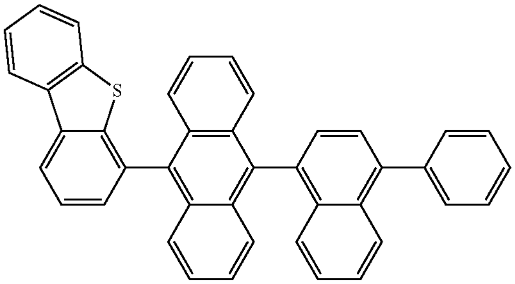
C36
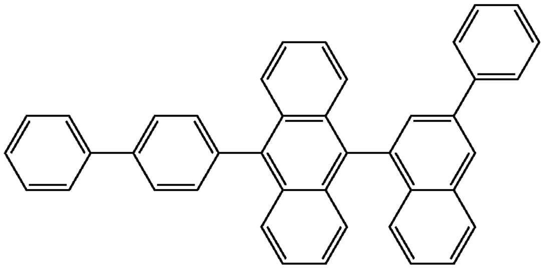
C37
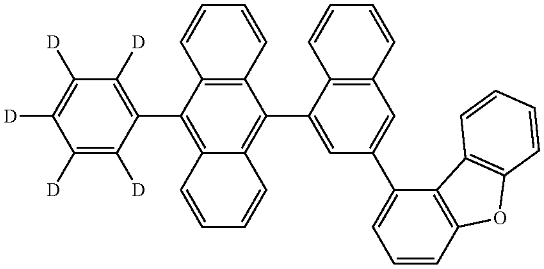

C38
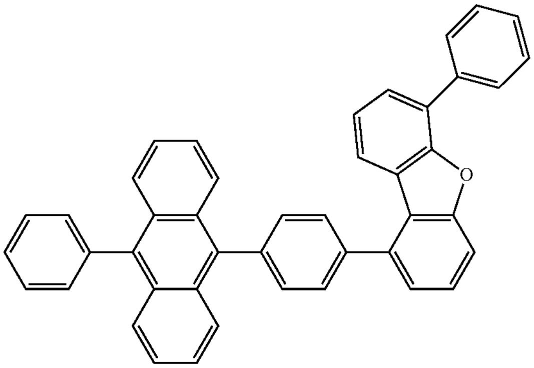
C39
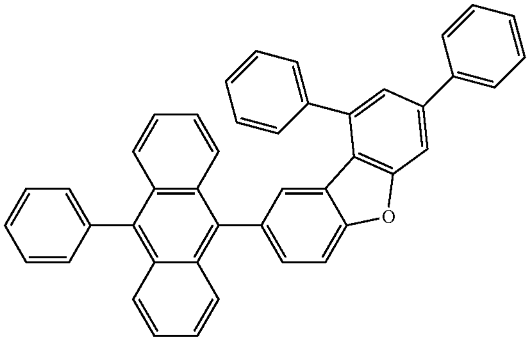
C40
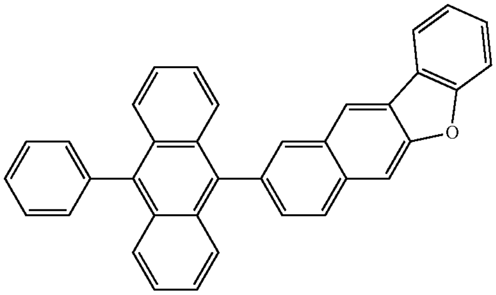
C41
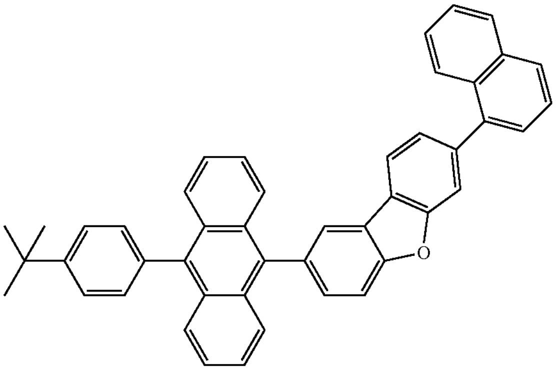
C42
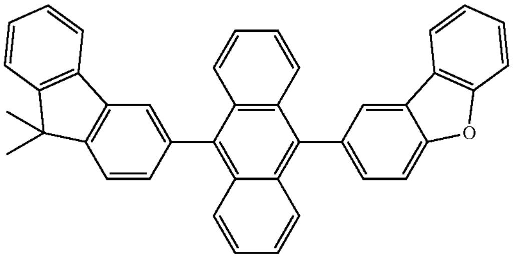
C43
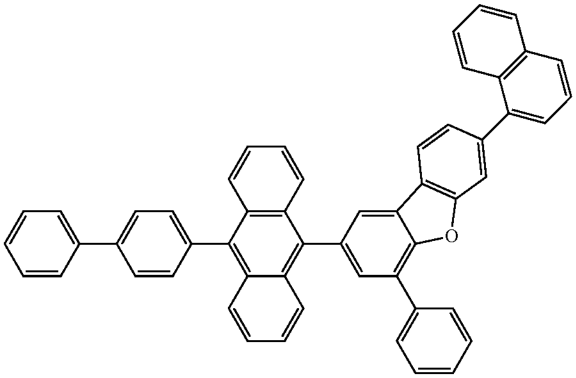
C44
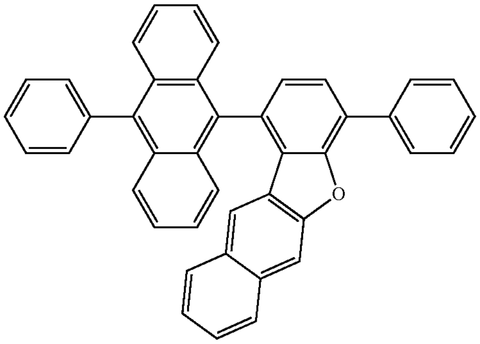
C45
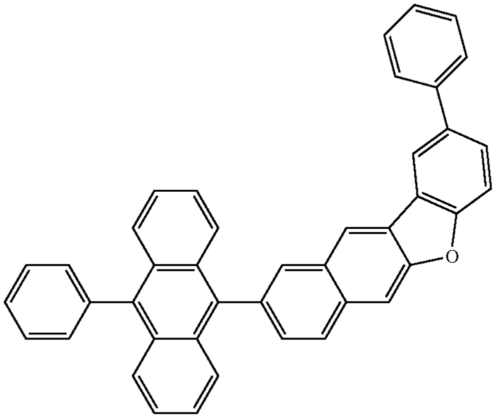

-continued

C46

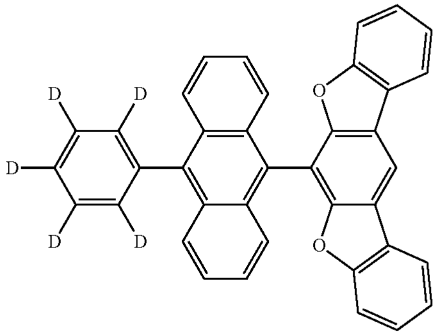

C47

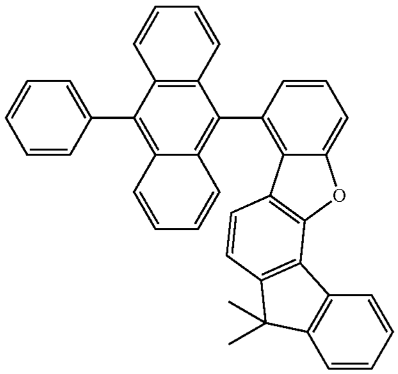

C48

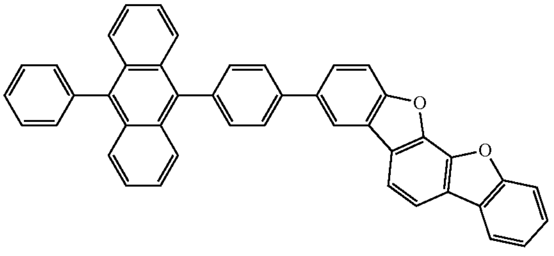

The organic electroluminescent device of the present invention may further include a hole transport layer, an electron blocking layer, and a capping layer, each of which may include a compound represented by Formula D:

(D)

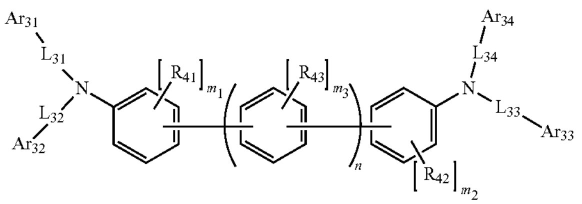

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

In Formula D, at least one of $Ar_{31}$ to $Ar_{34}$ is represented by Formula E:

(E)

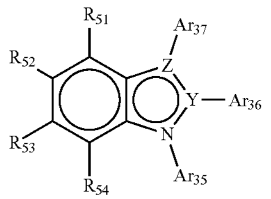

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_3$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

The compound of Formula D employed in the organic electroluminescent device of the present invention may be specifically selected from the compounds of Formulae D1 to D79:

D1
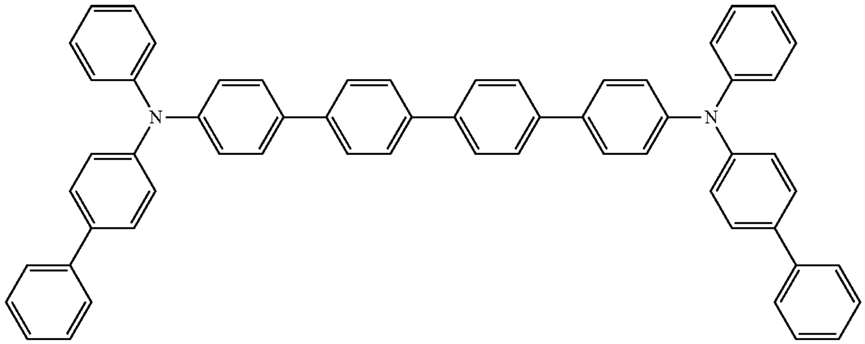
D2
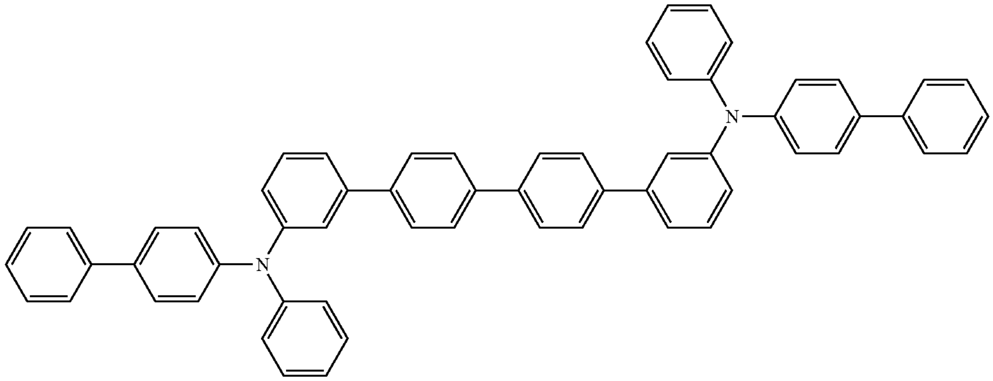
D3
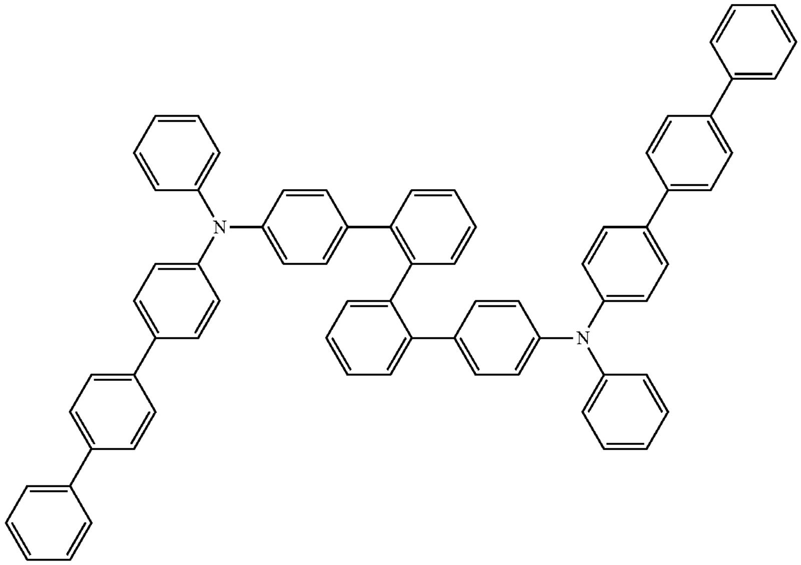
D4
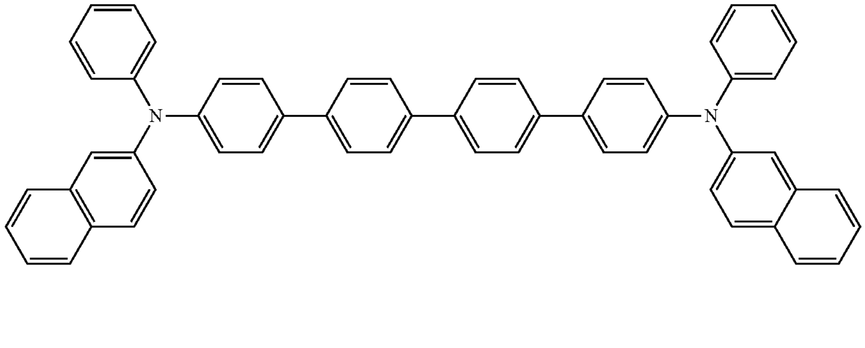

-continued
D5
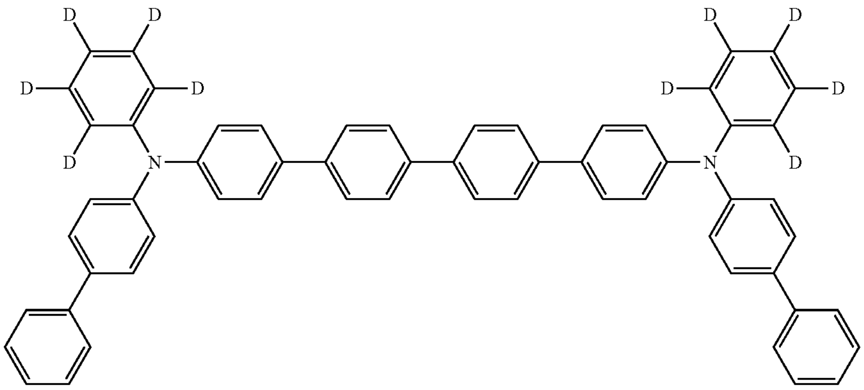
D6
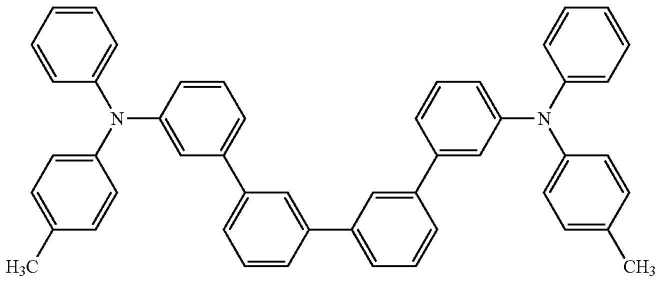
D7
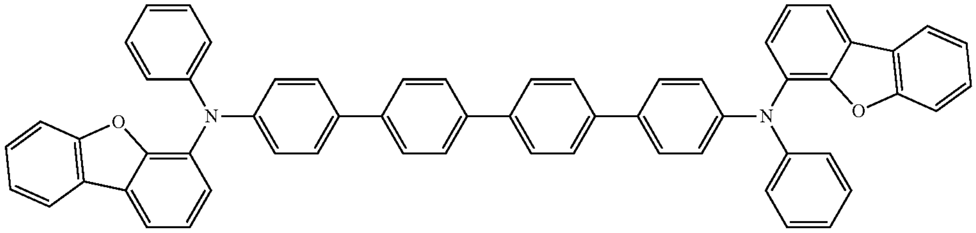
D8
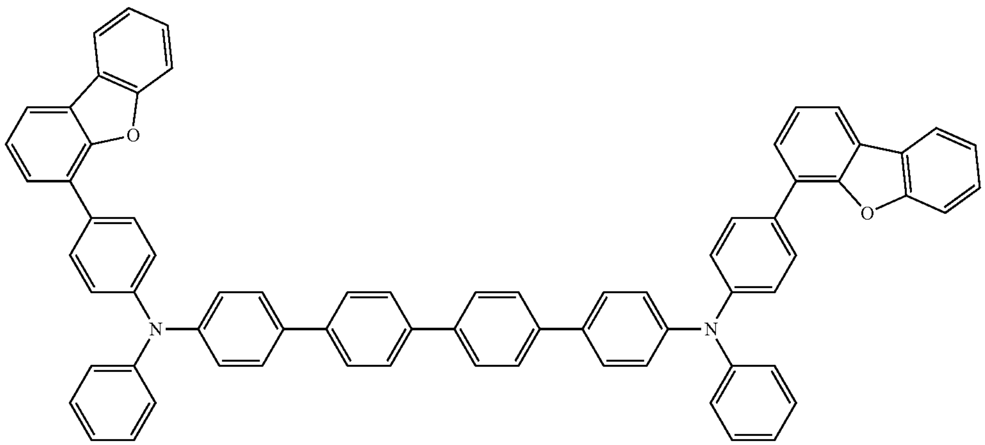

-continued
D9
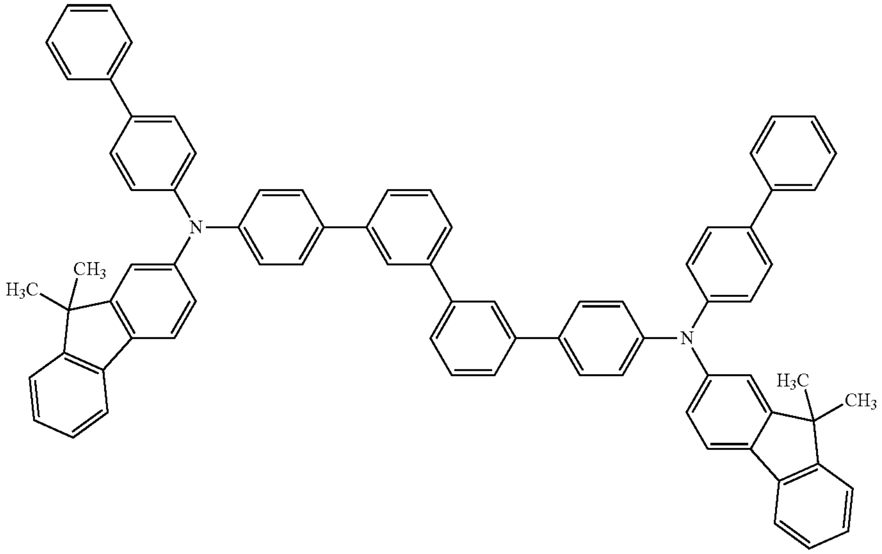
D10
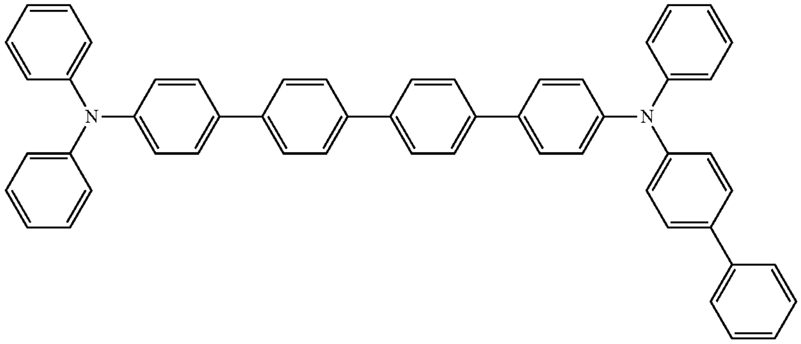
D11
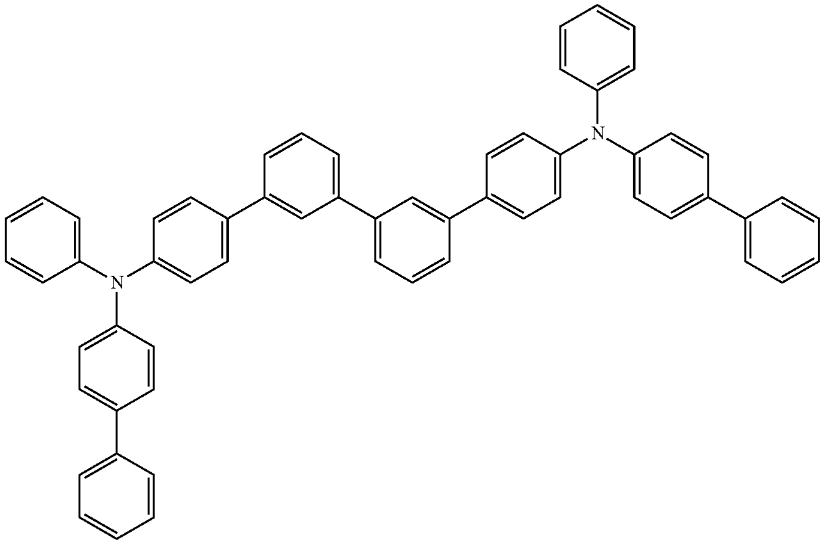

-continued
D12
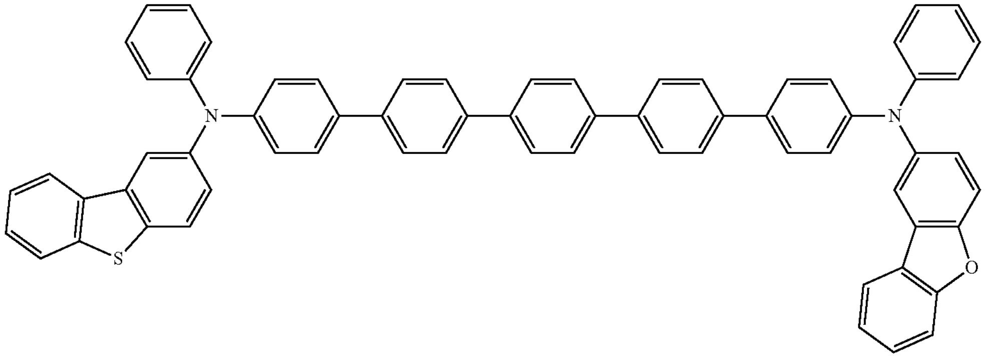
D13
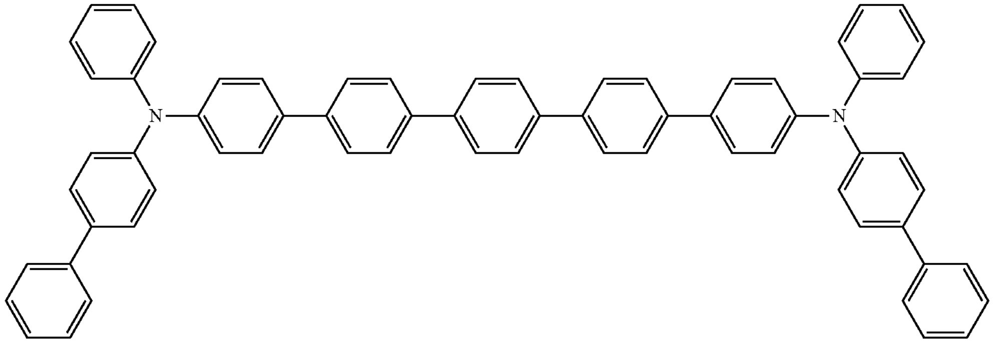
D14
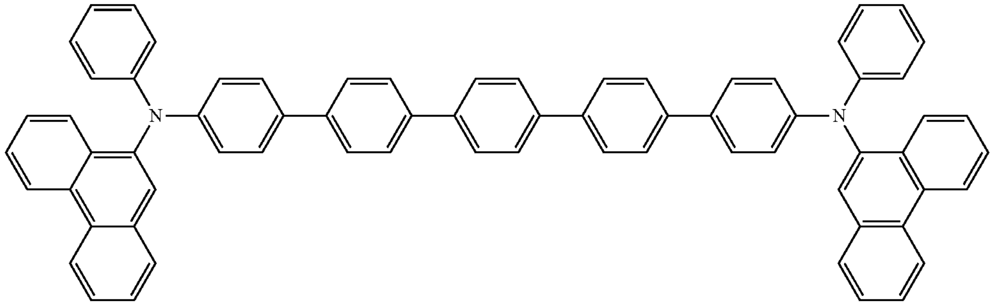
D15
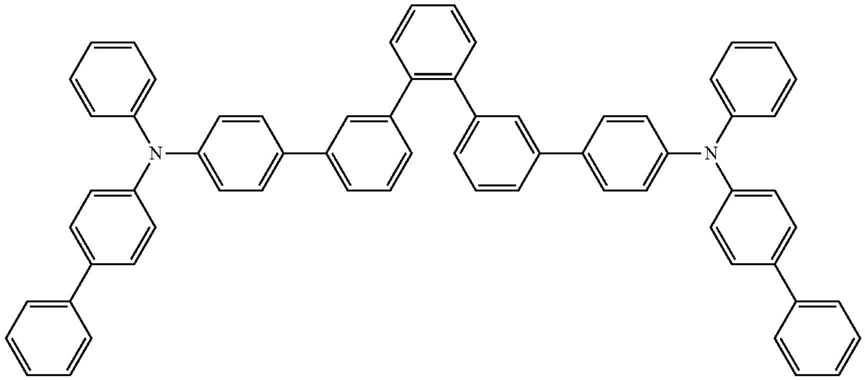

-continued
D16
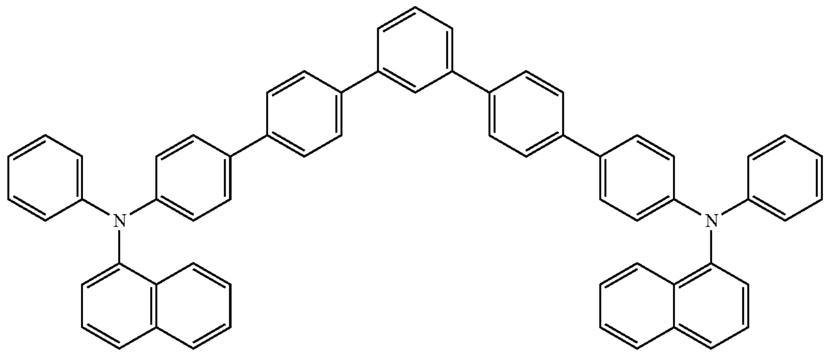
D17
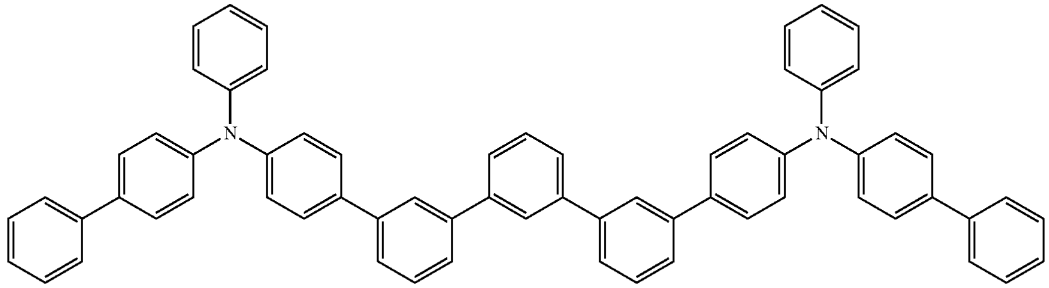
D18
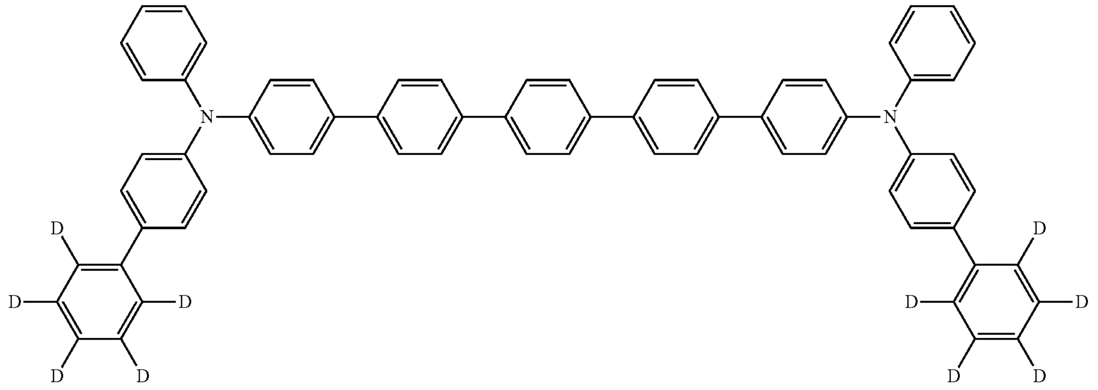
D19
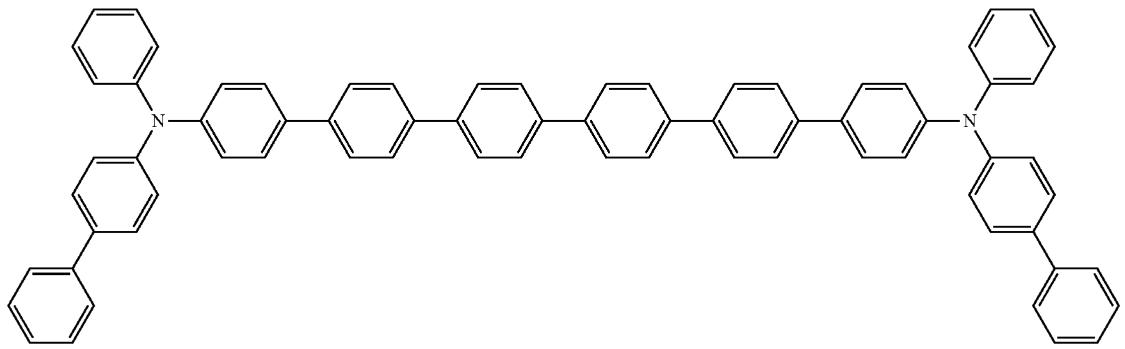

-continued
D20
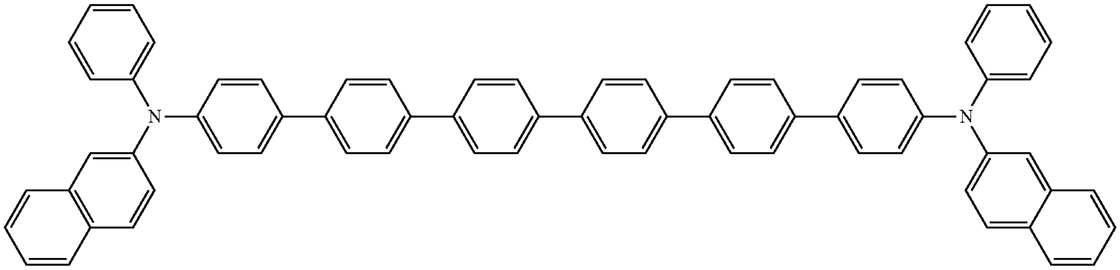
D21
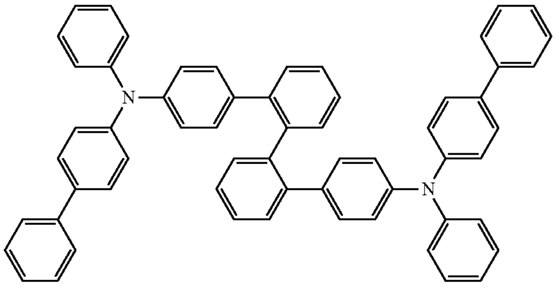
D22
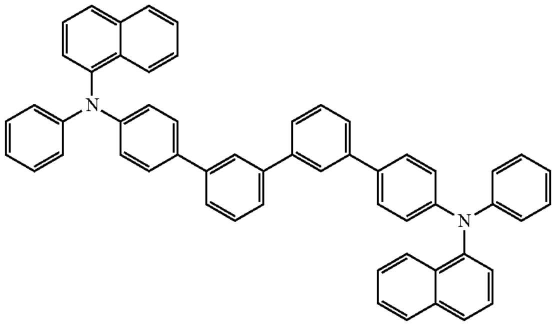
D23
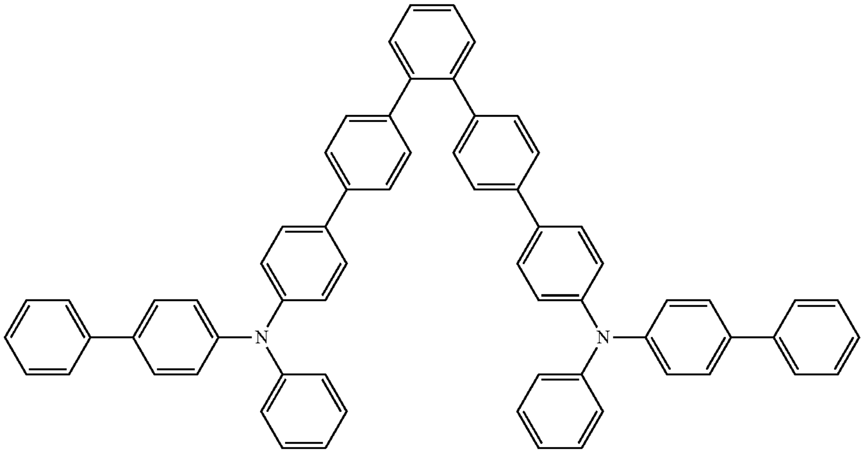
D24
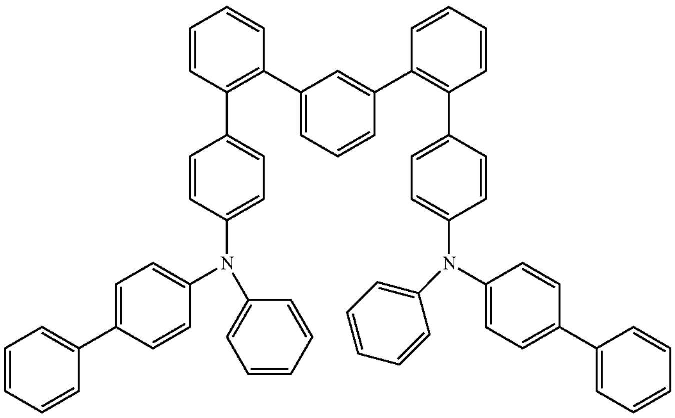

-continued
D25
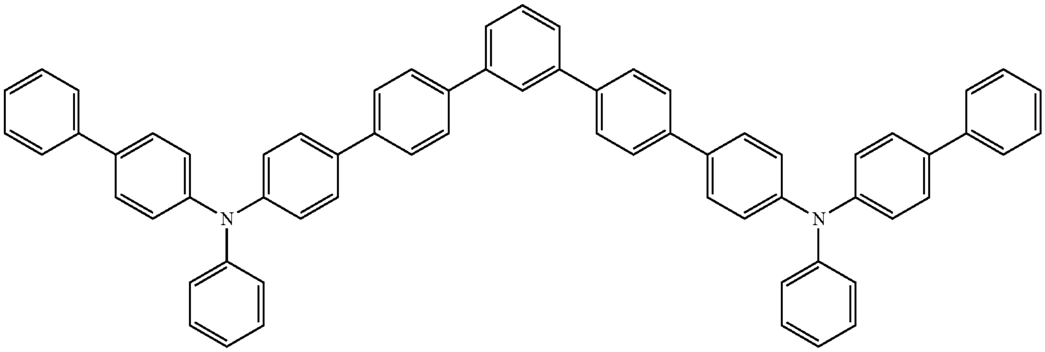
D26
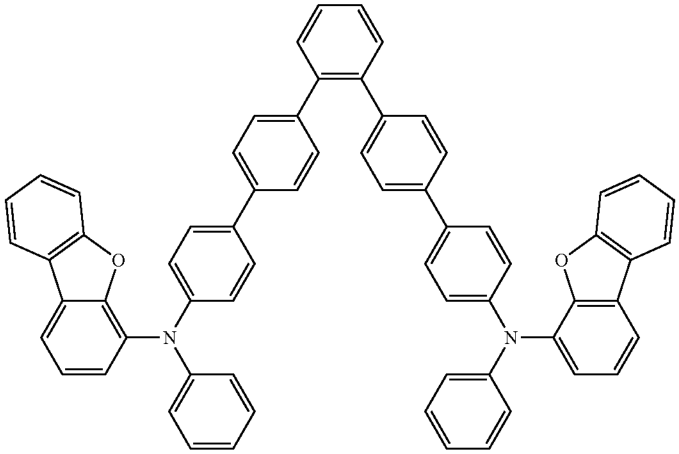
D27
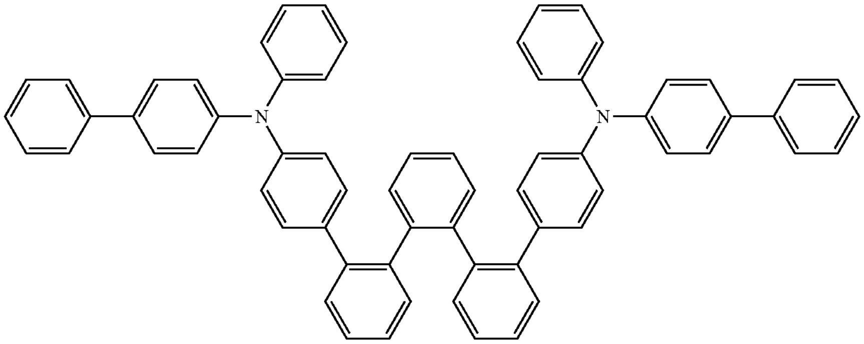
D28
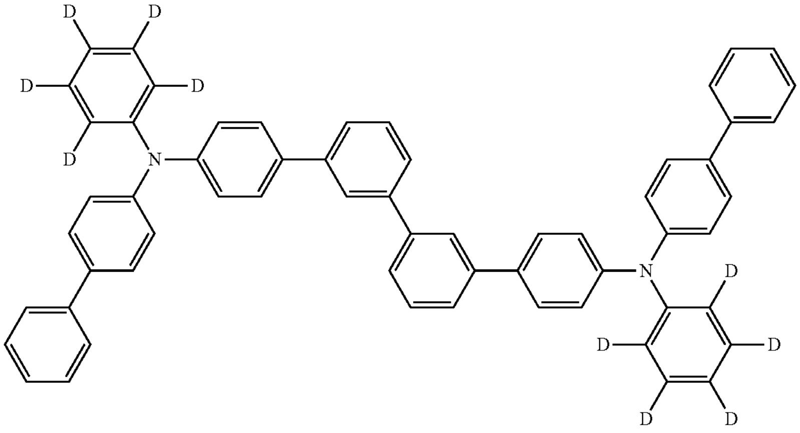

-continued
D29
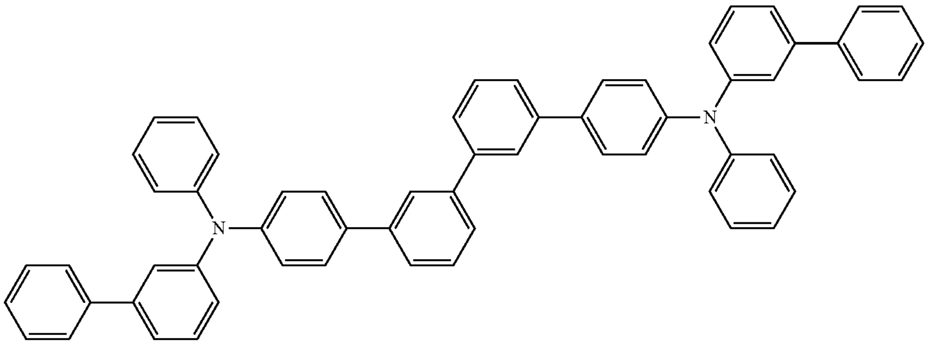
D30
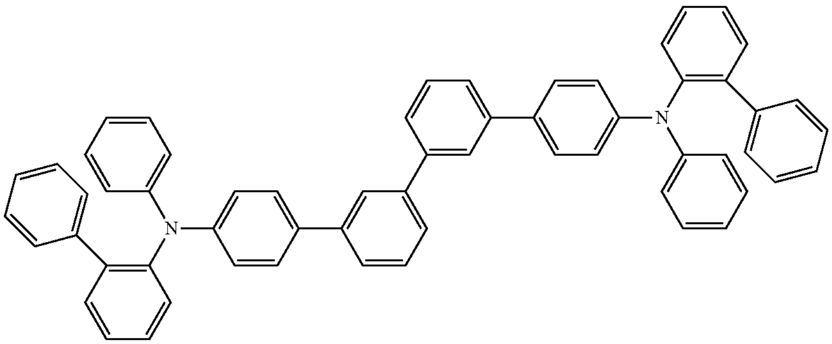
D31
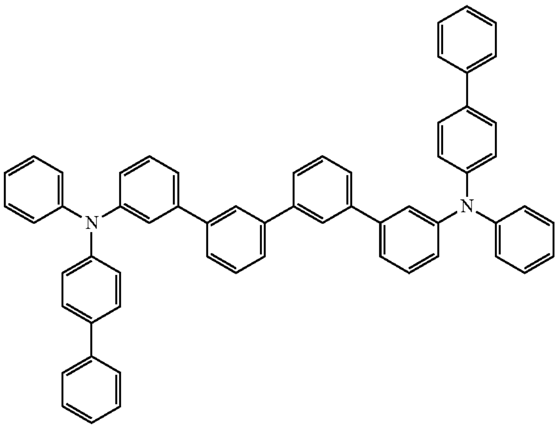
D32
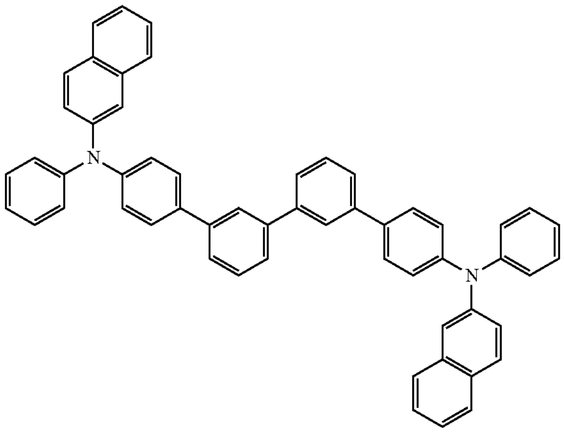
D33
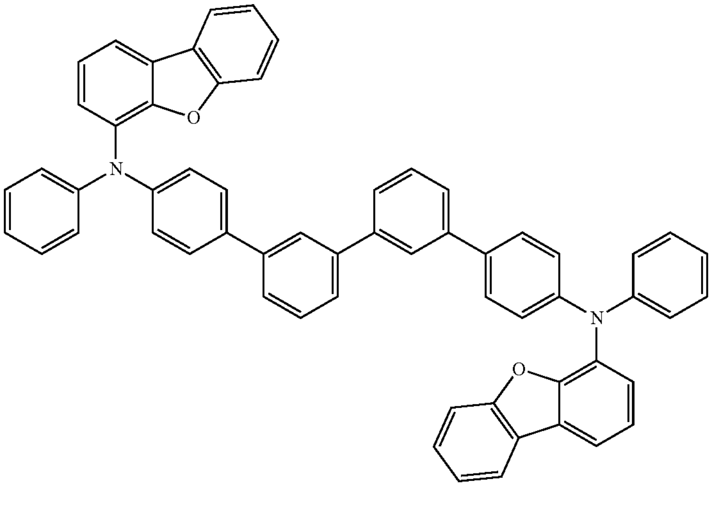

-continued
D34
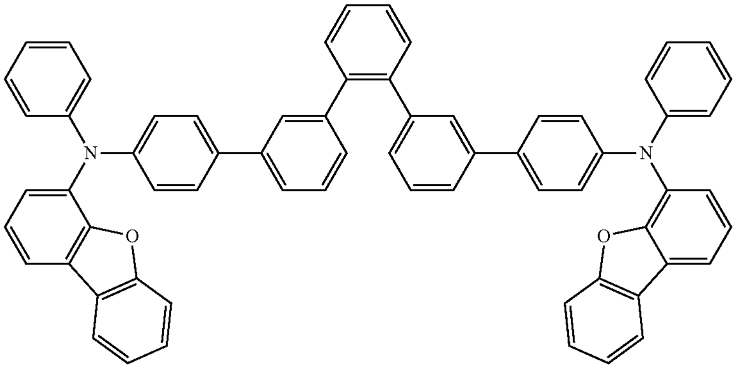
D35
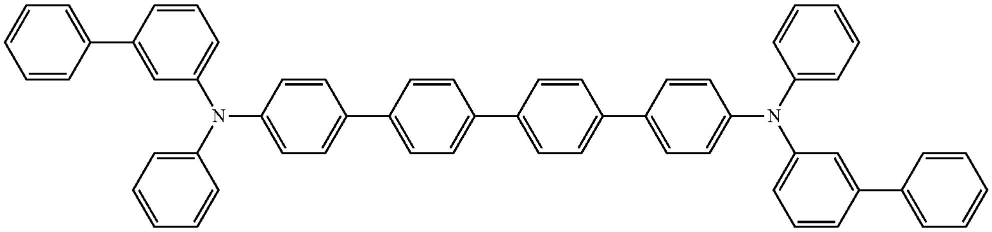
D36
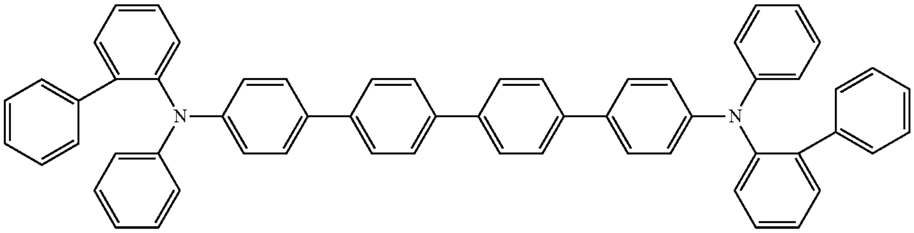
D37
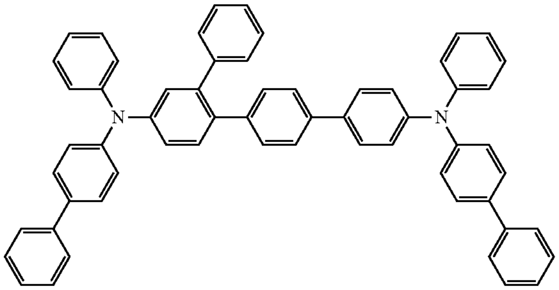
D38
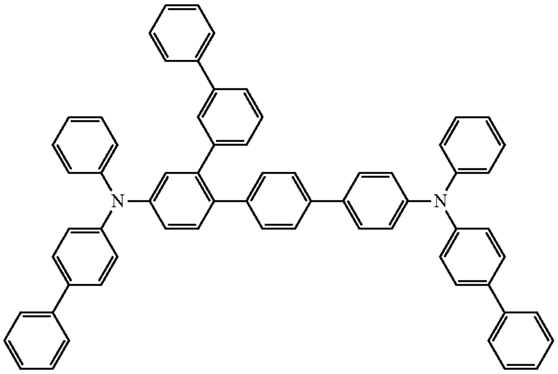
D39
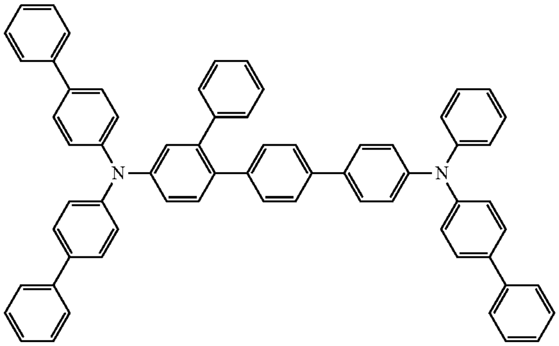
D40
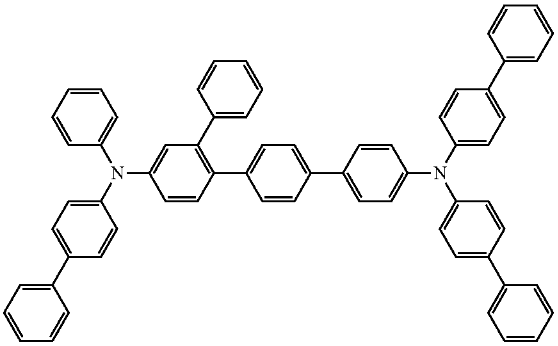

-continued
D41
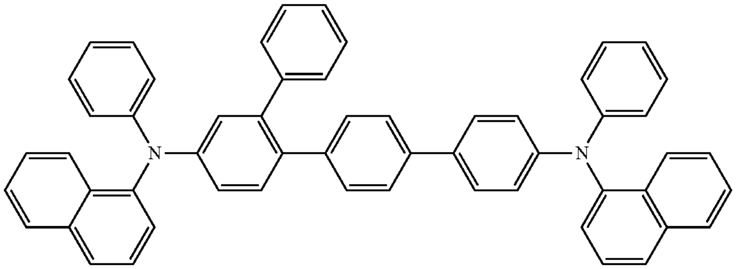
D42
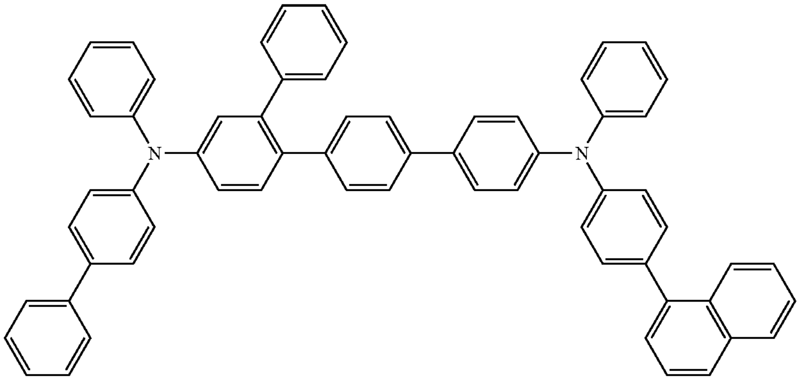
D43
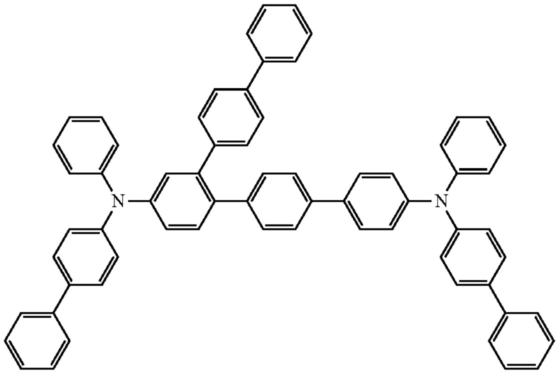
D44
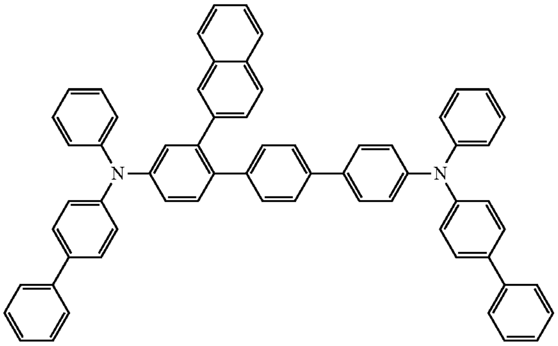
D45
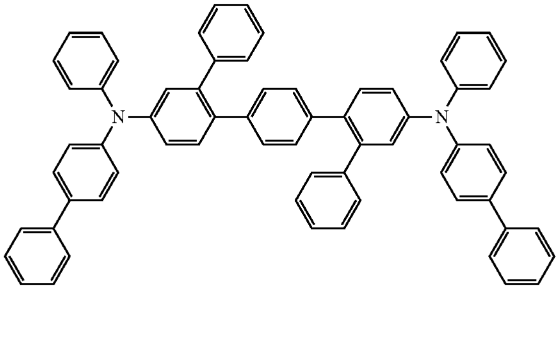
D46
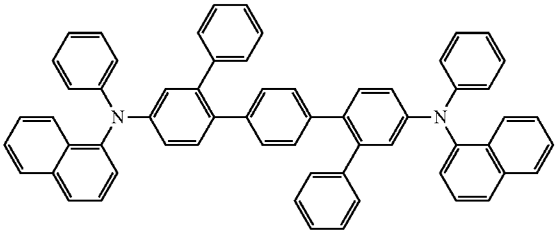

-continued
D47
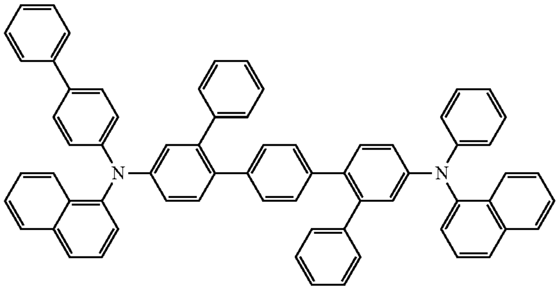
D48
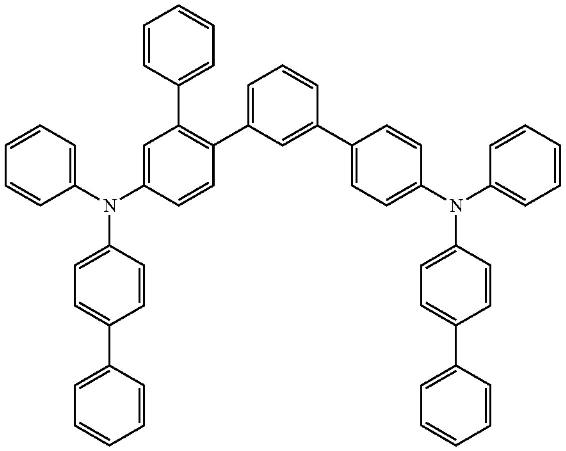
D49
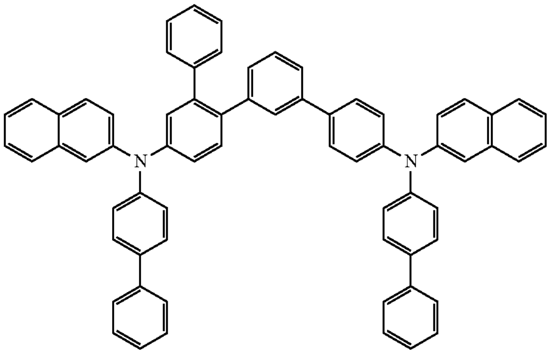
D50
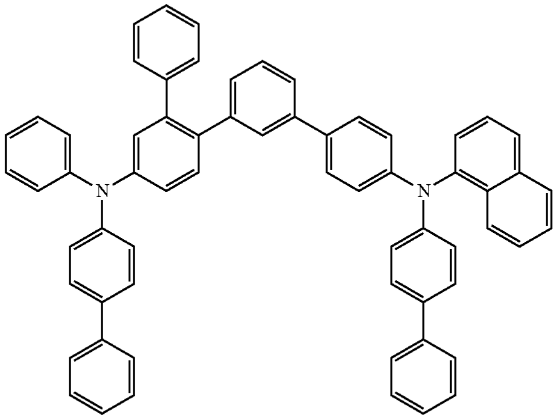
D51
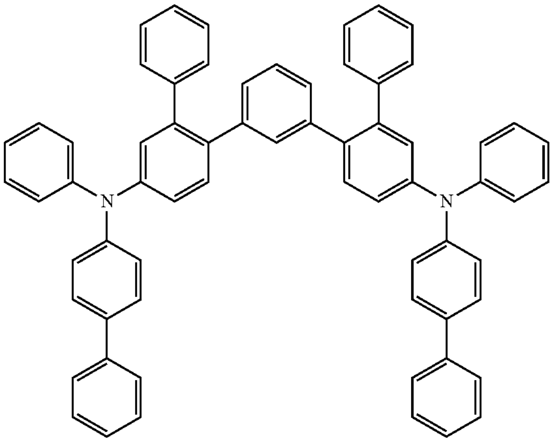
D52
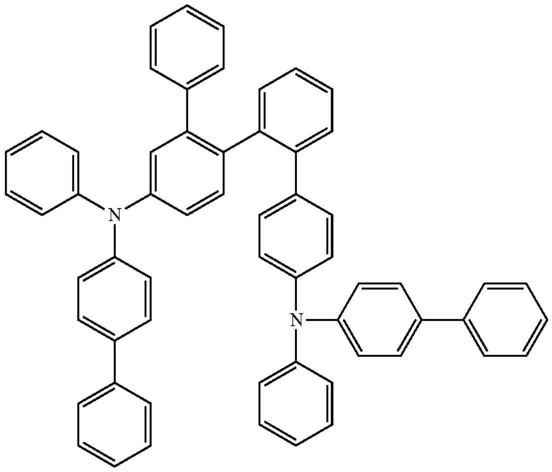

-continued
D53
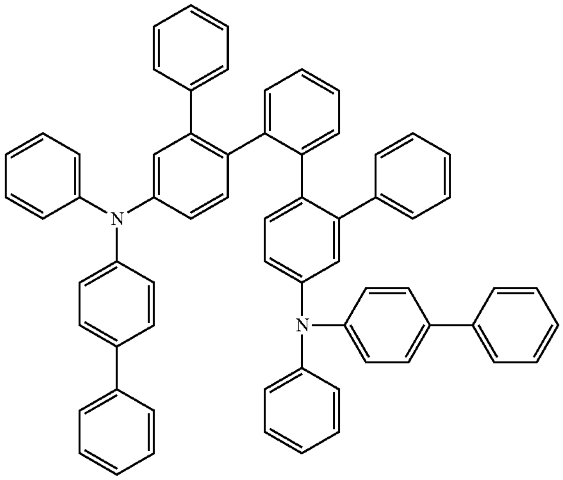
D54
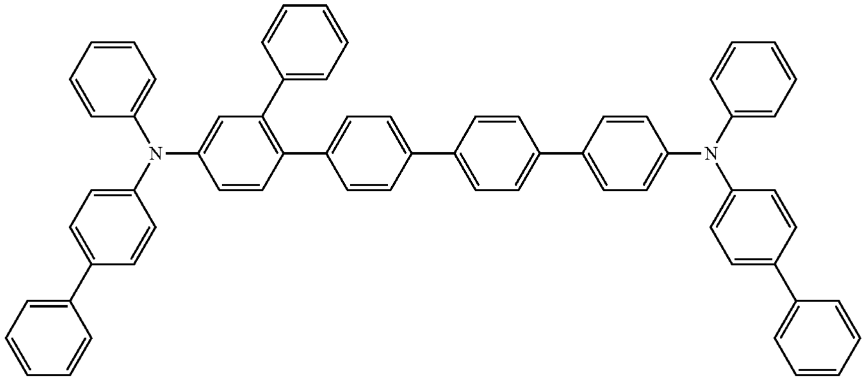
D55
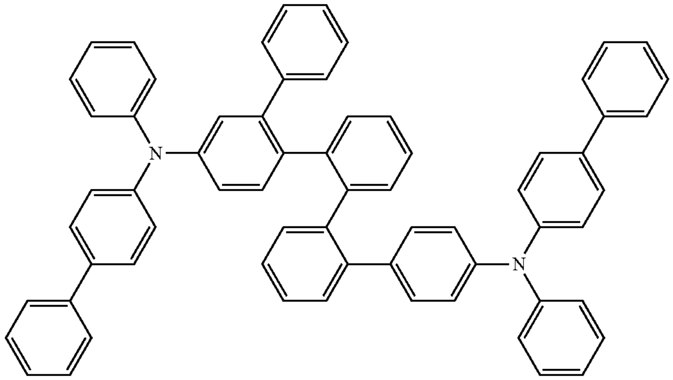
D56
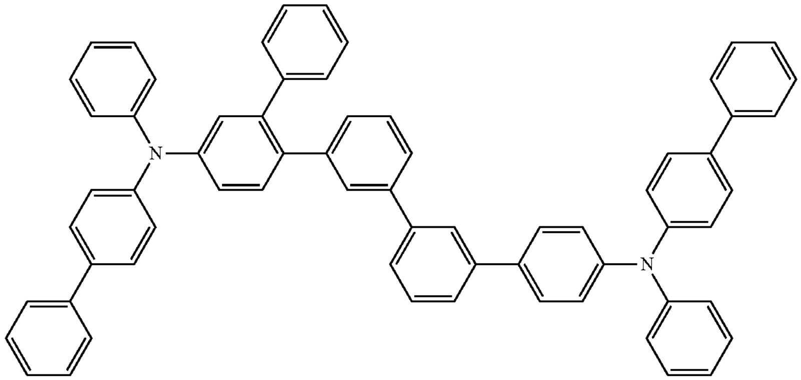

-continued
D57
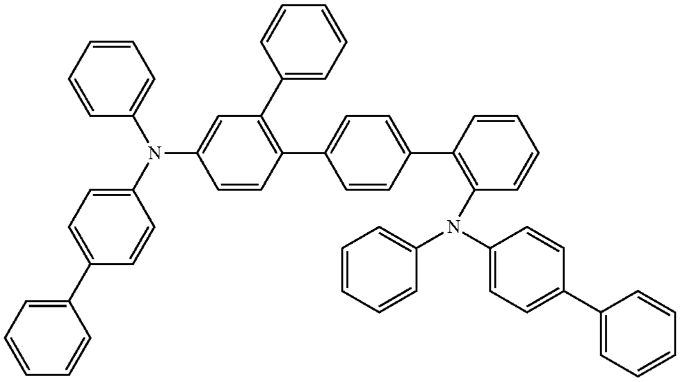
D58
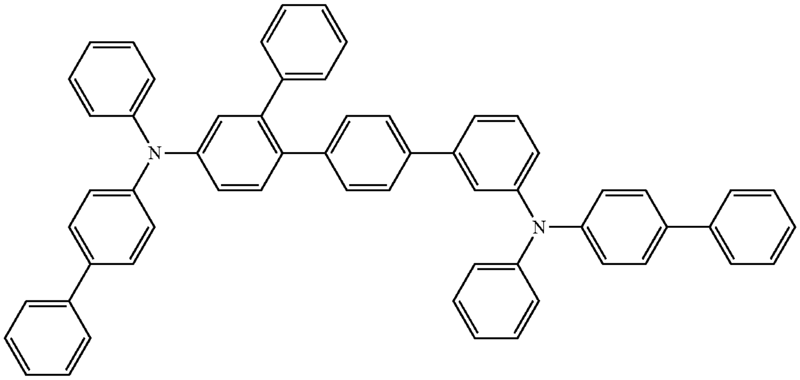
D59
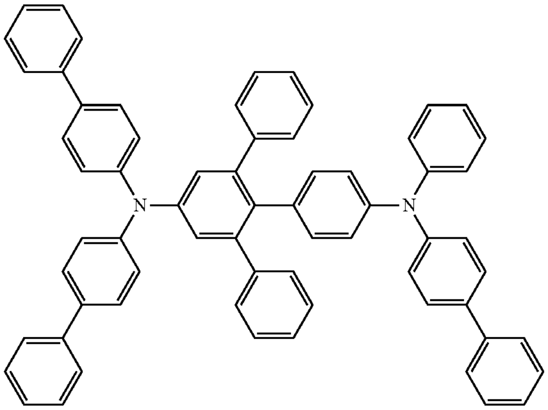
D60
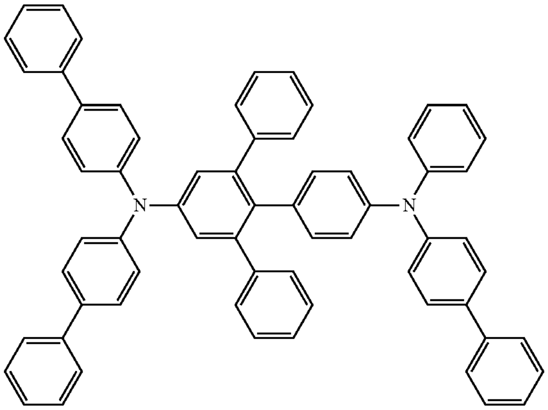

-continued
D61
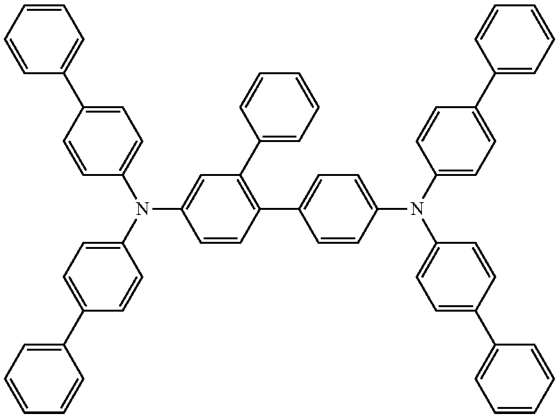
D62
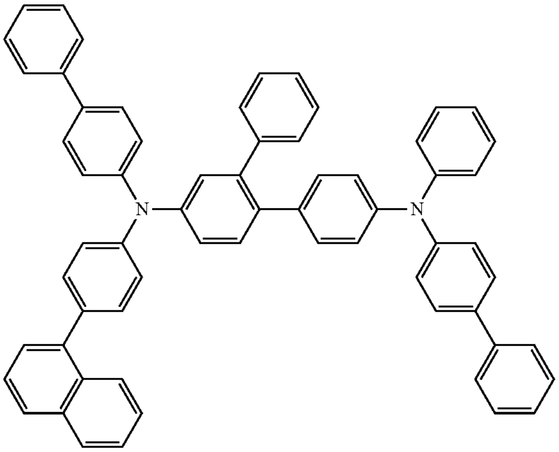
D63
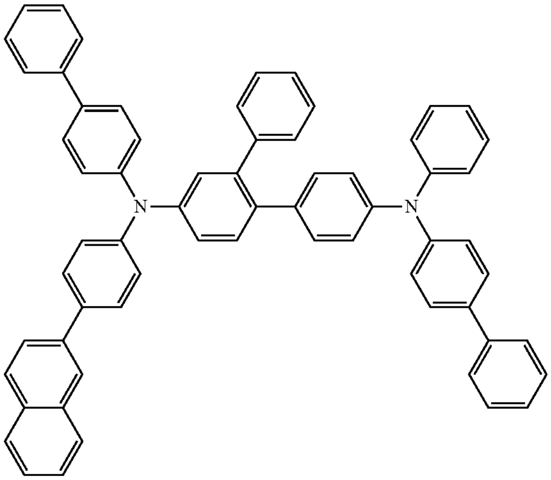
D64
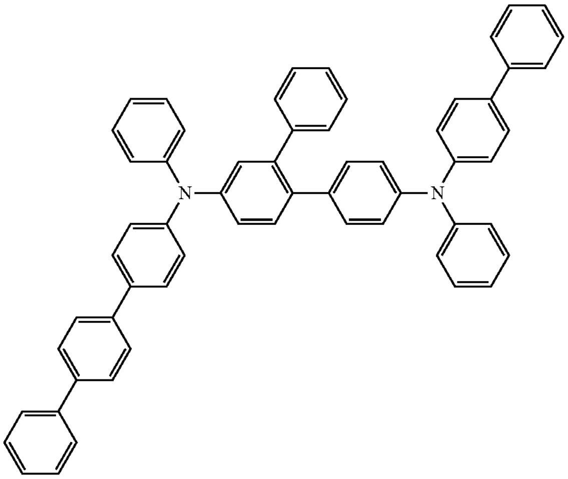
D65
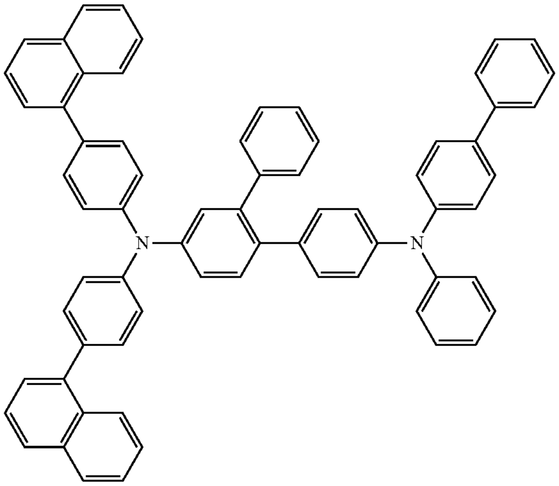
D66
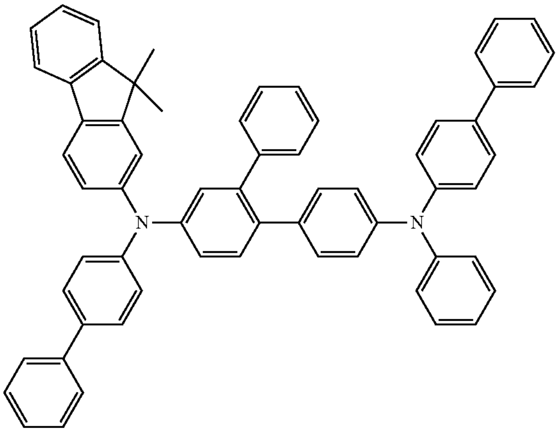

-continued
D67
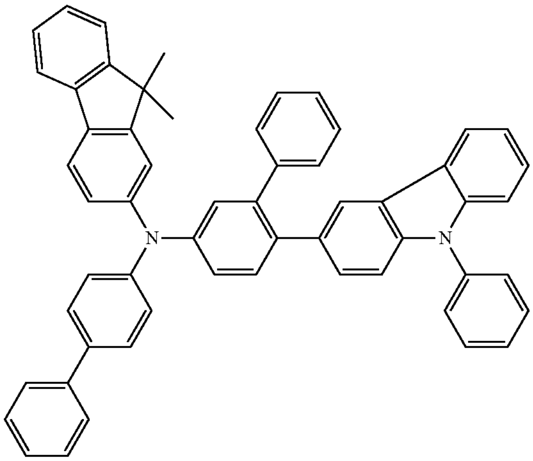
D68
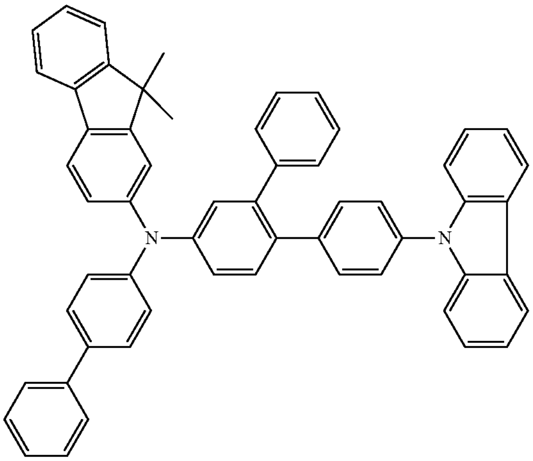
D69
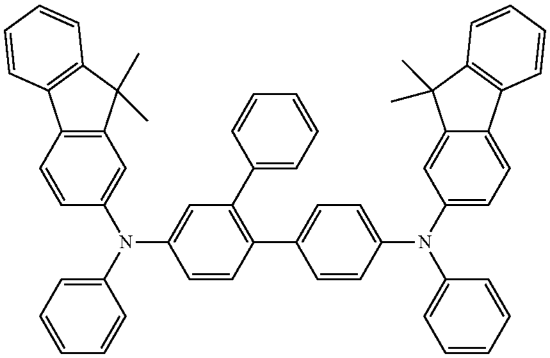
D70
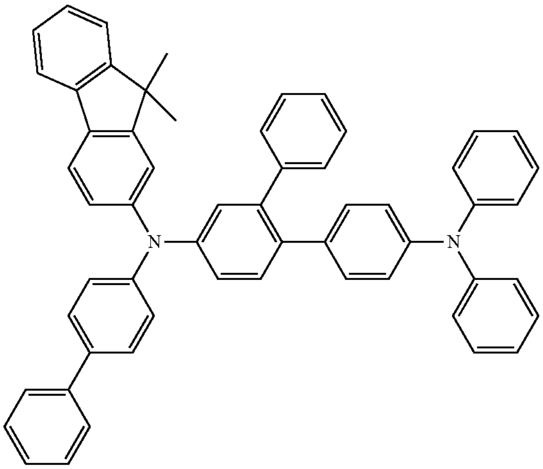
D71
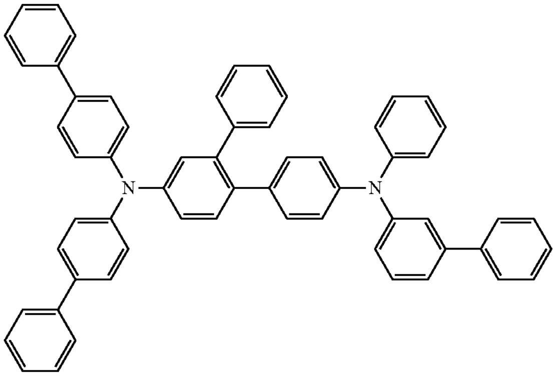
D72
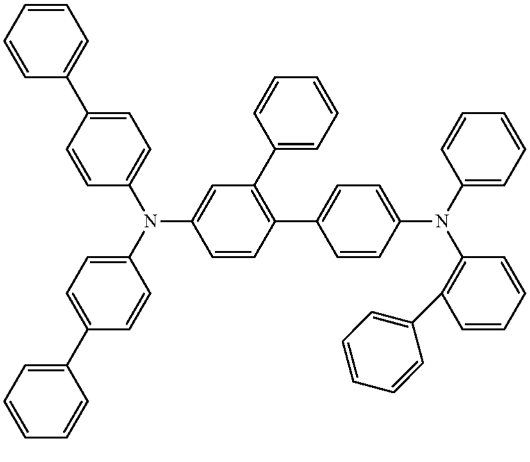

-continued
D73
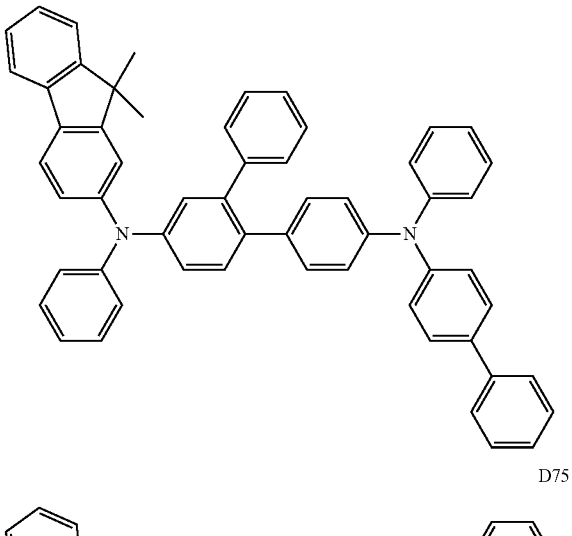
D74
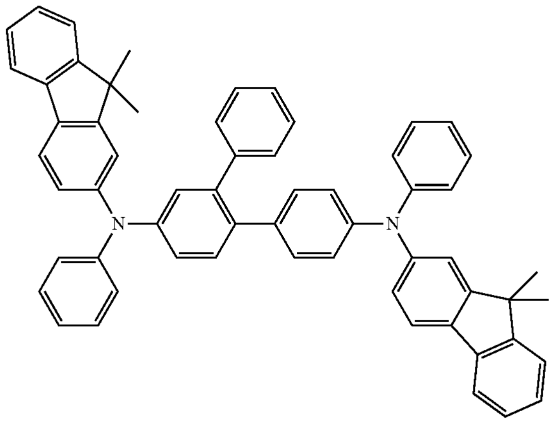
D75
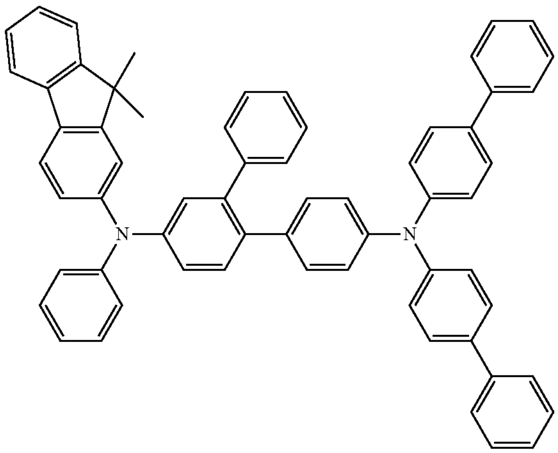
D76
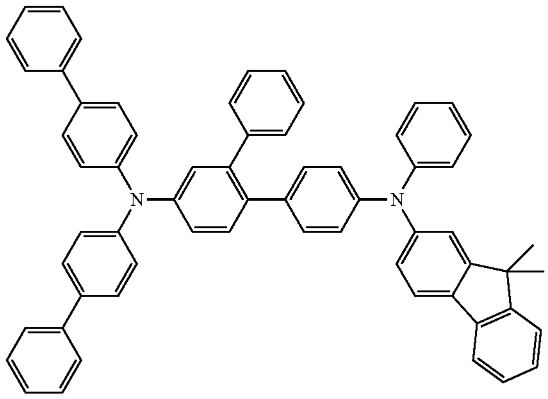
D77
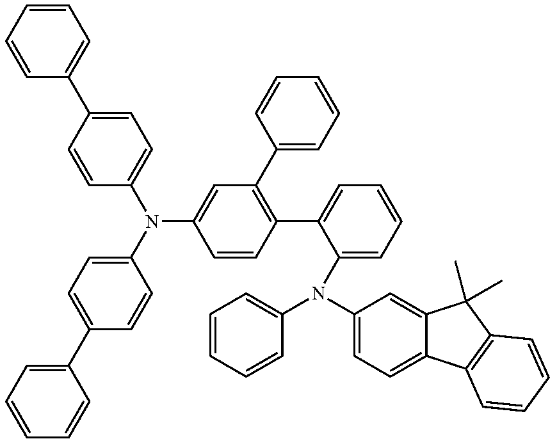
D78
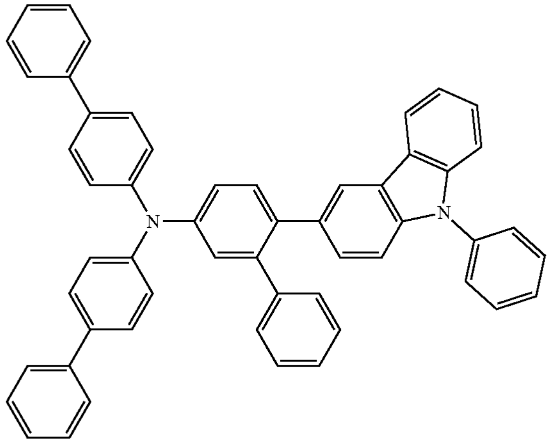

-continued
D79
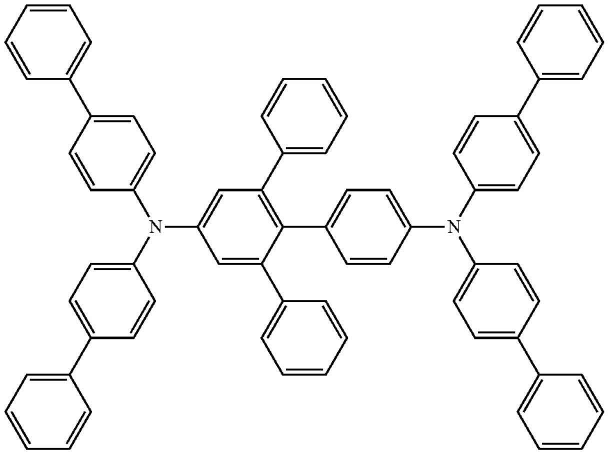
The compound of Formula D employed in the organic electroluminescent device of the present invention may be specifically selected from the compounds of Formulae D101 to D145:
D101
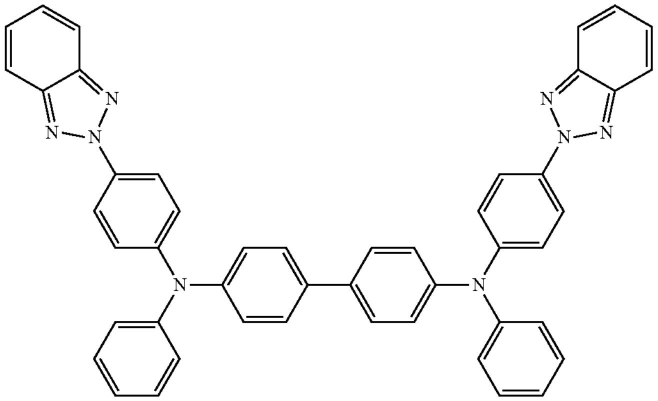
D102
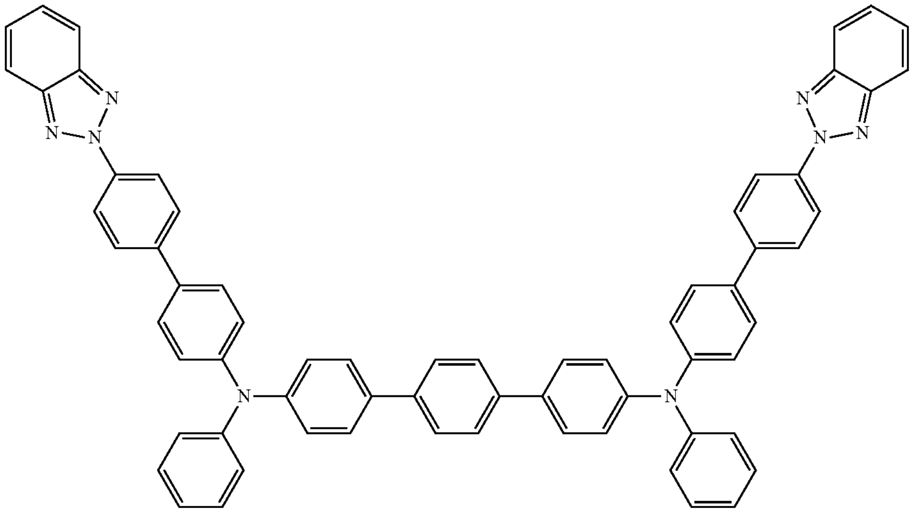

-continued
D103
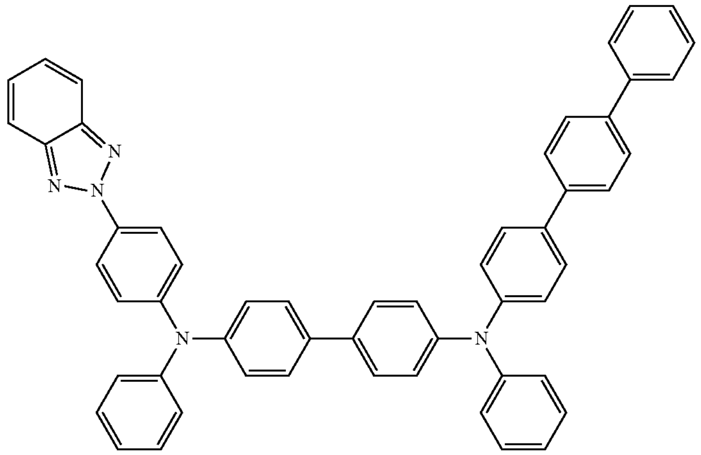
D104
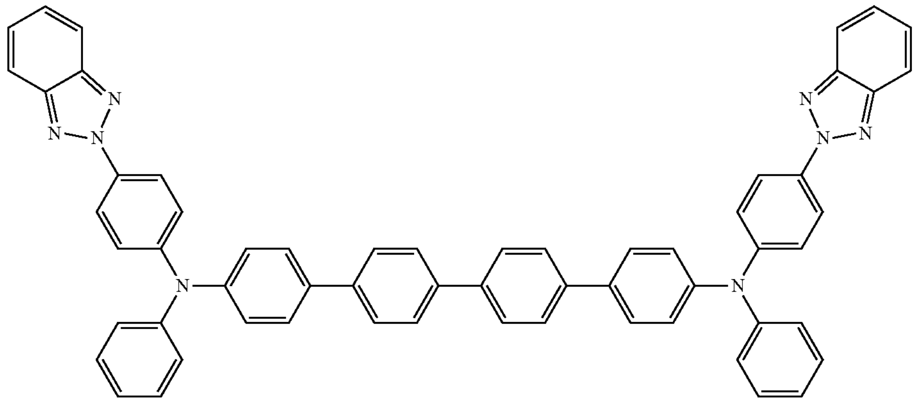
D105
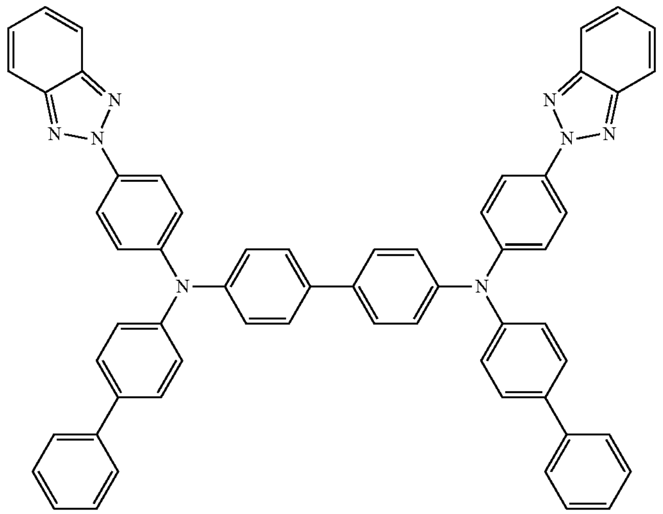

-continued
D106
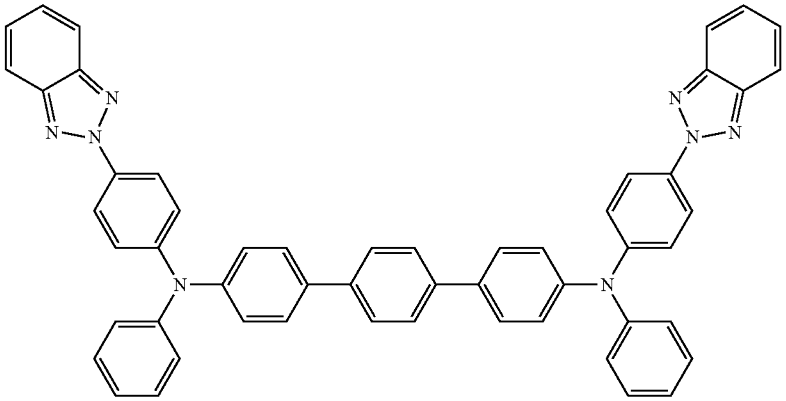
D107
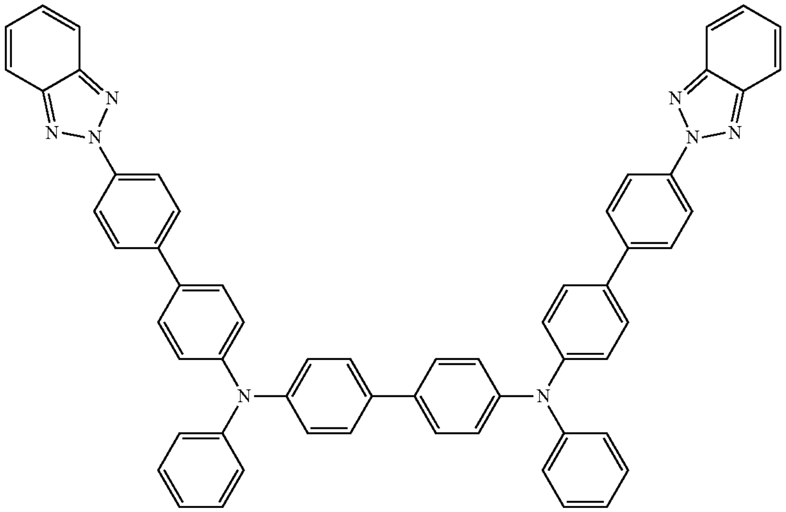
D108
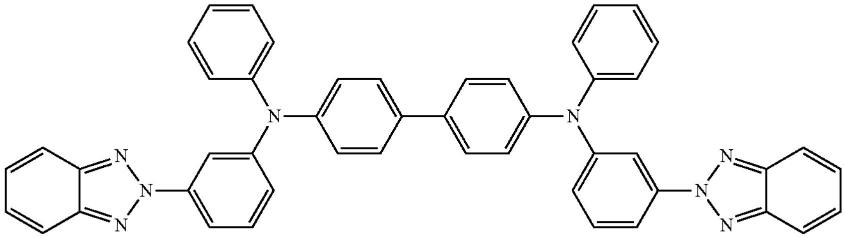
D109
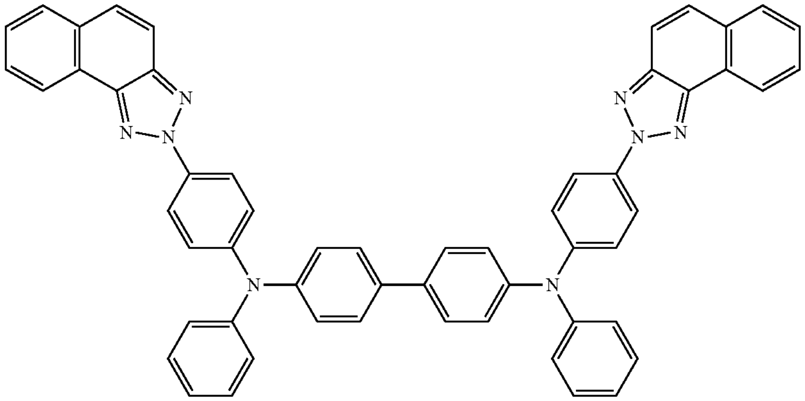

-continued
D110
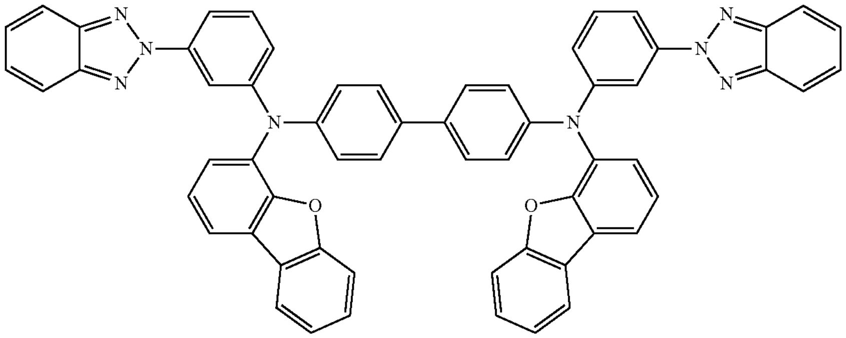
D111
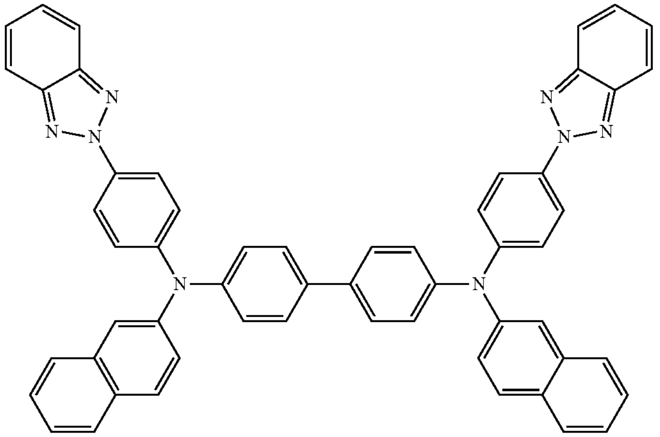
D112
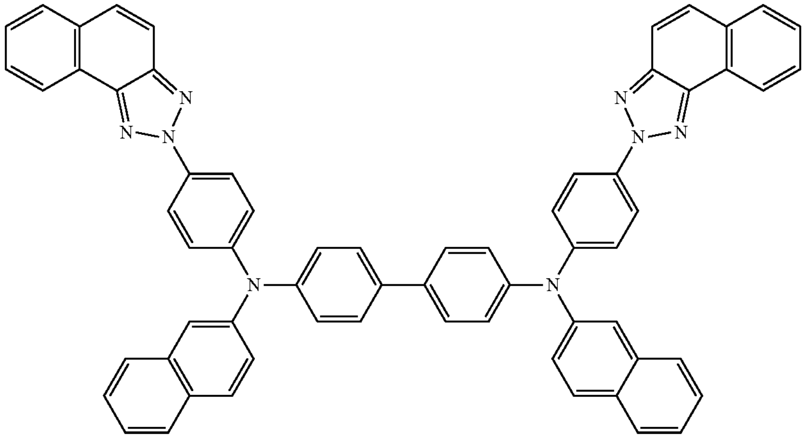

-continued
D113
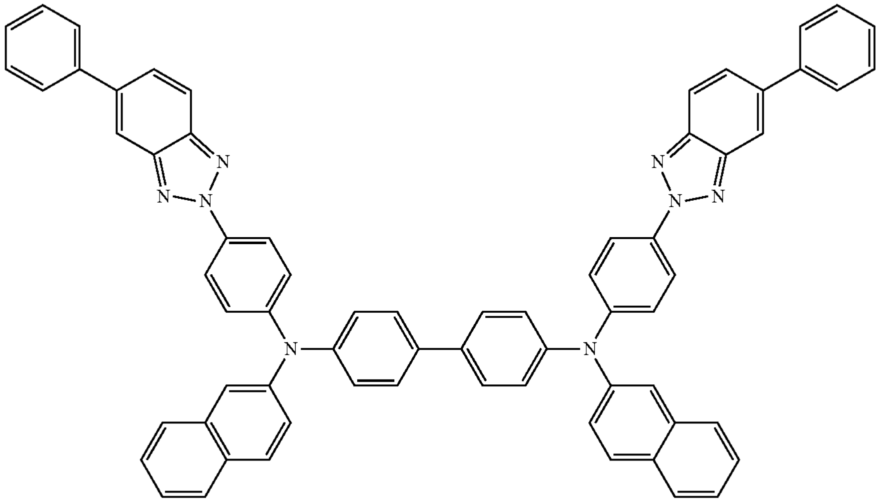
D114
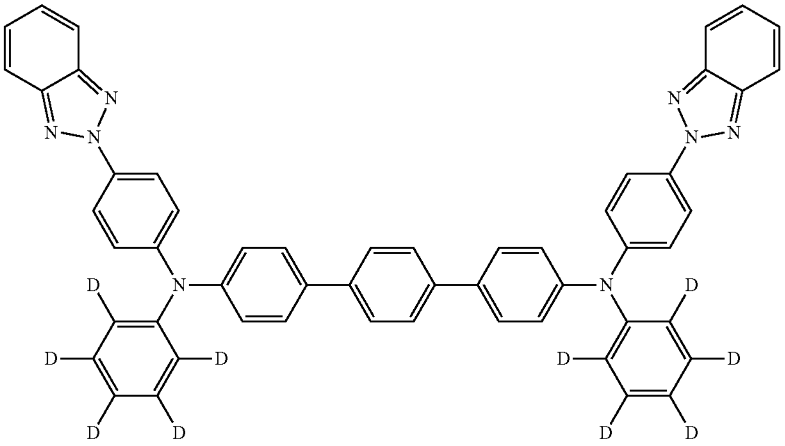
D115
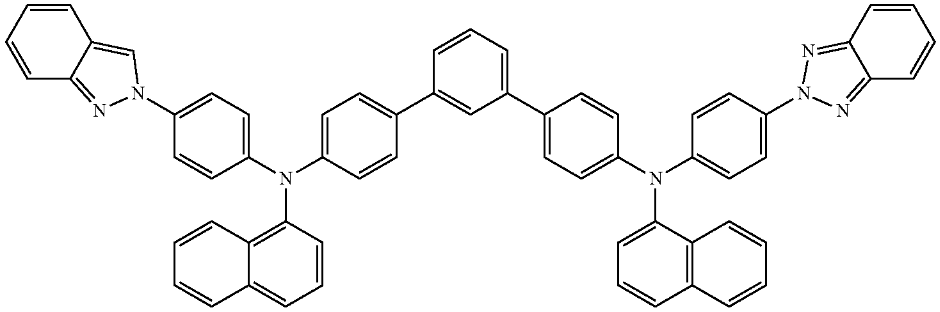
D116
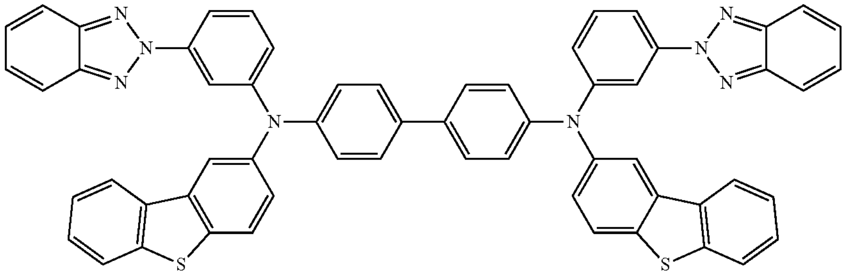

-continued
D117
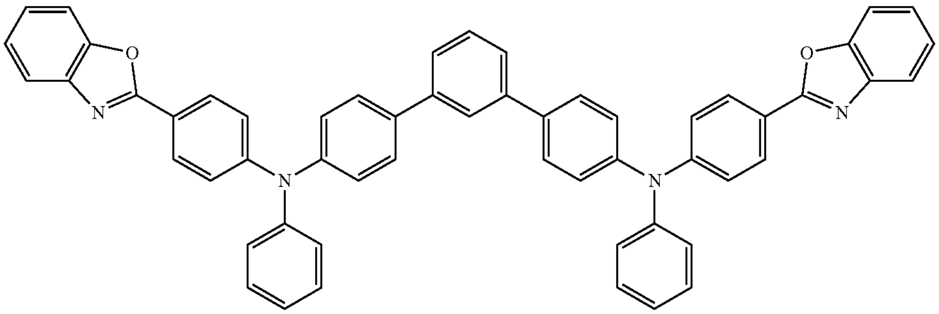
D118
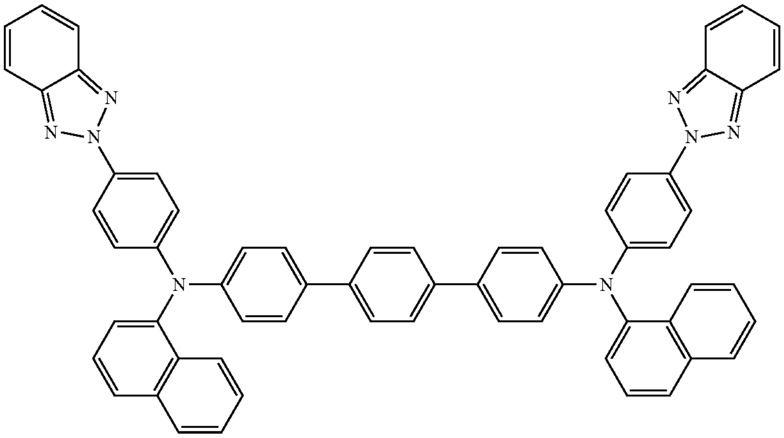
D119
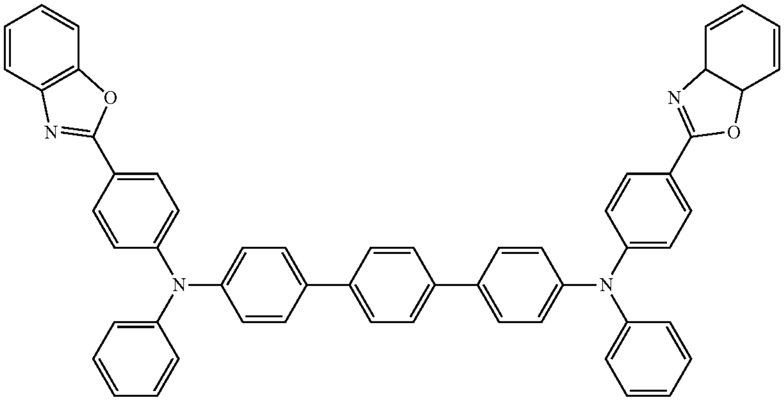
D120
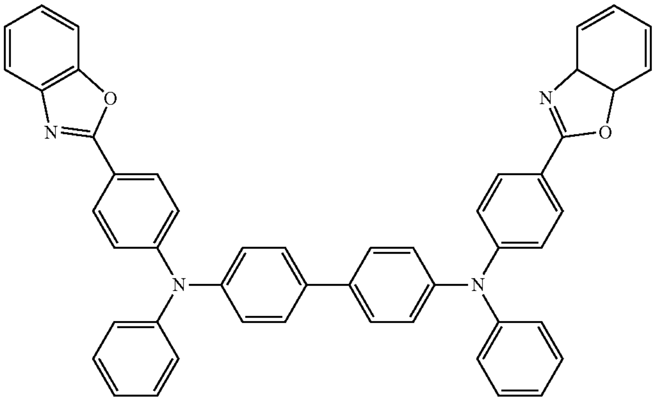

-continued
D121
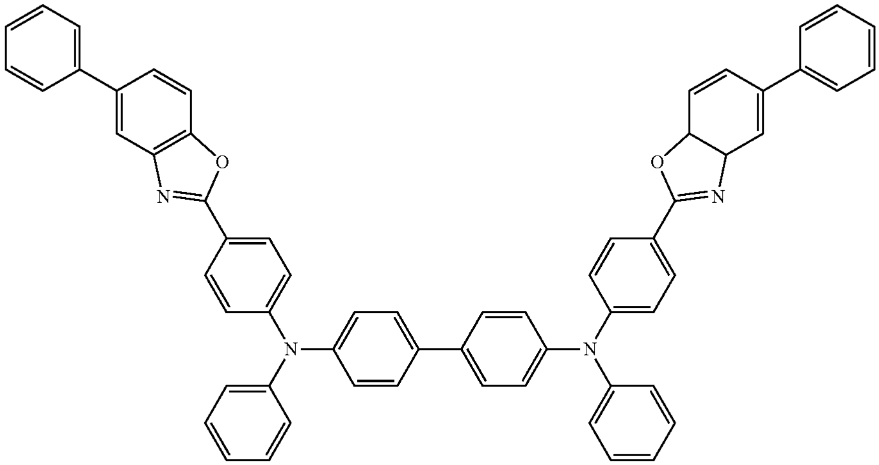
D122
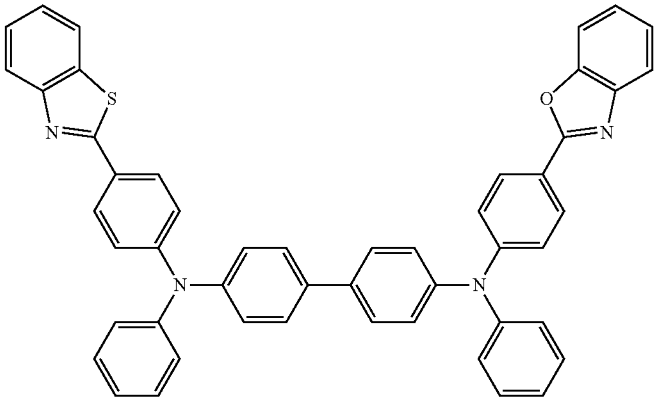
D123
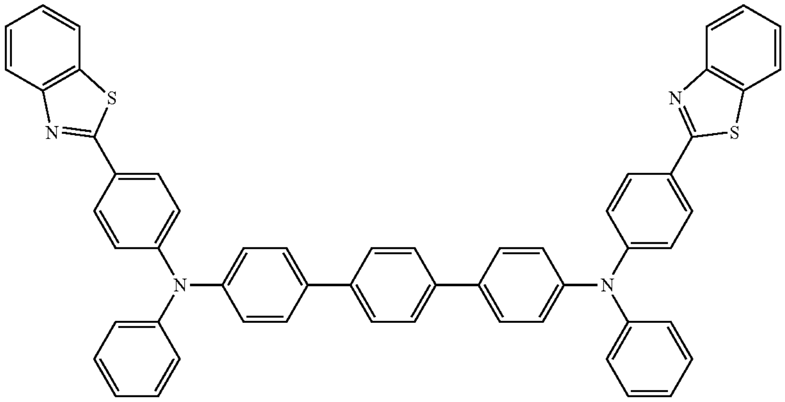

-continued
D124
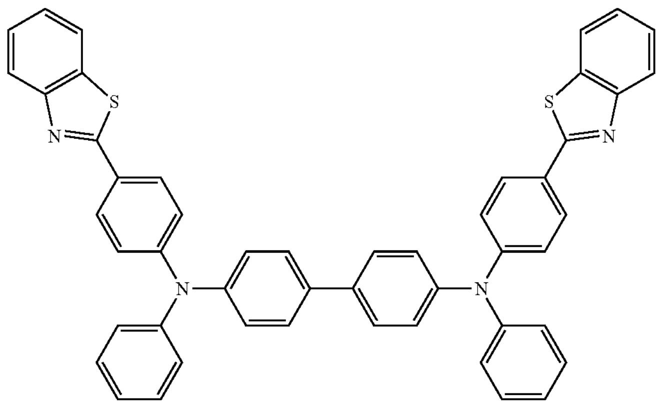
D125
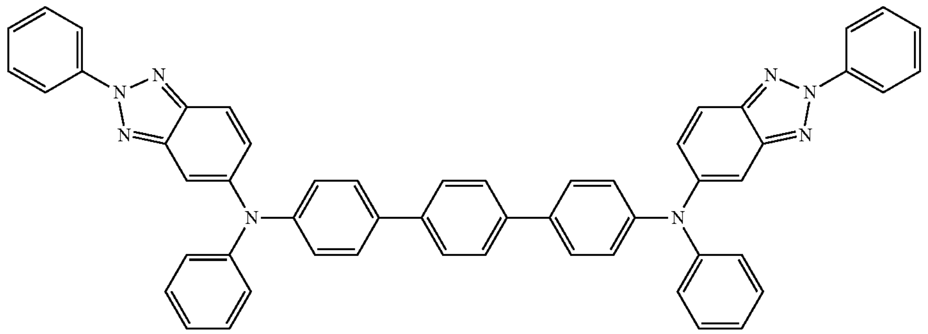
D126
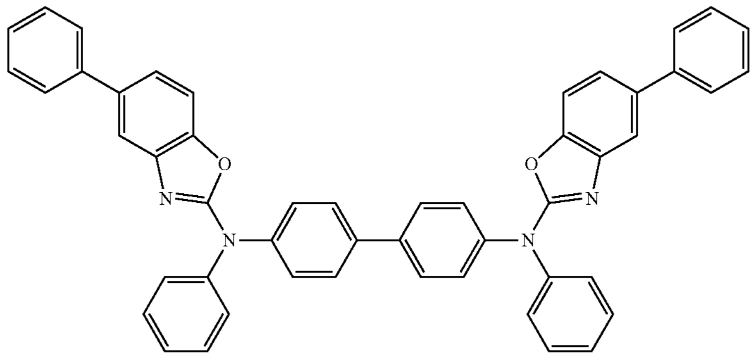
D127
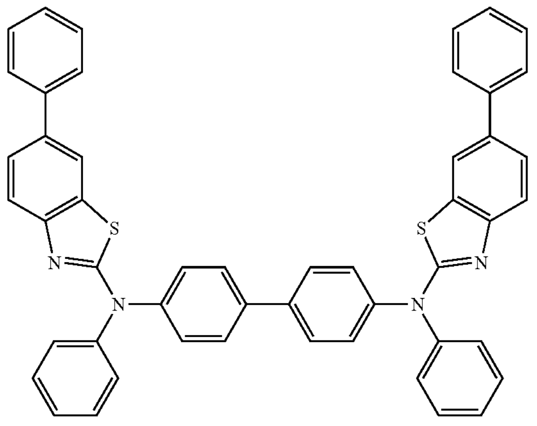

-continued
D128
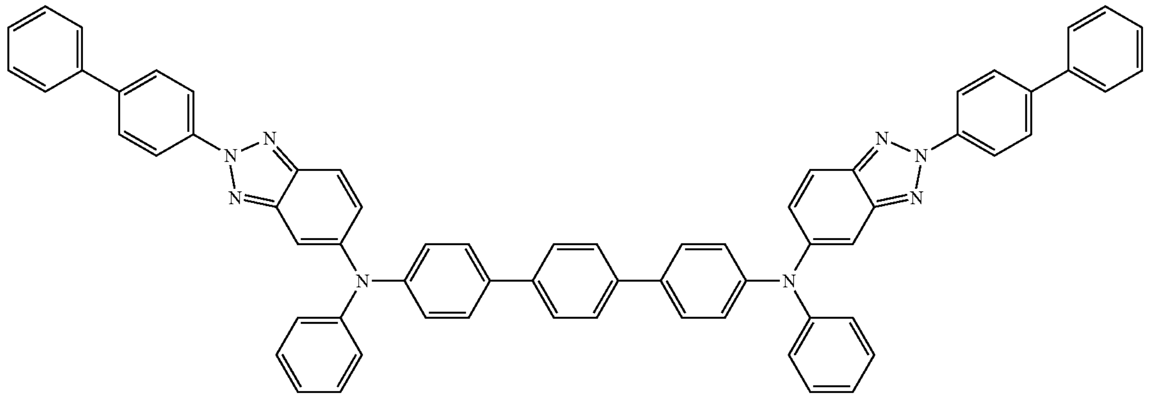
D129
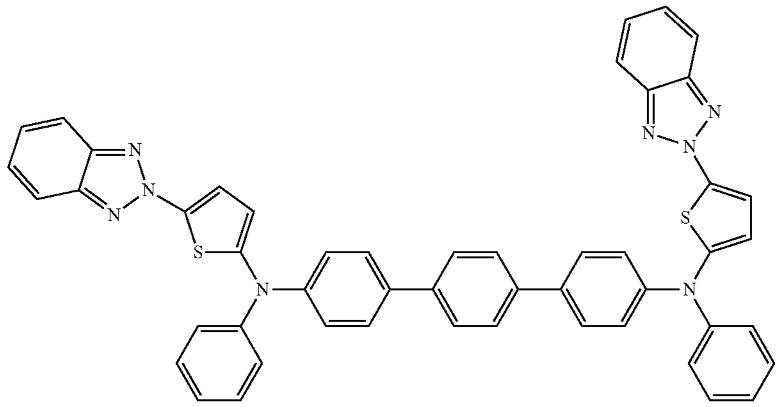
D130
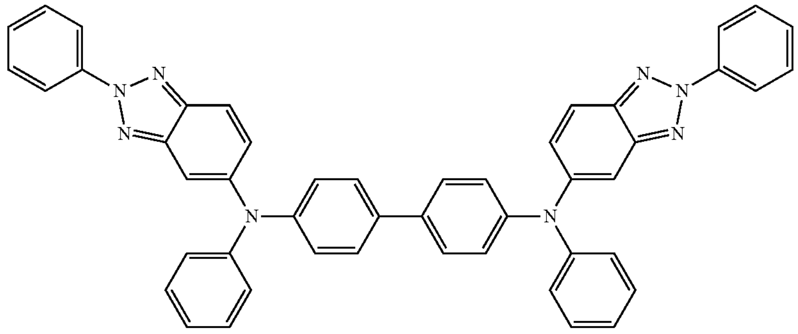
D131
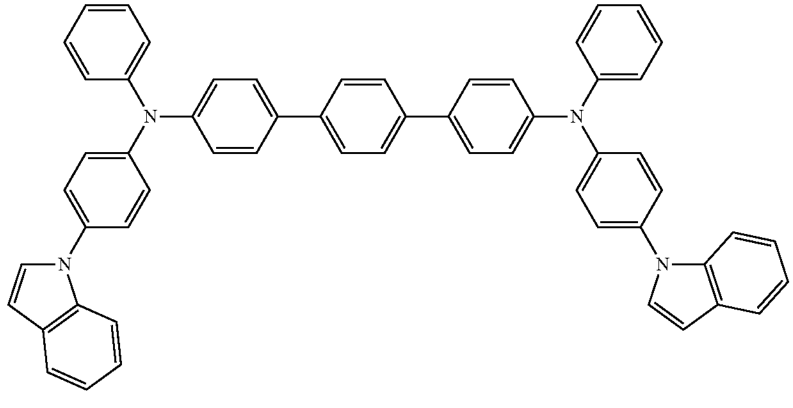

-continued
D132
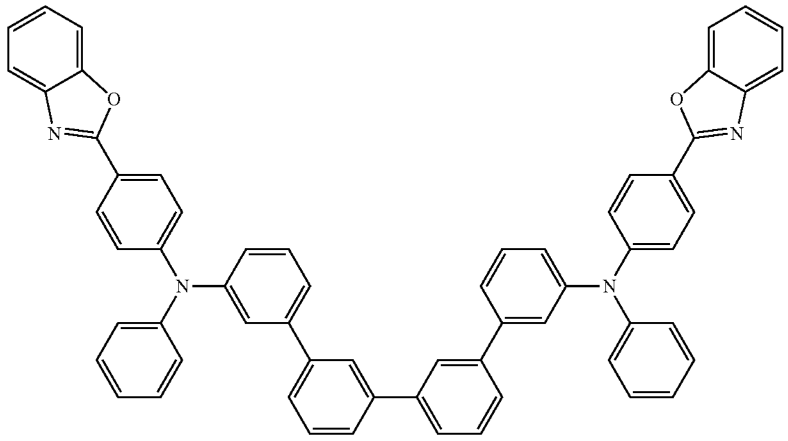
D133
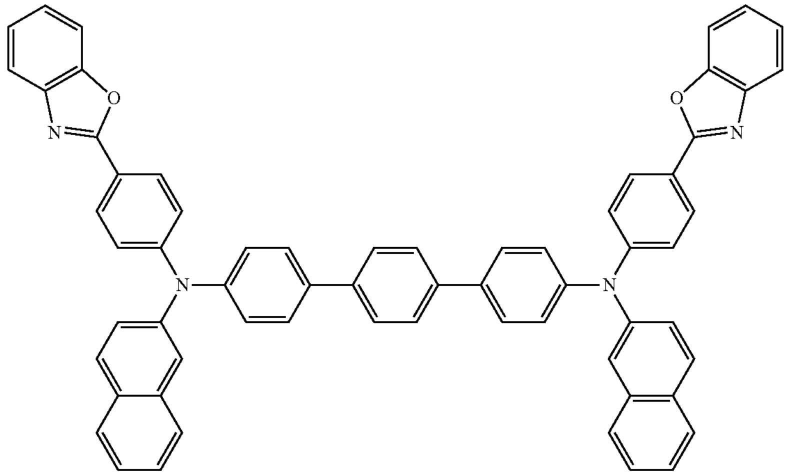
D134
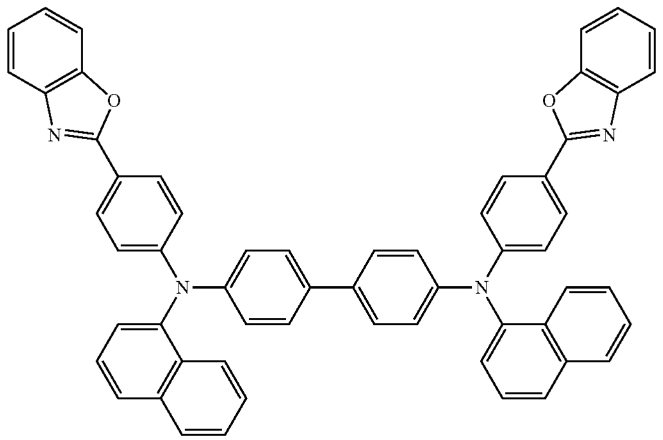

-continued
D135
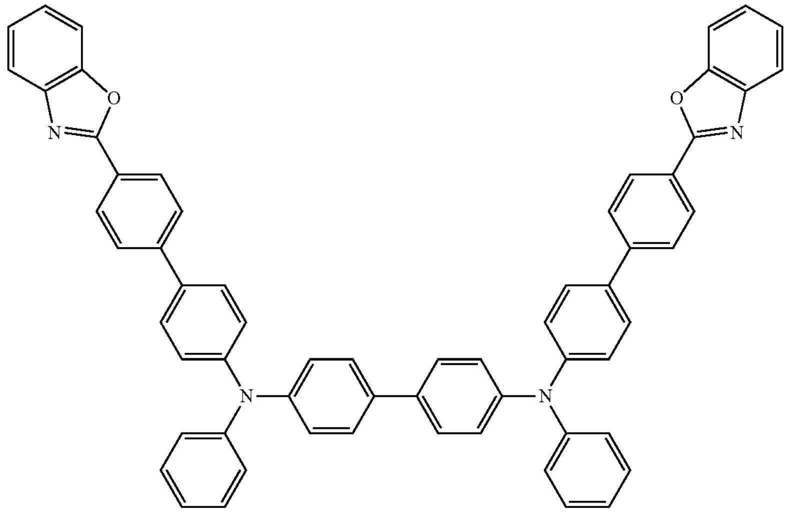
D136
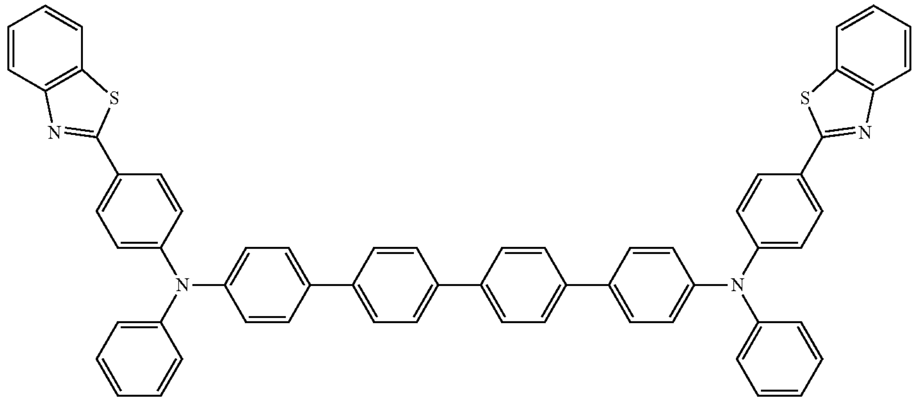
D137
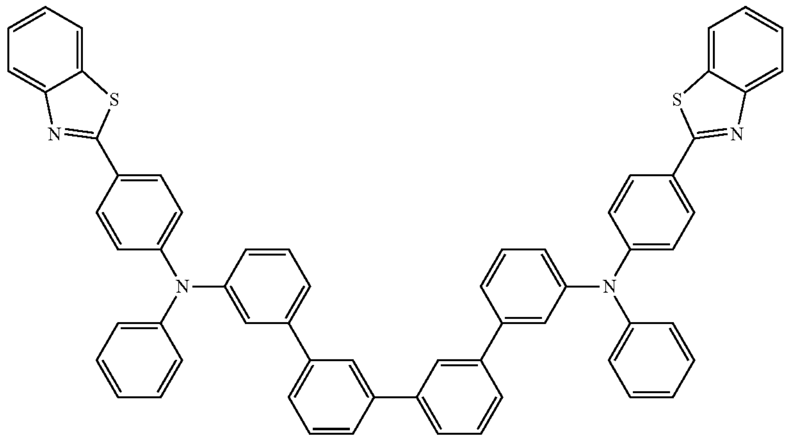

-continued
D138
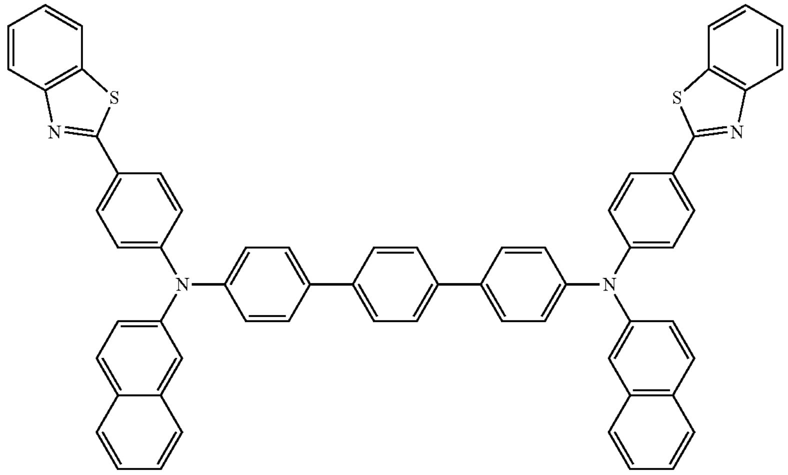
D139
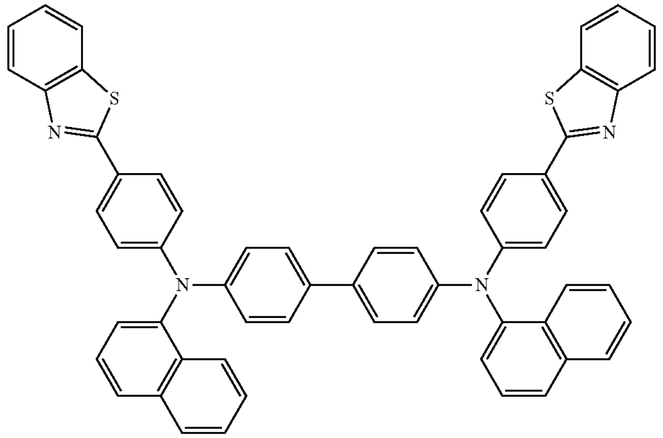
D140
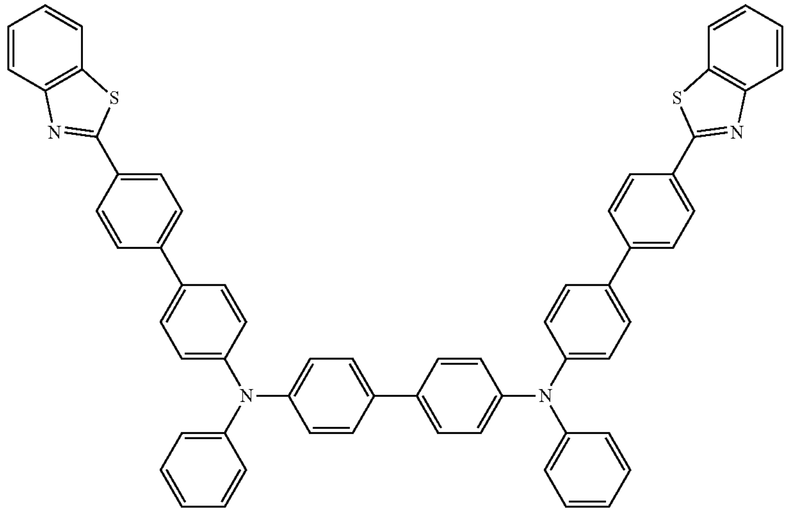

-continued
D141
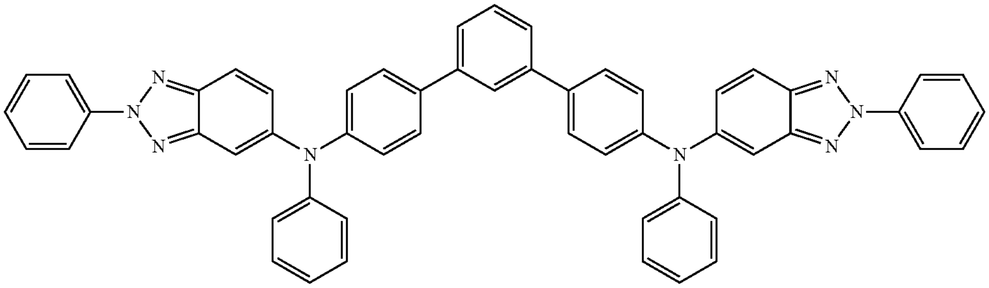
D142
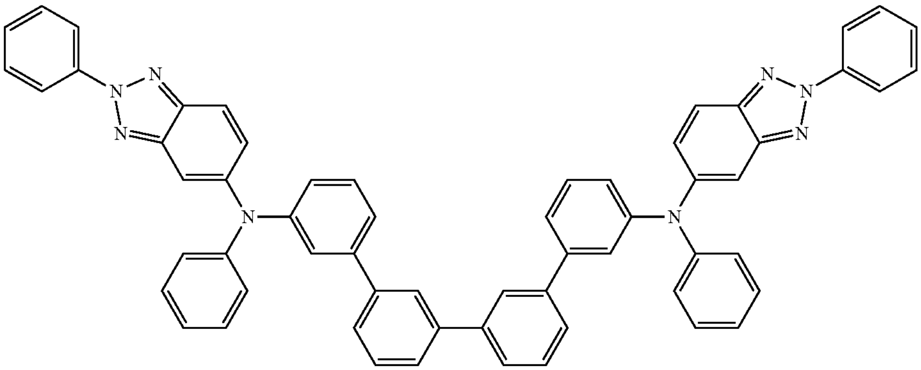
D143
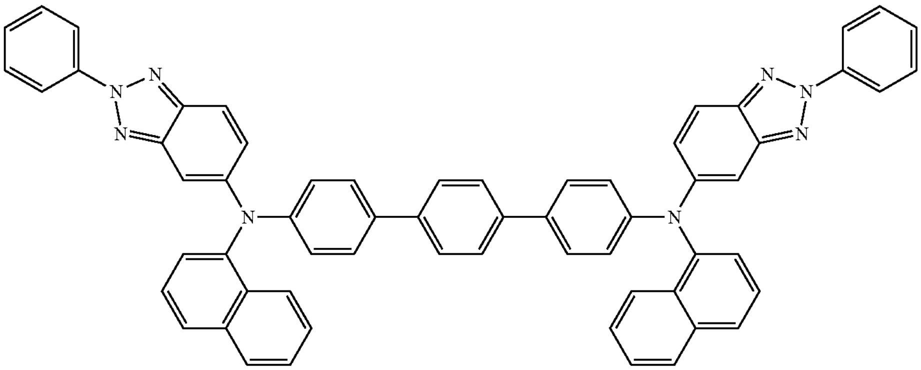
D144
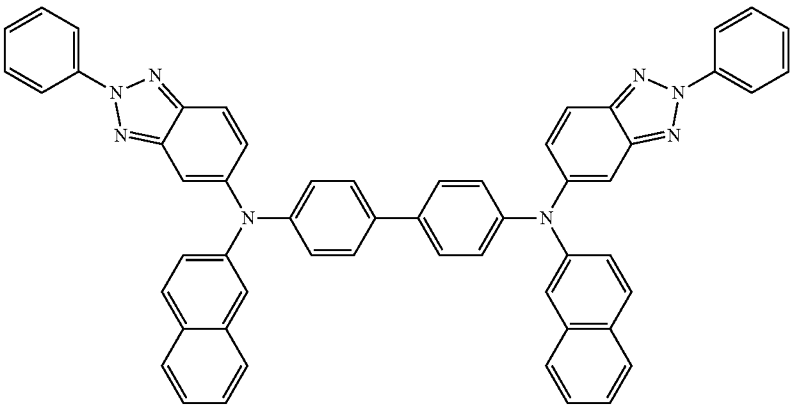

-continued

D145

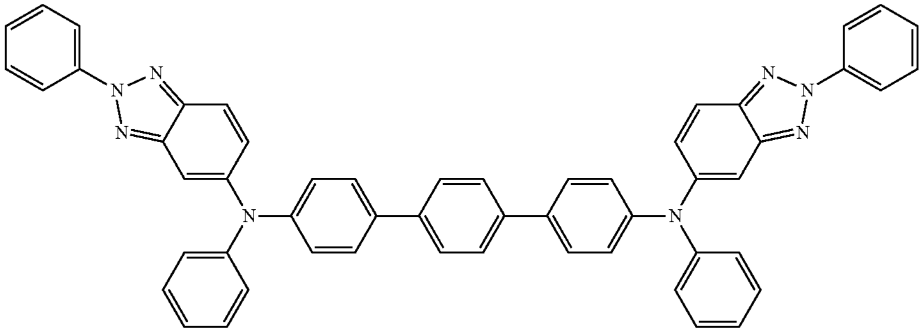

The organic electroluminescent device of the present invention may further include a hole transport layer, an electron blocking layer, and a capping layer, each of which may include a compound represented by Formula F:

(F)

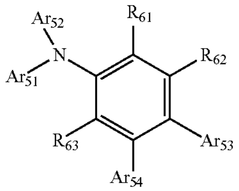

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_3$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

The compound of Formula F employed in the organic electroluminescent device of the present invention may be specifically selected from the compounds of Formulae F1 to F33:

F1

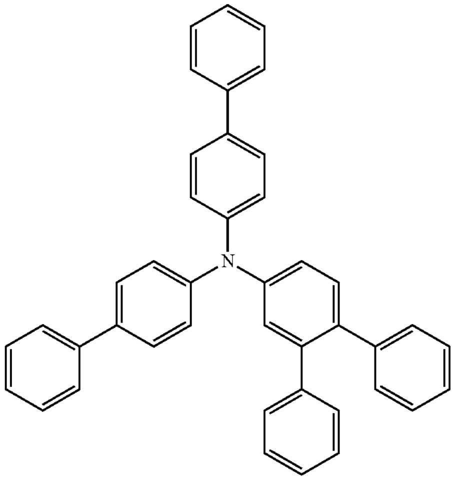

F2

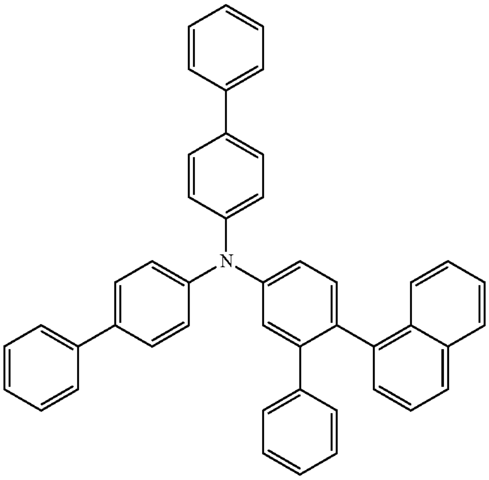

-continued
F3
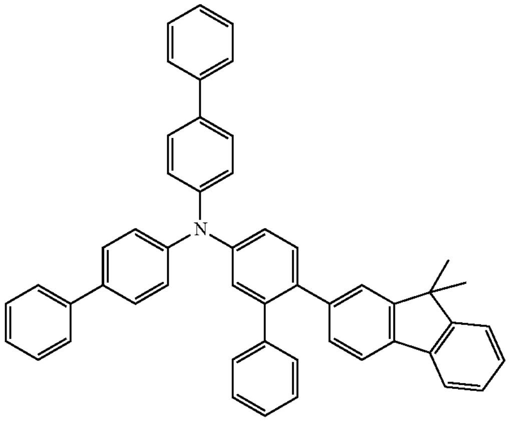
F4
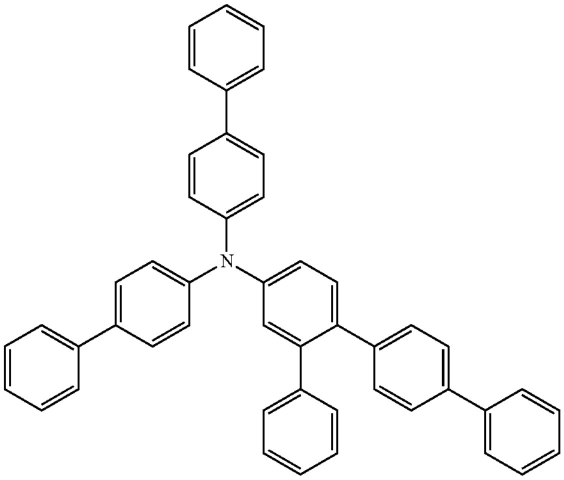
F5
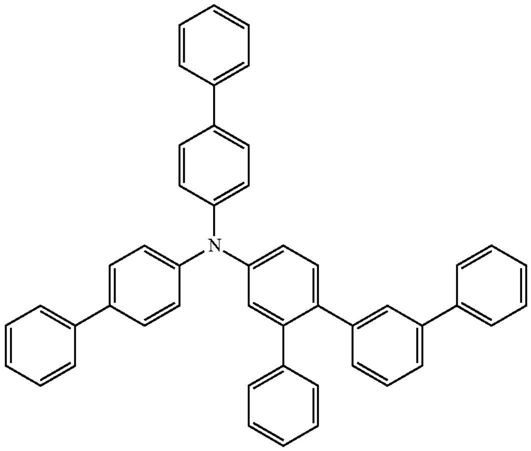
F6
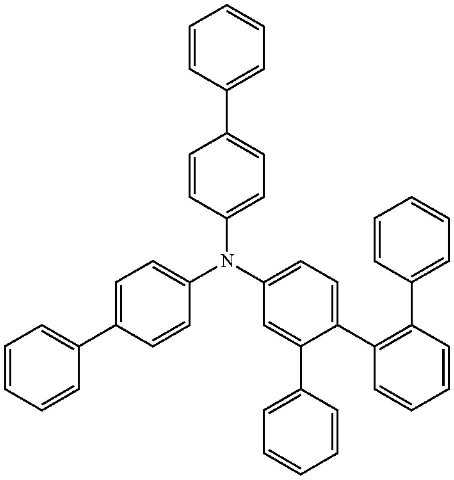
F7
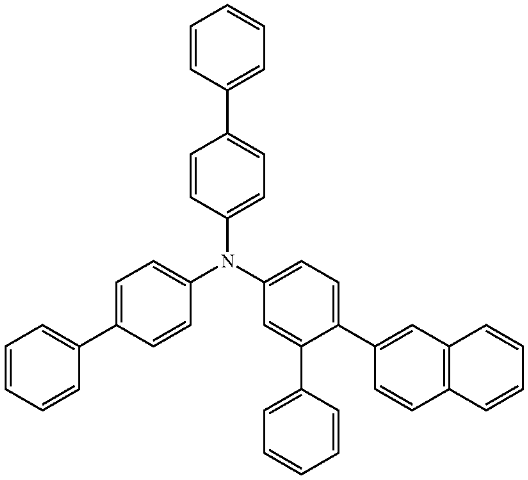
F8
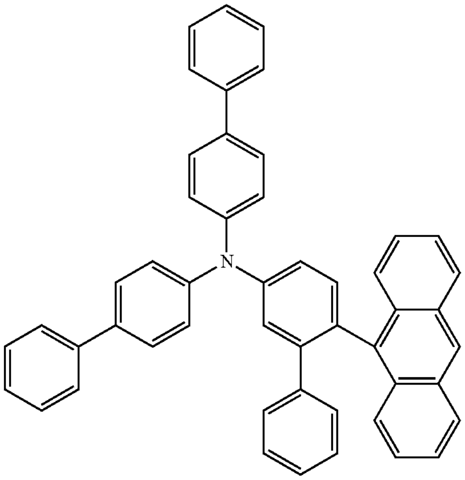

-continued
F9
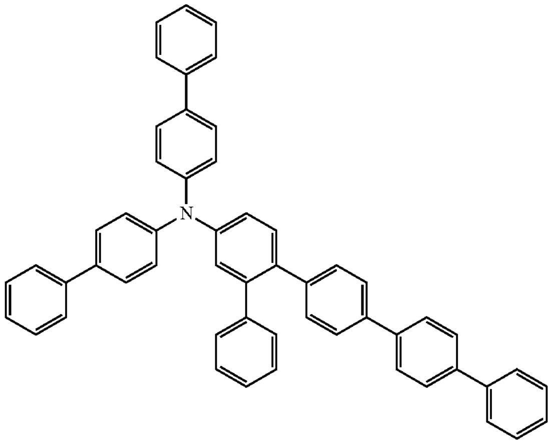
F10
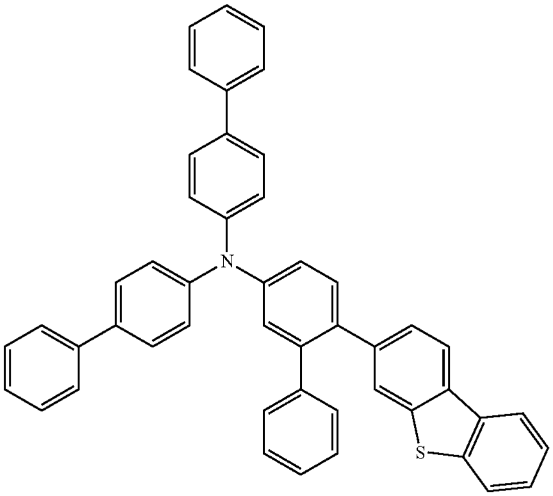
F11
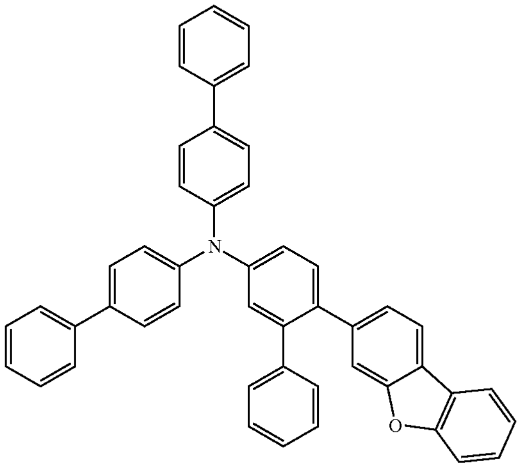
F12
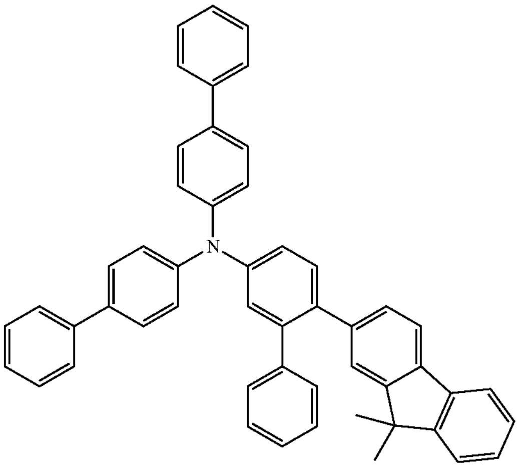
F13
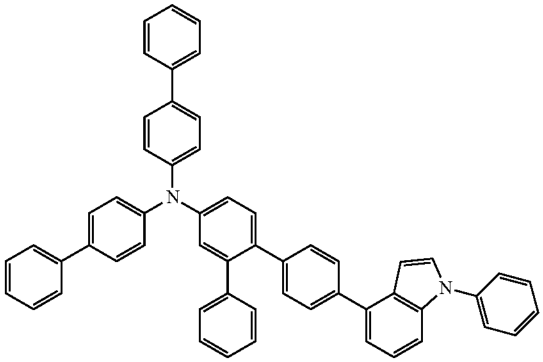
F14
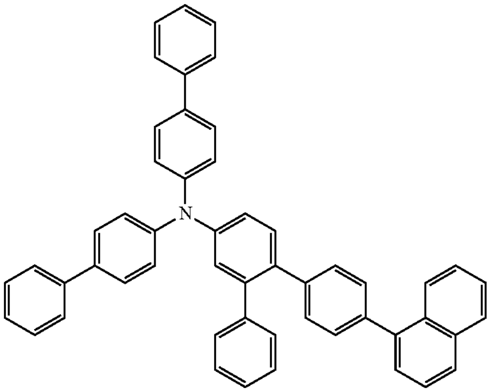

-continued
F15
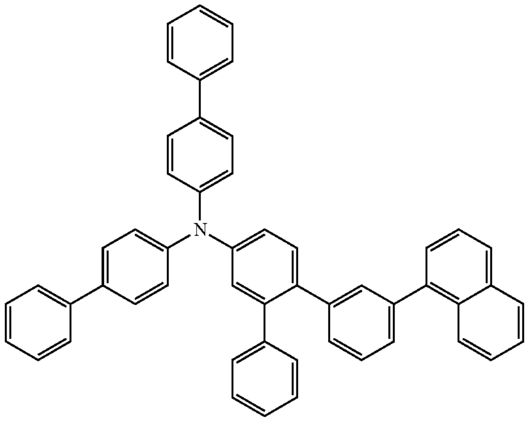
F16
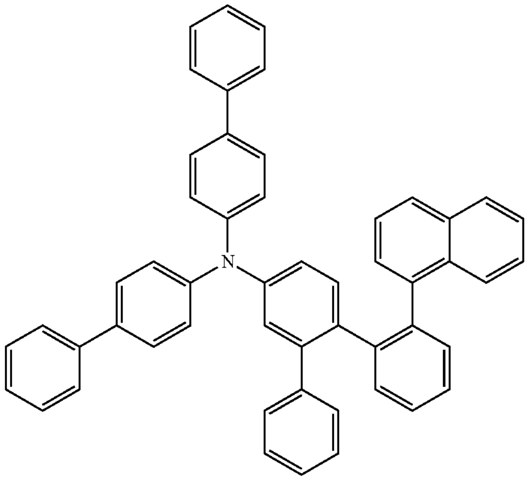
F17
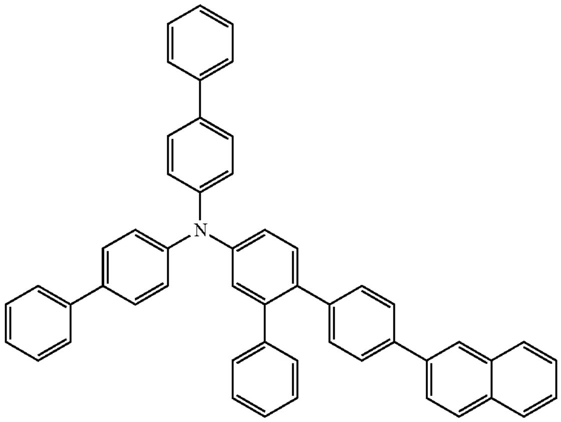
F18
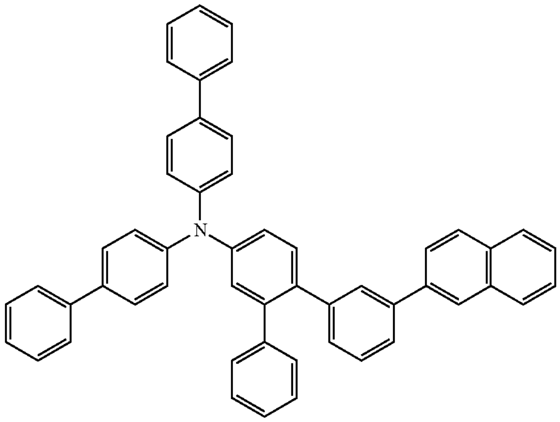
F19
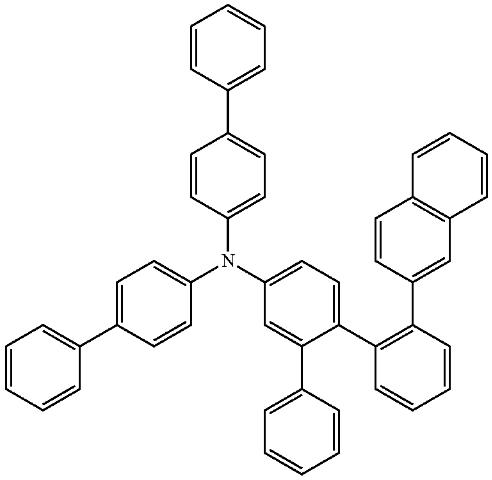
F20
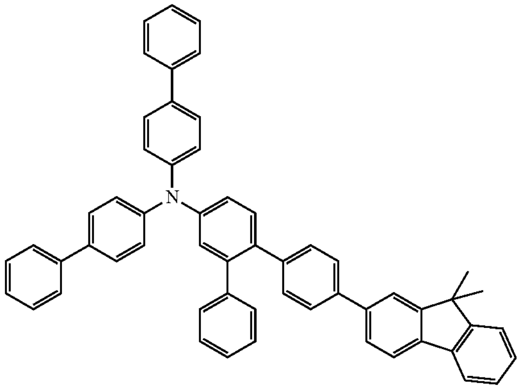

-continued
F21
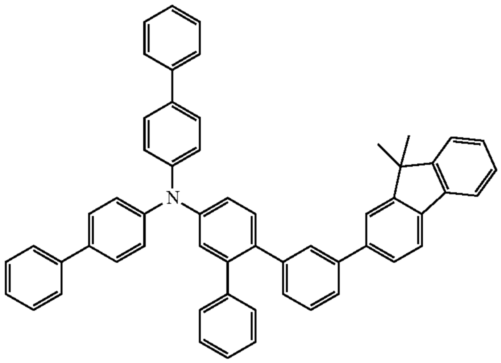
F22
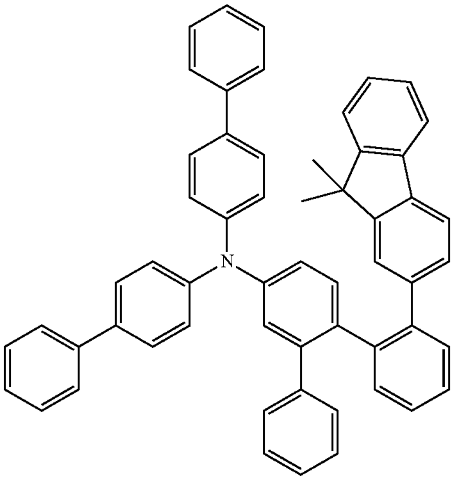
F23
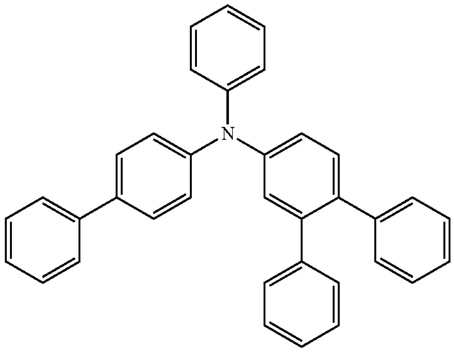
F24
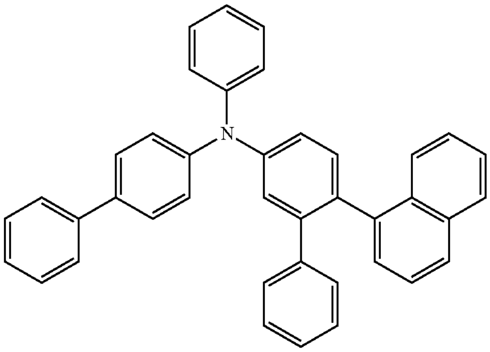
F25
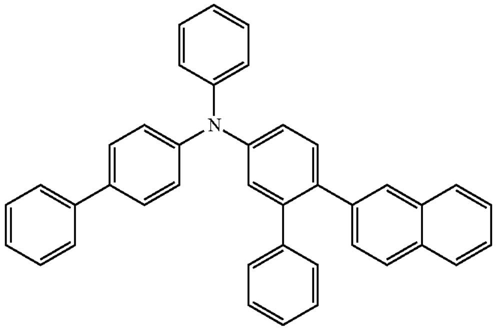
F26
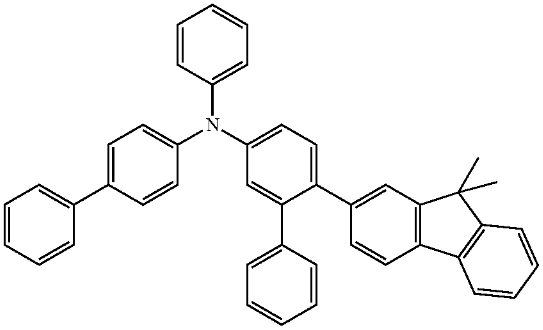

-continued
F27
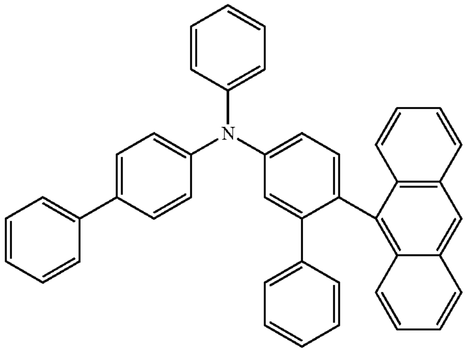
F28
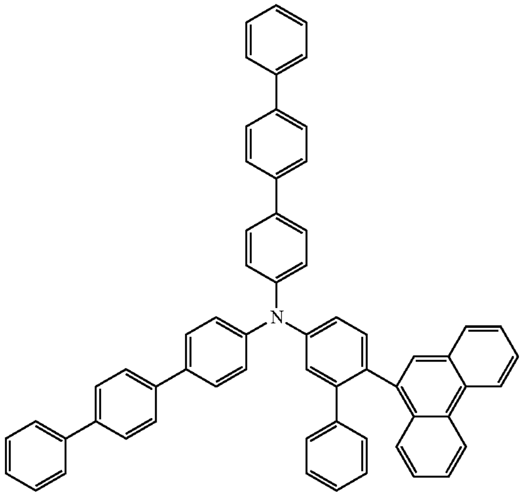
F29
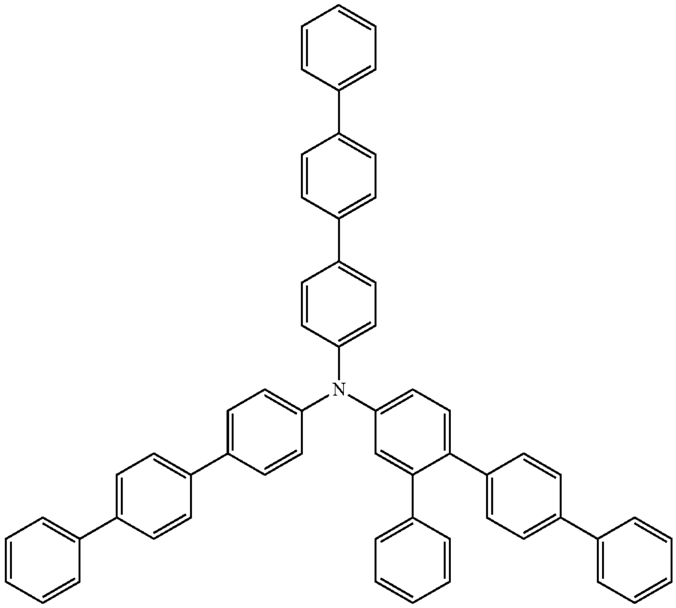

-continued
F30
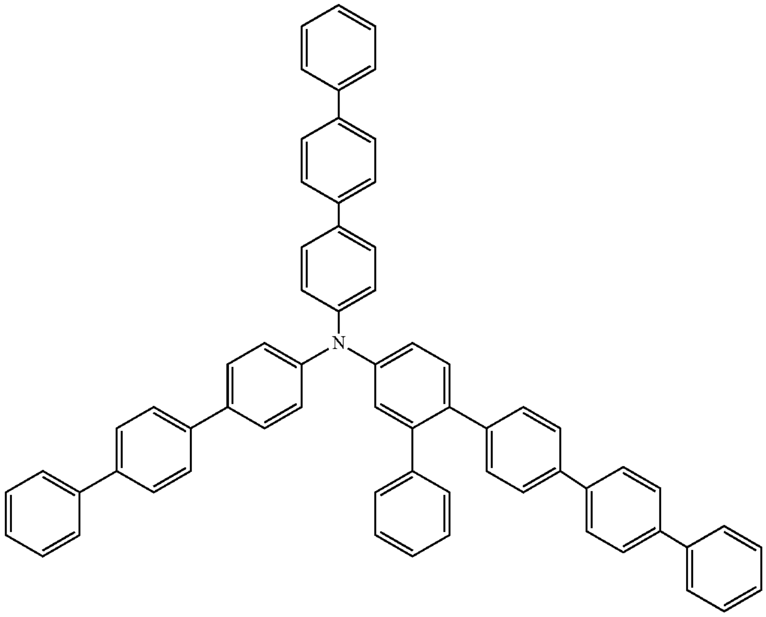
F31
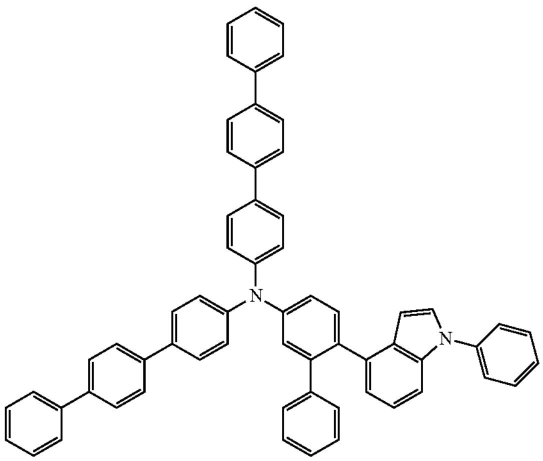
F32
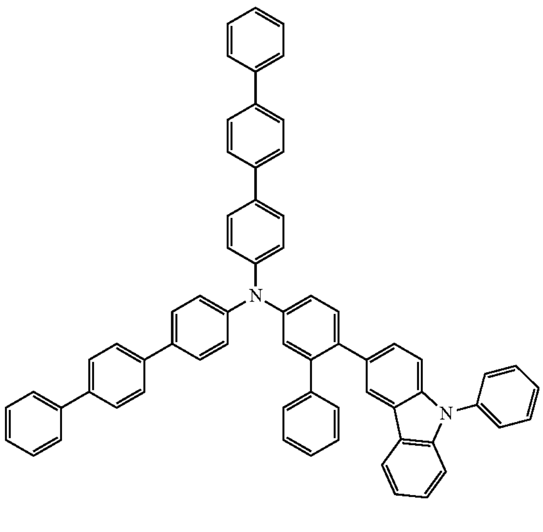

-continued

F33

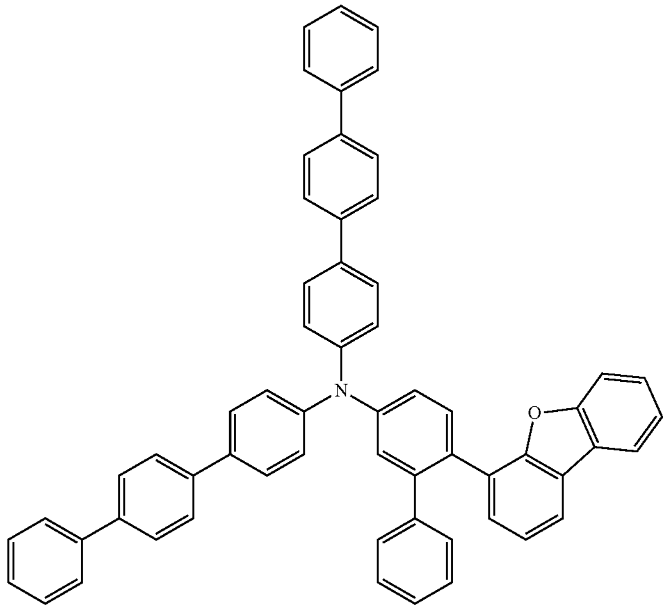

A specific structure of the organic electroluminescent device according to the present invention, a method for fabricating the device, and materials for the organic layers will be described below.

First, a material for the anode is coated on the substrate to form the anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide, such as indium tin oxide (ITO), indium zinc oxide (IZO), tin oxide ($SnO_2$) or zinc oxide (ZnO), is used as the anode material.

A material for the hole injecting layer is coated on the anode by vacuum thermal evaporation or spin coating to form the hole injecting layer. Then, a material for the hole transport layer is coated on the hole injecting layer by vacuum thermal evaporation or spin coating to form the hole transport layer.

The material for the hole injecting layer is not specially limited so long as it is usually used in the art. Specific examples of such materials include 4,4',4"-tris(2-naphthyl (phenyl)amino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis[4-(phenyl-m-tolylamino)phenyl]biphenyl-4,4'-diamine (DNTPD).

The material for the hole transport layer is not specially limited so long as it is commonly used in the art. Examples of such materials include N,N'-bis(3-methylphenyl)-N,N'-diphenyl-[1,1-biphenyl]-4,4'-diamine (TPD) and N,N'-di (naphthalen-1-yl)-N,N'-diphenylbenzidine (α-NPD).

Subsequently, a hole auxiliary layer and the light emitting layer are sequentially laminated on the hole transport layer. A hole blocking layer may be optionally formed on the organic light emitting layer by vacuum thermal evaporation or spin coating. The hole blocking layer blocks holes from entering the cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it has the ability to transport electrons and a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

The electron transport layer is deposited on the hole blocking layer by vacuum thermal evaporation or spin coating, and the electron injecting layer is formed thereon. A metal for the cathode is deposited on the electron injecting layer by vacuum thermal evaporation to form the cathode, completing the fabrication of the organic electroluminescent device.

As the metal for the formation of the cathode, there may be used, for example, lithium (Li), magnesium (Mg), aluminum (Al), aluminum-lithium (Al—Li), calcium (Ca), magnesium-indium (Mg—In) or magnesium-silver (Mg—Ag). The organic electroluminescent device may be of top emission type. In this case, a transmissive material, such as ITO or IZO, may be used to form the cathode.

The material for the electron transport layer functions to stably transport electrons injected from the cathode. The electron transport material may be any of those known in the art and examples thereof include, but are not limited to, quinoline derivatives, particularly, tris(8-quinolinolate)aluminum (Alq3), TAZ, Balq, beryllium bis(benzoquinolin-10-olate (Bebg2), ADN, and oxadiazole derivatives, such as PBD, BMD, and BND.

The light emitting layer of the organic electroluminescent device according to the present invention may further include a combination of various host and dopant materials in addition to the dopant compound of Formula A-1 or A-2 and the host compound of Formula B or C.

Each of the organic layers can be formed by a monomolecular deposition or solution process. According to the monomolecular deposition process, the material for each layer is evaporated under heat and vacuum or reduced pressure to form the layer in the form of a thin film. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

The present invention will be explained in more detail with reference to the following examples. However, it will be obvious to those skilled in the art that these examples are in no way intended to limit the scope of the invention.

Synthesis of Compounds of Formulae A-1 and A-2

Synthesis Example 1. Synthesis of Compound A1

Synthesis Example 1-1. Synthesis of Intermediate 1-a

Intermediate 1-a was synthesized by Reaction 1:

[Reaction 1]

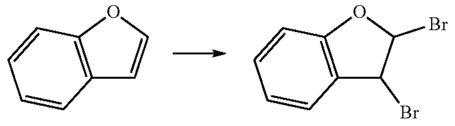

<Intermediate 1-a>

Benzofuran (50 g, 423 mmol) and dichloromethane (500 mL) were stirred in a 1 L reactor. The mixture was cooled to −10° C. and a dilute solution of bromine (67.7 g, 423 mmol) in dichloromethane (100 mL) was added dropwise thereto. The resulting mixture was stirred at 0° C. for 2 h. After completion of the reaction, the reaction mixture was added with an aqueous sodium thiosulfate solution, stirred, and extracted with ethyl acetate and $H_2O$. The organic layer was concentrated under reduced pressure and recrystallized from ethanol to afford Intermediate 1-a (100 g, yield 93%).

Synthesis Example 1-2. Synthesis of Intermediate 1-b

Intermediate 1-b was synthesized by Reaction 2:

[Reaction 2]

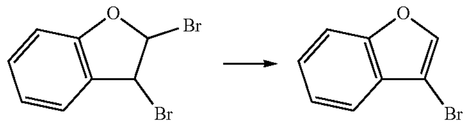

<Intermediate 1-a> <Intermediate 1-b>

Potassium hydroxide (48.6 g, 866 mmol) and ethanol (400 mL) were dissolved in a 1 L reactor and a solution of Intermediate 1-a (120 g, 433 mmol) in ethanol was added dropwise thereto at 0° C. After the dropwise addition was finished, the mixture was refluxed with stirring for 2 h. After completion of the reaction, the reaction mixture was concentrated under reduced pressure to remove the ethanol and extracted with ethyl acetate and water. The organic layer was concentrated and purified by column chromatography to afford Intermediate 1-b (42 g, yield 50%).

Synthesis Example 1-3. Synthesis of Intermediate 1-c

Intermediate 1-c was synthesized by Reaction 3:

[Reaction 3]

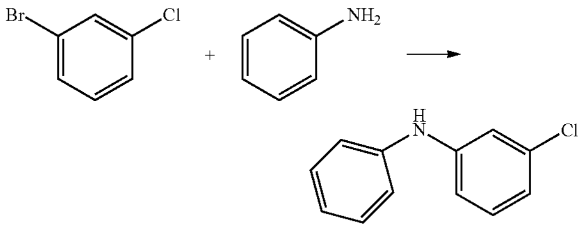

<Intermediate 1-c>

1-Bromo-3-iodobenzene (4.5 g, 16 mmol), aniline (5.8 g, 16 mmol), palladium acetate (0.1 g, 1 mmol), sodium tert-butoxide (3 g, 32 mmol), bis(diphenylphosphino)-1,1'-binaphthyl (0.2 g, 1 mmol), and toluene (45 mL) were placed in a 100 mL reactor. The mixture was refluxed with stirring for 24 h. After completion of the reaction, the reaction mixture was filtered. The filtrate was concentrated and purified by column chromatography to afford Intermediate 1-c (5.2 g, yield 82%).

Synthesis Example 1-4. Synthesis of Intermediate 1-d

Intermediate 1-d was synthesized by Reaction 4:

[Reaction 4]

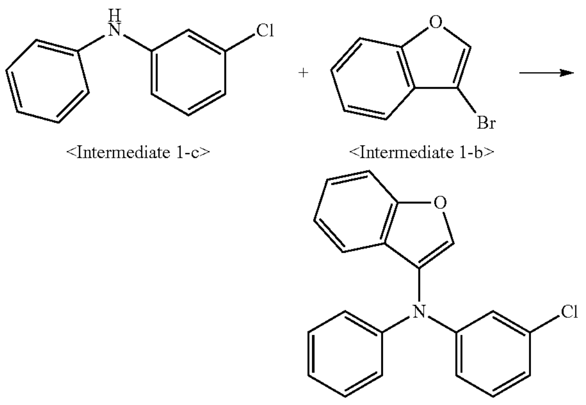

<Intermediate 1-c> <Intermediate 1-b>

<Intermediate 1-d>

Intermediate 1-c (20 g, 98 mmol), Intermediate 1-b (18.4 g, 98 mmol), palladium acetate (0.5 g, 2 mmol), sodium tert-butoxide (18.9 g, 196 mmol), tri-tert-butylphosphine (0.8 g, 4 mmol), and toluene (200 mL) were placed in a 250 mL reactor. The mixture was refluxed with stirring for 5 h.

After completion of the reaction, the reaction mixture was filtered. The filtrate was concentrated and purified by column chromatography to afford Intermediate 1-d (22 g, yield 75%)

Synthesis Example 1-5. Synthesis of Intermediate 1-e

Intermediate 1-e was synthesized by Reaction 5:

[Reaction 5]

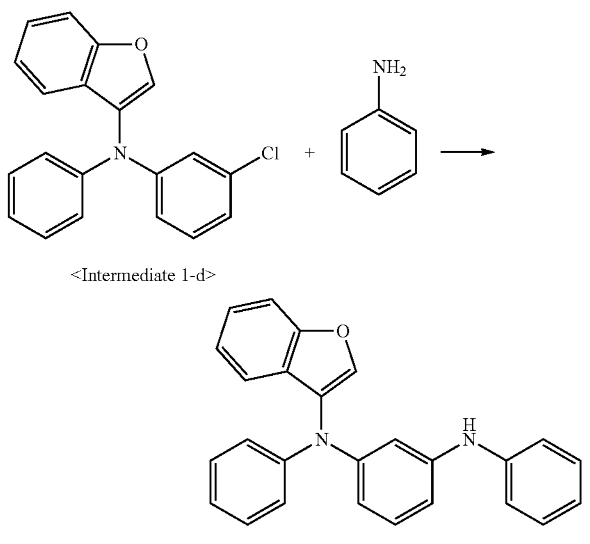

<Intermediate 1-d>

<Intermediate 1-e>

Intermediate 1-e (18.5 g, yield 74.1%) was synthesized in the same manner as in Synthesis Example 1-3, except that Intermediate 1-d was used instead of 1-bromo-4-iodobenzene.

Synthesis Example 1-6. Synthesis of Intermediate 1-f

Intermediate 1-f was synthesized by Reaction 6:

[Reaction 6]

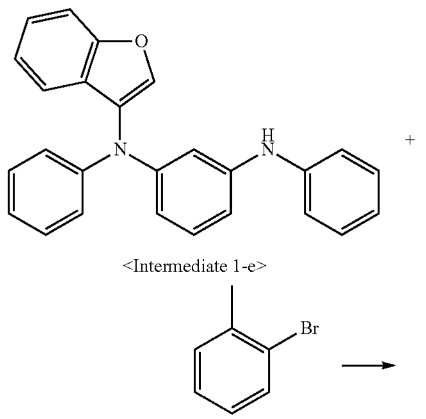

<Intermediate 1-e>

-continued

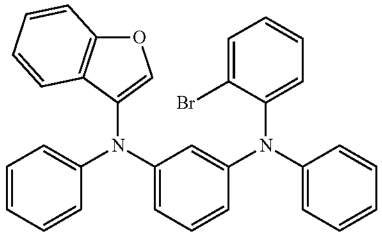

<Intermediate 1-f>

Intermediate 1-f (12 g, yield 84.1%) was synthesized in the same manner as in Synthesis Example 1-4, except that Intermediate 1-e and 1-bromo-2-iodobenzene were used instead of Intermediate 1-c and Intermediate 1-b.

Synthesis Example 1-7. Synthesis of Compound A1

Compound A1 was synthesized by Reaction 7:

[Reaction 7]

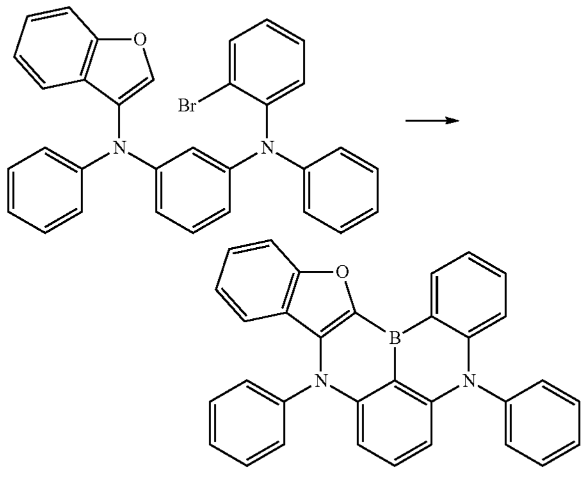

<Compound A1>

Intermediate 1-f (12 g, 23 mmol) and tert-butylbenzene (120 mL) were placed in a 300 mL reactor, and n-butyllithium (42.5 mL, 68 mmol) was added dropwise thereto at −78° C. After the dropwise addition was finished, the mixture was stirred at 60° C. for 3 h. Thereafter, the reactor was flushed with nitrogen at 60° C. to remove heptane. After dropwise addition of boron tribromide (11.3 g, 45 mmol) at −78° C., the resulting mixture was stirred at room temperature for 1 h and N,N-diisopropylethylamine (5.9 g, 45 mmol) was added dropwise thereto at 0° C. After the dropwise addition was finished, the mixture was stirred at 120° C. for 2 h. After completion of the reaction, the reaction mixture was added with an aqueous sodium acetate solution at room temperature, stirred, and extracted with ethyl acetate. The organic layer was concentrated and purified by column chromatography to give Compound A1 (0.8 g, yield 13%).

MS (MALDI-TOF): m/z 460.17 [$M^+$]

Synthesis Example 2. Synthesis of Compound A2

Synthesis Example 2-1. Synthesis of Intermediate 2-a

Intermediate 2-a was synthesized by Reaction 8:

[Reaction 8]

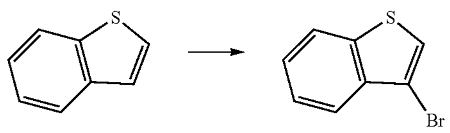

<Intermediate 2-a>

Benzothiophene (50 g, 373 mmol) and chloroform (500 mL) were stirred in a 1 L reactor. The mixture was cooled to −0° C. and a dilute solution of bromine (59.5 g, 373 mmol) in chloroform (100 mL) was added dropwise thereto. After the dropwise addition was finished, the resulting mixture was stirred at room temperature for 4 h. After completion of the reaction, the reaction mixture was added with an aqueous sodium thiosulfate solution, stirred, and extracted with ethyl acetate and $H_2O$. The organic layer was concentrated under reduced pressure and purified by column chromatography to afford Intermediate 2-a (70 g, yield 91%).

Synthesis Example 2-2. Synthesis of Intermediate 2-b

Intermediate 2-b was synthesized by Reaction 9:

[Reaction 9]

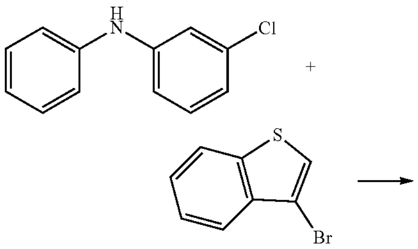

<Intermediate 2-a>

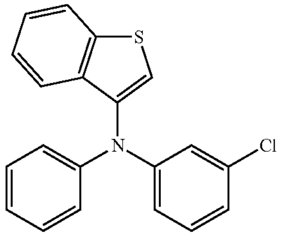

<Intermediate 2-b>

Intermediate 2-b (32 g, yield 75.4%) was synthesized in the same manner as in Synthesis Example 1-4, except that Intermediate 2-a was used instead of Intermediate 1-b.

Synthesis Example 2-3. Synthesis of Intermediate 2-c

Intermediate 2-c was synthesized by Reaction 10:

[Reaction 10]

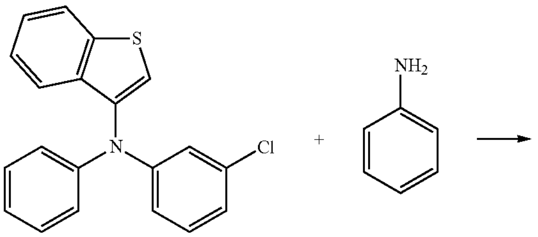

<Intermediate 2-b>

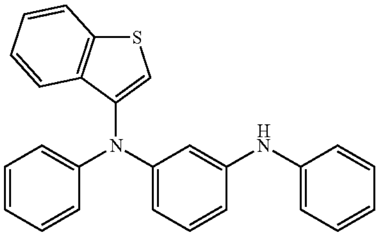

<Intermediate 2-c>

Intermediate 2-c (24.5 g, yield 73.1%) was synthesized in the same manner as in Synthesis Example 1-3, except that Intermediate 2-b was used instead of 1-bromo-4-iodobenzene.

Synthesis Example 2-4. Synthesis of Intermediate 2-d

Intermediate 2-d was synthesized by Reaction 11:

[Reaction 11]

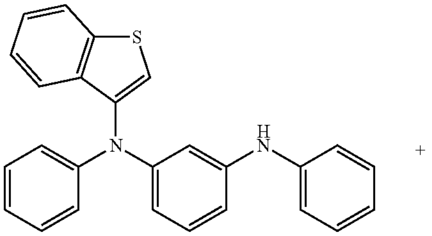

<Intermediate 2-c>

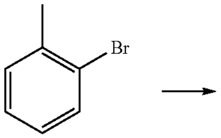

-continued

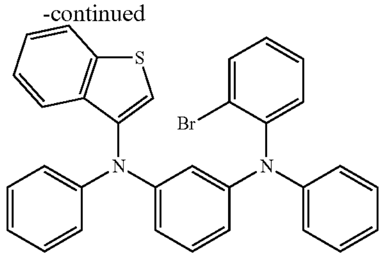

<Intermediate 2-d>

Intermediate 2-d (21 g, yield 77.5%) was synthesized in the same manner as in Synthesis Example 1-4, except that Intermediate 2-c and 1-bromo-2-iodobenzene were used instead of Intermediate 1-c and Intermediate 1-b.

Synthesis Example 2-5. Synthesis of Compound A2

Compound A2 was synthesized by Reaction 12:

[Reaction 12]

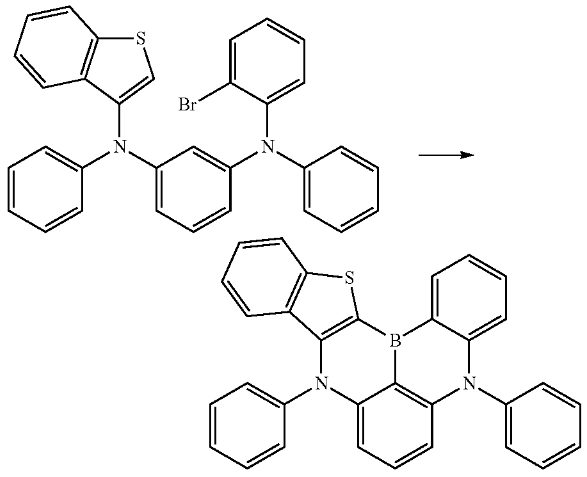

<Compound A2>

Compound A2 (1.5 g, yield 10.1%) was synthesized in the same manner as in Synthesis Example 1-7, except that Intermediate 2-d was used instead of Intermediate 1-f.

MS (MALDI-TOF): m/z 467.15 [$M^+$]

Synthesis Example 3. Synthesis of Compound A13

Synthesis Example 3-1. Synthesis of Intermediate 3-a

Intermediate 3-a was synthesized by Reaction 13:

[Reaction 13]

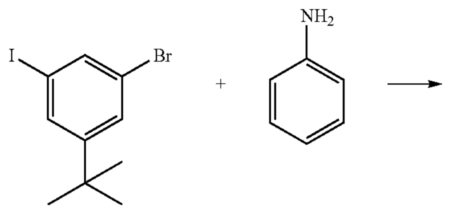

-continued

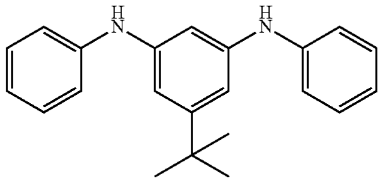

<Intermediate 3-a>

1-Bromo-3(tert-butyl)-5-iodobenzene (50 g, 177 mmol), aniline (36.2 g, 389 mmol), palladium acetate (1.6 g, 7 mmol), sodium tert-butoxide (51 g, 530 mmol), bis(diphenylphosphino)-1,1'-binaphthyl (4.4 g, 7 mmol), and toluene (500 mL) were placed in a 1 L reactor. The mixture was refluxed with stirring for 24 h. After completion of the reaction, the reaction mixture was filtered. The filtrate was concentrated and purified by column chromatography to afford Intermediate 3-a (42.5 g, yield 50%).

Synthesis Example 3-2. Synthesis of Intermediate 3-b

Intermediate 3-b was synthesized by Reaction 14:

[Reaction 14]

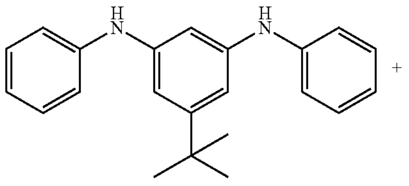

<Intermediate 3-a>

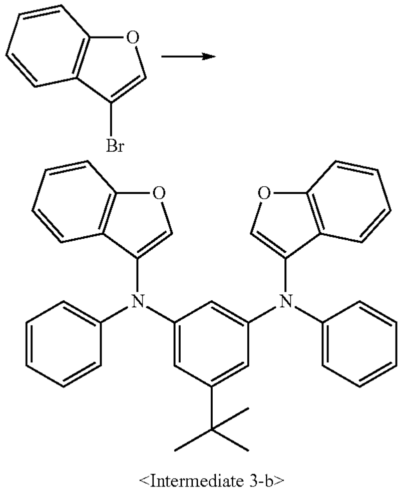

<Intermediate 3-b>

Intermediate 3-a (11 g, 42 mmol), Intermediate 1-b (20 g, 101 mmol), palladium acetate (1 g, 2 mmol), sodium tert-butoxide (12.2 g, 127 mmol), tri-tert-butylphosphine (0.7 g, 3 mmol), and toluene (150 mL) were placed in a 250 mL reactor. The mixture was refluxed with stirring for 5 h. After completion of the reaction, the reaction mixture was filtered. The filtrate was concentrated and purified by column chromatography to afford Intermediate 3-b (11 g, yield 65%).

Synthesis Example 3-3. Synthesis of Compound A13

Compound A13 was synthesized by Reaction 15:

[Reaction 15]

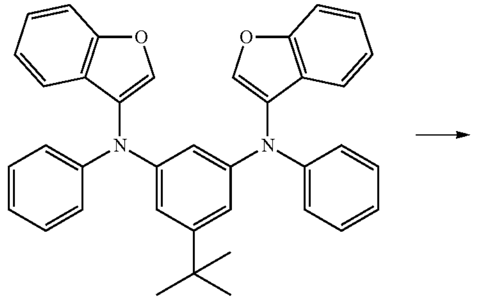

<Intermediate 3-b>

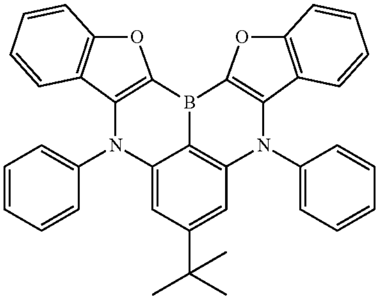

<Compound A13>

Compound A13 (0.5 g, yield 8%) was synthesized in the same manner as in Synthesis Example 1-7, except that Intermediate 3-b was used instead of Intermediate 1-f.

MS (MALDI-TOF): m/z 556.23 [$M^+$]

Synthesis Example 4. Synthesis of Compound A65

Synthesis Example 4-1. Synthesis of Intermediate 4-a

Intermediate 4-a was synthesized by Reaction 16:

[Reaction 16]

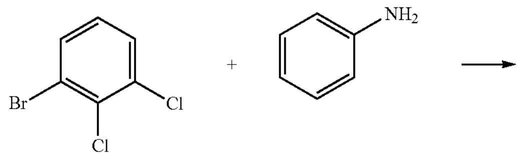

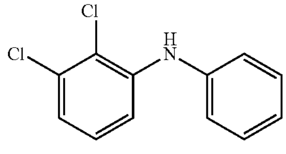

<Intermediate 4-a>

Intermediate 4-a (35.6 g, yield 71.2%) was synthesized in the same manner as in Synthesis Example 1-3, except that 1-bromo-2,3-dichlorobenzene was used instead of 1-bromo-4-iodobenzene.

Synthesis Example 4-2. Synthesis of Intermediate 4-b

Intermediate 4-b was synthesized by Reaction 17:

[Reaction 17]

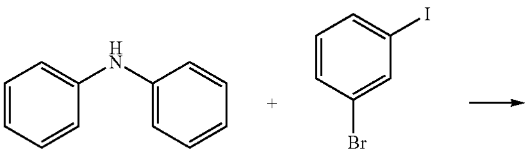

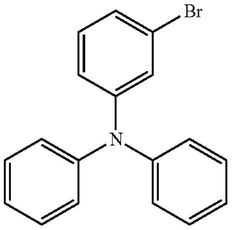

<Intermediate 4-b>

Diphenylamine (60.0 g, 355 mmol), 1-bromo-3-iodobenzene (100.3 g, 355 mmol), palladium acetate (0.8 g, 4 mmol), xantphos (2 g, 4 mmol), sodium tert-butoxide (68.2 g, 709 mmol), and toluene (700 mL) were placed in a 2 L reactor. The mixture was refluxed with stirring for 2 h. After completion of the reaction, the reaction mixture was filtered at room temperature, concentrated under reduced pressure, and purified by column chromatography to afford Intermediate 4-b (97 g, yield 91.2%).

Synthesis Example 4-3. Synthesis of Intermediate 4-c

Intermediate 4-c was synthesized by Reaction 18:

[Reaction 18]

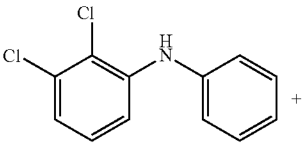

<Intermediate 4-a>

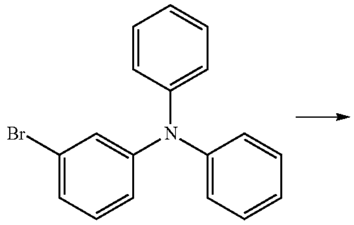

<Intermediate 4-b>

-continued

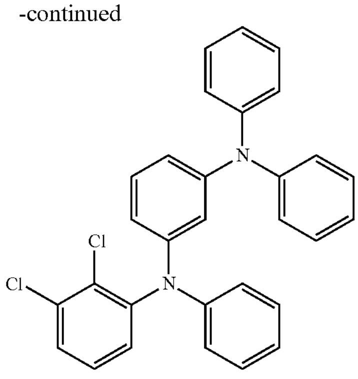

<Intermediate 4-c>

Intermediate 4-c (31 g, yield 77.7%) was synthesized in the same manner as in Synthesis Example 1-4, except that Intermediate 4-a and Intermediate 4-b were used instead of Intermediate 1-c and Intermediate 1-b.

Synthesis Example 4-4. Synthesis of Intermediate 4-d

Intermediate 4-d was synthesized by Reaction 19:

[Reaction 19]

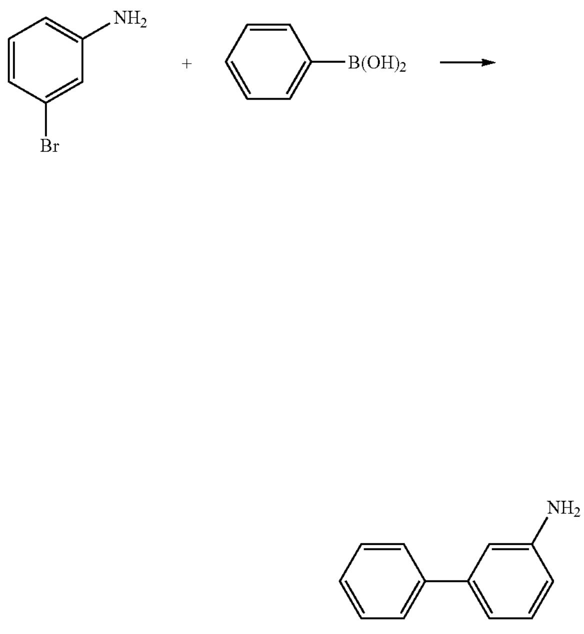

<Intermediate 4-d>

3-Bromoaniline (30 g, 174 mmol), phenylboronic acid (25.5 g, 209 mmol), tetrakis(triphenylphosphine)palladium (4 g, 3 mmol), potassium carbonate (48.2 g, 349 mmol), 1,4-dioxane (150 mL), toluene (150 mL), and distilled water (90 mL) were placed in a 1 L reactor. The mixture was refluxed with stirring for 4 h. After completion of the reaction, the reaction mixture was allowed to stand at room temperature for layer separation. The organic layer was concentrated under reduced pressure and purified by column chromatography to afford Intermediate 4-d (24 g, yield 80%).

Synthesis Example 4-5. Synthesis of Intermediate 4-e

Intermediate 4-e was synthesized by Reaction 20:

[Reaction 20]

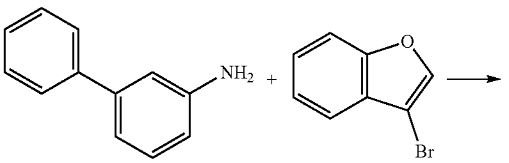

<Intermediate 4-d> <Intermediate 1-b>

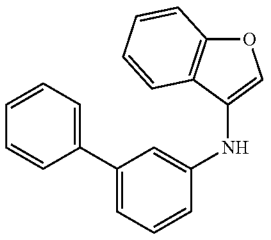

<Intermediate 4-e>

Intermediate 4-e (31.6 g, yield 68.2%) was synthesized in the same manner as in Synthesis Example 1-3, except that Intermediate 4-d and Intermediate 1-b were used instead of 1-bromo-4-iodobenzene and aniline.

Synthesis Example 4-6. Synthesis of Intermediate 4-f

Intermediate 4-f was synthesized by Reaction 21:

[Reaction 21]

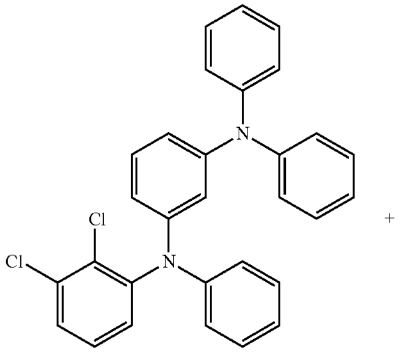

<Intermediate 4-c>

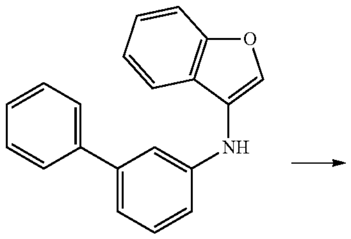

<Intermediate 4-e>

-continued

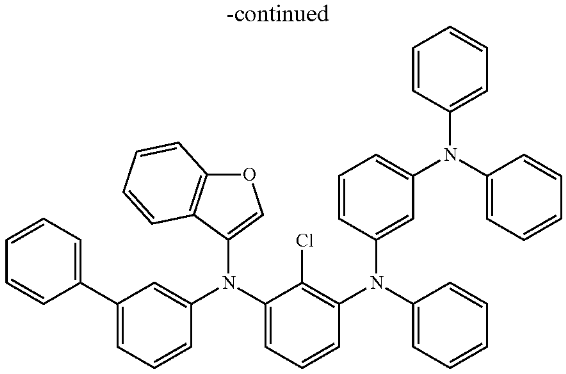

<Intermediate 4-f>

Intermediate 4-f (21 g, yield 67.7%) was synthesized in the same manner as in Synthesis Example 1-4, except that Intermediate 4-c and Intermediate 4-e were used instead of Intermediate 1-c and Intermediate 1-b.

Synthesis Example 4-7. Synthesis of Compound A65

Compound A65 was synthesized by Reaction 22:

[Reaction 22]

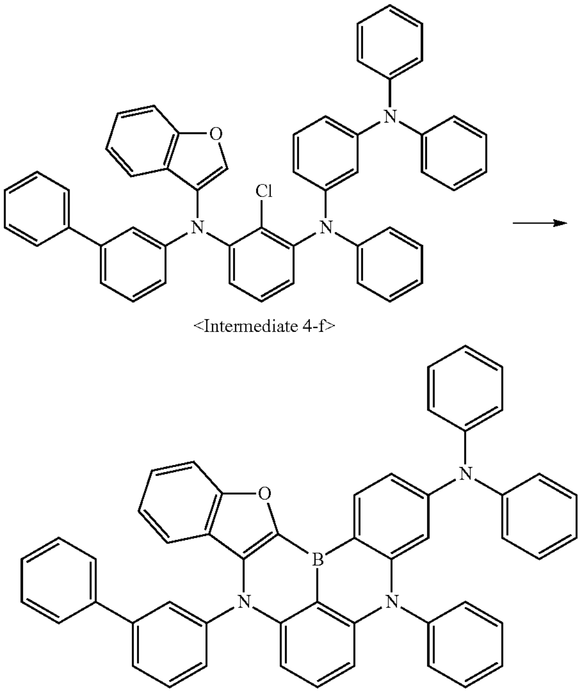

<Intermediate 4-f>

<Compound A65>

Intermediate 4-f (21 g, 37 mmol) and tert-butylbenzene were placed in a 250 mL reactor, and tert-butyllithium (42.4 mL, 74 mmol) was added dropwise thereto at −78° C. After the dropwise addition was finished, the mixture was stirred at 60° C. for 3 h. Thereafter, the reactor was flushed with nitrogen at 60° C. to remove pentane. After dropwise addition of boron tribromide (7.1 mL, 74 mmol) at −78° C., the resulting mixture was stirred at room temperature for 1 h and N,N-diisopropylethylamine (6 g, 74 mmol) was added dropwise thereto at 0° C. After the dropwise addition was finished, the mixture was stirred at 120° C. for 2 h. After completion of the reaction, the reaction mixture was added with an aqueous sodium acetate solution at room temperature, stirred, and extracted with ethyl acetate. The organic layer was concentrated and purified by column chromatography to give Compound A65 (2.0 g, yield 17.4%).

MS (MALDI-TOF): m/z 703.28 [$M^+$]

Synthesis Example 5. Synthesis of Compound A73

Synthesis Example 5-1. Synthesis of Intermediate 5-a

Intermediate 5-a was synthesized by Reaction 23:

[Reaction 23]

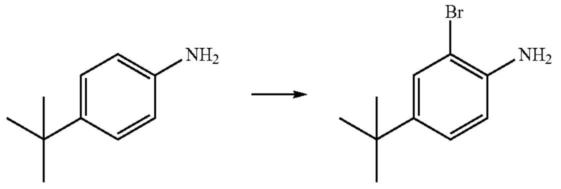

<Intermediate 5-a>

4-tert-butylaniline (40 g, 236 mmol) was dissolved in methylene chloride (400 mL) in a 1 L reactor. The mixture was stirred at 0° C. Thereafter, N-bromosuccinimide (42 g, 236 mmol) was slowly added to the reactor. The resulting mixture was stirred at room temperature for 4 h. After completion of the reaction, $H_2O$ was added dropwise to the reaction mixture at room temperature, followed by extraction with methylene chloride. The organic layer was concentrated and purified by column chromatography to afford Intermediate 5-a (48 g, yield 80%).

Synthesis Example 5-2. Synthesis of Intermediate 5-b

Intermediate 5-b was synthesized by Reaction 24:

[Reaction 24]

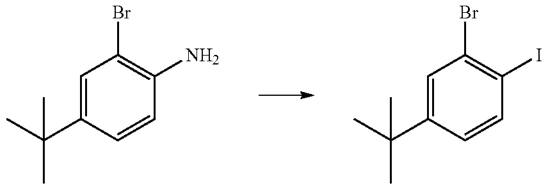

<Intermediate 5-a> <Intermediate 5-b>

Intermediate 5-a (80 g, 351 mmol) and water (450 mL) were stirred in a 2 L reactor. The mixture was added with sulfuric acid (104 mL) and a solution of sodium nitrite (31.5 g, 456 mmol) in water (240 mL) was added dropwise thereto at 0° C. After the dropwise addition was finished, the resulting mixture was stirred at 0° C. for 2 h. After dropwise addition of a solution of potassium iodide (116.4 g, 701 mmol) in water (450 mL) at 0° C., the mixture was stirred at room temperature for 6 h. After completion of the reaction, the reaction mixture was added with an aqueous sodium thiosulfate solution at room temperature, stirred, and extracted with ethyl acetate. The organic layer was concentrated and purified by column chromatography to afford Intermediate 5-b (58 g, yield 51%).

Synthesis Example 5-3. Synthesis of Intermediate 5-c

Intermediate 5-c was synthesized by Reaction 25:

[Reaction 25]

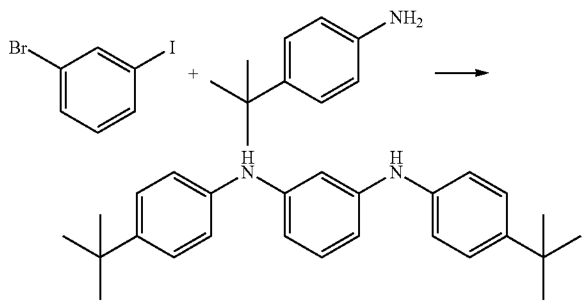

<Intermediate 5-c>

Intermediate 5-c (95 g, yield 80.4%) was synthesized in the same manner as in Synthesis Example 3-1, except that 4-tert-butylaniline was used instead of aniline.

Synthesis Example 5-4. Synthesis of Intermediate 5-d

Intermediate 5-d was synthesized by Reaction 26:

[Reaction 26]

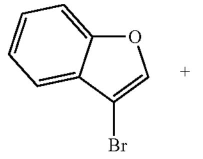

<Intermediate 1-a>

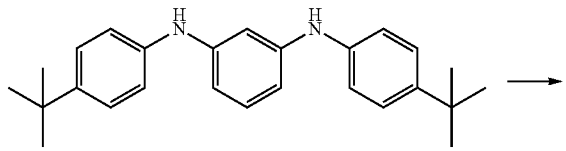

<Intermediate 5-c>

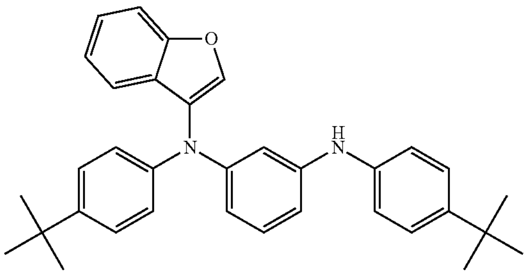

<Intermediate 5-d>

Intermediate 5-d (31 g, yield 71.5%) was synthesized in the same manner as in Synthesis Example 1-4, except that Intermediate 5-c was used instead of Intermediate 1-c.

Synthesis Example 5-5. Synthesis of Intermediate 5-e

Intermediate 5-e was synthesized by Reaction 27:

[Reaction 27]

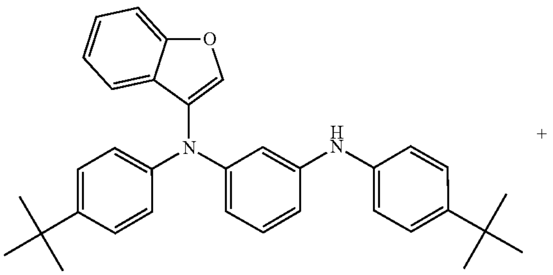

<Intermediate 5-d>

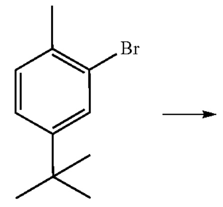

<Intermediate 5-b>

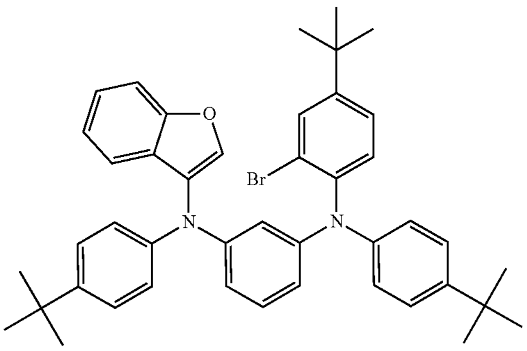

<Intermediate 5-e>

Intermediate 5-e (24 g, yield 67.1%) was synthesized in the same manner as in Synthesis Example 1-4, except that Intermediate 5-d and Intermediate 5-b were used instead of Intermediate 1-c and Intermediate 1-b.

Synthesis Example 5-6. Synthesis of Compound A73

Compound A73 was synthesized by Reaction 28:

[Reaction 28]

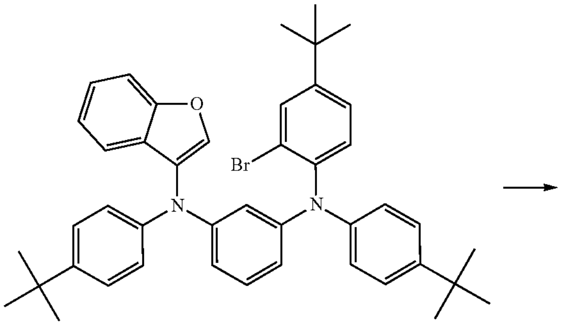

<Intermediate 5-e>

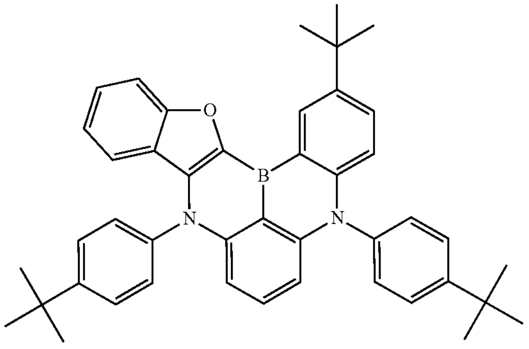

<Compound A73>

Compound A73 (2.4 g, yield 1 was synthesized in the same manner as in Synthesis Example 1-7, except that Intermediate 5-e was used instead of Intermediate 1-f.

MS (MALDI-TOF): m/z 628.36 [$M^+$]

Synthesis Example 6. Synthesis of Compound A109

Synthesis Example 6-1. Synthesis of Intermediate 6-a

Intermediate 6-a was synthesized by Reaction 29:

[Reaction 29]

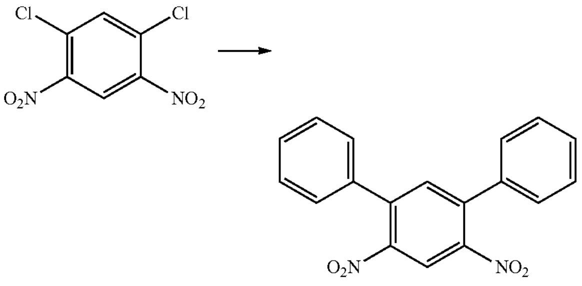

<Intermediate 6-a>

1,5-Dichloro-2,4-dinitrobenzene (40.0 g, 123 mmol), phenylboronic acid (44.9 g, 368 mmol), tetrakis(triphenylphosphine)palladium (2.8 g, 2.5 mmol), potassium carbonate (50.9 g, 368 mmol), 1,4-dioxane (120 mL), toluene (200 mL), and water (120 mL) were placed in a 1 L reactor. The mixture was refluxed with stirring. After completion of the reaction, the reaction mixture was extracted with water and ethyl acetate. The organic layer was concentrated and purified by column chromatography to afford Intermediate 6-a (27.5 g, yield 70%).

Synthesis Example 6-2. Synthesis of Intermediate 6-b

Intermediate 6-b was synthesized by Reaction 30:

[Reaction 30]

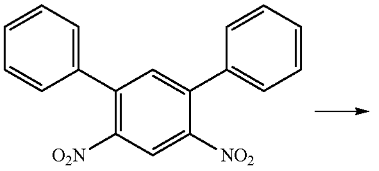

<Intermediate 6-a>

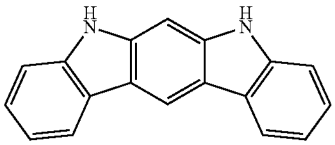

<Intermediate 6-b>

Intermediate 6-a (27.5 g, 86 mmol), triphenylphosphine (57.8 g, 348 mmol), and dichlorobenzene (300 mL) were placed in a 1 L reactor. The mixture was refluxed with stirring for 3 days. After completion of the reaction, the dichlorobenzene was removed, followed by column chromatography to afford Intermediate 6-b (10.8 g, yield 49.0%).

Synthesis Example 6-3. Synthesis of Intermediate 6-c

Intermediate 6-c was synthesized by Reaction 31:

[Reaction 31]

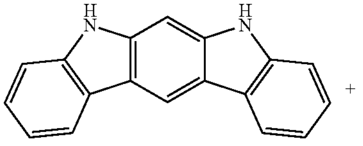

<Intermediate 6-b>

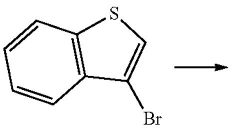

<Intermediate 2-a>

-continued

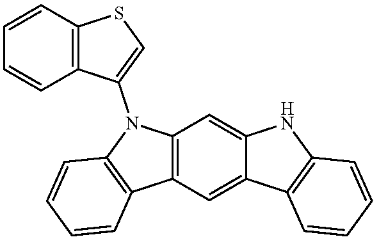

<Intermediate 6-c>

Intermediate 6-b (10.8 g, 42 mmol), Intermediate 2-a (11.0 g, 10.8 mmol), a copper powder (10.7 g, 1 mmol), 18-crown-6-ether (4.5 g, 17 mmol), and potassium carbonate (34.9 g, 253 mmol) were placed in a 250 mL reactor, and dichlorobenzene (110 mL) was added thereto. The mixture was refluxed with stirring at 180° C. for 24 h. After completion of the reaction, the dichlorobenzene was removed, followed by column chromatography to afford Intermediate 6-c (9.5 g, yield 52%).

Synthesis Example 6-4. Synthesis of Intermediate 6-d

Intermediate 6-d was synthesized by Reaction 32:

[Reaction 32]

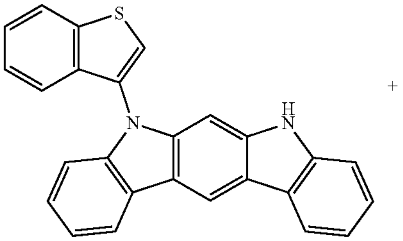

<Intermediate 6-c>

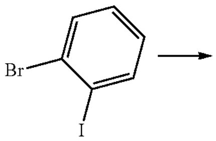

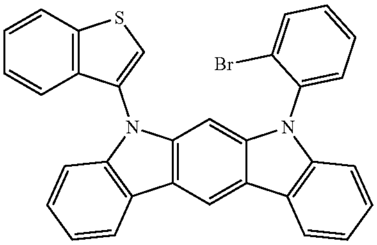

<Intermediate 6-d>

Intermediate 6-d (14 g, yield 67.1%) was synthesized in the same manner as in Synthesis Example 6-3, except that Intermediate 6-c and 1-bromo-2-iodobenzene were used instead of Intermediate 1-c and Intermediate 2-a.

Synthesis Example 6-5. Synthesis of Compound A109

Compound A109 was synthesized by Reaction 33:

[Reaction 33]

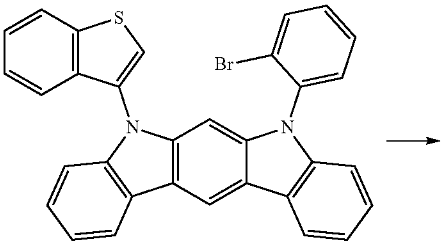

<Intermediate 6-d>

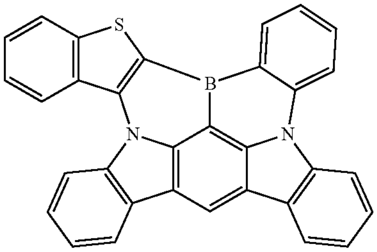

<Compound A109>

Compound A109 (2.1 g, yield 14%) was synthesized in the same manner as in Synthesis Example 1-7, except that Intermediate 6-d was used instead of Intermediate 1-f.

MS (MALDI-TOF): m/z 472.12 [$M^+$]

Synthesis Example 7. Synthesis of Compound A126

Synthesis Example 7-1. Synthesis of Intermediate 7-a

Intermediate 7-a was synthesized by Reaction 34:

[Reaction 34]

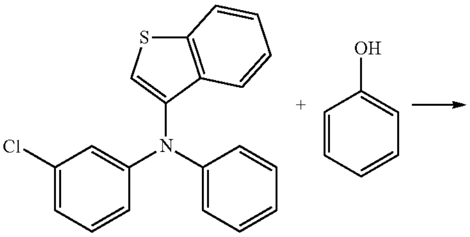

<Intermediate 2-b>

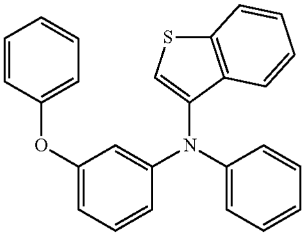

<Intermediate 7-a>

Intermediate 2-b (30.0 g, 150 mmol), phenol (31.2 g, 160 mmol), potassium carbonate (45.7 g, 300 mmol), and NMP (250 mL) were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 7-a (22 g, yield 68%).

Synthesis Example 7-2. Synthesis of Compound A126

Compound A126 was synthesized by Reaction 35:

[Reaction 35]

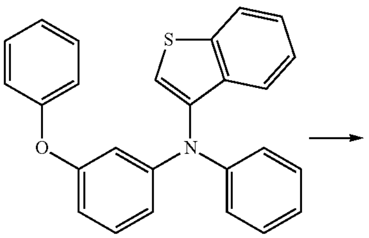

<Intermediate 7-a>

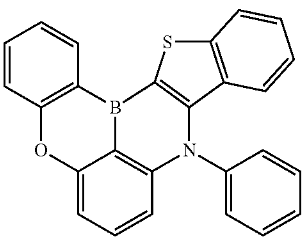

<Compound A126>

Compound A126 (1.2 g, yield 13.4%) was synthesized in the same manner as in Synthesis Example 1-7, except that Intermediate 7-a was used instead of Intermediate 1-f.

MS (MALDI-TOF): m/z 401.10 [$M^+$]

Synthesis Example 8. Synthesis of Compound A145

Synthesis Example 8-1. Synthesis of 8-a 8-a was synthesized by Reaction 36:

[Reaction 36]

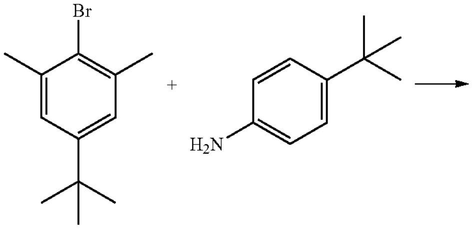

-continued

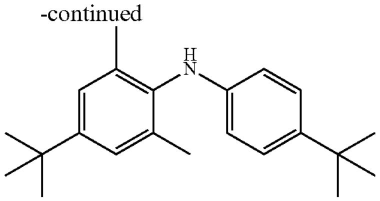

<8-a>

8-a (41.6 g, yield 88.2%) was synthesized in the same manner as in Synthesis Example 1-3, except that 2-bromo-5-tert-butyl-1,3-dimethylbenzene and 4-tert-butylaniline were used instead of 1-bromo-3-iodobenzene and aniline.

Synthesis Example 8-2. Synthesis of 8-b 8-b was synthesized by Reaction 37:

[Reaction 37]

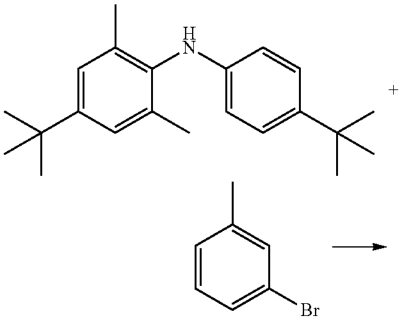

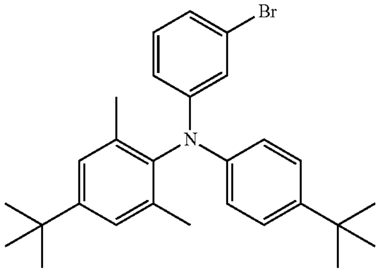

<8-b>

8-b (37.6 g, yield 78.4%) was synthesized in the same manner as in Synthesis Example 4-2, except that 8-a was used instead of diphenylamine.

Synthesis Example 8-3. Synthesis of 8-c 8-c was synthesized by Reaction 38:

[Reaction 38]

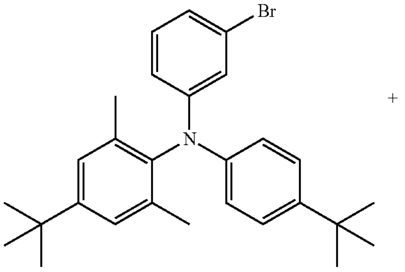

-continued

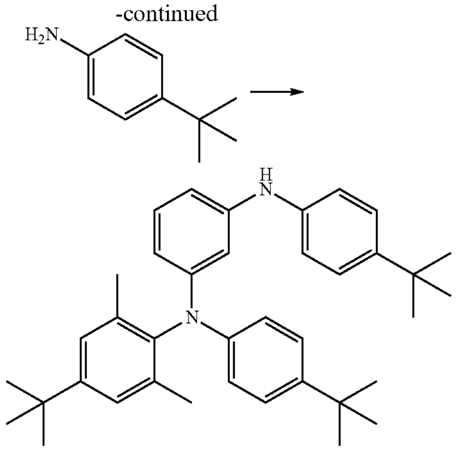

<8-c>

8-c (31.2 g, yield 74.2%) was synthesized in the same manner as in Synthesis Example 1-3, except that 8-b and 4-tert-butylaniline were used instead of 1-bromo-3-iodobenzene and aniline.

Synthesis Example 8-4. Synthesis of 8-d 8-d was synthesized by Reaction 39:

[Reaction 39]

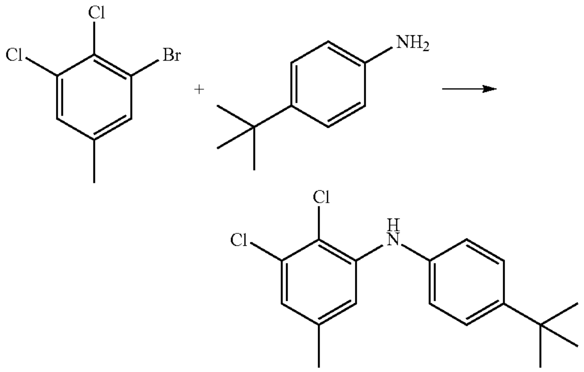

<8-d>

8-d (30.3 g, yield 89.8%) was synthesized in the same manner as in Synthesis Example 1-3, except that 1-bromo-2,3-dichloro-5-ethylbenzene and 4-tert-butylaniline were used instead of 1-bromo-3-iodobenzene and aniline.

Synthesis Example 8-5. Synthesis of 8-e 8-e was synthesized by Reaction 40:

[Reaction 40]

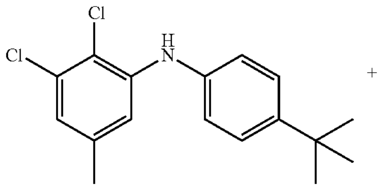

-continued

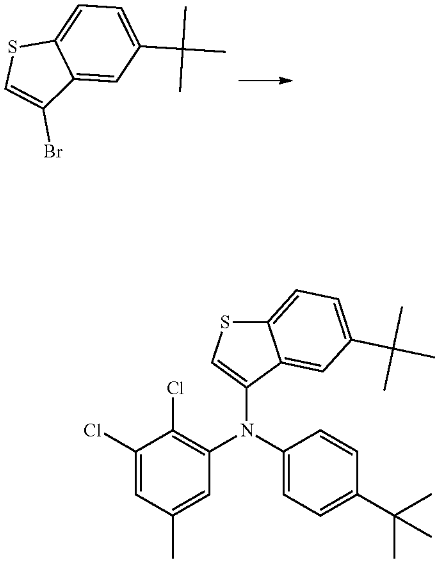

<8-e>

8-e (27.4 g, yield 77.1%) was synthesized in the same manner as in Synthesis Example 1-4, except that 8-d and 3-bromo-5-tert-butylbenzothiophene were used instead of 1-c and 1-b.

Synthesis Example 8-6. Synthesis of 8-f 8-f was synthesized by Reaction 41:

[Reaction 41]

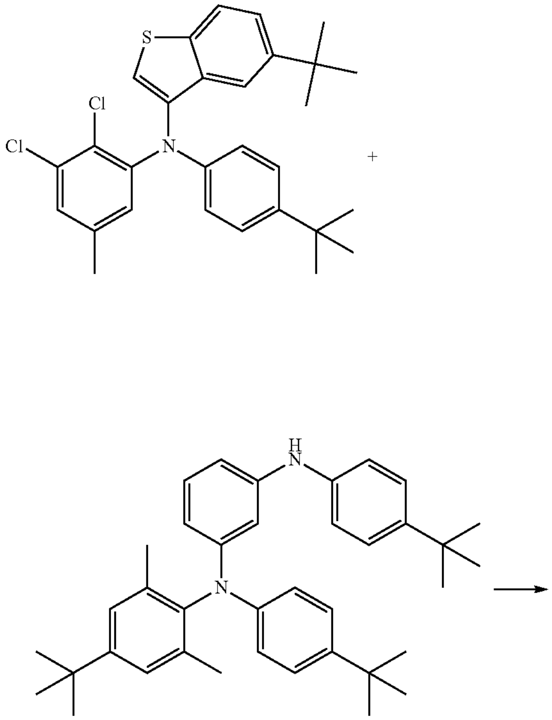

-continued

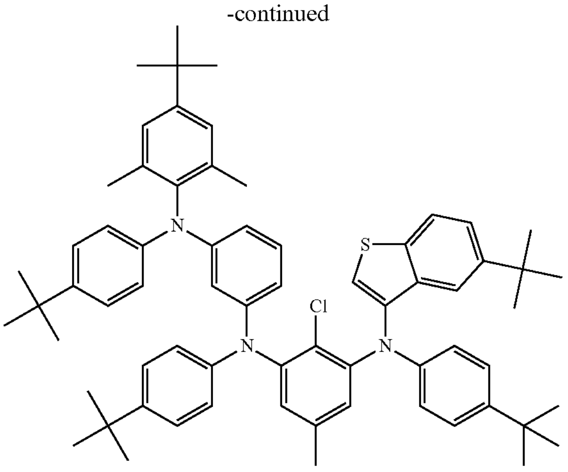

<8-f>

8-f (21 g, yield 74.1%) was synthesized in the same manner as in Synthesis Example 1-4, except that 8-e and 8-c were used instead of 1-c and 1-b.

Synthesis Example 8-7. Synthesis of Compound A145

Compound A145 was synthesized by Reaction 42:

[Reaction 42]

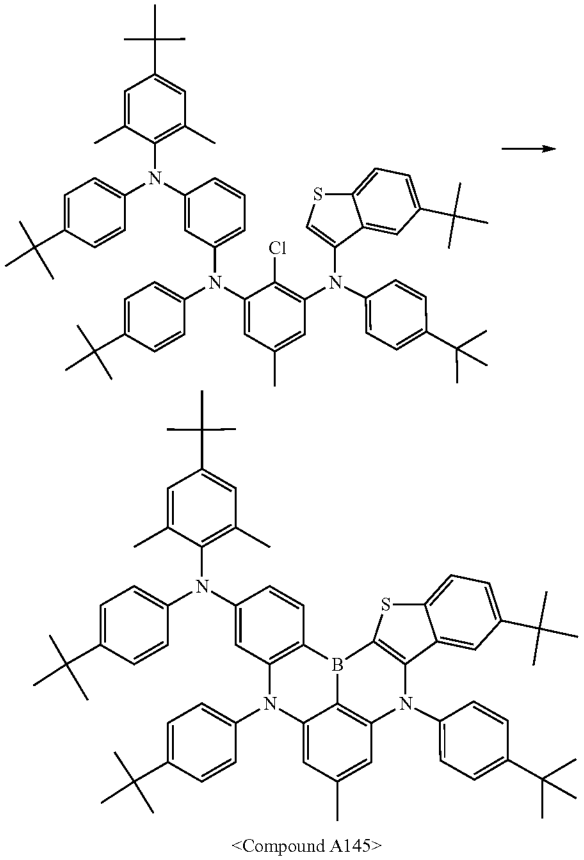

<Compound A145>

Compound A145 (3.4 g, yield 19.4%) was synthesized in the same manner as in Synthesis Example 1-7, except that 8-f was used instead of 1-f.

MS $[M]^+$979.60

Synthesis Example 9. Synthesis of Compound A150

Synthesis Example 9-1. Synthesis of 9-a 9-a was synthesized by Reaction 43:

[Reaction 43]

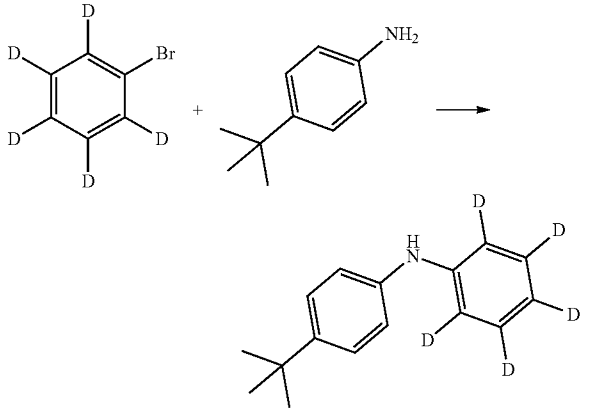

<9-a>

9-a (32.7 g, yield 78.2%) was synthesized in the same manner as in Synthesis Example 1-3, except that 1-bromobenzene-d5 and 4-tert-butylaniline were used instead of 1-bromo-3-iodobenzene and aniline.

Synthesis Example 9-2. Synthesis of 9-b 9-b was synthesized by Reaction 44:

[Reaction 44]

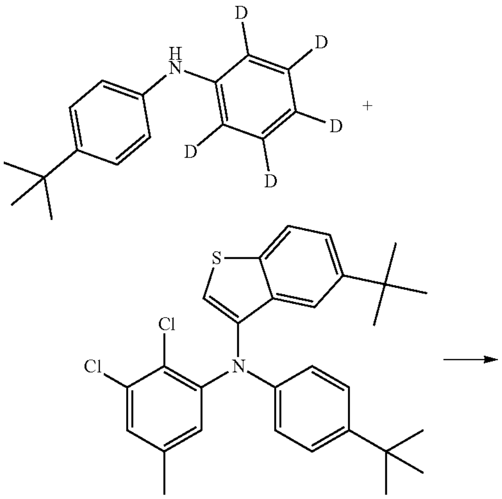

-continued

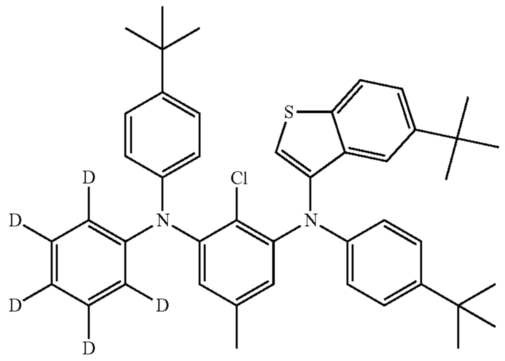

<9-b>

9-b (34.2 g, yield 84.1%) was synthesized in the same manner as in Synthesis Example 1-4, except that 8-e and 9-a were used instead of 1-c and 1-b.

Synthesis Example 9-3. Synthesis of Compound A150

Compound A150 was synthesized by Reaction 45:

[Reaction 45]

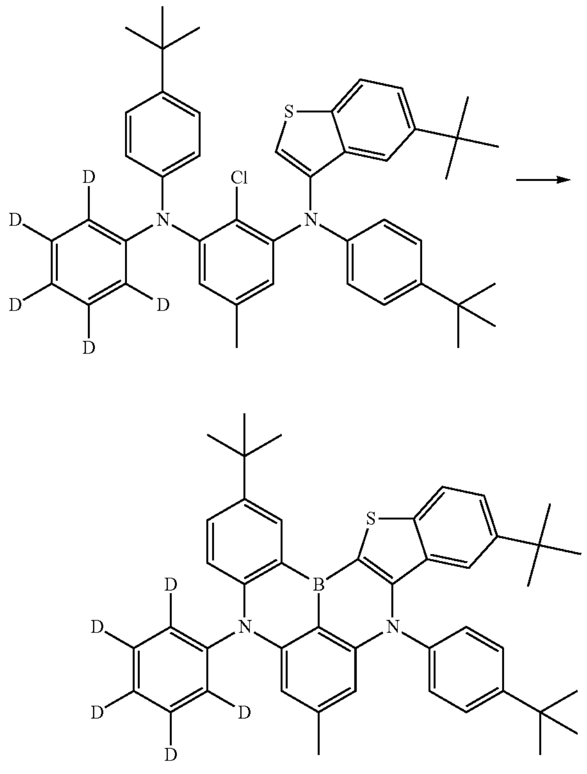

<Compound A150>

Compound A150 (2.7 g, yield 11.4%) was synthesized in the same manner as in Synthesis Example 1-7, except that 9-b was used instead of 1-f.

MS $[M]^+$663.39

Synthesis Example 10. Synthesis of Compound A153

Synthesis Example 10-1. Synthesis of 10-a 10-a was synthesized by Reaction 46:

[Reaction 46]

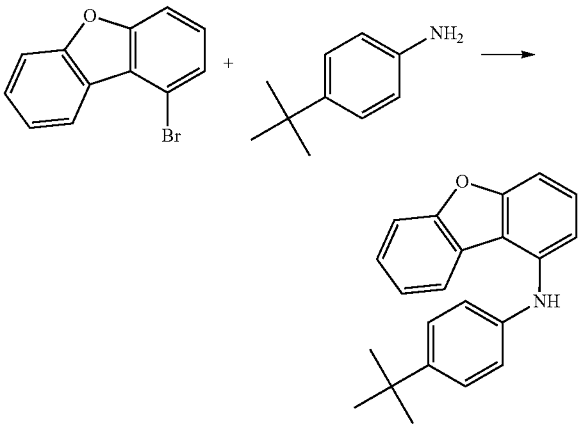

<10-a>

10-a (25.6 g, yield 79.2%) was synthesized in the same manner as in Synthesis Example 1-3, except that 1-bromo-dibenzofuran and 4-tert-butylaniline were used instead of 1-bromo-3-iodobenzene and aniline.

Synthesis Example 10-2. Synthesis of 10-b 10-b was synthesized by Reaction 47:

[Reaction 47]

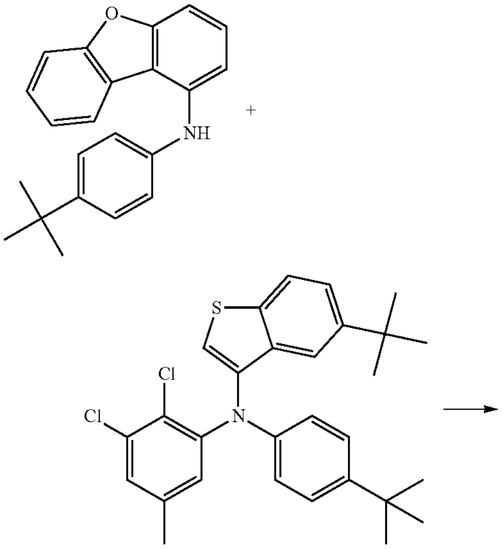

-continued

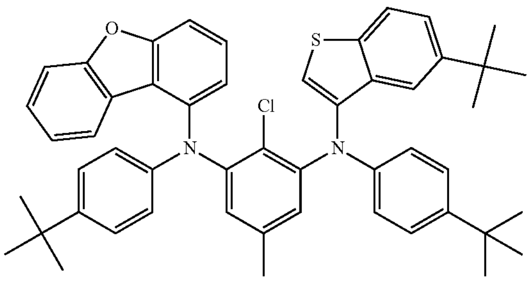

<10-b>

10-b (18.6 g, yield 74.1%) was synthesized in the same manner as in Synthesis Example 1-4, except that 8-e and 10-a were used instead of 1-c and 1-b.

Synthesis Example 10-3. Synthesis of Compound A153

Compound A153 was synthesized by Reaction 48:

[Reaction 48]

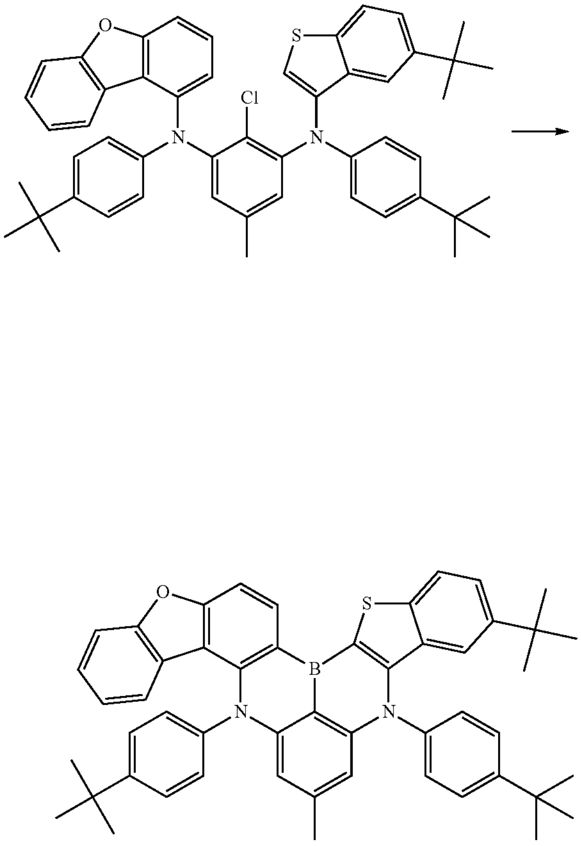

<Compound A153>

Compound A153 (3.4 g, yield 15.4%) was synthesized in the same manner as in Synthesis Example 1-7, except that 10-b was were used instead of 1-f.

MS $[M]^+$748.37

Synthesis of Compounds of Formula B

Synthesis Example 1. Synthesis of Compound B1

Synthesis Example 1-1. Synthesis of Compound B1

Compound B1 was synthesized by Reaction 1:

[Reaction 1]

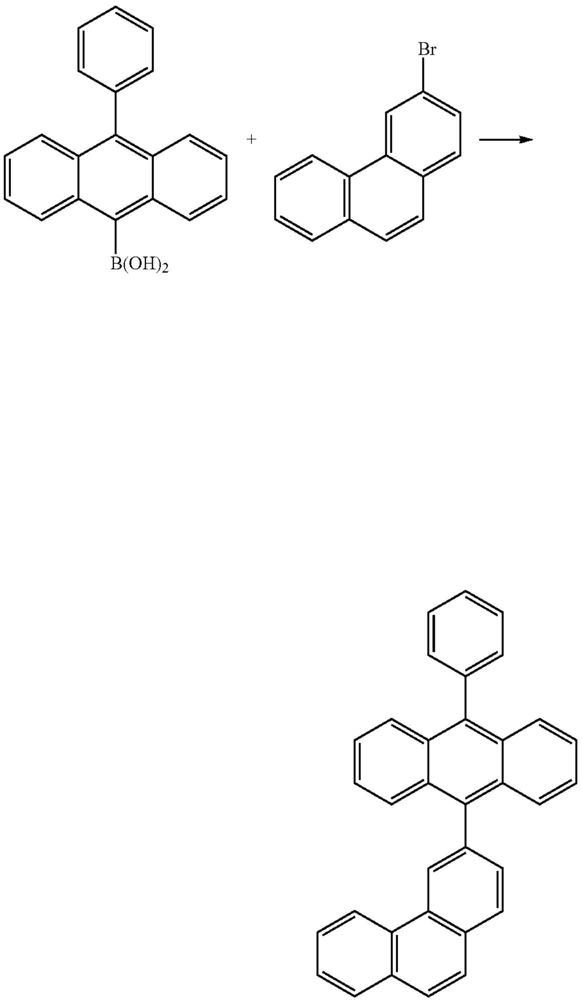

<Compound B1>

20 g (0.08 mol) of 3-bromophenanthrene, 30.15 g (0.1 mol) of phenylanthracene boronic acid, 21.5 g (0.16 mol) of potassium carbonate ($K_2CO_3$), 1.8 g (0.002 mol) of tetrakis (triphenylphosphine)palladium ($Pd(PPh_3)_4$), 100 mL of toluene, 100 mL of 1,4-dioxane, and 40 mL of water were placed in a 1 L round-bottom flask. The mixture was refluxed with stirring at ≤80° C. for 24 h. After completion of the reaction, the resulting mixture was allowed to stand at room temperature for layer separation. The aqueous layer was removed, and the organic layer was concentrated under reduced pressure and purified by column chromatography to give Compound A1 (15.7 g, 64%).

MS (MALDI-TOF): m/z 430.17 $[M^+]$

Synthesis Example 2. Synthesis of Compound B2

Synthesis Example 2-1. Synthesis of Compound B2

Compound B2 was synthesized by Reaction 2:

[Reaction 2]

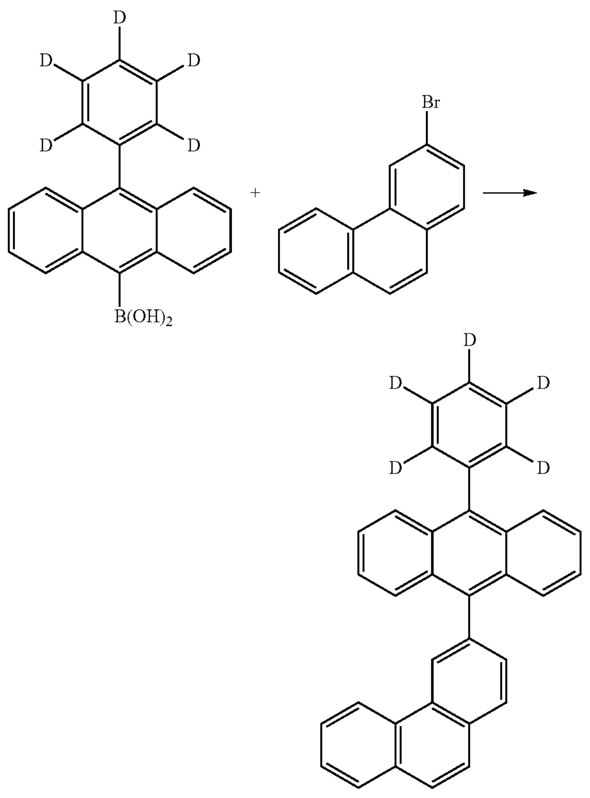

<Compound B2>

Compound B2 (7.0 g, 66.1%) was synthesized in the same manner as in Synthesis Example 1-1, except that phenyl(d5) anthracene boronic acid was used instead of phenylanthracene boronic acid.

MS (MALDI-TOF): m/z 435.20 [$M^+$]

Synthesis Example 3. Synthesis of Compound B3

Synthesis Example 3-1. Synthesis of Intermediate 3-a

Intermediate 3-a was synthesized by Reaction 3:

[Reaction 3]

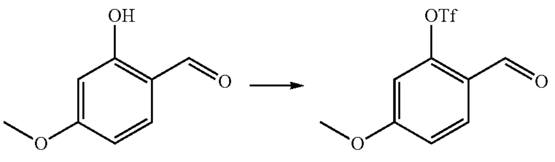

<3-a>

After sufficient drying of a 1 L round-bottom flask, a solution of 25.2 g (0.17 mol) of 2-hydroxy-4-methoxybenzaldehyde in 252 mL of dichloromethane was placed in the reactor under a nitrogen atmosphere and 26.2 g (0.331 mol) of pyridine was added thereto under a nitrogen atmosphere. The mixture was cooled to 0° C. To the mixture was slowly added dropwise 70.09 g (0.248 mol) of trifluoromethanesulfonic anhydride. The resulting mixture was stirred at room temperature. 2 h later, the reaction mixture was slowly poured into 400 mL of water in a beaker to quench the reaction, extracted with dichloromethane, and allowed to stand for layer separation. The aqueous layer was removed, and the organic layer was filtered through Celite and silica gel. The filtrate was concentrated under reduced pressure to afford Intermediate 3-a (36 g, yield 85%).

Synthesis Example 3-2. Synthesis of Intermediate 3-b

Intermediate 3-b was synthesized by Reaction 4:

[Reaction 4]

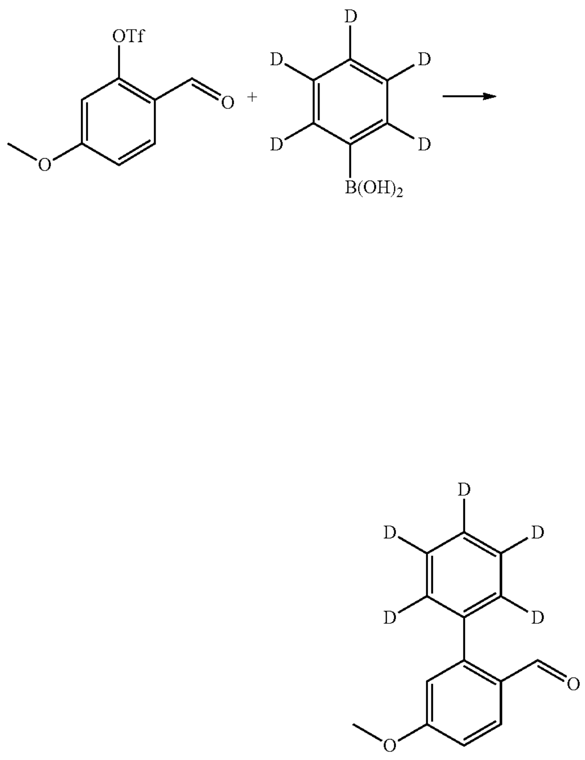

<3-b>

36 g (0.13 mol) of Intermediate 3-a, 19.7 g (0.16 mol) of phenyl-d5-boronic acid, 35.72 g (0.26 mol) of potassium carbonate ($K_2CO_3$), 3.0 g (0.003 mol) of tetrakis(triphenylphosphine)palladium ($Pd(PPh_3)_4$), 180 mL of toluene, 180 mL of 1,4-dioxane, and 72 mL of water were placed in a 1 L round-bottom flask. The mixture was refluxed at ≤80° C. with stirring for 24 h. After completion of the reaction, the reaction mixture was allowed to stand for layer separation. The aqueous layer was removed, and the organic layer was concentrated under reduced pressure and purified by column chromatography to afford Intermediate 3-b (23.83 g, yield 85%).

Synthesis Example 3-3. Synthesis of Intermediate 3-c

Intermediate 3-c was synthesized by Reaction 5:

[Reaction 5]

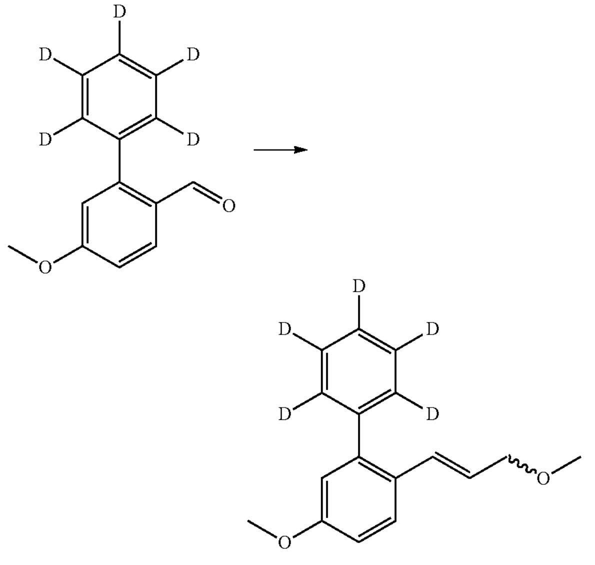

<3-c>

18.44 g (0.16 mol) of potassium tert-butoxide was dissolved in 238 mL of tetrahydrofuran in a 1 L round-bottom flask under a nitrogen atmosphere. The internal temperature of the reactor was reduced to ≤0° C. 56.3 g (0.16 mol) of (methoxymethyl)triphenylphosphonium chloride was added portionwise to the reactor under a nitrogen atmosphere. A solution of 23.8 g (0.11 mol) of the starting material in 238 mL of tetrahydrofuran was slowly added dropwise to the reactor at ≤0° C. The resulting mixture was allowed to warm to room temperature. 1 h later, the reaction mixture was slowly poured into 400 mL of water in a beaker to quench the reaction. The aqueous layer was removed, and the organic layer was collected, concentrated under reduced pressure, and purified by column chromatography to afford Intermediate 3-c (24.4 g, yield 87%).

Synthesis Example 3-4. Synthesis of Intermediate 3-d

Intermediate 3-d was synthesized by Reaction 6:

[Reaction 6]

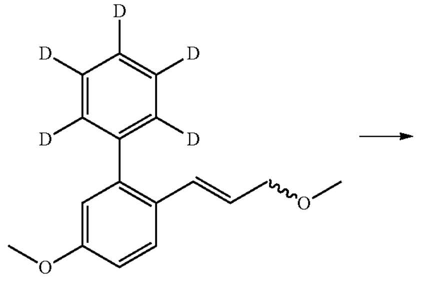

-continued

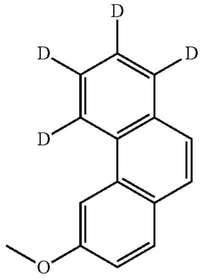

<3-d>

A solution of 3.09 g (0.005 mol) of bismuth (III) trifluoromethanesulfonate in 120 mL of dichloromethane in a 1 L round-bottom flask under a nitrogen atmosphere, and a solution of 24 g (0.093 mol) of Intermediate 3-c in 120 mL of dichloroethane was added to the reactor. 1 h later, the reaction mixture was dissolved in 120 mL dichloromethane and filtered through Celite and silica gel. The filtrate was concentrated under reduced pressure to afford Intermediate 3-d (7.8 g, yield 40%).

Synthesis Example 3-5. Synthesis of Intermediate 3-e

Intermediate 3-e was synthesized by Reaction 7:

[Reaction 7]

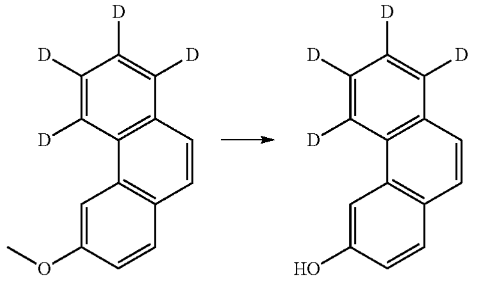

<3-e>

A solution of 7.8 g (0.04 mol) of Intermediate 3-d in 78 mL of dichloromethane was placed in a 250 mL round-bottom flask under a nitrogen atmosphere. The solution was cooled to 0° C. and 27.62 g (0.11 mol) of tribromoboron was slowly added dropwise thereto at ≤0° C. The temperature was raised to room temperature. 2 h later, the reaction mixture was slowly poured into 100 mL of ice-water in a beaker to quench the reaction and extracted with dichloromethane. After layer separation, the aqueous layer was removed and the organic layer was separated and filtered through Celite and silica gel. The filtrate was concentrated under reduced pressure to afford Intermediate 3-e (6 g, yield 82%).

Synthesis Example 3-6. Synthesis of Intermediate 3-f

Intermediate 3-f was synthesized by Reaction 8:

[Reaction 8]

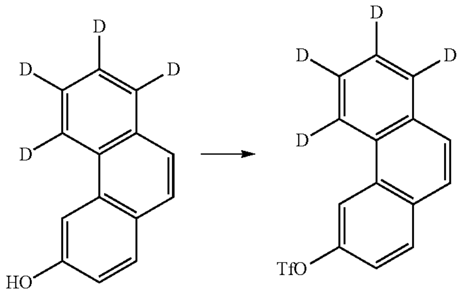

<3-f>

A solution of 6 g (0.03 mol) of Intermediate 3-e in 10 mL of dichloromethane was placed in a 100 mL round-bottom flask under a nitrogen atmosphere, and 4.79 g (0.061 mol) of pyridine was added to the reactor. The mixture was cooled to 0° C. and 12.81 g (0.05 mol) of trifluoromethanesulfonic anhydride was slowly added dropwise thereto. The temperature was raised to room temperature. 2 h later, the reaction mixture was slowly poured into water in a beaker to quench the reaction and extracted with dichloromethane. After layer separation, the aqueous layer was removed and the organic layer was separated and filtered through Celite and silica gel. The filtrate was concentrated under reduced pressure to afford Intermediate 3-f (9.9 g, yield 99%).

Synthesis Example 3-7. Synthesis of Compound B3

Compound B3 was synthesized by Reaction 9:

[Reaction 9]

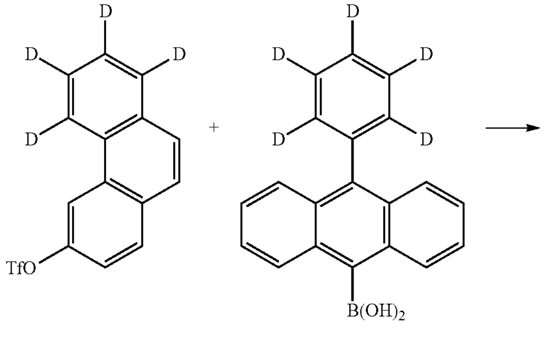

-continued

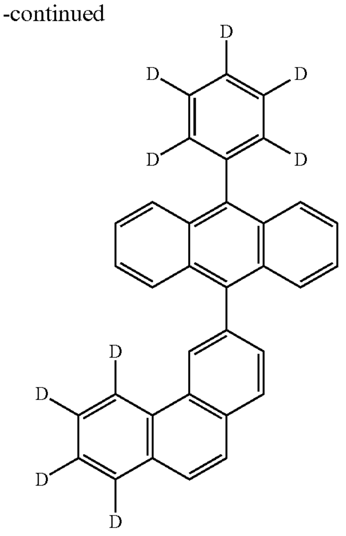

<Compound B3>

Compound B3 (7.0 g, 66.1%) was synthesized in the same manner as in Synthesis Example 1-1, except that phenyl(d5) anthracene boronic acid and Intermediate 3-f were used instead of phenylanthracene boronic acid and 3-bromophenanthrene, respectively.

MS (MALDI-TOF): m/z 439.23 [$M^+$]

Synthesis Example 4. Synthesis of Compound B4

Synthesis Example 4-1. Synthesis of Intermediate 4-a

Intermediate 4-a was synthesized by Reaction 10:

[Reaction 10]

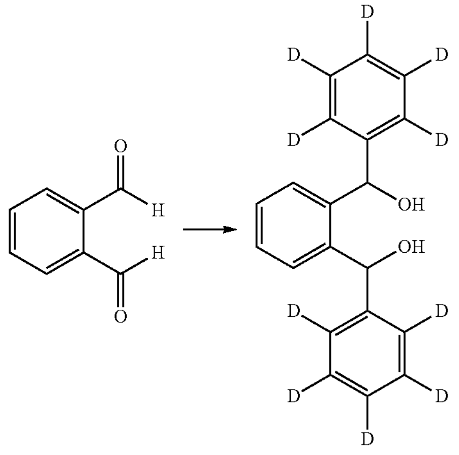

<4-a>

Bromobenzene (d-5) (60.4 g, 0.373 mol) and 480 mL of tetrahydrofuran were placed in a 2 L round-bottom flask under a nitrogen atmosphere. The mixture was cooled to −78° C. and stirred. To the cooled solution was added dropwise n-butyllithium (223.6 mL, 0.357 mol). The resulting mixture was stirred at the same temperature for 1 h. To the reaction solution was added dropwise a solution of O-phthalaldehyde (20.0 g, 0.149 mol) in 100 mL of tetrahydrofuran, followed by stirring at room temperature. The reaction was stopped by the addition of 200 mL of an aqueous ammonium chloride solution. The reaction solution was extracted with ethyl acetate. The organic layer was separated, concentrated under reduced pressure, and purified by column chromatography to afford Intermediate 4-a (40 g, yield 89%).

Synthesis Example 4-2. Synthesis of Intermediate 4-b

Intermediate 4-b was synthesized by Reaction 11:

[Reaction 11]

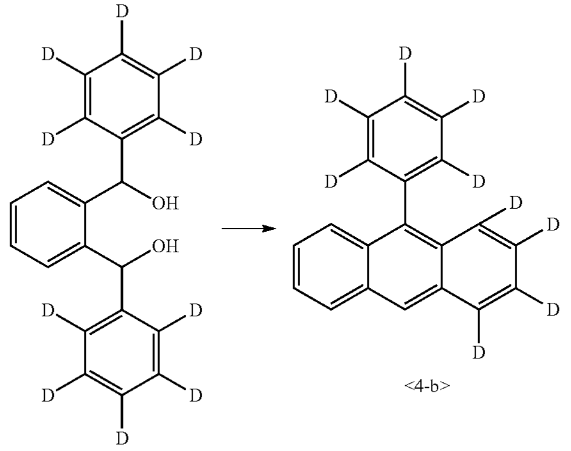

<4-b>

A solution of Intermediate 4-a (40.0 g, 0.133 mol) in acetic acid (200 mL) was stirred in a 500 mL round-bottom flask and hydrogen bromide (2 mL) was added thereto. The mixture was stirred at 80° C. for 2 h. After completion of the reaction, the reaction solution was cooled to room temperature. The reaction solution was slowly poured into 500 mL of water in a beaker and stirred. The resulting solid was filtered, washed with water, and purified by column chromatography to afford Intermediate 4-b (13 g, yield 37%).

Synthesis Example 4-3. Synthesis of Intermediate 4-c

Intermediate 4-c was synthesized by Reaction 12:

[Reaction 12]

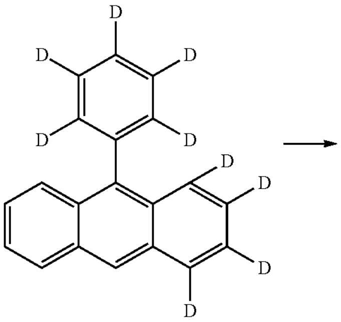

-continued

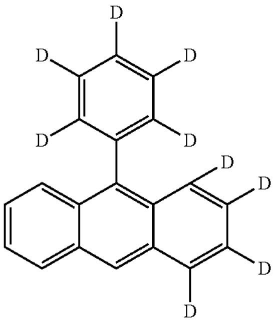

<4-c>

A solution of Intermediate 4-b (13.0 g, 0.049 mol) in 130 mL of N,N-dimethylamide was stirred at room temperature in a 500 mL round-bottom flask and a solution of N-bromosuccinimide (10.54 g, 0.059 mol) in 40 mL of N,N-dimethylamide was added dropwise thereto. The completion of the reaction was confirmed by thin layer chromatography. The reaction solution was poured into 500 mL of water in a beaker and stirred. The resulting solid was filtered, washed with water, and purified by column chromatography to afford Intermediate 4-c (14.0 g, yield 83%).

Synthesis Example 4-4. Synthesis of Intermediate 4-d

Intermediate 4-d was synthesized by Reaction 13:

[Reaction 13]

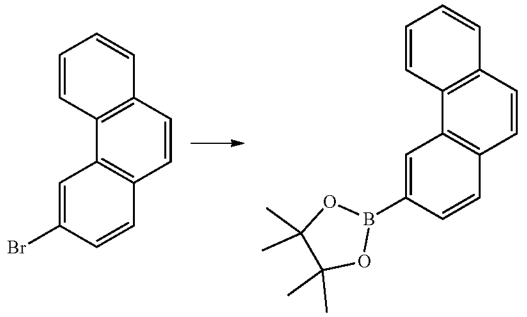

3-Bromophenanthrene (0.194 mol), bis(pinacolato)diboron (74.1 g, 0.292 mol), 1,1'-bis(diphenylphosphino)ferrocene-palladium(II) dichloride (4.8 g, 0.006 mol), potassium acetate (57.13 g, 0.583 mol), and 500 mL of 1,4-dioxane were refluxed in a 1 L round-bottom flask overnight. After completion of the reaction, the reaction mixture was passed through a pad of celite. The filtrate was concentrated under reduced pressure and purified by column chromatography to afford Intermediate 4-d (48.0 g, yield 81%).

Synthesis Example 4-5. Synthesis of Compound B4

Compound B4 was synthesized by Reaction 14:

[Reaction 14]

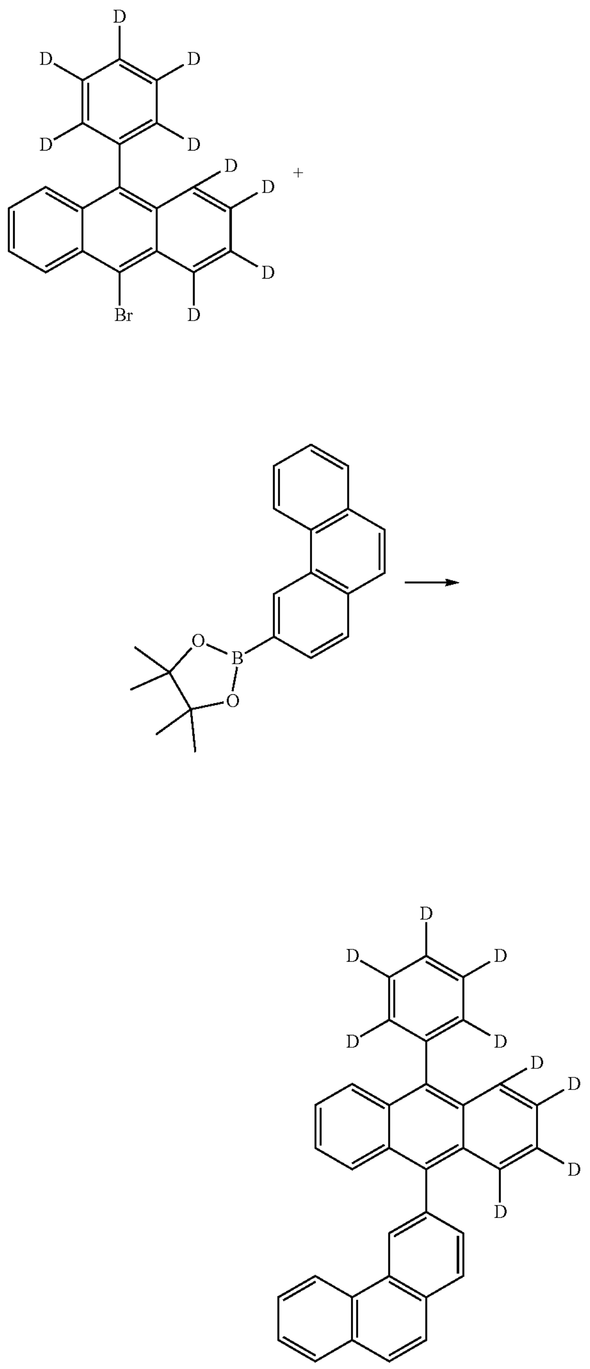

<Compound B4>

Compound B4 (5.6 g, 62.1%) was synthesized in the same manner as in Synthesis Example 1-1, except that Intermediate 4-d and Intermediate 4-c were used instead of phenylanthracene boronic acid and 3-bromophenanthrene, respectively.

MS (MALDI-TOF): m/z 439.23 [$M^+$]

Synthesis Example 5. Synthesis of Compound B5

Synthesis Example 5-1. Synthesis of Compound B5

Compound B5 was synthesized by Reaction 15:

[Reaction 15]

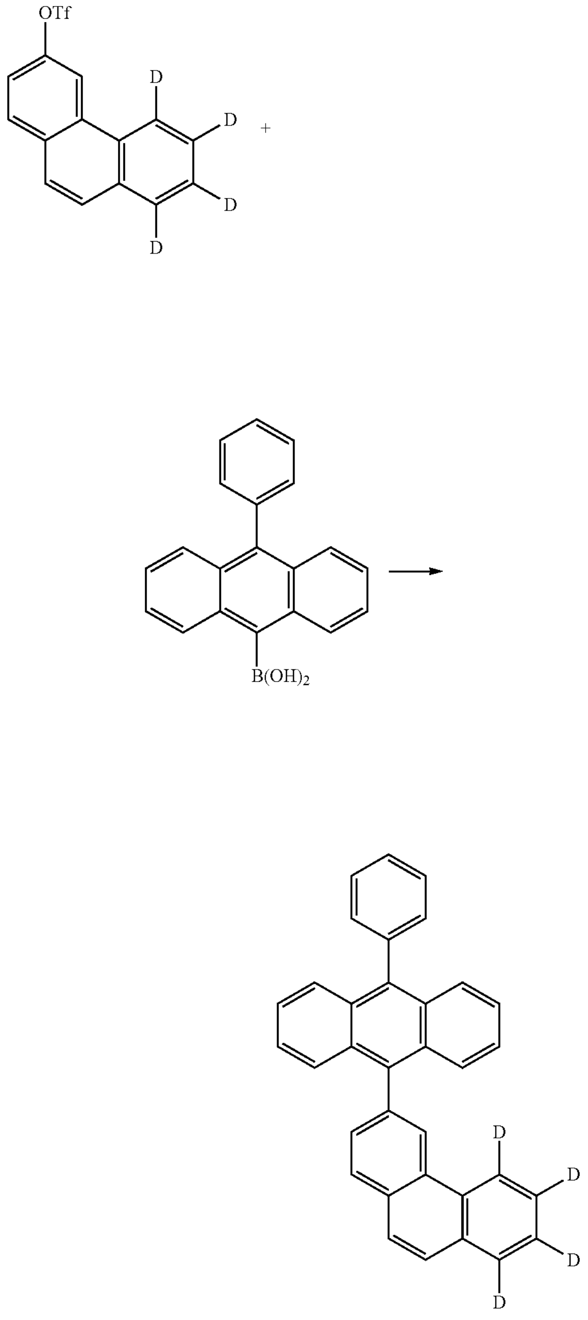

<Compound B5>

Compound B5 (5.0 g, 42.3%) was synthesized in the same manner as in Synthesis Example 3-7, except that Intermediate 3-f was used instead of 3-bromophenanthrene.

MS (MALDI-TOF): m/z 434.20 [$M^+$]

Synthesis Example 6. Synthesis of Compound B8

Synthesis Example 6-1. Synthesis of Intermediate 6-a

Intermediate 6-a was synthesized by Reaction 16:

[Reaction 16]

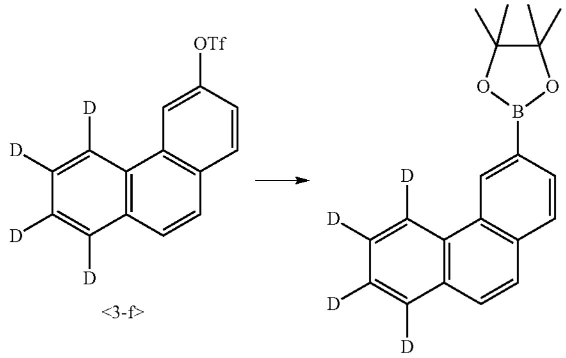

<3-f>

<6-a>

Intermediate 3-f (20.0 g, 0.061 mol), bis(pinacolato) diboron (18.5 g, 0.073 mol), 1,1'-bis(diphenylphosphino) ferrocene-palladium(II) dichloride (1.0 g, 0.001 mol), potassium acetate (11.9 g, 0.121 mol), and 160 mL of toluene were refluxed in a 1 L round-bottom flask overnight. After completion of the reaction, the reaction mixture was passed through a pad of celite. The filtrate was concentrated under reduced pressure and purified by column chromatography to afford Intermediate 6-a (15.0 g, yield 80.4%).

Synthesis Example 6-2. Synthesis of Compound B8

Compound B8 was synthesized by Reaction 17:

[Reaction 17]

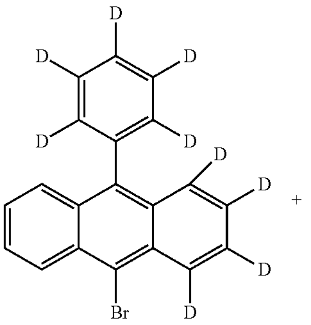

-continued

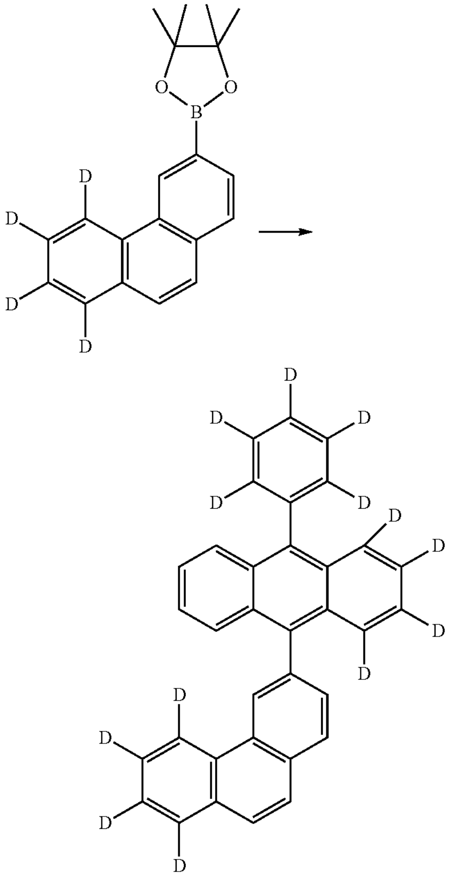

<Compound B8>

Compound B8 (7.0 g, 70.0%) was synthesized in the same manner as in Synthesis Example 1-1, except that Intermediate 4-d and Intermediate 6-a were used instead of phenylanthracene boronic acid and 3-bromophenanthrene, respectively.

MS (MALDI-TOF): m/z 443.25 [$M^+$]

Synthesis Example 7. Synthesis of Compound B9

Synthesis Example 7-1. Synthesis of Intermediate 7-a

Intermediate 7-a was synthesized by Reaction 18:

[Reaction 18]

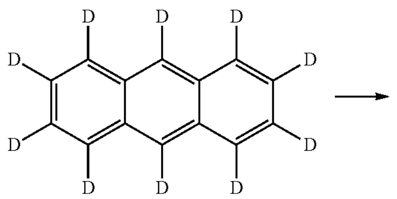

-continued

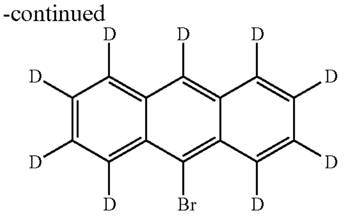

<7-a>

A solution of anthracene-d10 (20.0 g, 0.106 mol) in 200 mL of methylene chloride was stirred in a 500 mL round-bottom flask at room temperature. To the reaction solution was added portionwise N-bromosuccinimide (18.9 g, 0.106 mol). The resulting mixture was stirred overnight. The completion of the reaction was confirmed by thin layer chromatography. The reaction solution was poured into 500 mL of water in a beaker and stirred. The organic layer was separated, concentrated under reduced pressure, and purified by column chromatography to afford Intermediate 7-a (20.0 g, yield 70%).

Synthesis Example 7-2. Synthesis of Intermediate 7-b

Intermediate 7-b was synthesized by Reaction 19:

[Reaction 19]

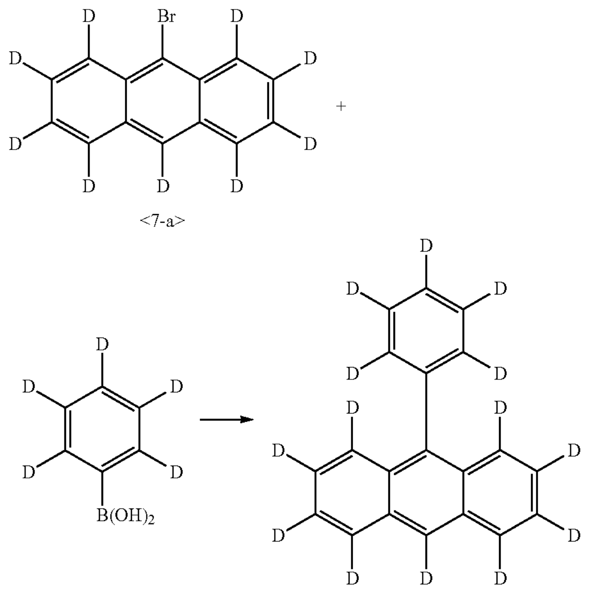

<7-a>

<7-b>

20.0 g (0.075 mol) of Intermediate 7-a, 11.4 g (0.090 mol) of phenyl-d5-boronic acid, 15.58 g (0.113 mol) of potassium carbonate ($K_2CO_3$), 4.35 g (0.004 mol) of tetrakis(triphenylphosphine)palladium ($Pd(PPh_3)_4$), 140 mL of toluene, 60 mL of 1,4-dioxane, and 40 mL of water were placed in a 500 mL round-bottom flask. The mixture was refluxed with stirring at ≤80° C. for 24 h. After completion of the reaction, the reaction mixture was allowed to stand at room temperature for layer separation. The aqueous layer was removed, and the organic layer was concentrated under reduced pressure and purified by column chromatography to afford Intermediate 7-b (17.5 g, 86.8%).

Synthesis Example 7-3. Synthesis of Intermediate 7-c

Intermediate 7-c was synthesized by Reaction 20:

[Reaction 20]

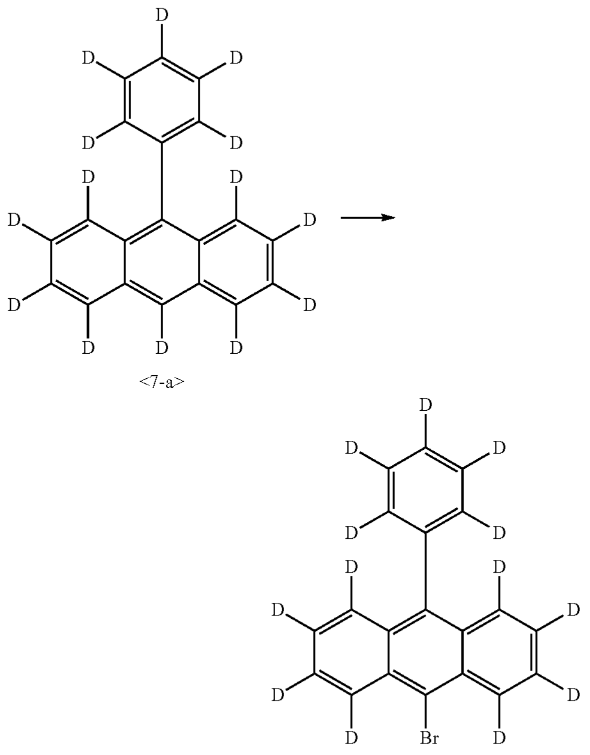

<7-a>

<7-c>

Intermediate 7-c (19.3 g, 88.0%) was synthesized in the same manner as in Synthesis Example 4-3, except that Intermediate 7-a was used instead of Intermediate 4-b.

Synthesis Example 7-4. Synthesis of Compound B9

Compound B9 was synthesized by Reaction 21:

[Reaction 21]

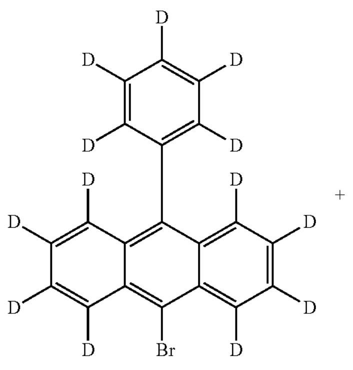

<7-c>

-continued

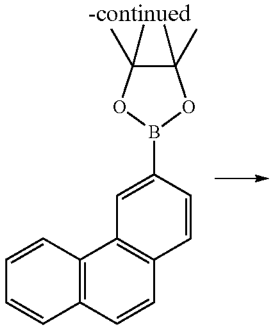

<4-d>

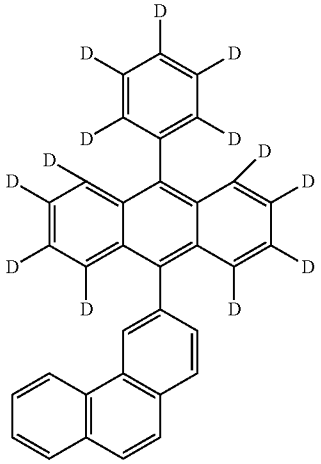

<Compound B9>

Compound B9 (7.2 g, 57.7%) was synthesized in the same manner as in Synthesis Example 1-1, except that Intermediate 4-d and Intermediate 7-c were used instead of phenylanthracene boronic acid and 3-bromophenanthrene, respectively.

MS (MALDI-TOF): m/z 443.25 [$M^+$]

Synthesis Example 8. Synthesis of Compound B13

Synthesis Example 8-1. Synthesis of Intermediate 8-a

Intermediate 8-a was synthesized by Reaction 22:

[Reaction 22]

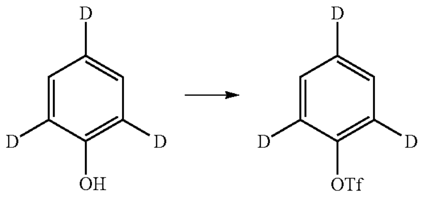

<8-a>

Intermediate 8-a (35.4 g, 75.0%) was synthesized in the same manner as in Synthesis Example 3-6, except that 2,4,6-deuterium phenol was used instead of Intermediate 3-e.

Synthesis Example 8-2. Synthesis of Intermediate 8-b

Intermediate 8-b was synthesized by Reaction 23:

[Reaction 23]

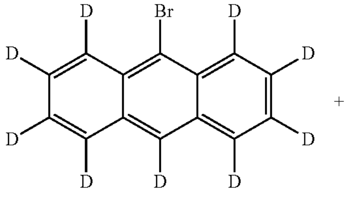

<7-a>

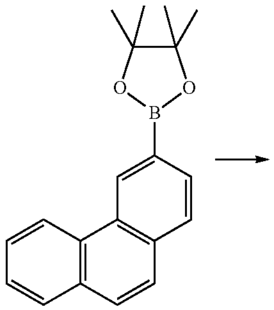

<4-d>

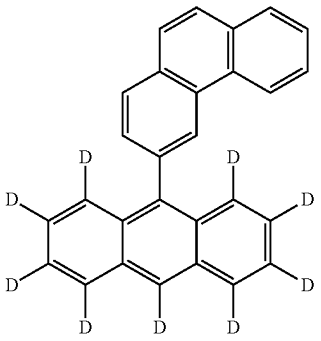

<8-b>

Intermediate 8-b (30.3 g, 67.0%) was synthesized in the same manner as in Synthesis Example 7-2, except that Intermediate 4-d was used instead of phenyl-d5-boronic acid.

Synthesis Example 8-3. Synthesis of Intermediate 8-c

Intermediate 8-c was synthesized by Reaction 24:

[Reaction 24]

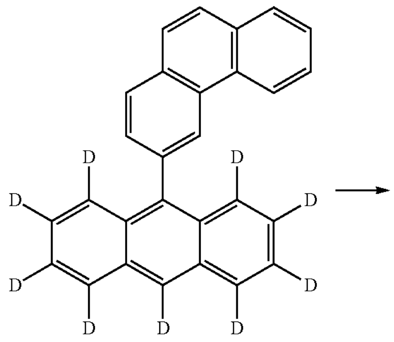

<8-b>

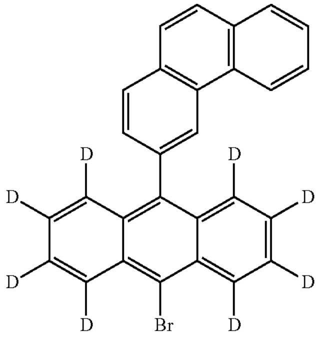

<8-c>

Intermediate 8-c (33.4 g, 85.0%) was synthesized in the same manner as in Synthesis Example 4-3, except that Intermediate 8-b was used instead of Intermediate 4-b.

Synthesis Example 8-4. Synthesis of Intermediate 8-d

Intermediate 8-d was synthesized by Reaction 25:

[Reaction 25]

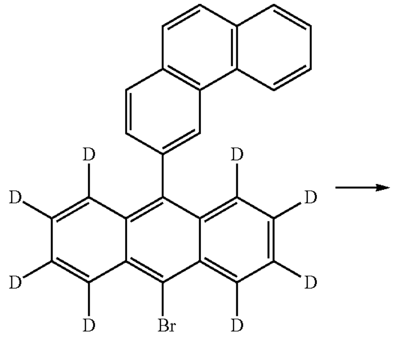

<8-c>

-continued

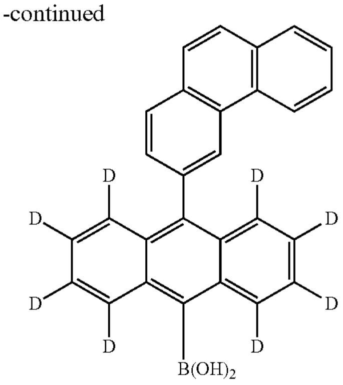

<8-d>

A solution of Intermediate 8-c (33.0 g, 0.075 mol) in 330 mL of tetrahydrofuran was placed in a 1 L round-bottom flask. The solution was cooled to −78° C. and stirred under a nitrogen atmosphere. To the cooled reaction solution was slowly added dropwise n-butyllithium (1.6 M, 51.4 mL, 0.082 mol). After the dropwise addition was finished, the resulting mixture was stirred at the same temperature for 1 h. To the reaction solution was added dropwise trimethyl borate (10.8 g, 0.097 mol), followed by stirring at room temperature for 2 h. After completion of the reaction, the reaction mixture was acidified with 2 M hydrochloric acid and extracted. The organic layer was separated, dried over anhydrous magnesium sulfate, concentrated under reduced pressure, and recrystallized from heptane to afford Intermediate 8-d (24.3 g, yield 80%).

Synthesis Example 8-5. Synthesis of Compound B13

Compound B13 was synthesized by Reaction 26:

[Reaction 26]

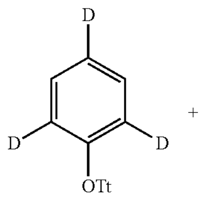

<8-a>

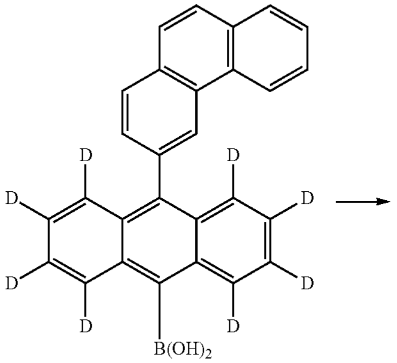

<8-d>

-continued

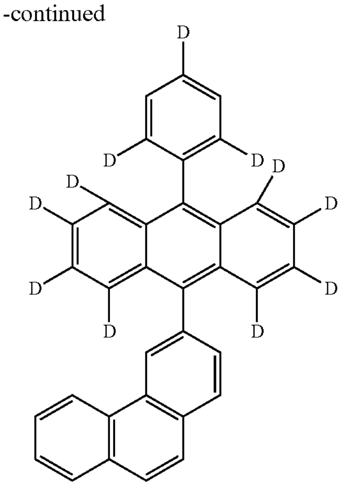

<Compound B13>

Compound B13 (4.3 g, 57.7%) was synthesized in the same manner as in Synthesis Example 1-1, except that Intermediate 8-d and Intermediate 8-a were used instead of phenylanthracene boronic acid and 3-bromophenanthrene, respectively.

MS (MALDI-TOF): m/z 441.24 [$M^+$]

Synthesis Example 9. Synthesis of Compound B14

Synthesis Example 9-1. Synthesis of Intermediate 9-a

Intermediate 9-a was synthesized by Reaction 27:

[Reaction 27]

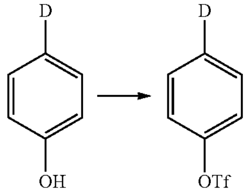

<9-a>

Intermediate 9-a (20.5 g, 73.5%) was synthesized in the same manner as in Synthesis Example 3-6, except that 4-deuterium phenol was used instead of Intermediate 3-e.

Synthesis Example 9-2. Synthesis of Compound B14

Compound B14 was synthesized by Reaction 28:

[Reaction 28]

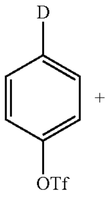

<9-a>

-continued

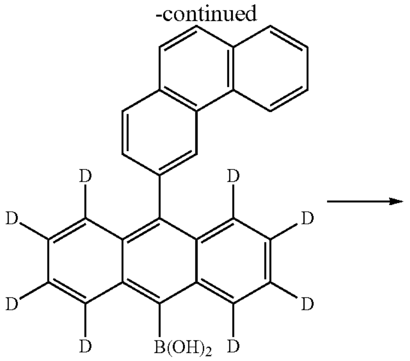

<8-d>

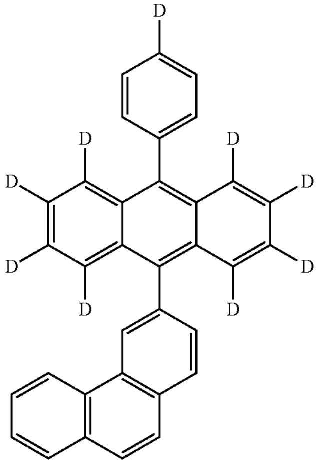

<Compound B14>

Compound B14 (5.1 g, 53.4%) was synthesized in the same manner as in Synthesis Example 1-1, except that Intermediate 8-d and Intermediate 9-a were used instead of phenylanthracene boronic acid and 3-bromophenanthrene, respectively.

MS (MALDI-TOF): m/z 439.23 [$M^+$]

Examples 1-21. Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-6}$ torr. DNTPD and the compound of Formula H were sequentially deposited on the ITO glass to form a 700 Å thick hole injecting layer and a 250 Å thick hole transport layer, respectively. A mixture of the corresponding host compound and the corresponding dopant compound (2 wt %) shown in Table 1 was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. Al was deposited on the electron injecting layer to form a 1000 Å thick Al electrode, completing the fabrication of an organic electroluminescent device. The luminescent properties of the organic electroluminescent device were measured at 0.4 mA.

<E-1>
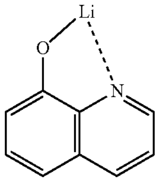
<E-2>
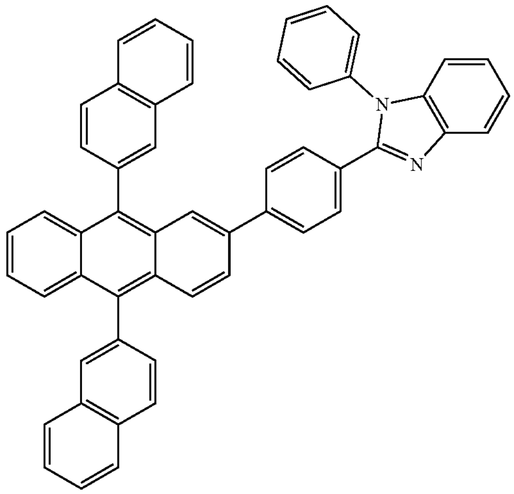
<DNTPD>
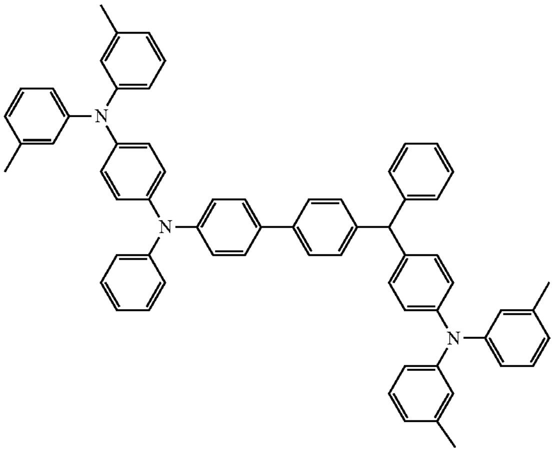
<H>
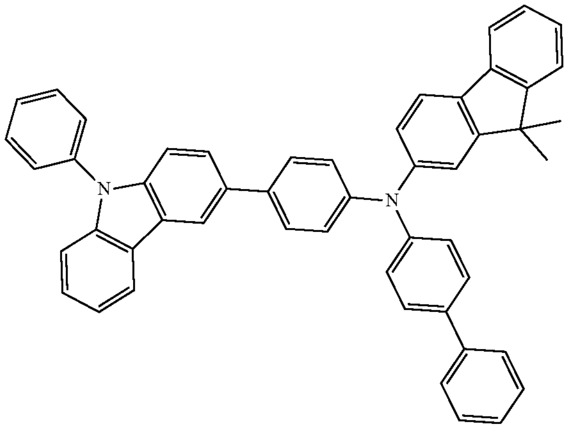
Comparative Examples 1-6
Organic electroluminescent devices were fabricated in the same manner as in Examples 1-21, except that BH1, BH-2 or BH-3 as a host compound and BD1, BD2, BD3 or BD4 as a dopant compound were used instead of the inventive compounds. The structures of BH1, BH2, BH3, BD1, BD2, BD3, and BD4 are as follow:
<BH1>
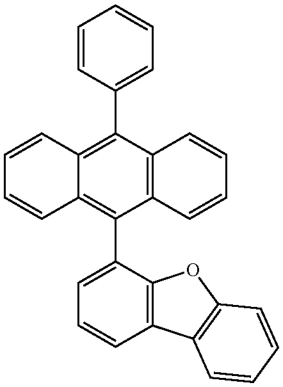
<BH2>
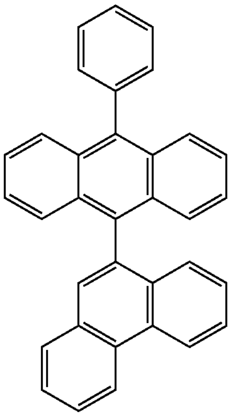
<BH3>
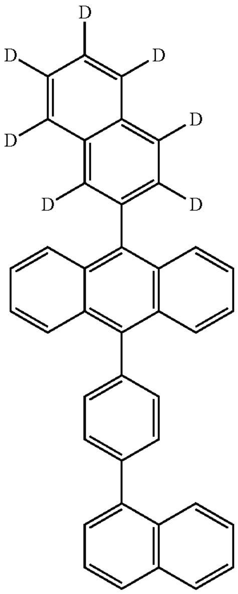

-continued

<BD1>

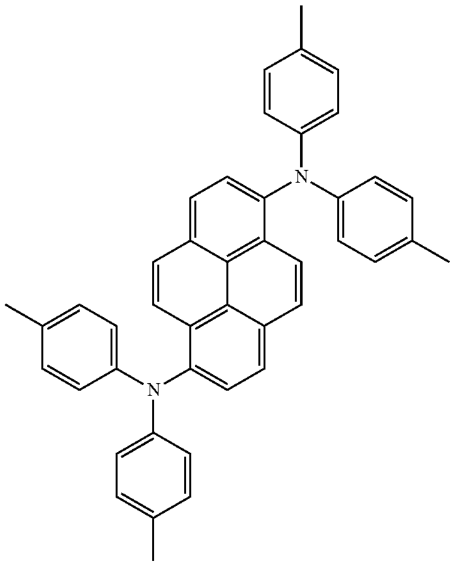

<BD2>

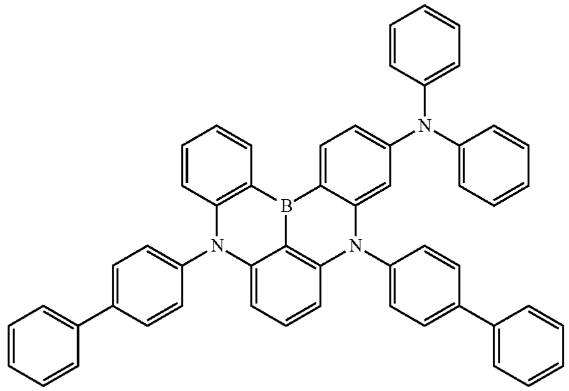

<BD3>

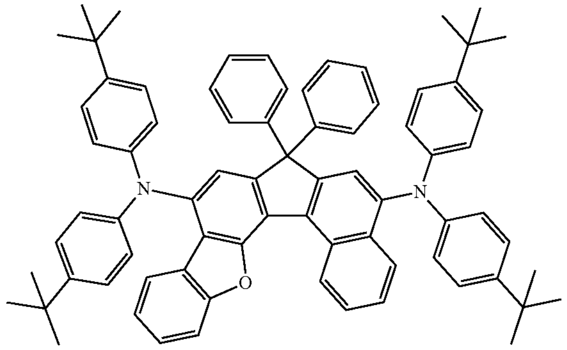

-continued

<BD4>

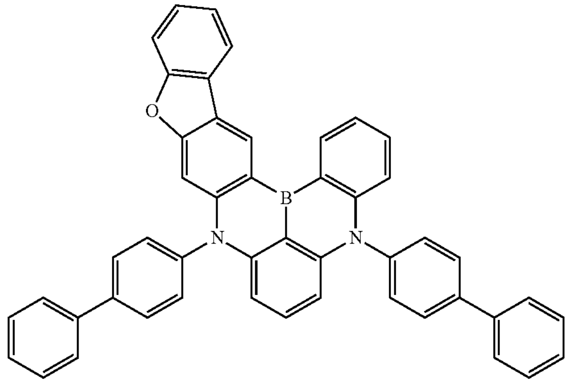

The organic electroluminescent devices of Examples 1-21 and Comparative Examples 1-6 were measured for voltage, luminance, color coordinates, external quantum efficiency, and lifetime. The results are shown in Table 1.

TABLE 1

| Example No. | Host | Dopant | V | cd/A | EQE | CIEx | CIEy | T95 |
|---|---|---|---|---|---|---|---|---|
| Example 1 | B1 | A1 | 3.97 | 732 | 8.8 | 0.135 | 0.083 | 180 |
| Example 2 | B2 | A2 | 3.95 | 745 | 8.7 | 0.130 | 0.097 | 195 |
| Example 3 | B3 | A13 | 3.85 | 767 | 8.9 | 0.130 | 0.110 | 200 |
| Example 4 | B4 | A65 | 3.90 | 785 | 8.8 | 0.133 | 0.089 | 215 |
| Example 5 | B5 | A73 | 3.96 | 771 | 8.5 | 0.136 | 0.075 | 197 |
| Example 6 | B6 | A109 | 3.90 | 750 | 8.3 | 0.133 | 0.105 | 200 |
| Example 7 | B7 | A126 | 3.97 | 787 | 8.7 | 0.137 | 0.102 | 217 |
| Example 8 | B8 | A150 | 3.91 | 757 | 9.0 | 0.133 | 0.093 | 212 |
| Example 9 | B9 | A153 | 3.91 | 780 | 8.8 | 0.132 | 0.092 | 210 |
| Example 10 | B1 | A145 | 3.98 | 776 | 8.9 | 0.132 | 0.091 | 220 |
| Example 11 | B2 | A146 | 3.97 | 765 | 8.7 | 0.132 | 0.088 | 213 |
| Example 12 | B3 | A68 | 3.98 | 780 | 8.8 | 0.133 | 0.092 | 224 |
| Example 13 | B4 | A46 | 3.99 | 776 | 8.7 | 0.137 | 0.089 | 210 |
| Example 14 | B5 | A151 | 4.01 | 756 | 9.1 | 0.132 | 0.086 | 220 |
| Example 15 | B8 | A25 | 3.99 | 767 | 8.8 | 0.132 | 0.085 | 221 |
| Example 16 | B9 | A31 | 3.97 | 776 | 8.9 | 0.133 | 0.086 | 216 |
| Example 17 | B11 | A62 | 3.98 | 758 | 8.8 | 0.134 | 0.083 | 215 |
| Example 18 | B13 | A68 | 3.98 | 781 | 8.8 | 0.133 | 0.092 | 229 |
| Example 19 | B14 | A148 | 3.97 | 762 | 8.9 | 0.136 | 0.082 | 220 |
| Example 20 | B15 | A149 | 3.98 | 778 | 8.8 | 0.134 | 0.086 | 218 |
| Example 21 | B16 | A157 | 3.99 | 779 | 8.9 | 0.132 | 0.089 | 223 |
| Comparative Example 1 | B1 | BD3 | 3.85 | 785 | 8.3 | 0.136 | 0.114 | 124 |
| Comparative Example 2 | B1 | BD2 | 3.97 | 730 | 8.7 | 0.127 | 0.101 | 130 |
| Comparative Example 3 | BH1 | A68 | 4.12 | 770 | 8.7 | 0.135 | 0.083 | 120 |
| Comparative Example 4 | BH2 | BD1 | 4.01 | 761 | 8.3 | 0.137 | 0.12 | 80 |
| Comparative Example 5 | BH3 | BD1 | 3.98 | 758 | 8.4 | 0.136 | 0.121 | 83 |
| Comparative Example 6 | B1 | BD4 | 3.94 | 710 | 8.8 | 0.128 | 0.105 | 122 |

As can be seen from the results in Table 1, the organic electroluminescent devices of Examples 1-21, each of which employed the compound of Formula B and the compound of Formula A-1 or A-2 as host and dopant materials for the light emitting layer, showed high color purities. Particularly, the organic electroluminescent devices of Examples 1-21 had greatly improved lifetimes.

What is claimed is:

1. An organic electroluminescent device comprising a first electrode, a second electrode opposite to the first electrode, and a light emitting layer interposed between the first and second electrodes wherein the light emitting layer comprises a compound represented by Formula A-1 or A-2:

(A-1)

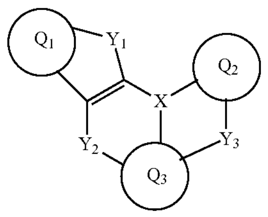

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ heteroaromatic ring;

wherein the linker $Y_1$ is selected from N—$R_1$, $CR_2R_3$, Se, and $SiR_4R_5$, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_1$ to form an alicyclic or aromatic monocyclic or polycyclic ring, $R_2$ and $R_3$ are optionally linked to each other to form an alicyclic or aromatic monocyclic or polycyclic ring, and $R_4$ and $R_5$ are optionally linked to each other to form an alicyclic or aromatic monocyclic or polycyclic ring;

wherein the linkers $Y_2$ and $Y_3$ are identical to or different from each other and are each independently selected from N—$R_1$, $CR_2R_3$, Se, and $SiR_4R_5$, X is selected from B, P, and P═O, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_2$ or $Q_3$ to form an alicyclic or aromatic monocyclic or polycyclic ring, $R_2$ and $R_5$ are optionally linked to each other to form an alicyclic or aromatic monocyclic or polycyclic ring, and $R_4$ and $R_5$ are optionally linked to each other to form an alicyclic or aromatic monocyclic or polycyclic ring;

(A-2)

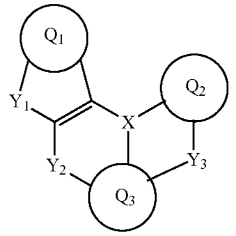

wherein $Q_1$, $Q_2$, $Q_3$, X, and $Y_1$ to $Y_3$ are as defined in Formula A-1; and an anthracene derivative represented by Formula B:

(B)

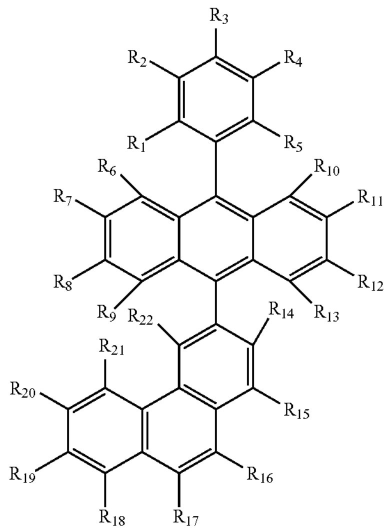

wherein $R_1$ to $R_5$ are each independently hydrogen, deuterium or $C_6$-$C_{24}$ aryl and $R_6$ to $R_{22}$ are each independently hydrogen or deuterium, and wherein the compound of Formula A-1 or A-2 has a structure represented by Formula A-3 or A-4:

(A-3)

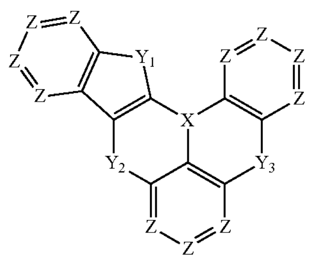

wherein each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms, and X and $Y_1$ to $Y_3$ are as defined in Formulae A-1 and A-2, (A-4)

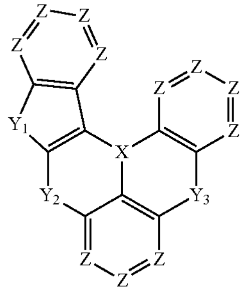

wherein X, $Y_1$ to $Y_3$, and Z are as defined in Formula A-3, and wherein the compound represented by Formula B is selected from the compounds of Formulae B2 to B16:

(B2)

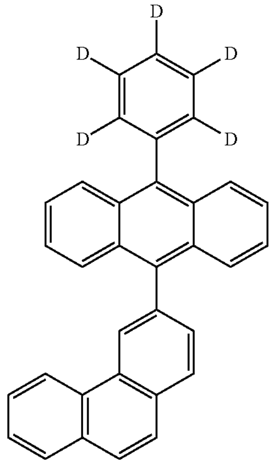

-continued (B3)

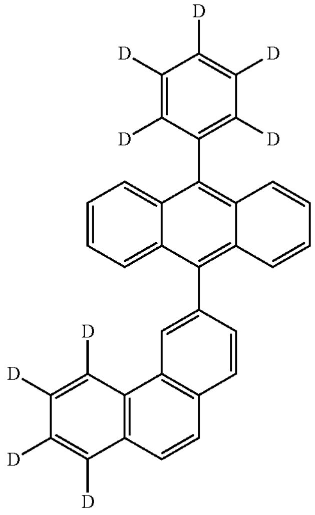

(B4)

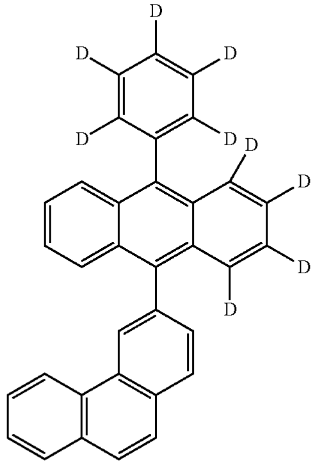

(B5)

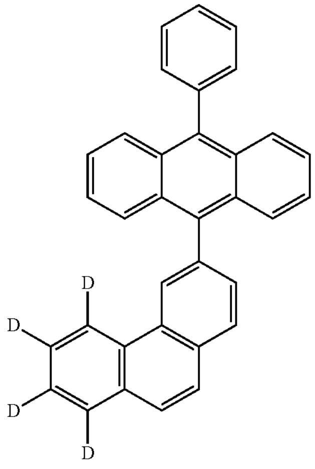

-continued
(B6)
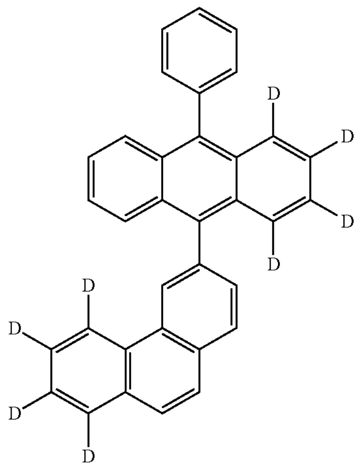
(B7)
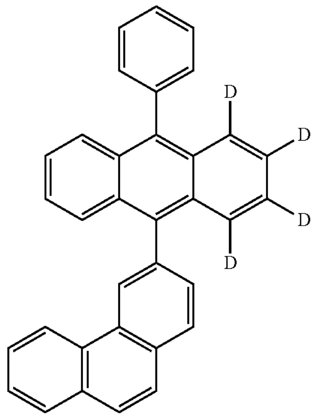
(B8)
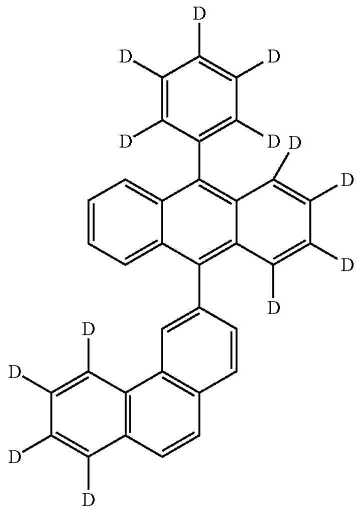
-continued
(B9)
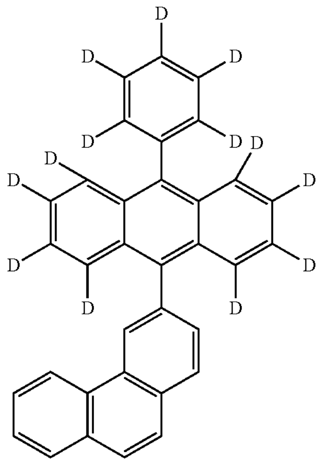
(B10)
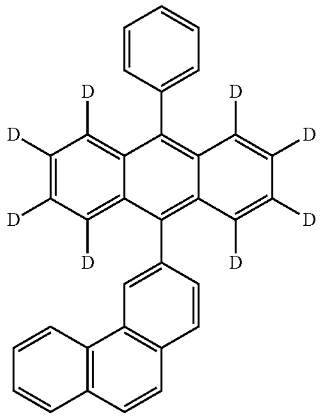
(B11)
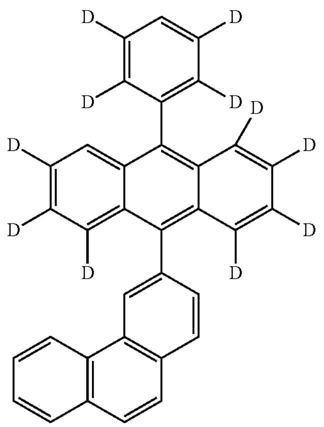

-continued (B12)

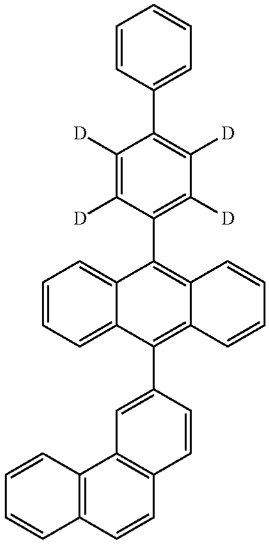

(B13)

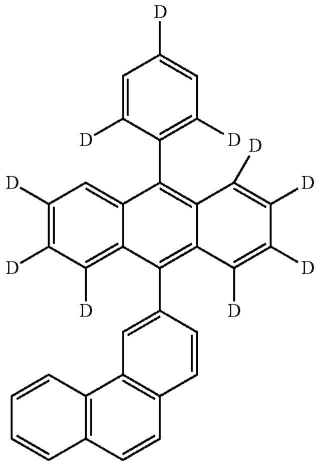

(B14)

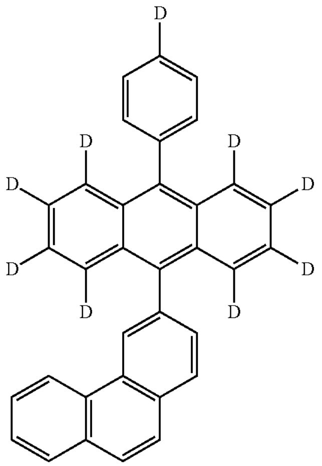

-continued (B15)

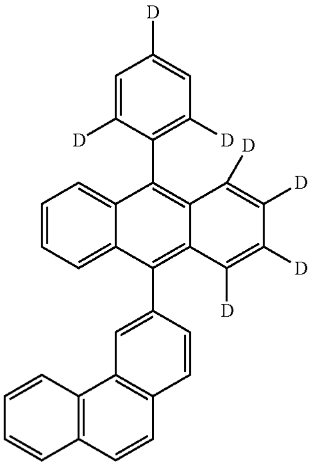

(B16)

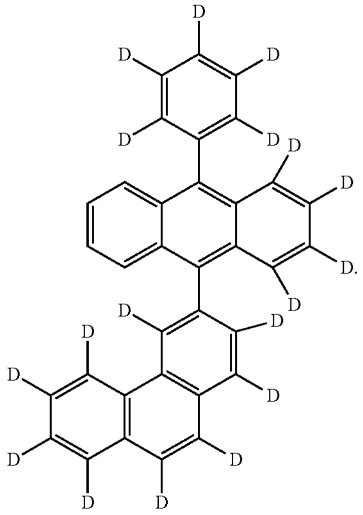

2. The organic electroluminescent device according to claim 1, wherein at least one of $R_6$ to $R_{13}$ in Formula B is deuterium.

3. The organic electroluminescent device according to claim 1, wherein at least one of $R_1$ to $R_5$ in Formula B is deuterium and at least one of $R_6$ to $R_{13}$ in Formula B is deuterium.

4. The organic electroluminescent device according to claim 1, wherein the light emitting layer further comprises, as a host compound, an anthracene derivative represented by Formula C:

(C)

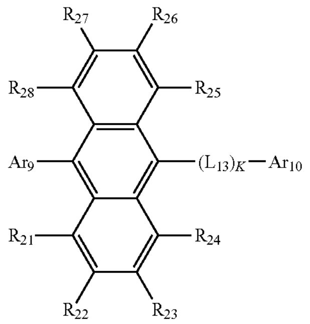

wherein $R_{21}$ to $R_{28}$ are identical to or different from each other and are as defined for $R_1$ to $R_4$ in Formula A-1 or A-2, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

5. The organic electroluminescent device according to claim 4, wherein $Ar_9$ in Formula C is represented by Formula C-1:

(C-1)

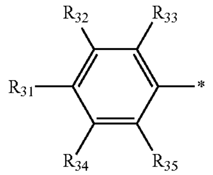

wherein $R_{31}$ to $R_{35}$ are identical to or different from each other and are as defined for $R_1$ to $R_4$ in Formula A, and each of $R_{31}$ to $R_{35}$ is optionally bonded to an adjacent substituent to form a saturated or unsaturated ring.

6. The organic electroluminescent device according to claim 4, wherein compound of Formula C is selected from the compounds of Formulae C1 to C48:

C1

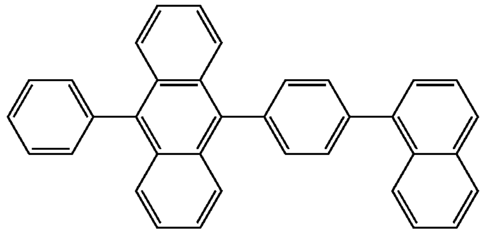

C2

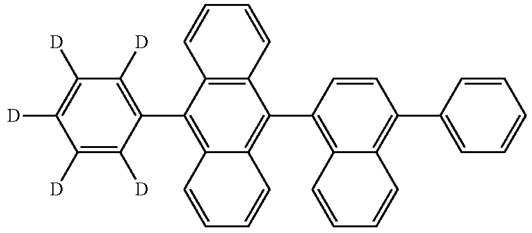

C3

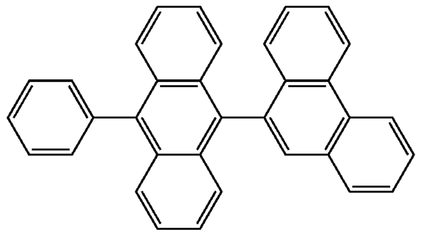

C4

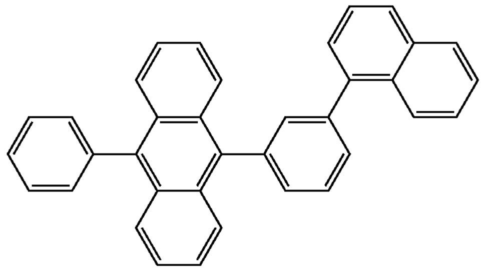

C5

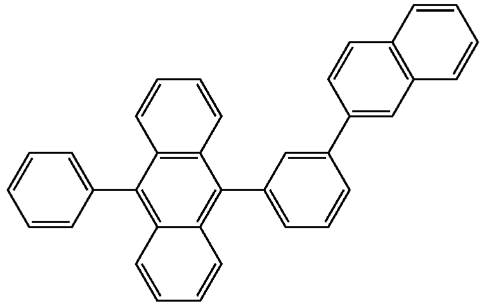

-continued
C6
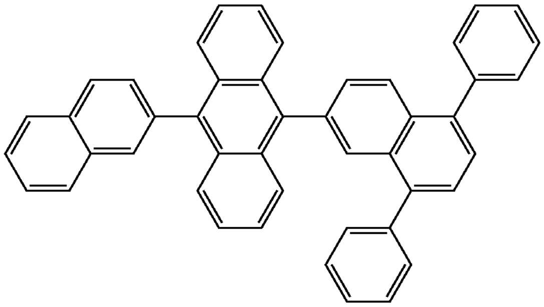
C7
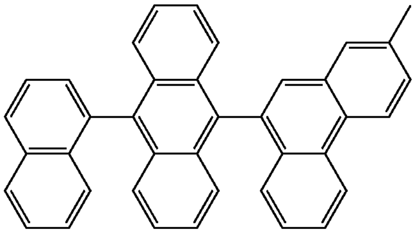
C8
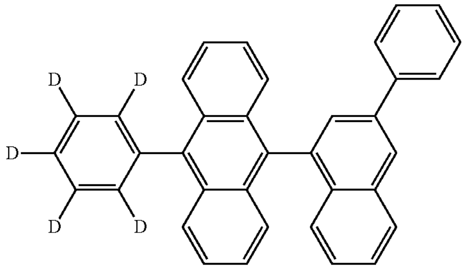
C9
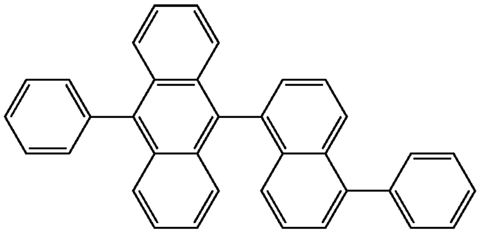
C10
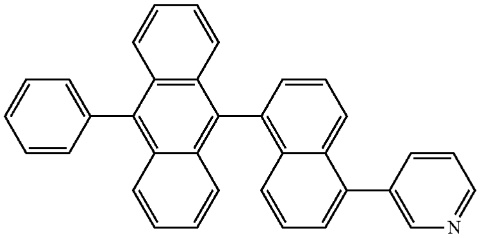
C11
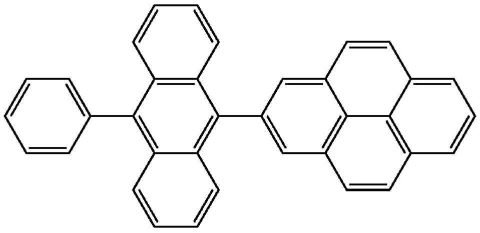
-continued
C12
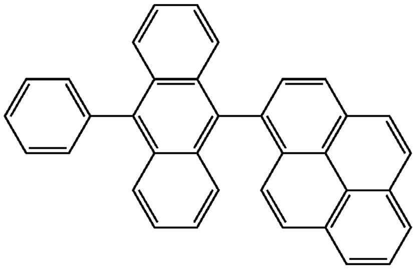
C13
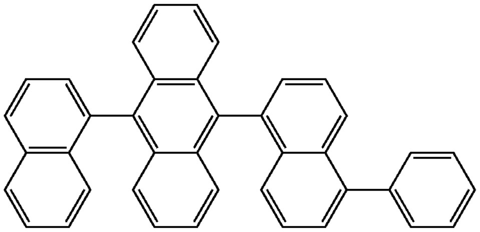
C14
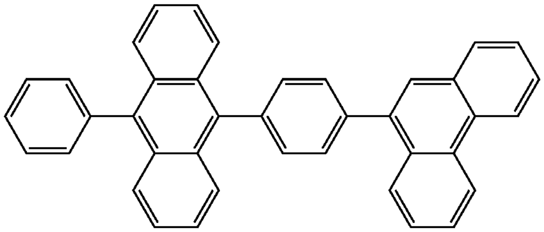
C15
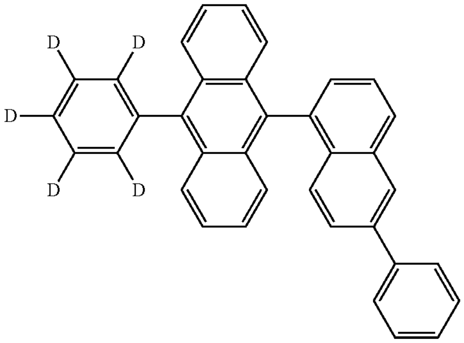
C16
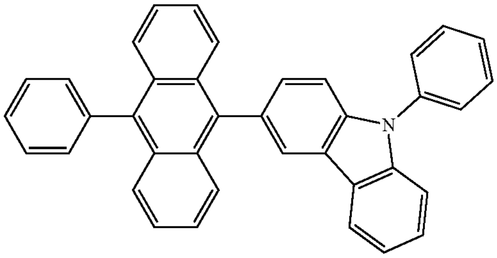

-continued
C17
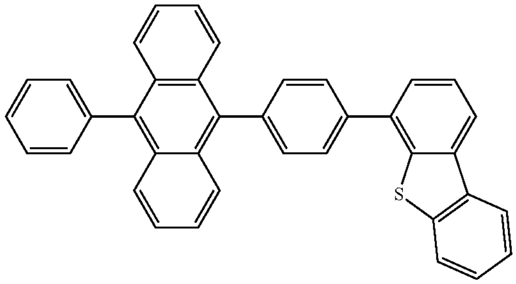
C18
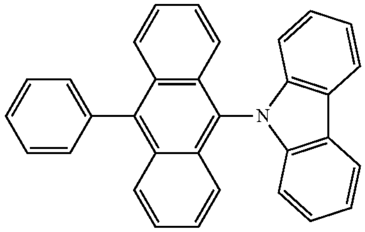
C19
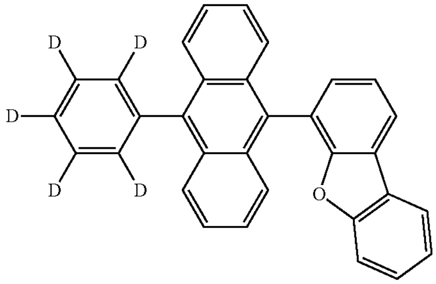
C20
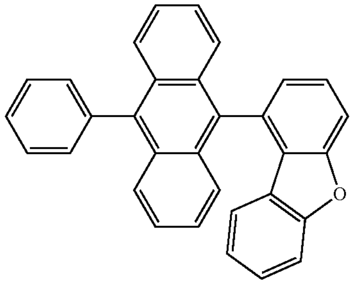
C21
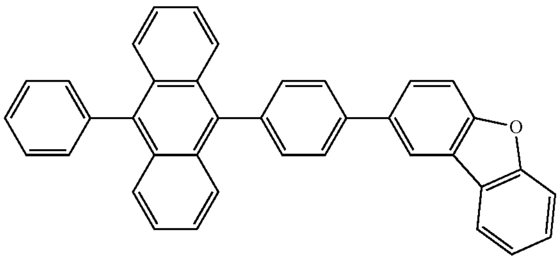
-continued
C22
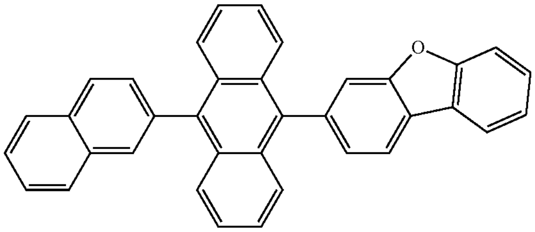
C23
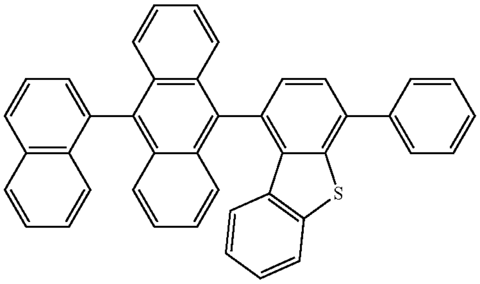
C24
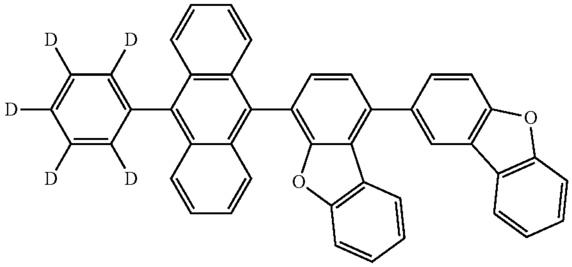
C25
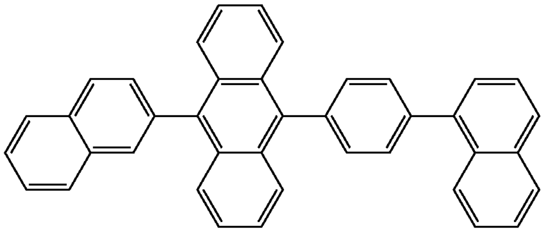
C26
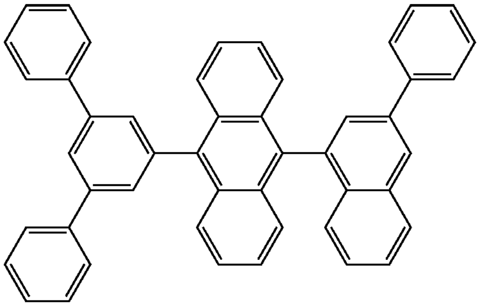

-continued
C27
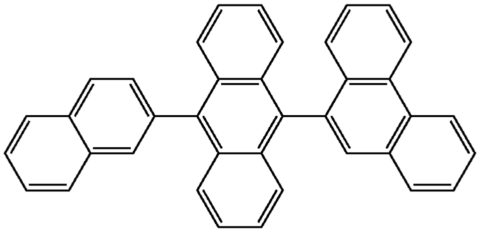
C28
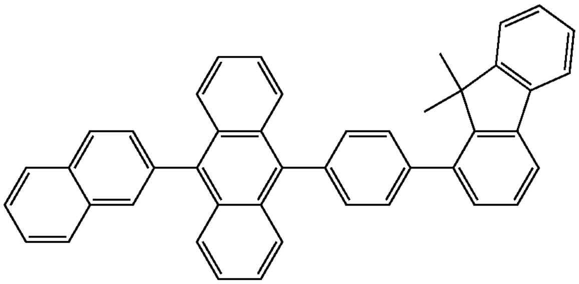
C29
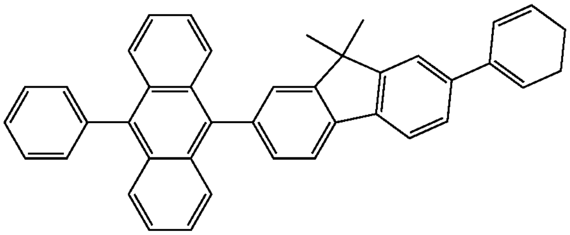
C30
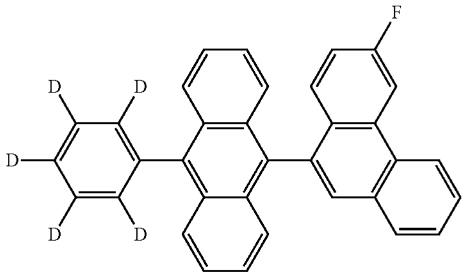
C31
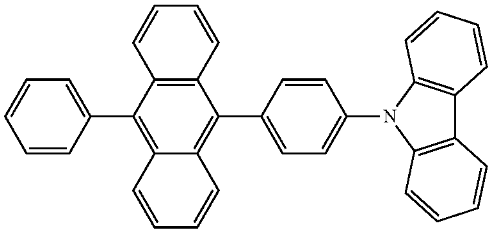
-continued
C32
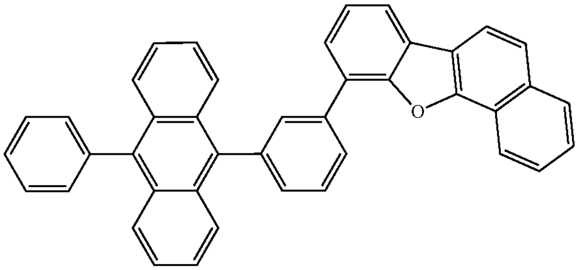
C33
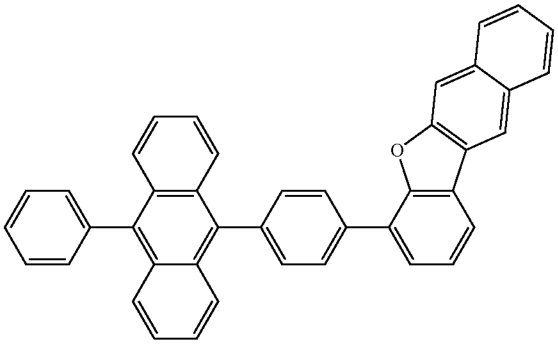
C34
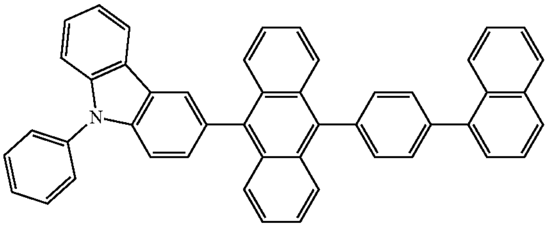
C35
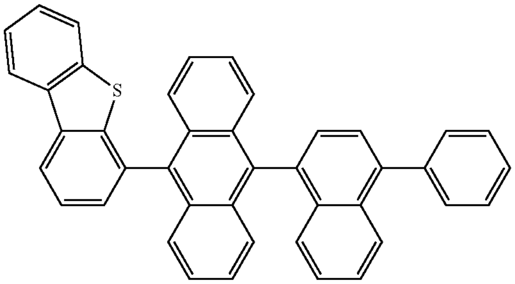
C36
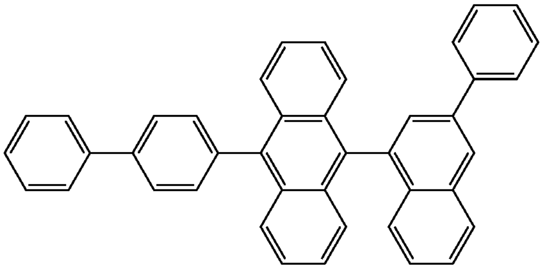

-continued
C37
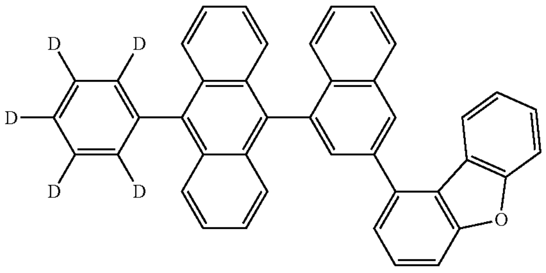
C38
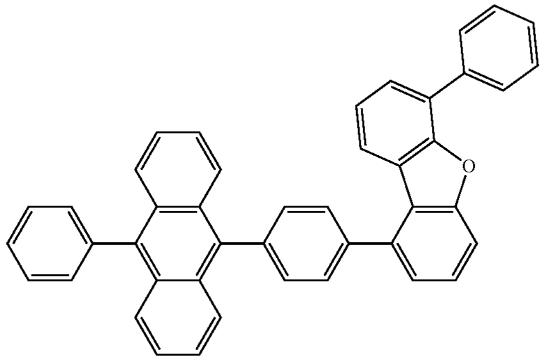
C39
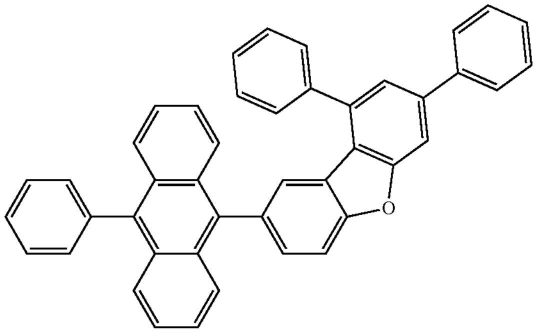
C40
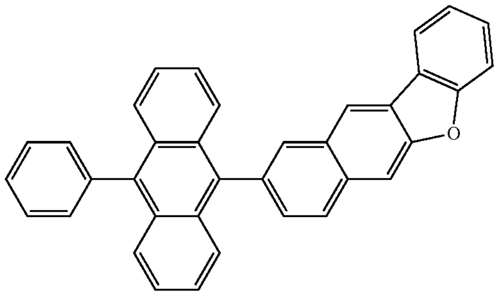
-continued
C41
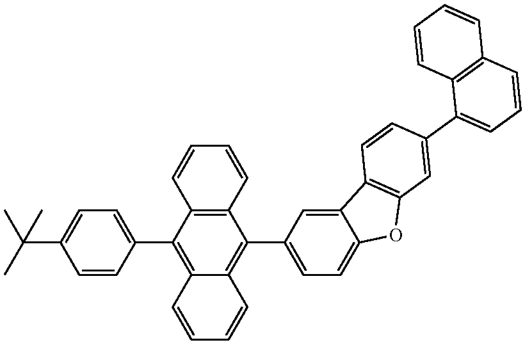
C42
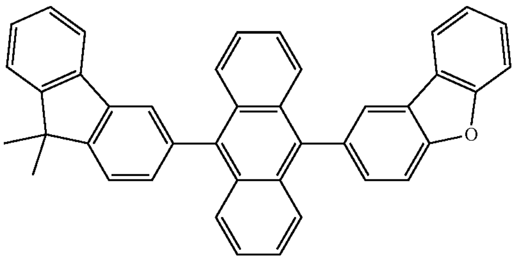
C43
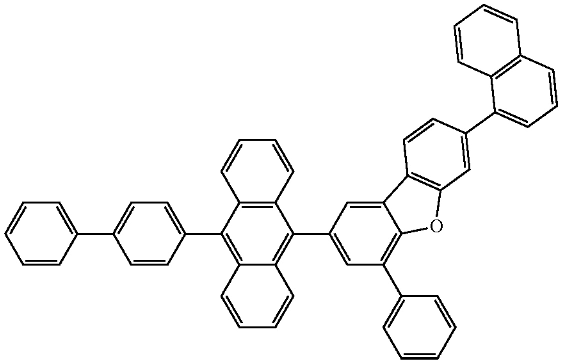
C44
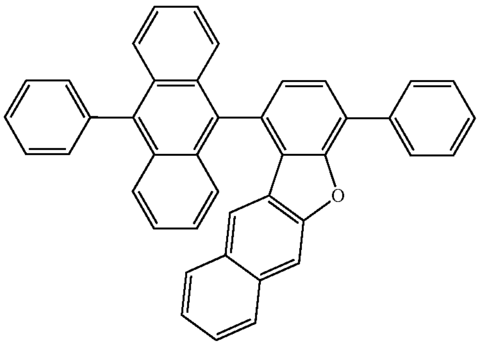

-continued

C45

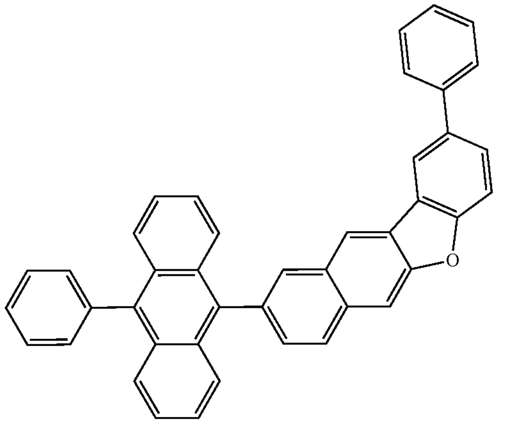

C46

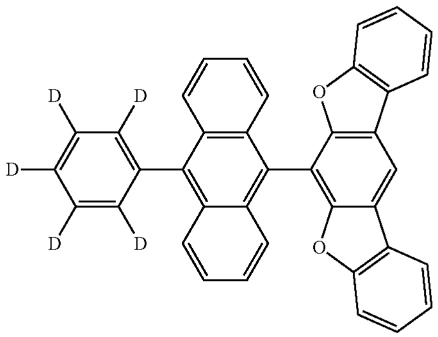

C47

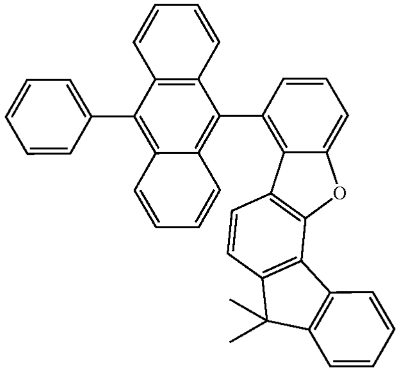

C48

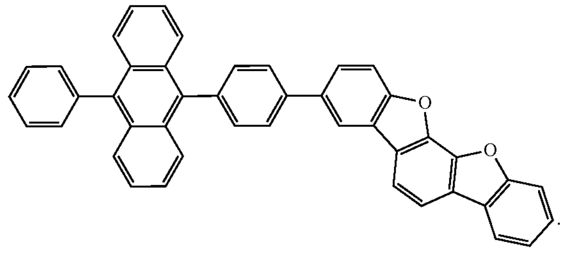

7. The organic electroluminescent device according to claim 1, further comprising a hole transport layer, an electron blocking layer, and a capping layer, each of which comprises a compound represented by Formula D:

(D)

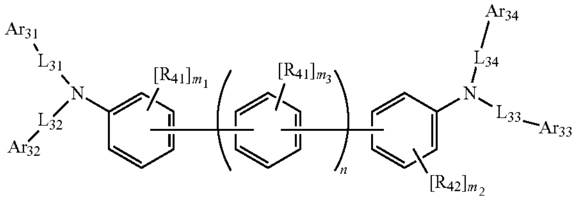

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

8. The organic electroluminescent device according to claim 7, wherein at least one of $Ar_{31}$ to $Ar_{34}$ is represented by Formula E:

(E)

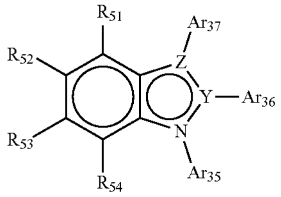

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

9. The organic electroluminescent device according to claim 7, wherein the compound of Formula D is selected from the compounds of Formulae D1 to D79:

D1

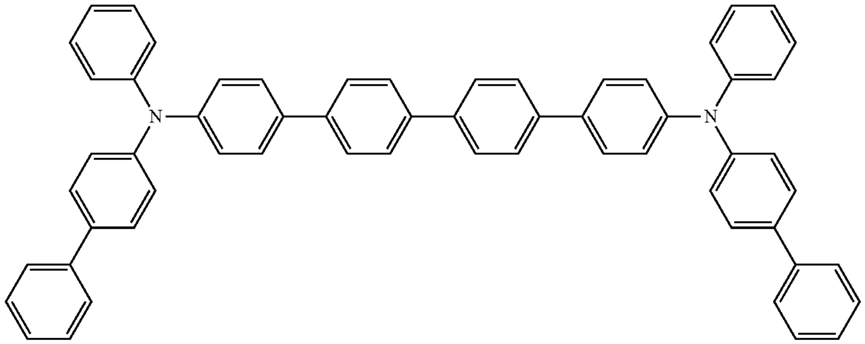

D2

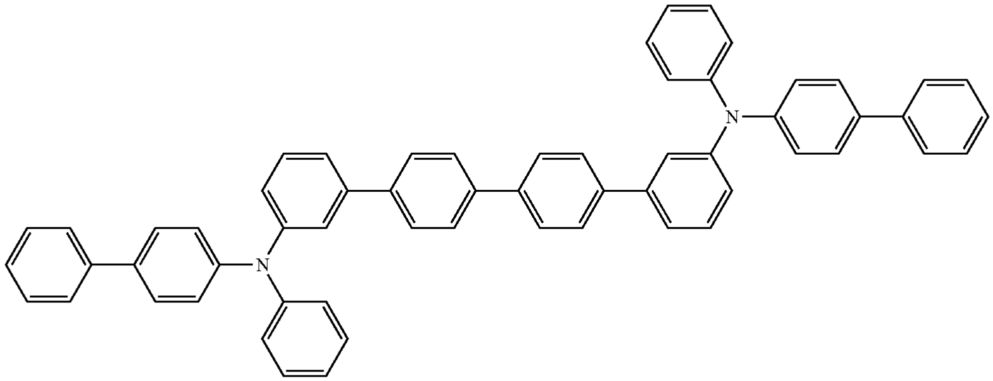

D3

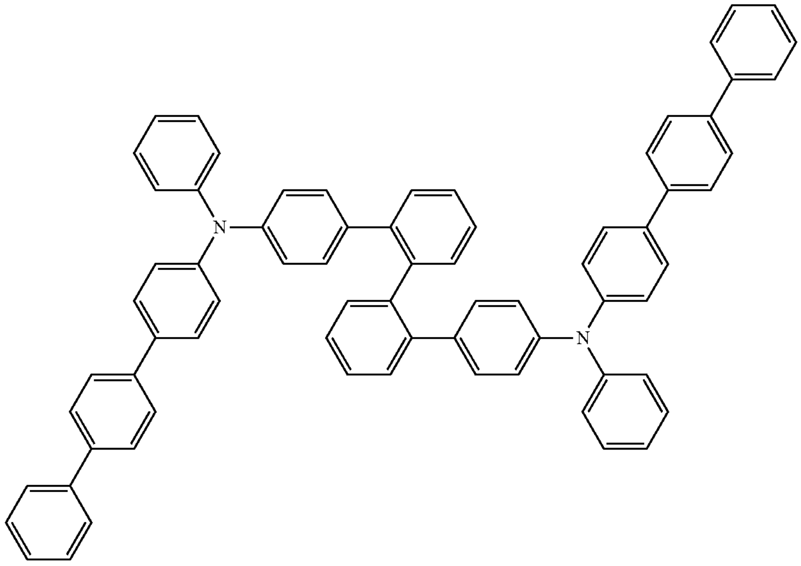

-continued
D4
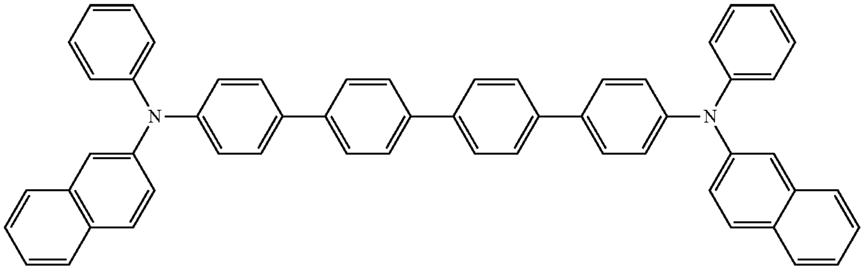
D5
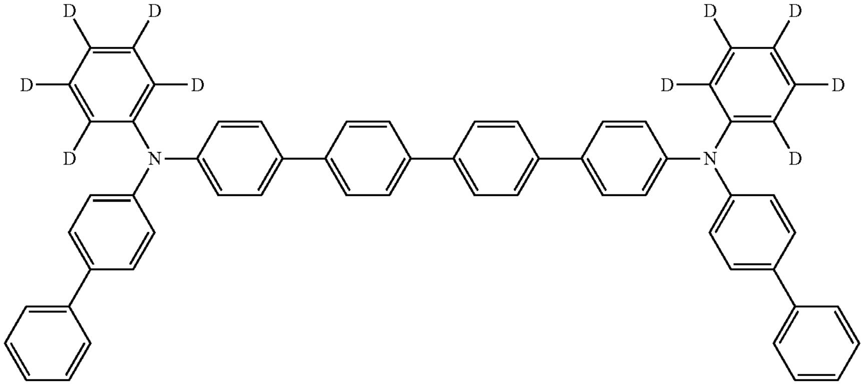
D6
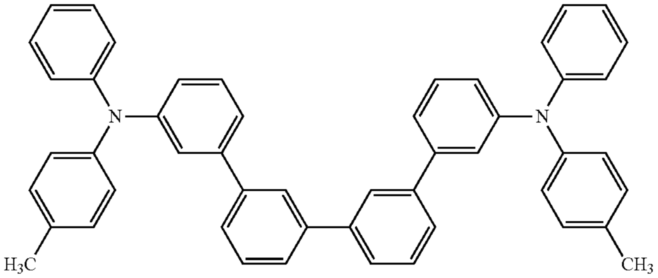
D7
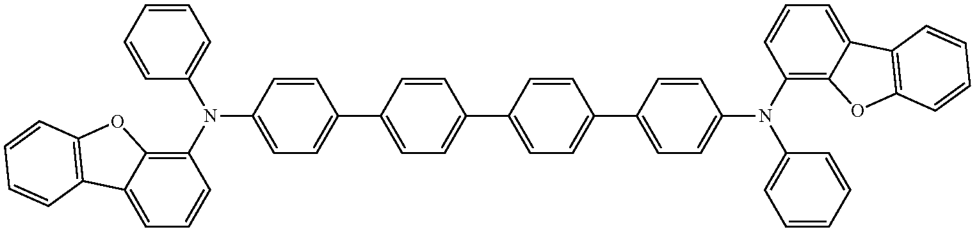
D8
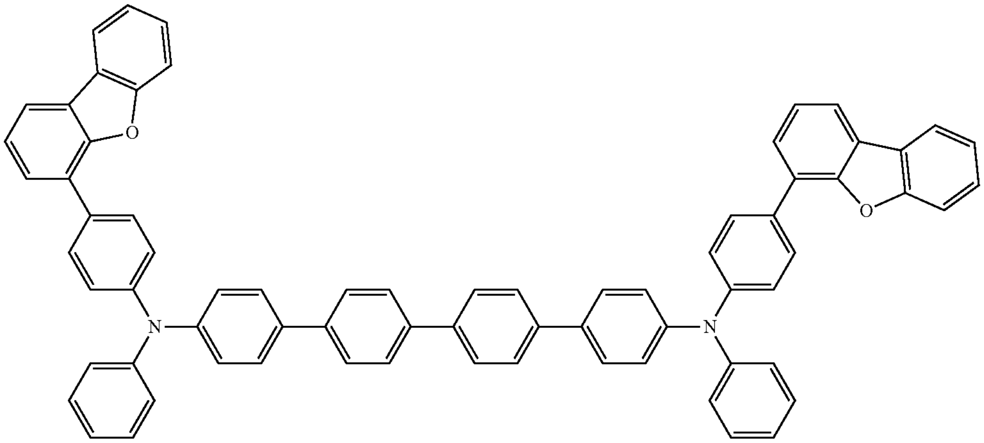

-continued
D9
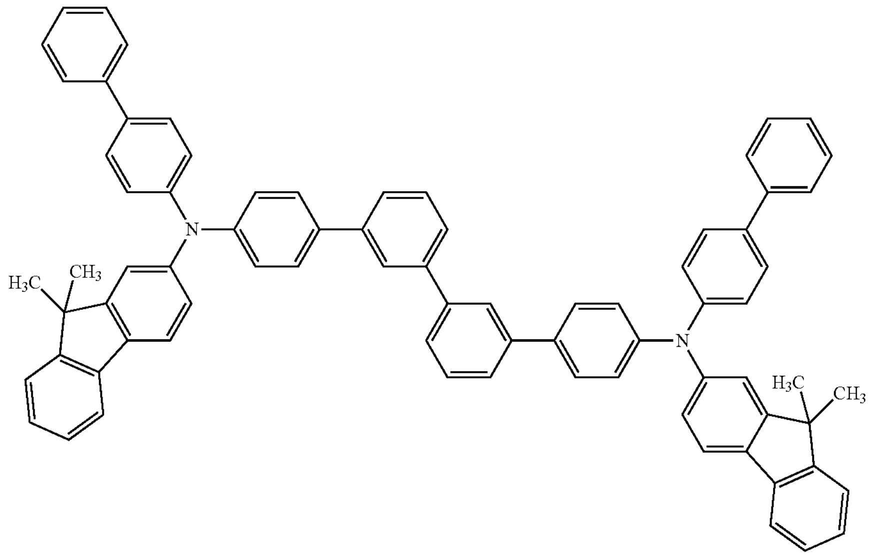
D10
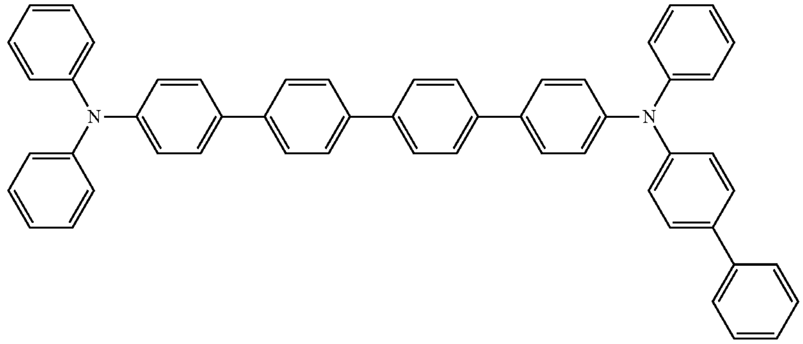
D11
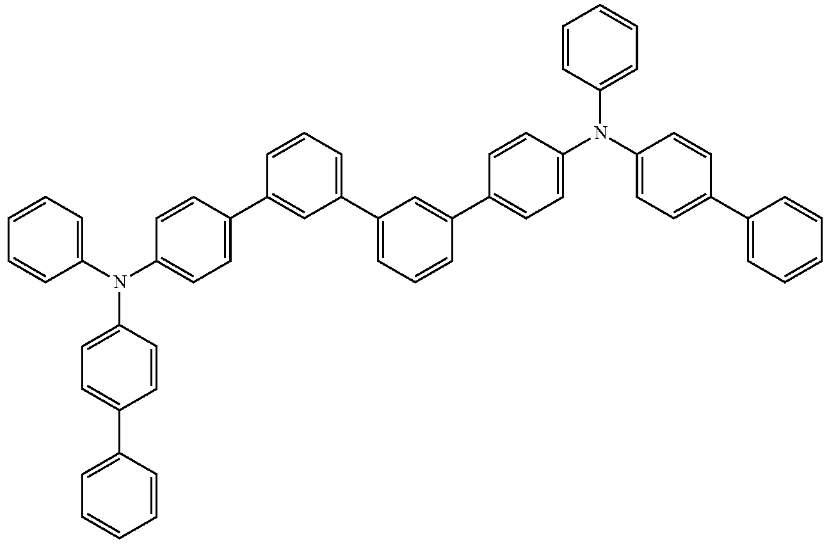

-continued
D12
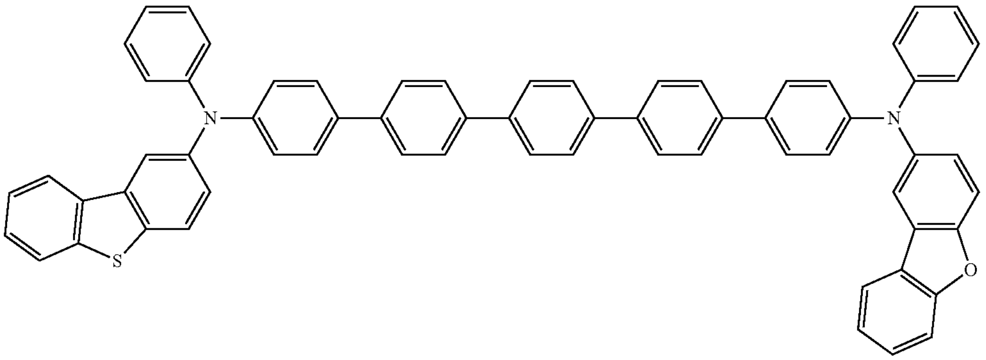
D13
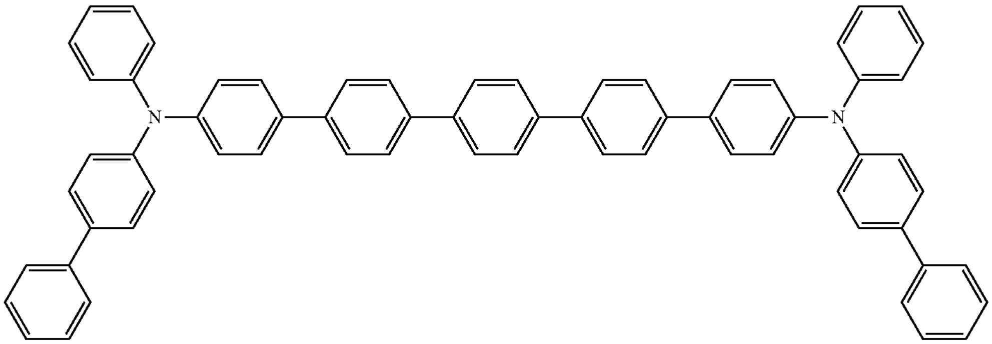
D14
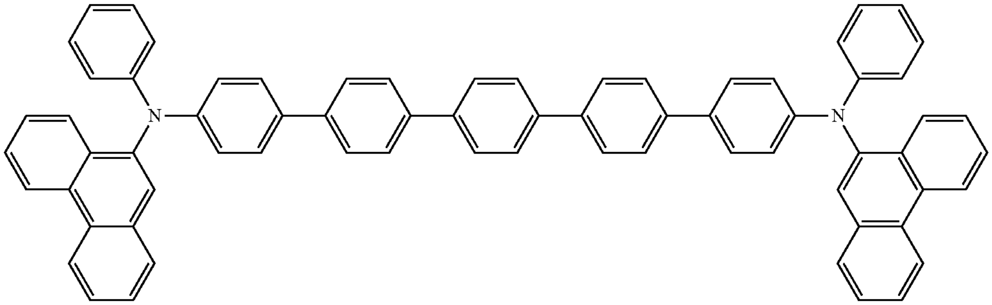
D15
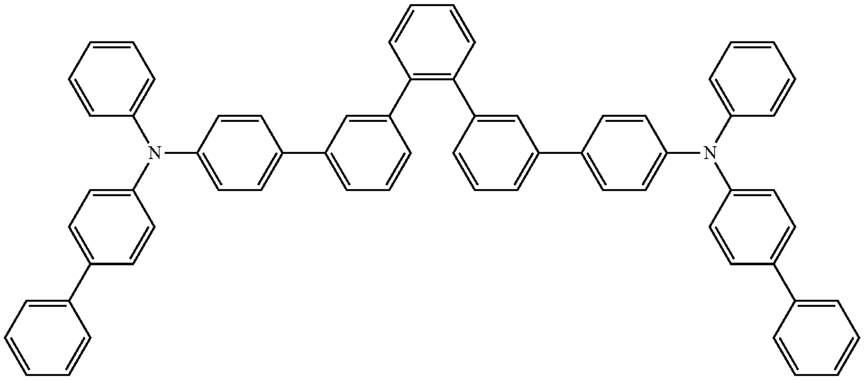

-continued
D16
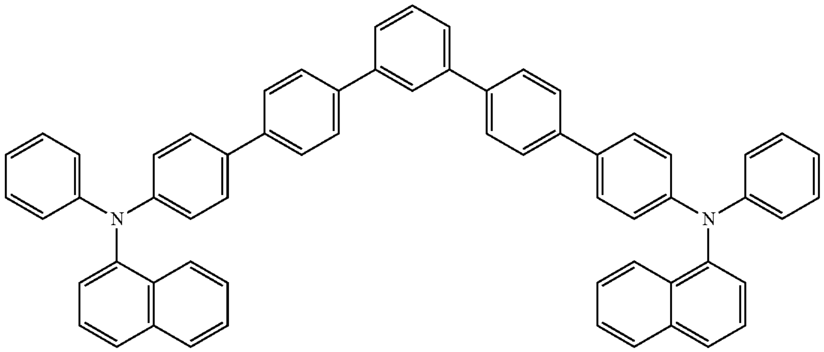
D17
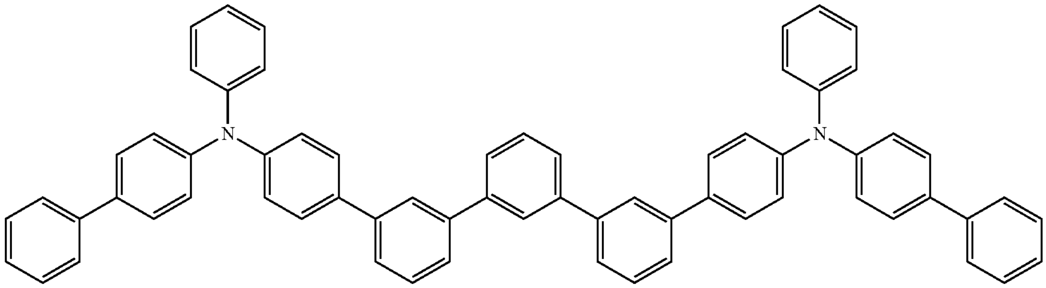
D18
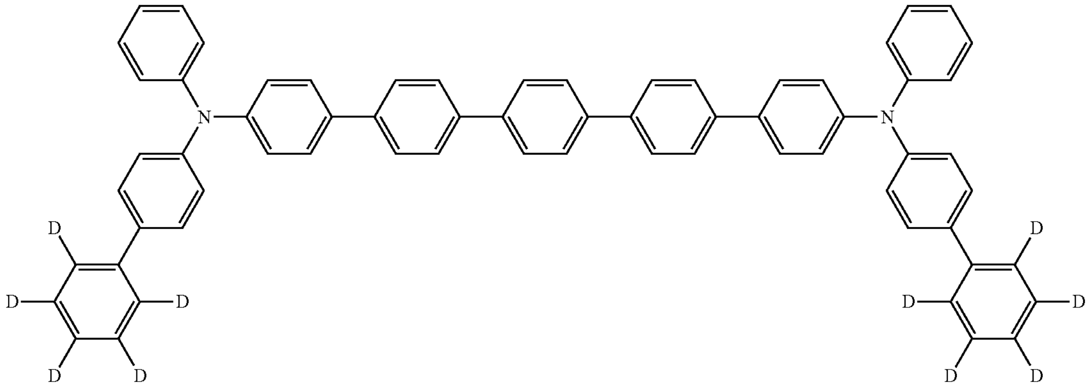
D19
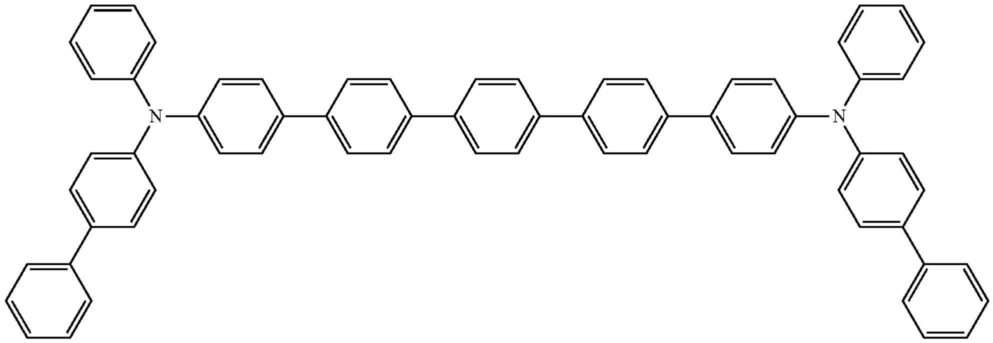

-continued
D20
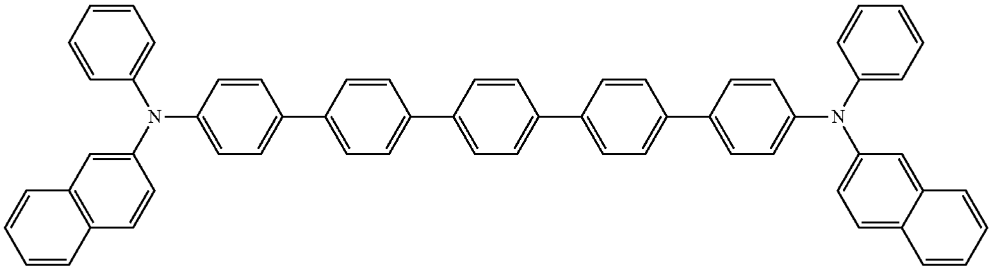
D21
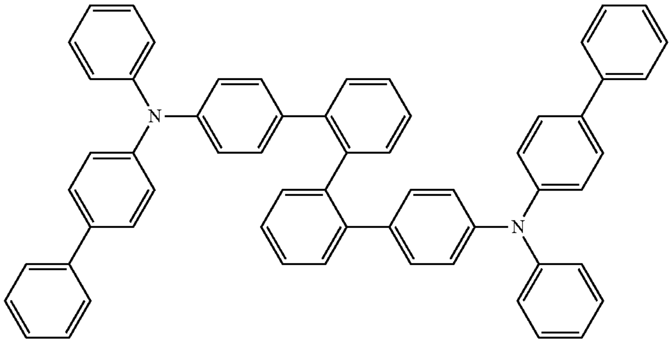
D22
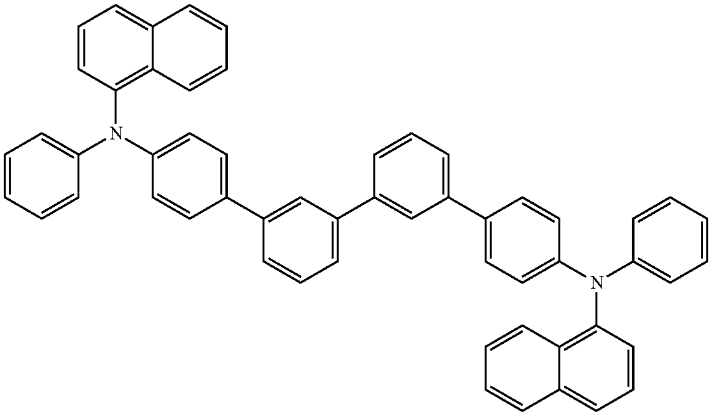
D23
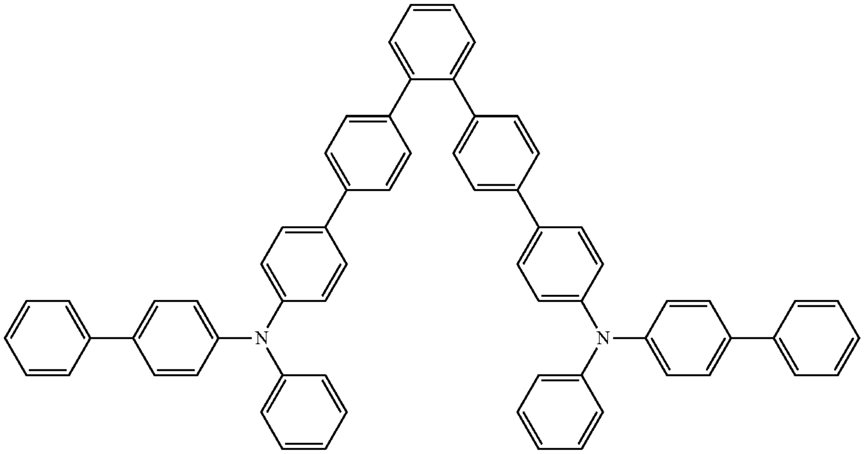

-continued
D24
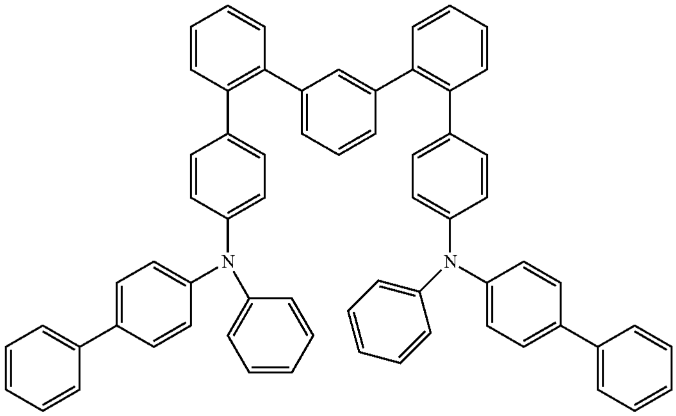
D25
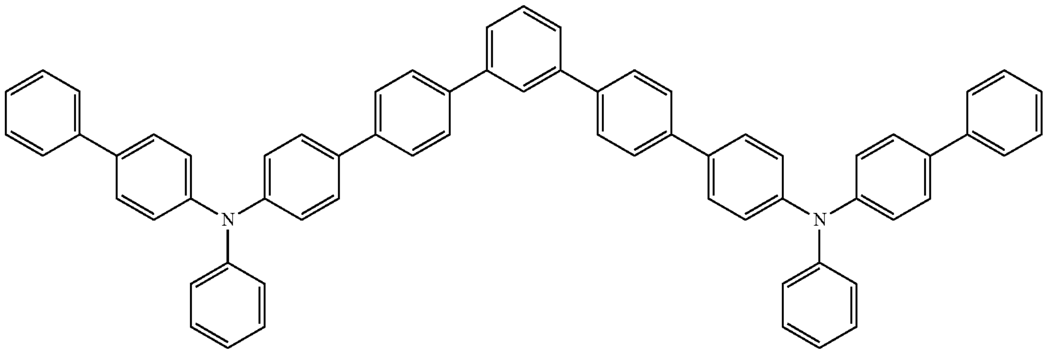
D26
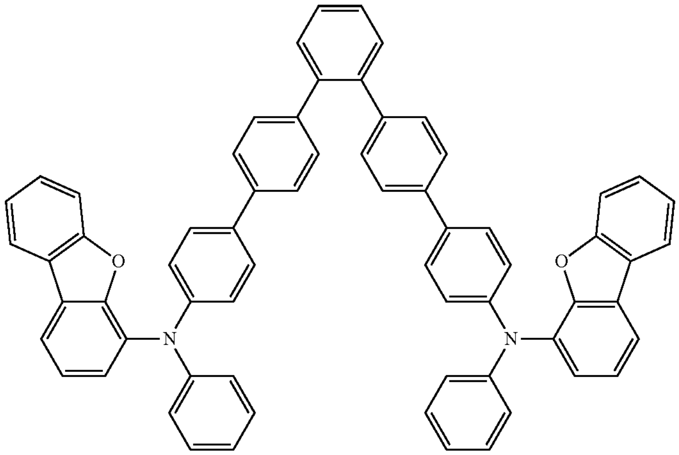
D27
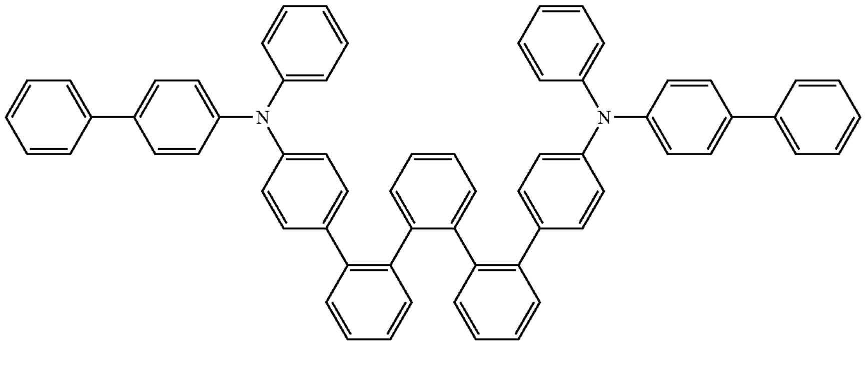

-continued
D28
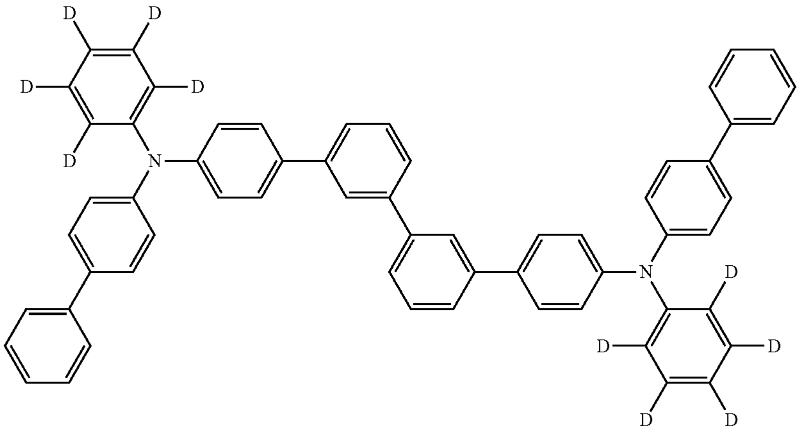
D29
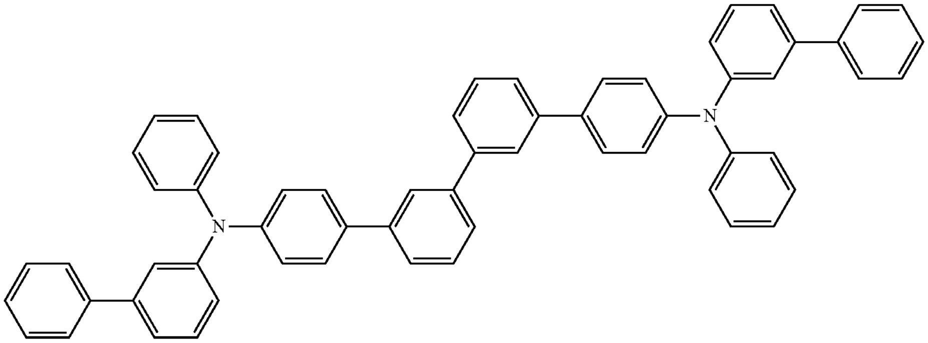
D30
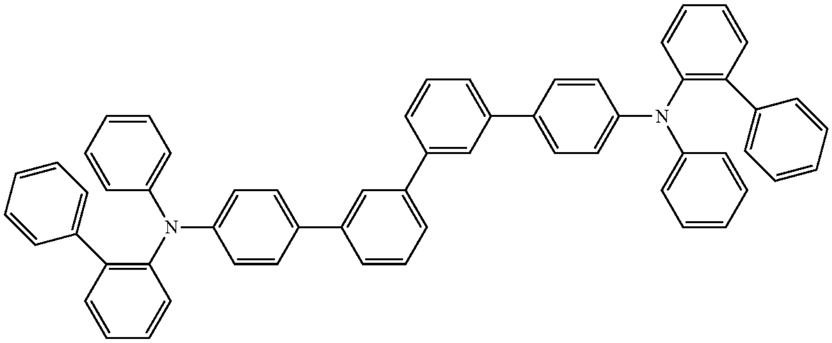
D31
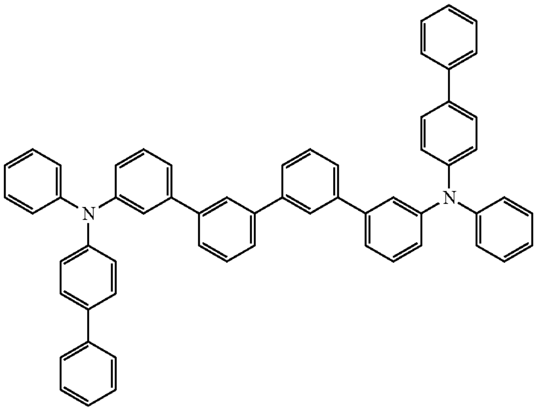
D32
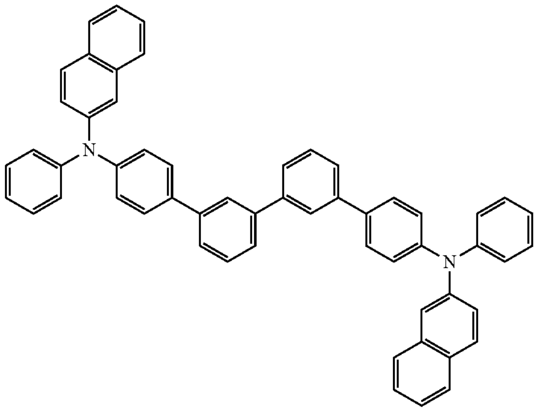

-continued
D33
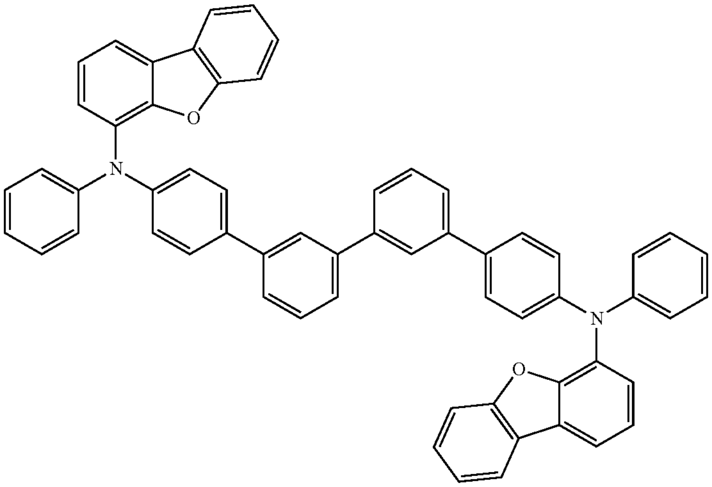
D34
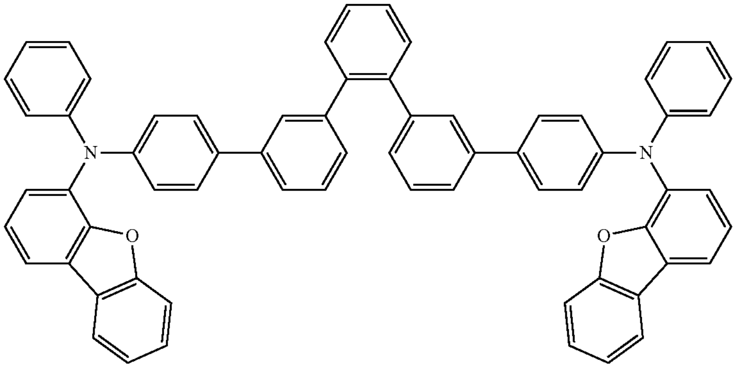
D35
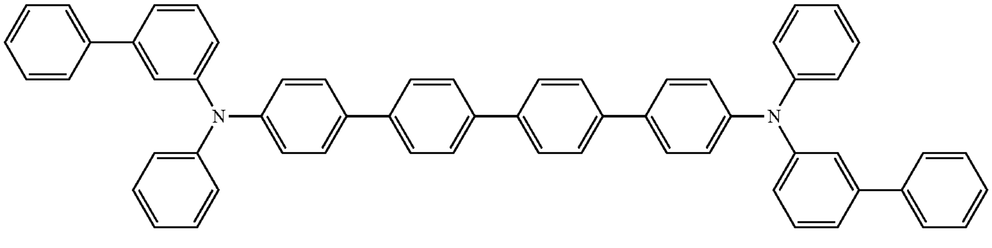
D36
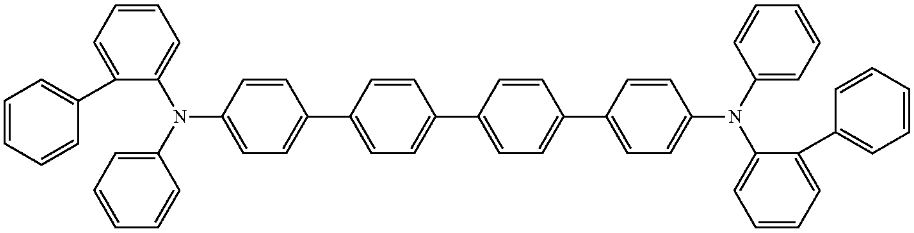

-continued
D37
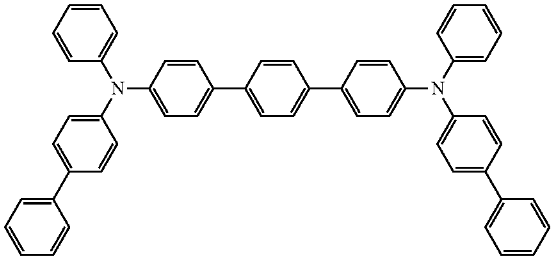
D38
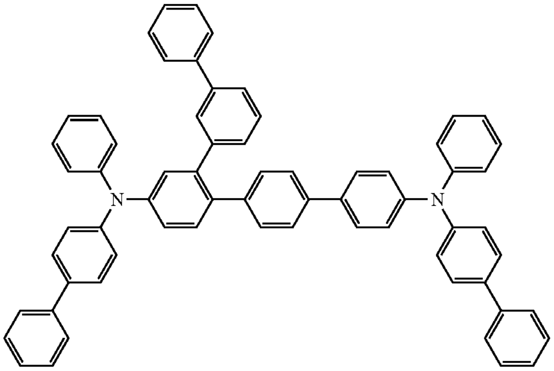
D39
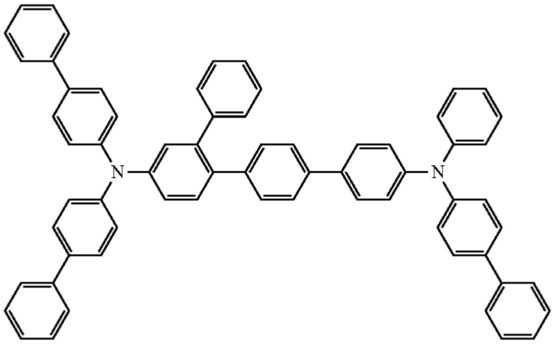
D40
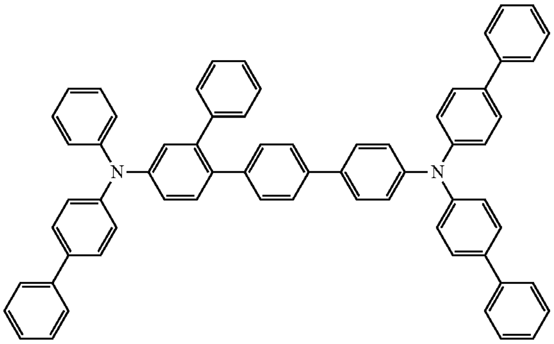
D41
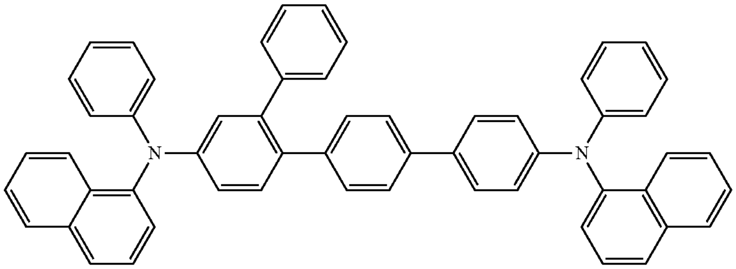
D42
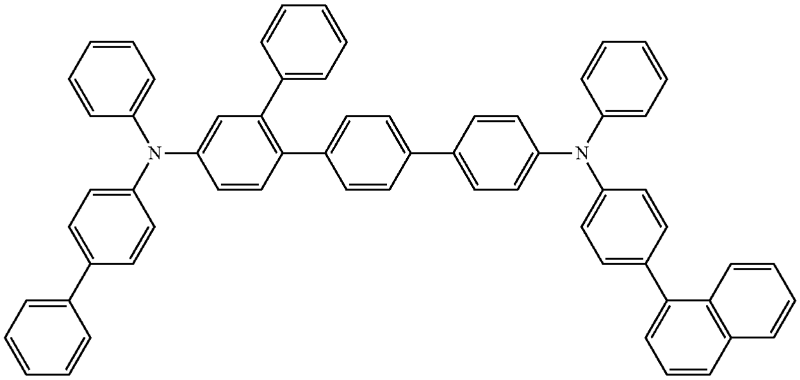

-continued
D43
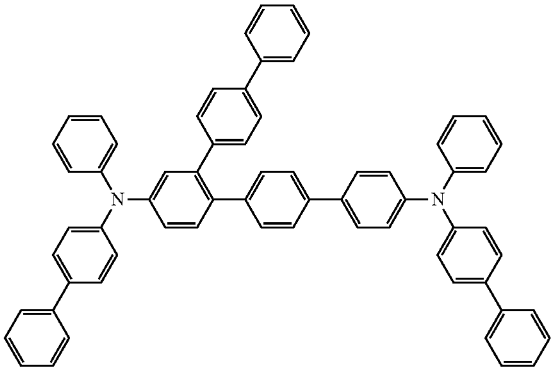
D44
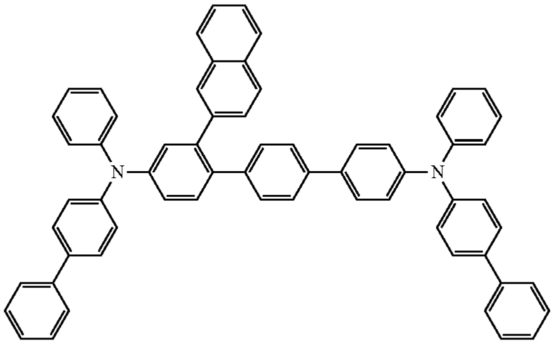
D45
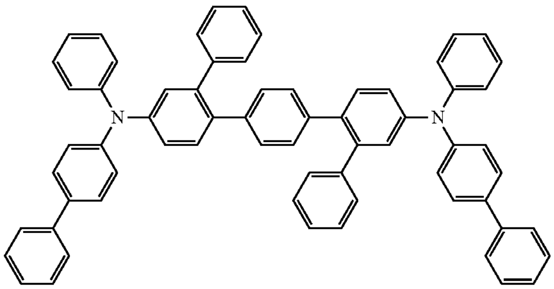
D46
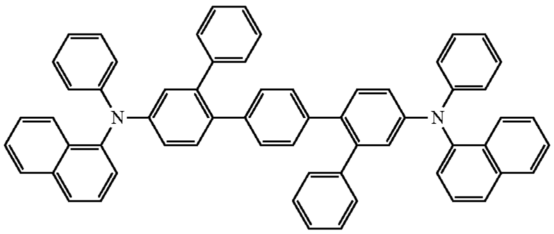
D47
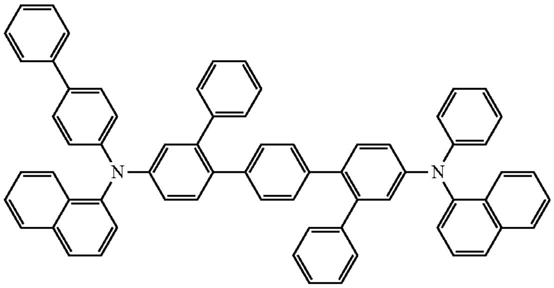
D48
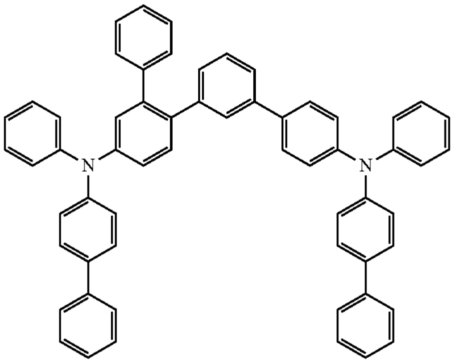
D49
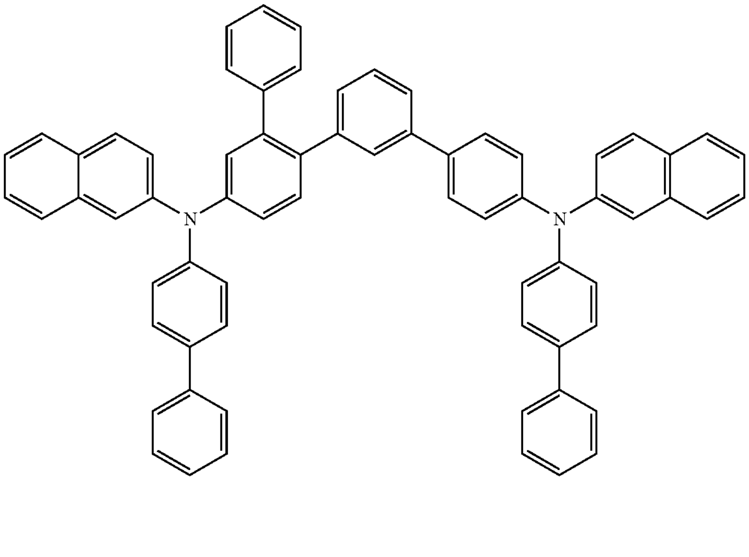

-continued
D50
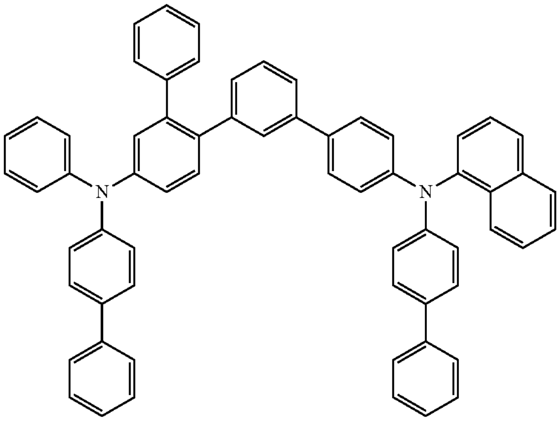
D51
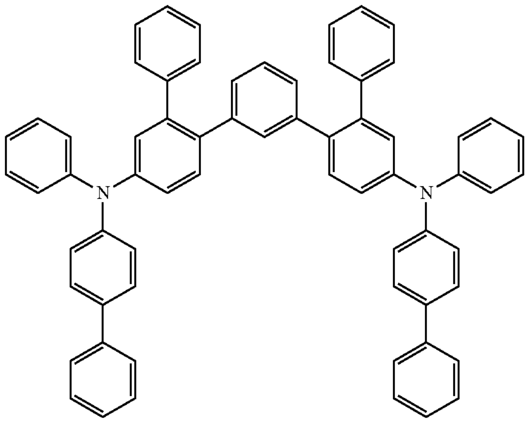
D52
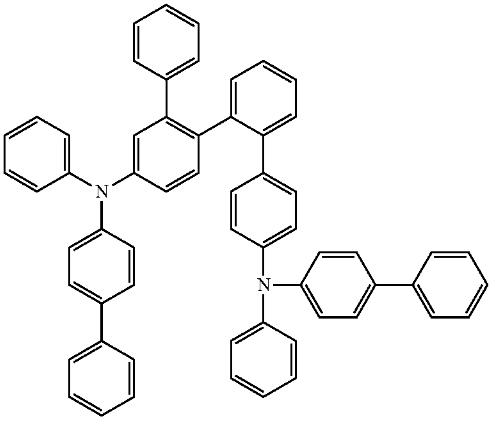
D53
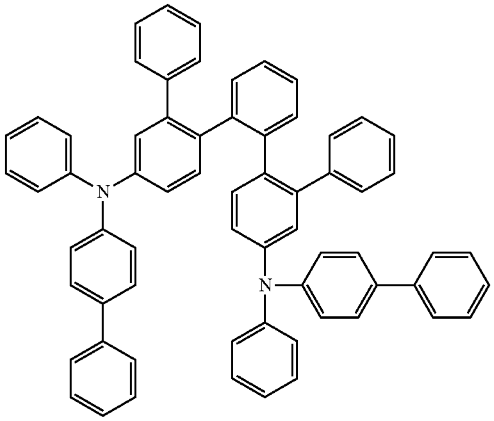
D54
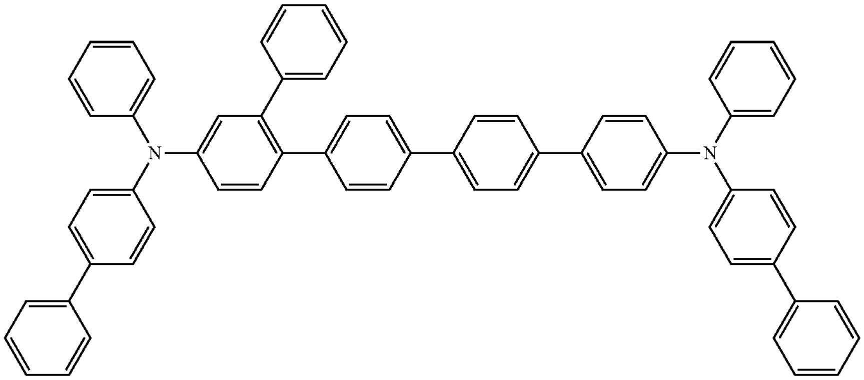
D55
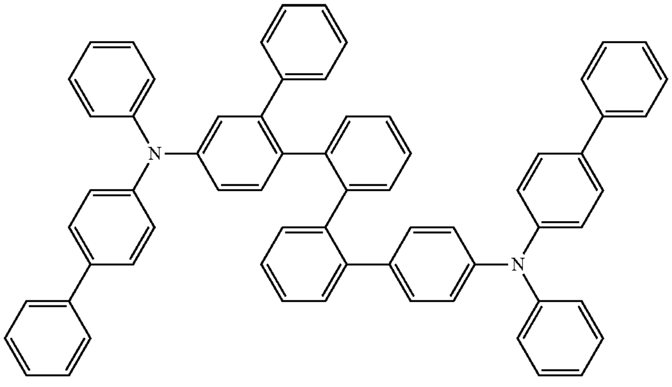

-continued
D56
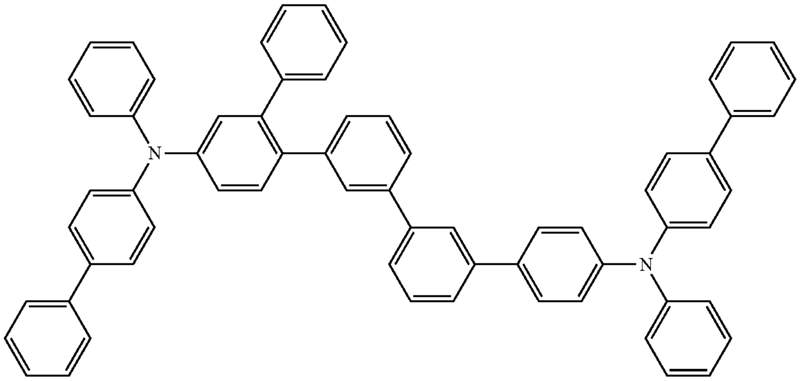
D57
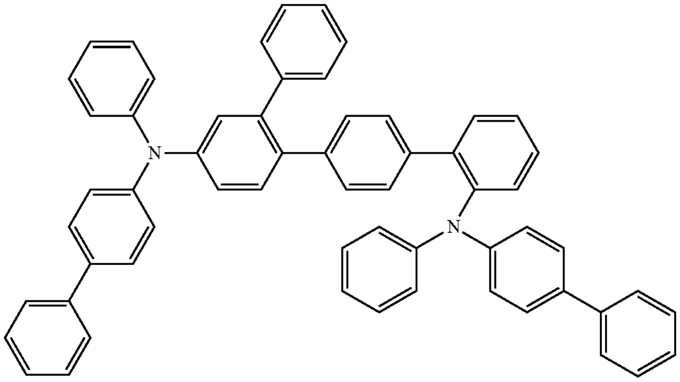
D58
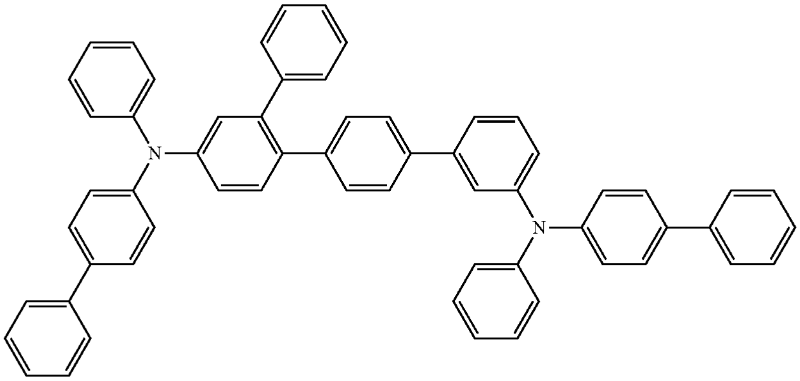
D59
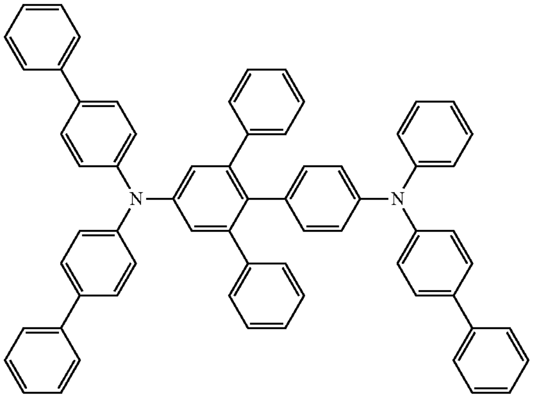
D60
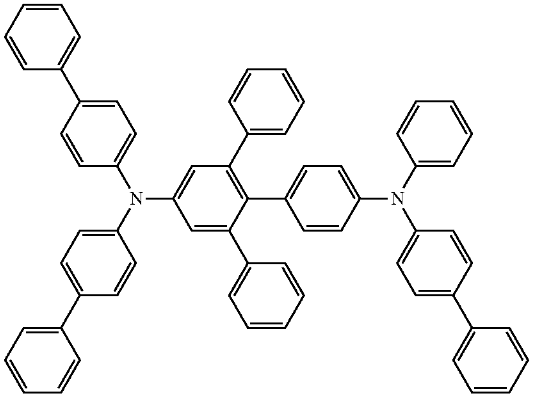

-continued
D61
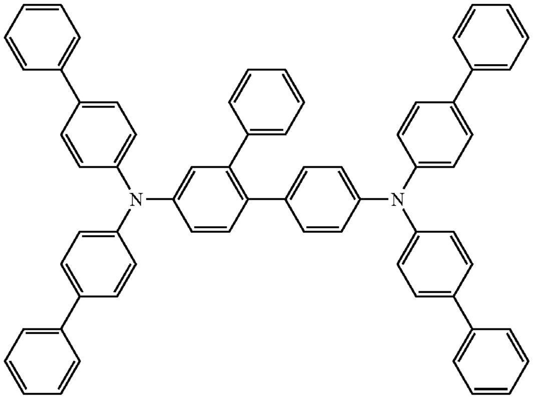
D62
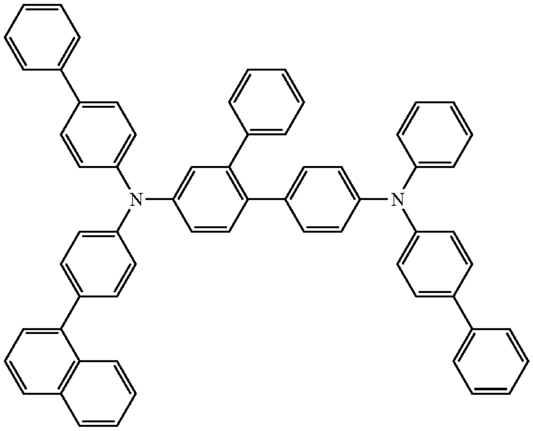
D63
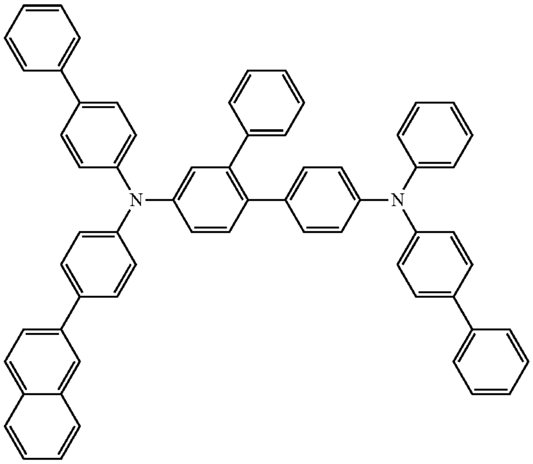
D64
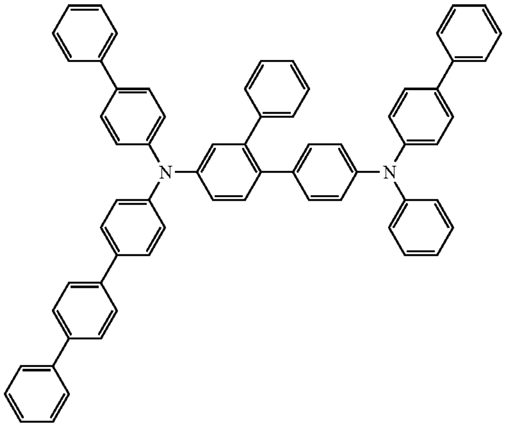
D65
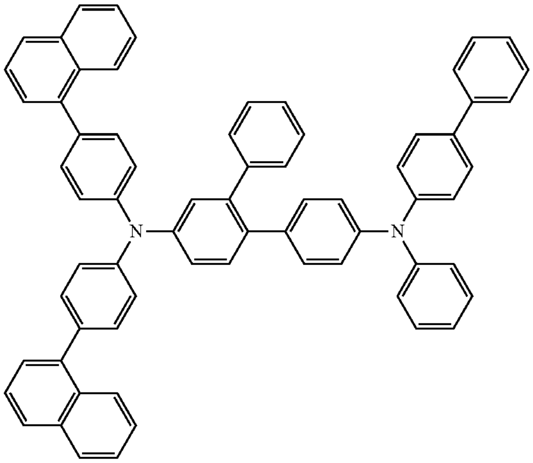
D66
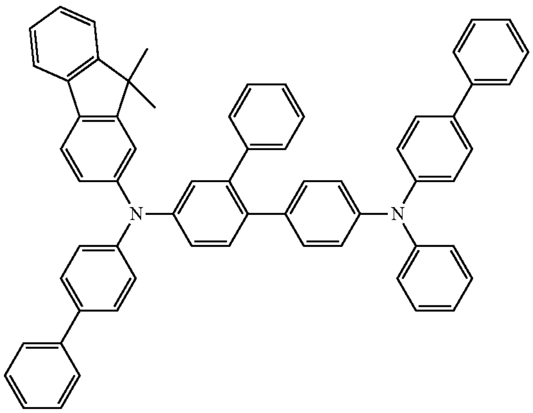

-continued
D67
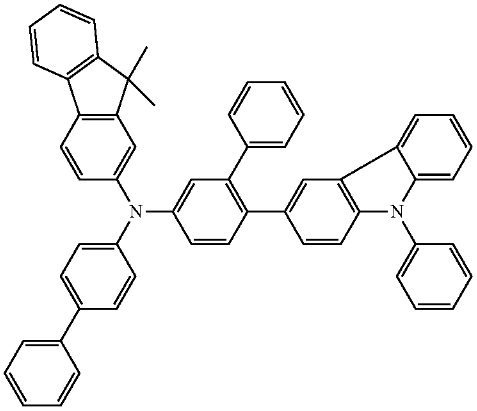
D68
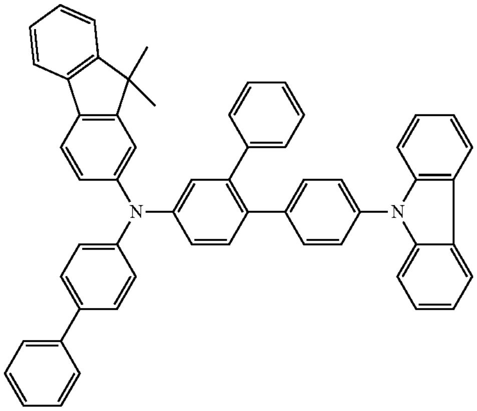
D69
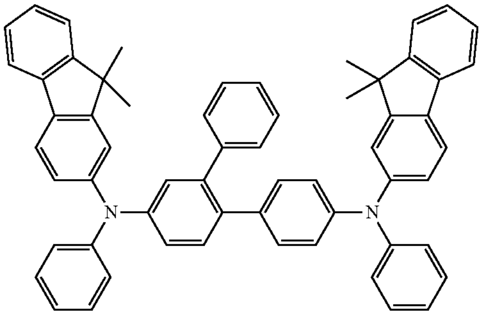
D70
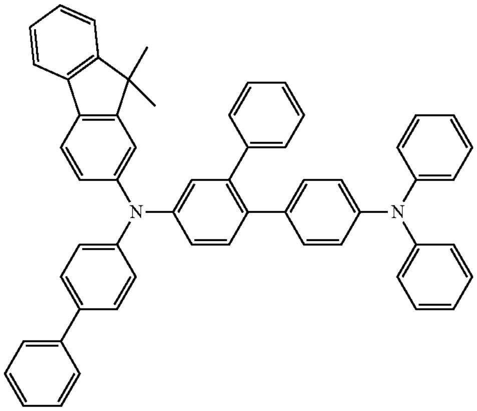
D71
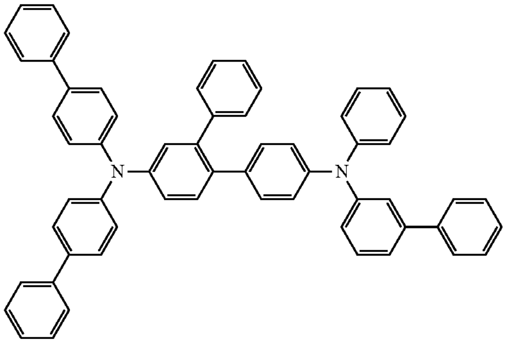
D72
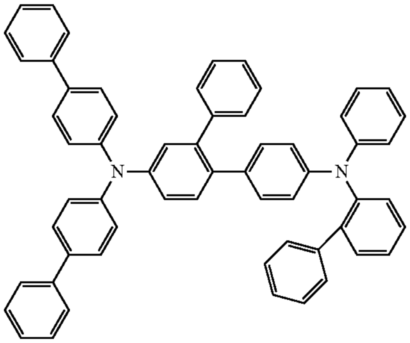
D73
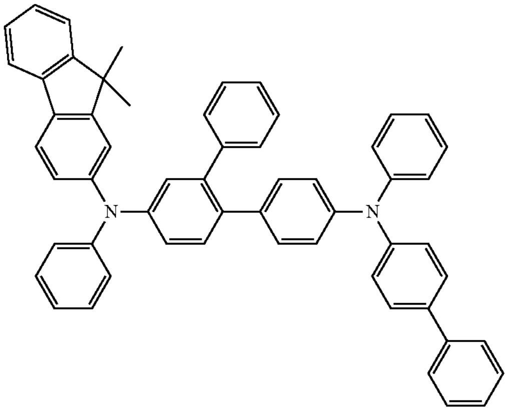
D74
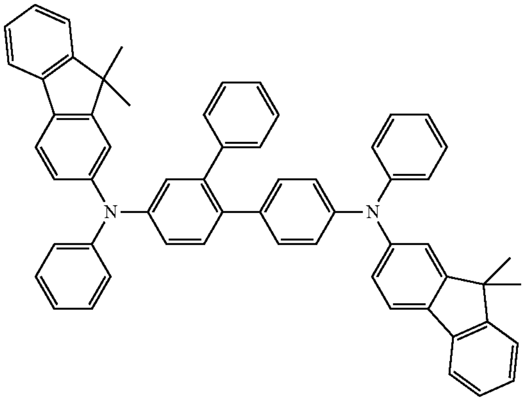

-continued
D75
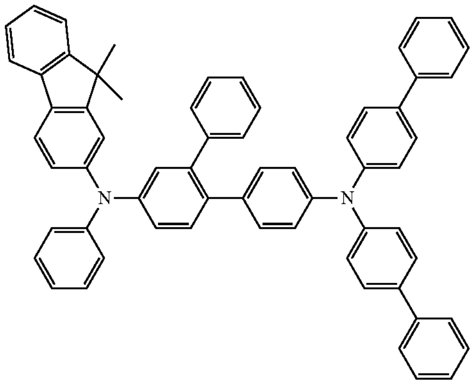
D76
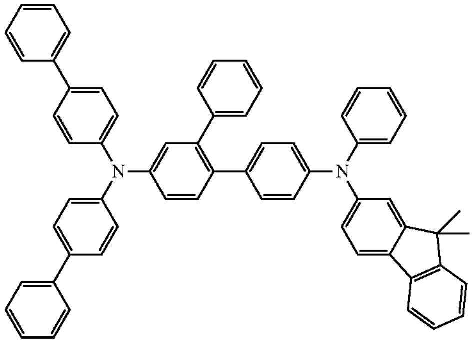
D77
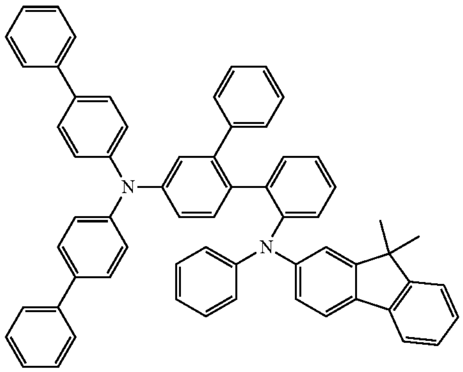
D78
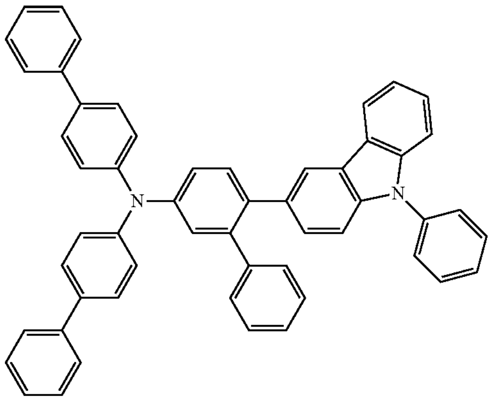
D79
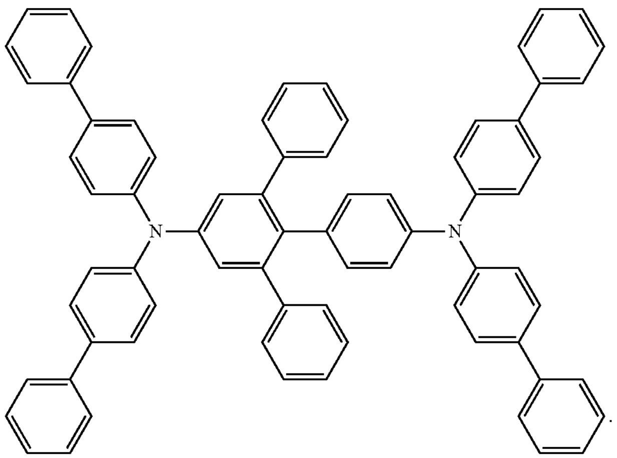

10. The organic electroluminescent device according to claim 7, wherein the compound of Formula D is selected from the compounds of Formulae D101 to D145:
D101
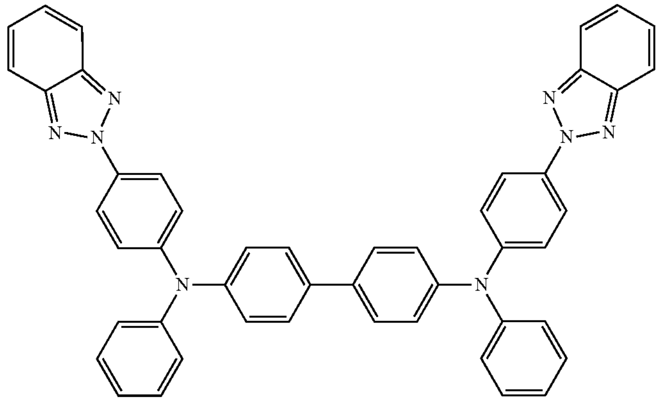
D102
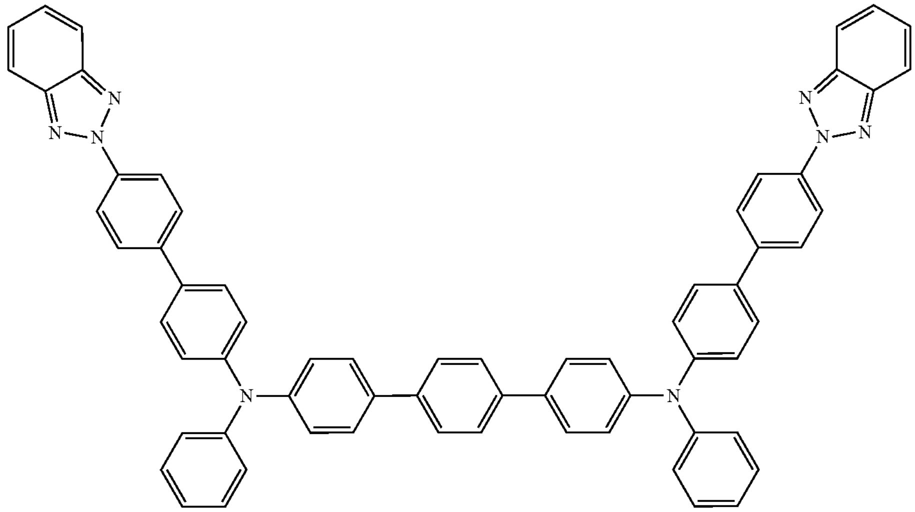
D103
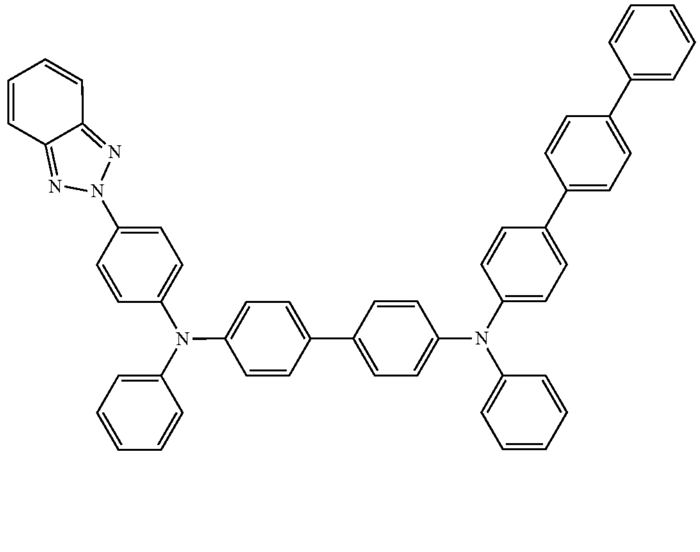

-continued
D104
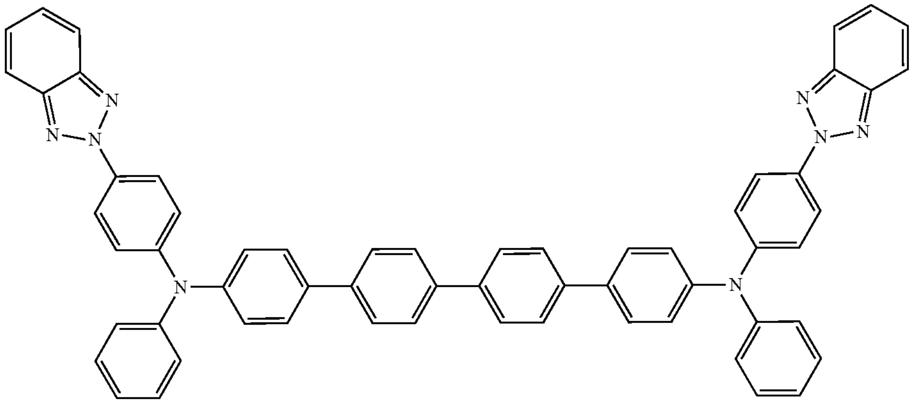
D105
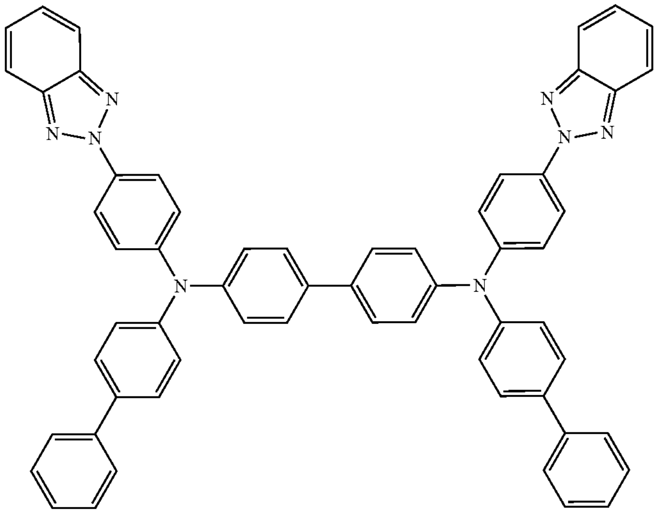
D106
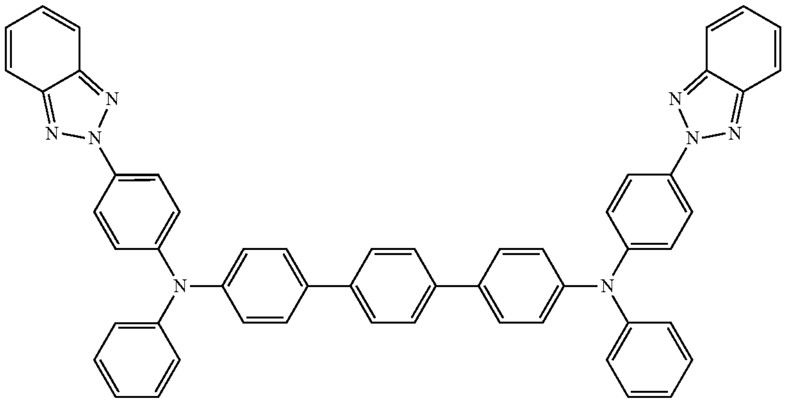

-continued
D107
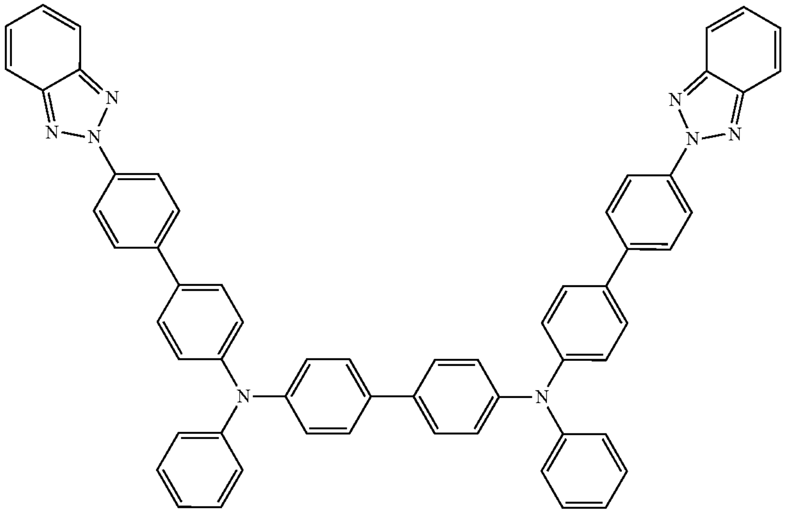
D108
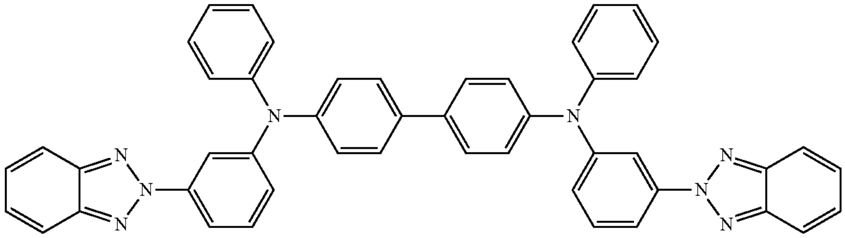
D109
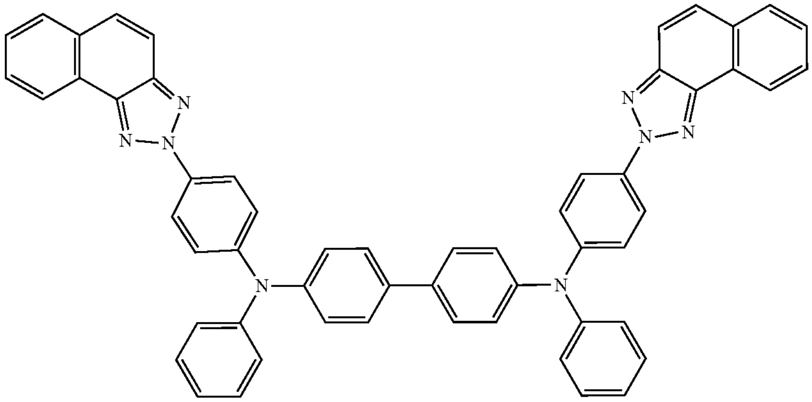
D110
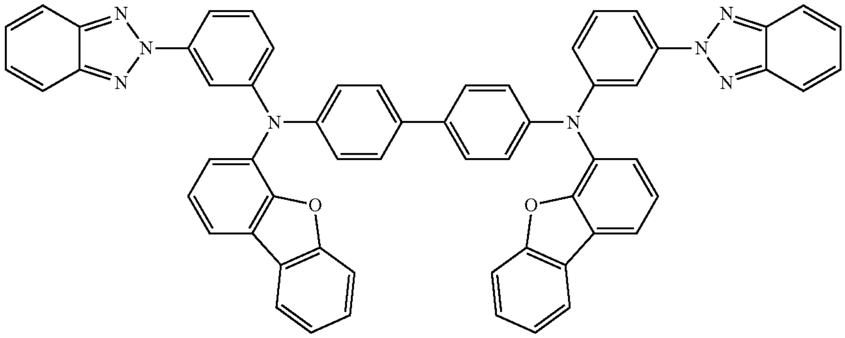

-continued
D111
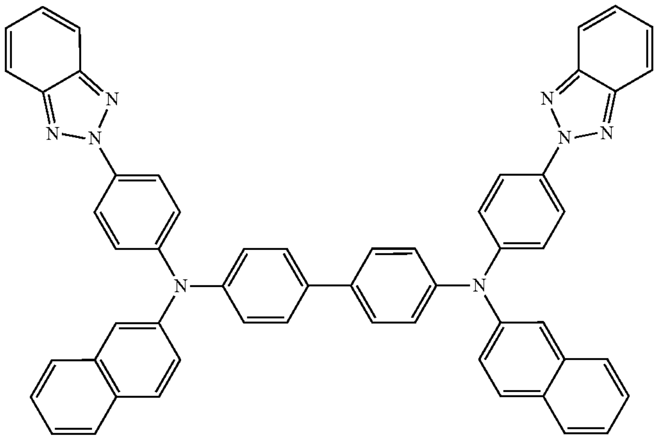
D112
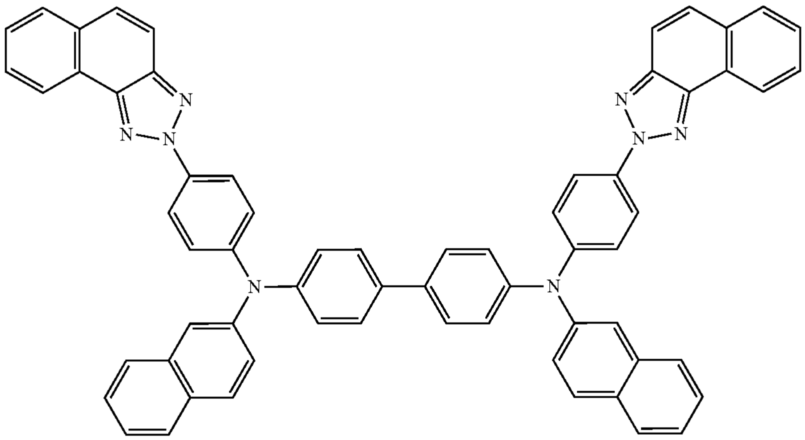
D113
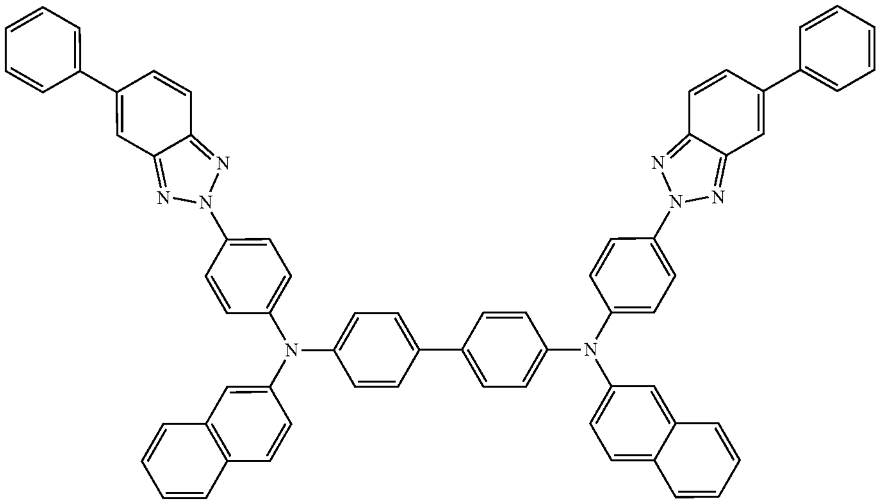

-continued
D114
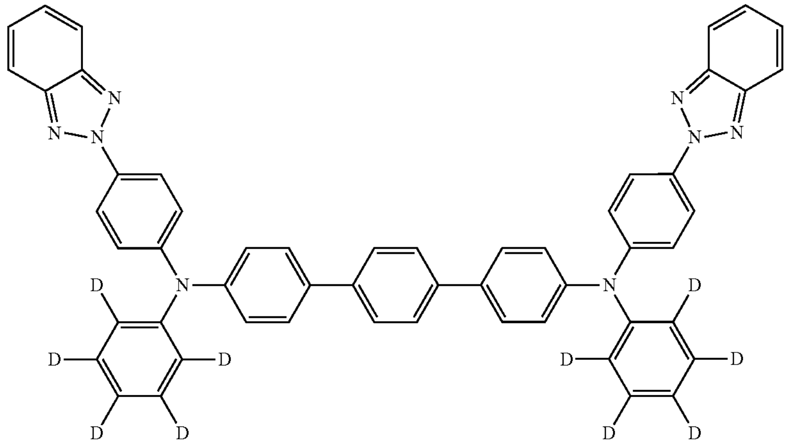
D115
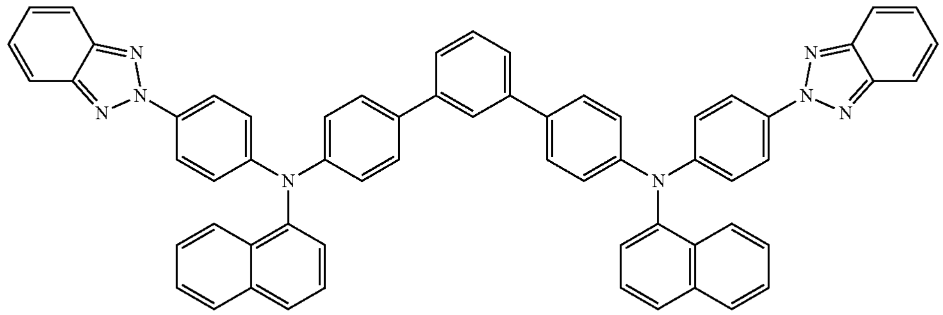
D116
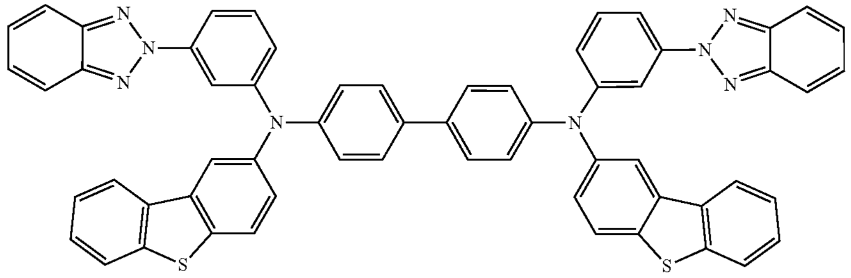
D117
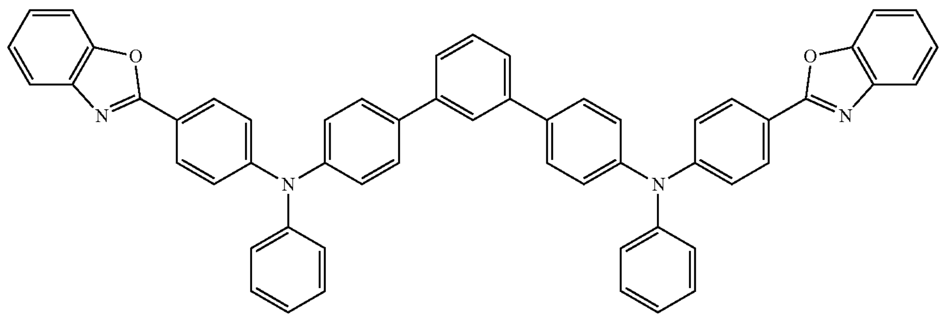

-continued
D118
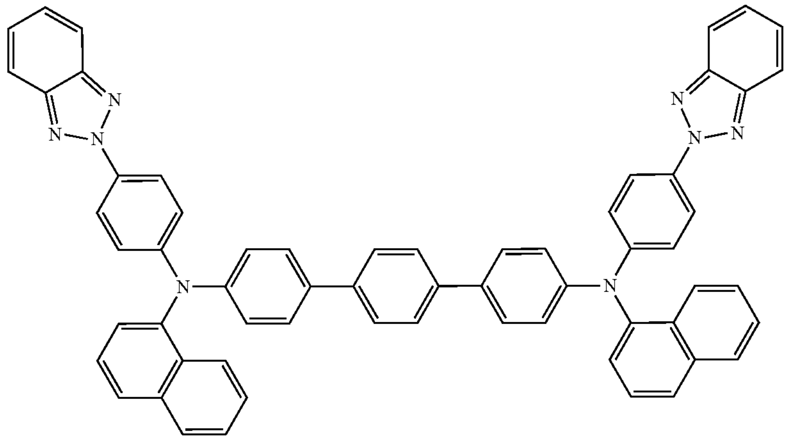
D119
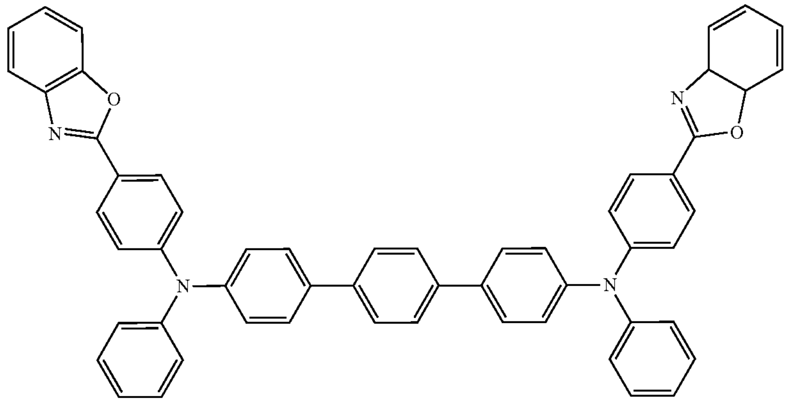
D120
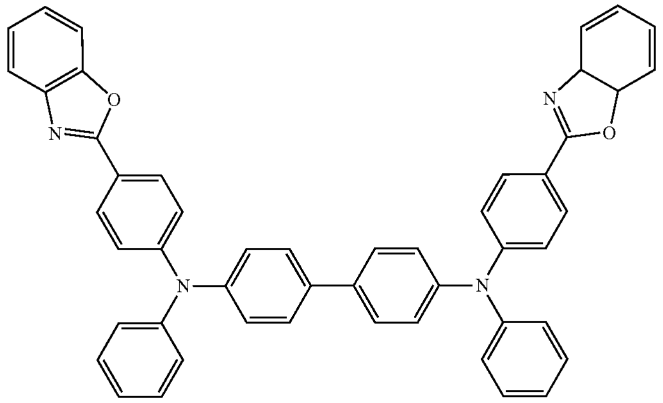

-continued
D121
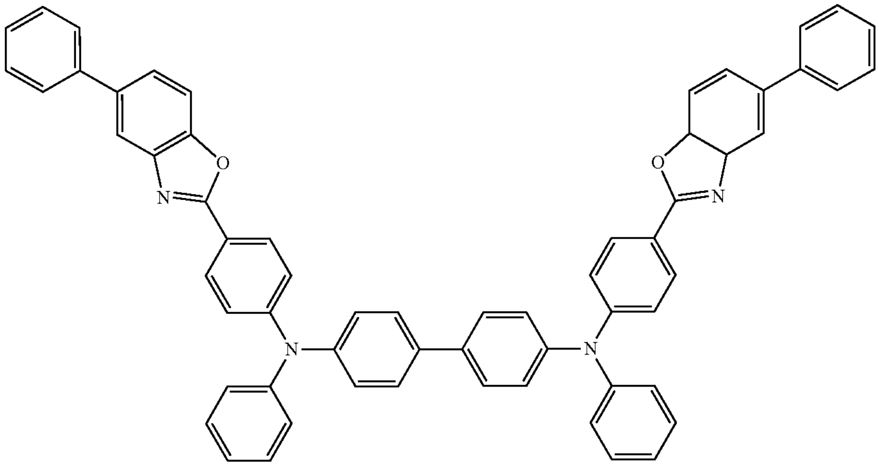
D122
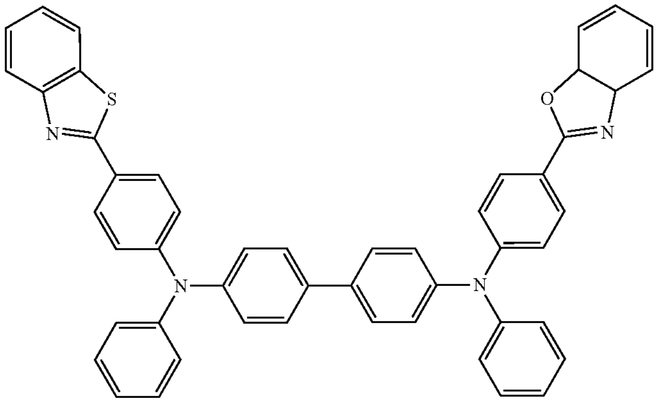
D123
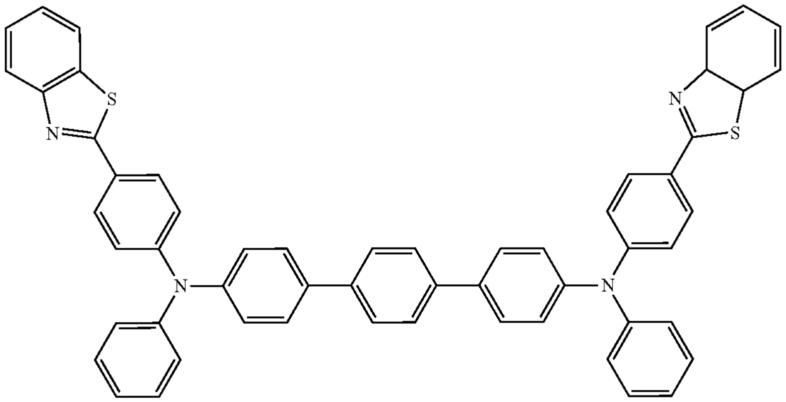

-continued
D124
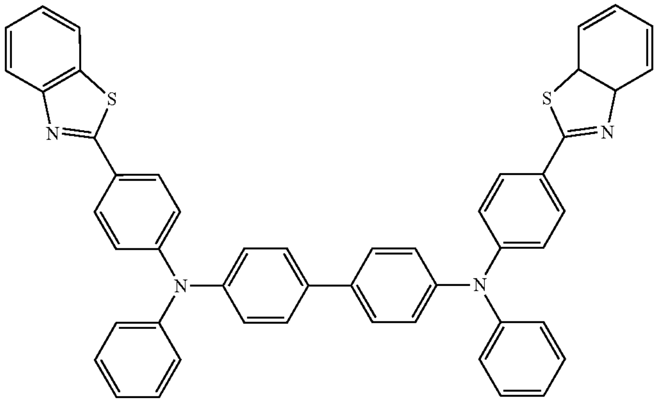
D125
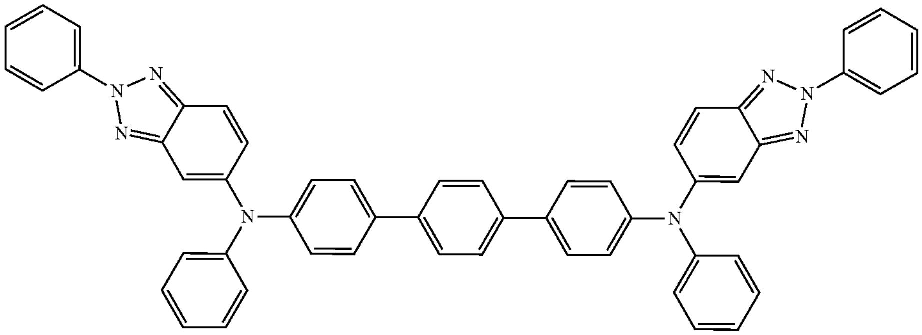
D126
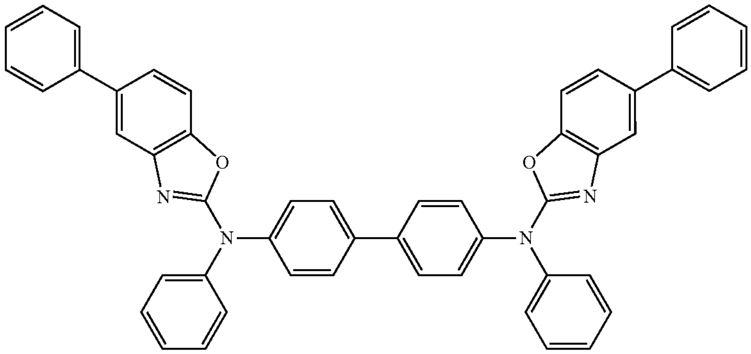
D127
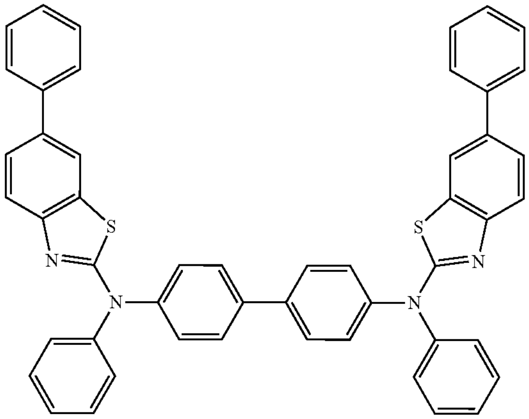

-continued
D128
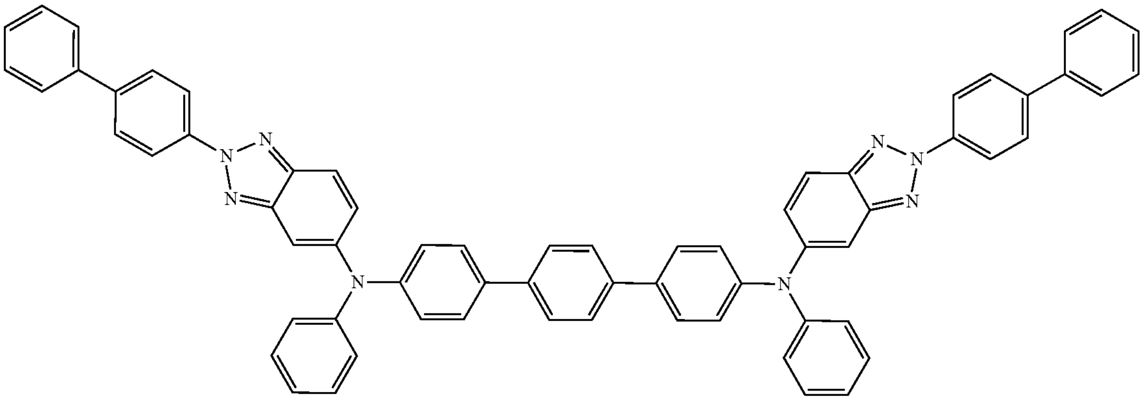
D129
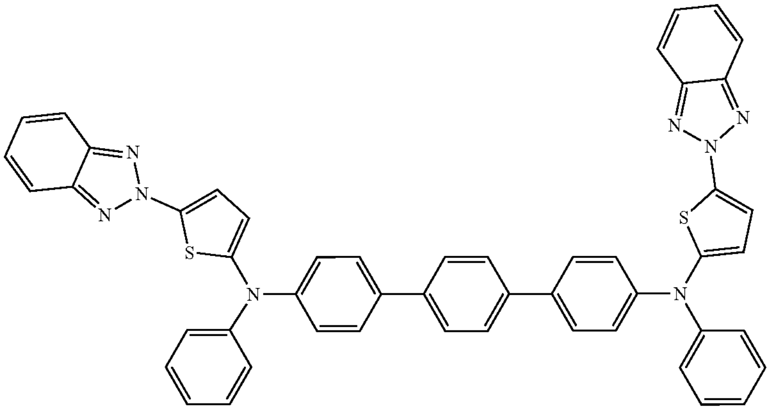
D130
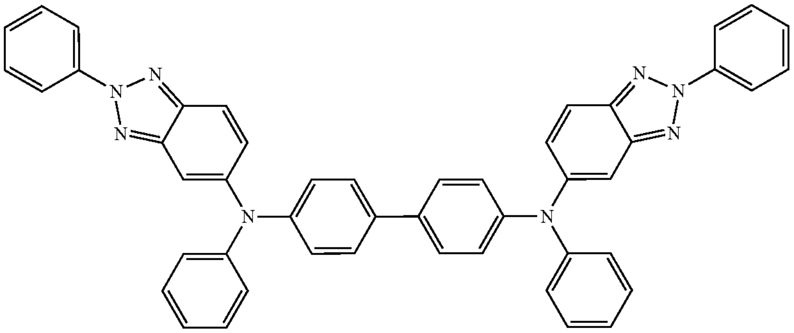
D131
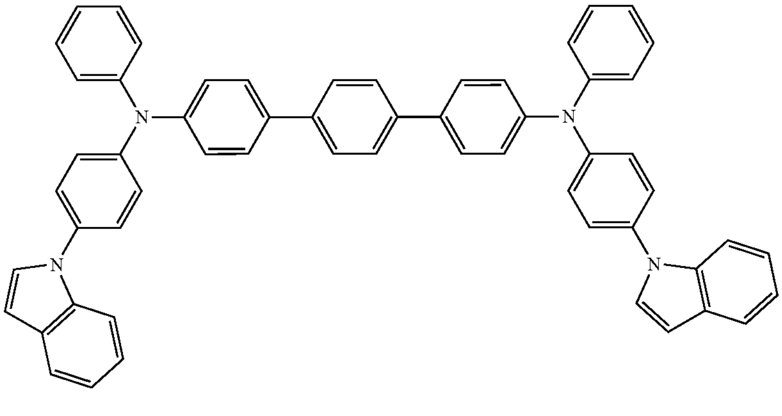

-continued
D132
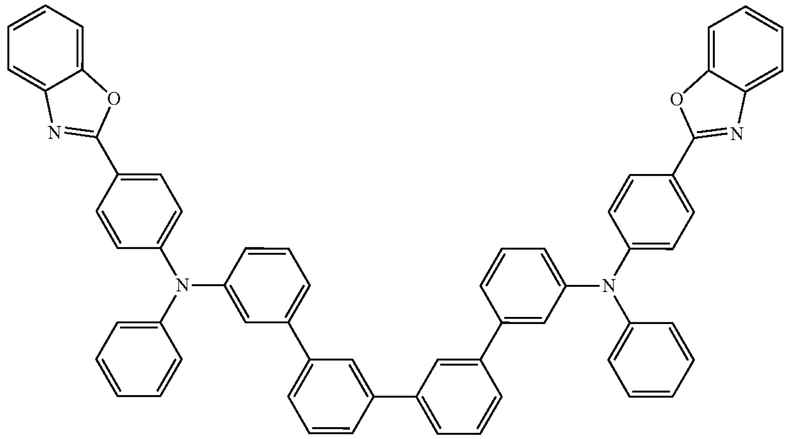
D133
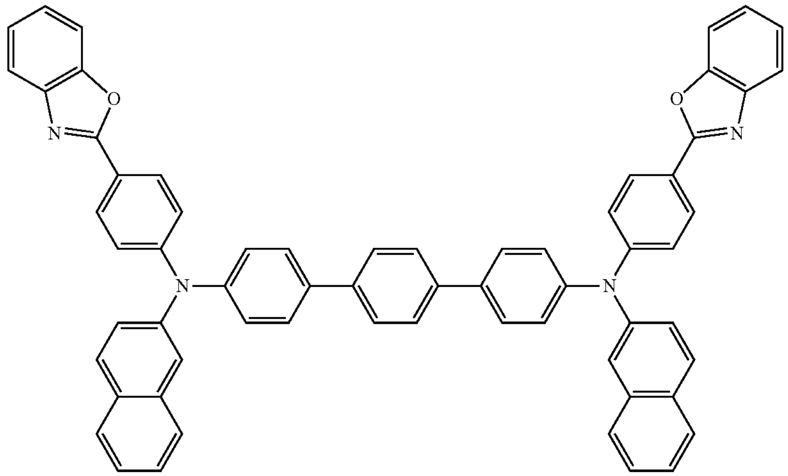
D134
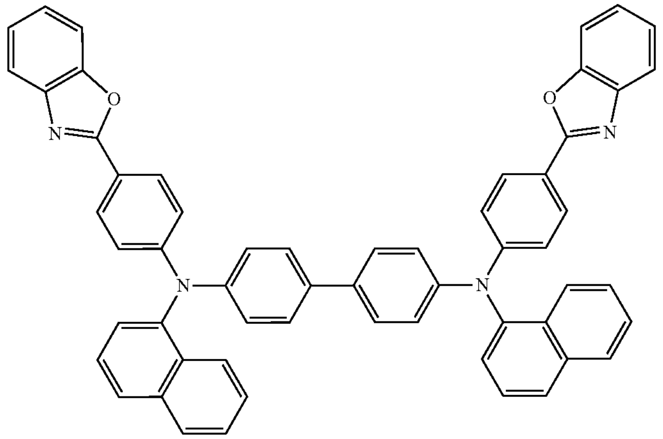

-continued
D135
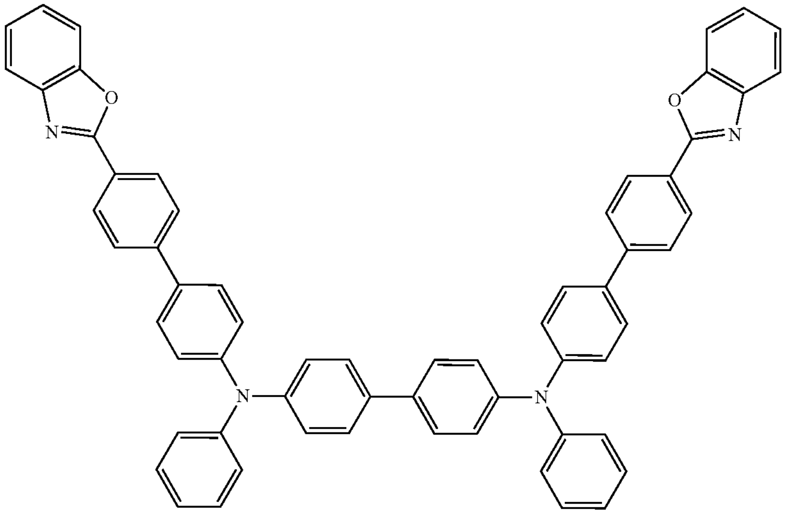
D136
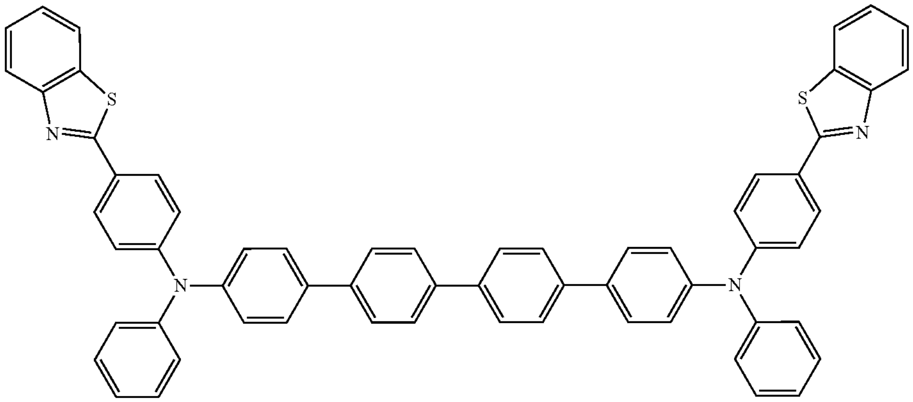
D137
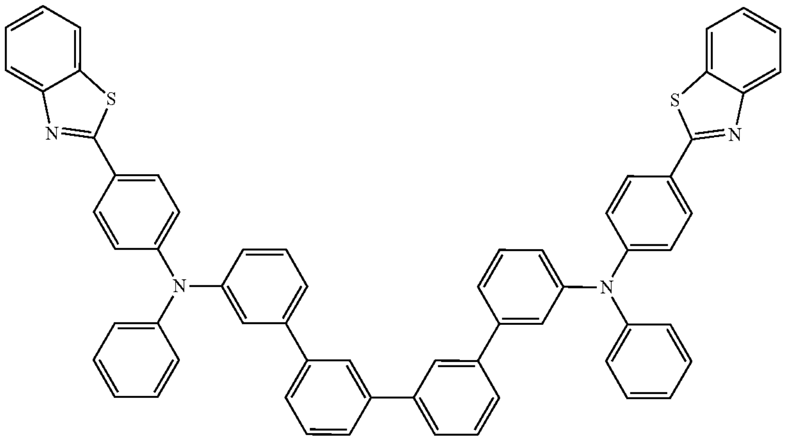

-continued
D138
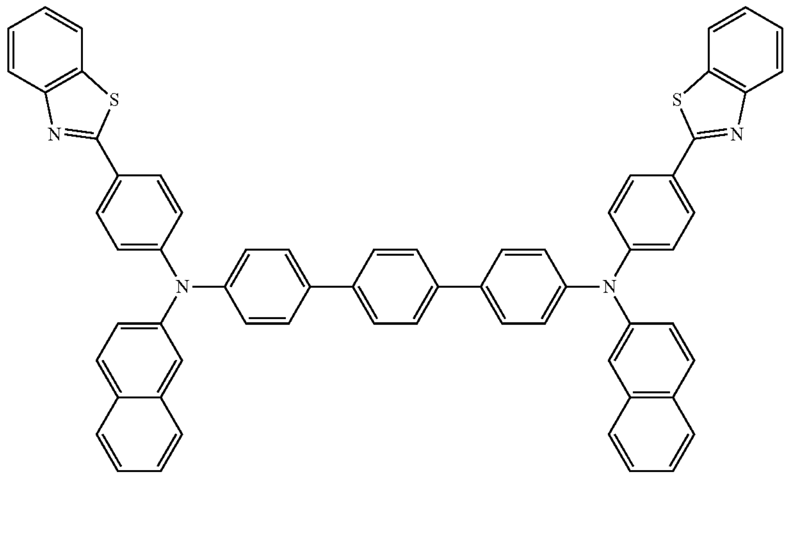
D139
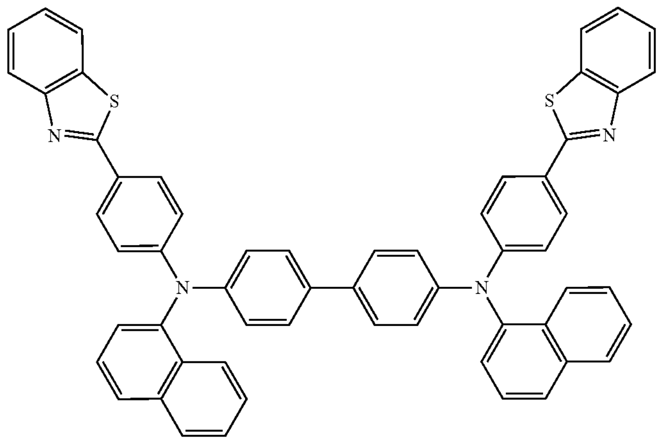
D140
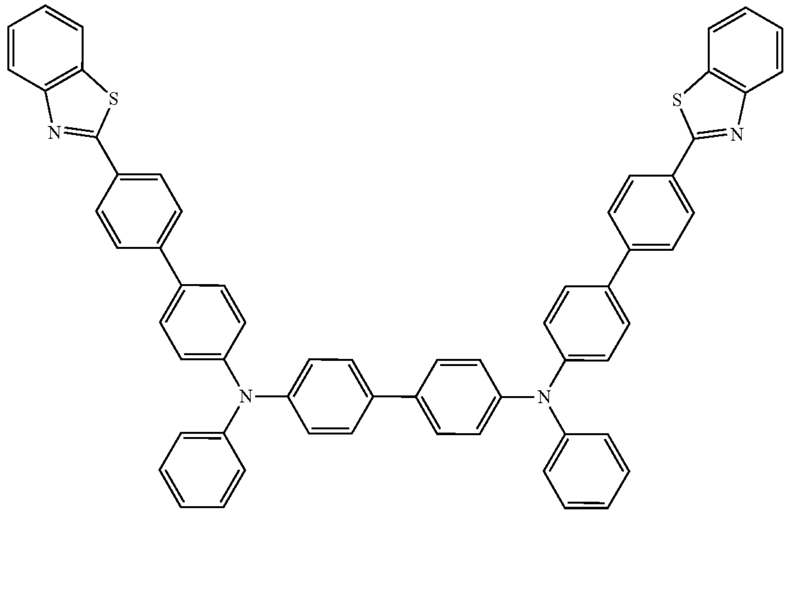

-continued
D141
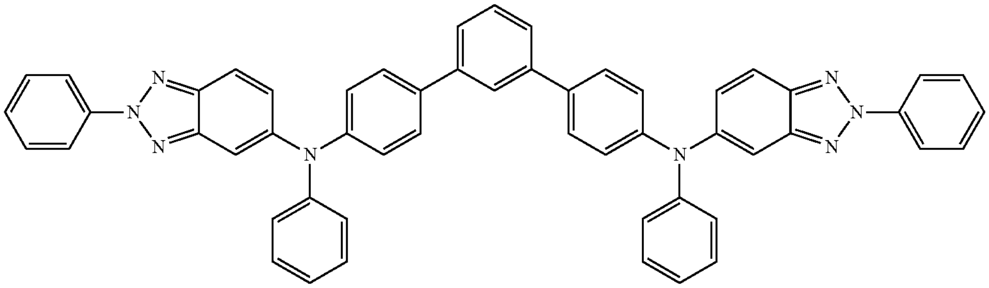
D142
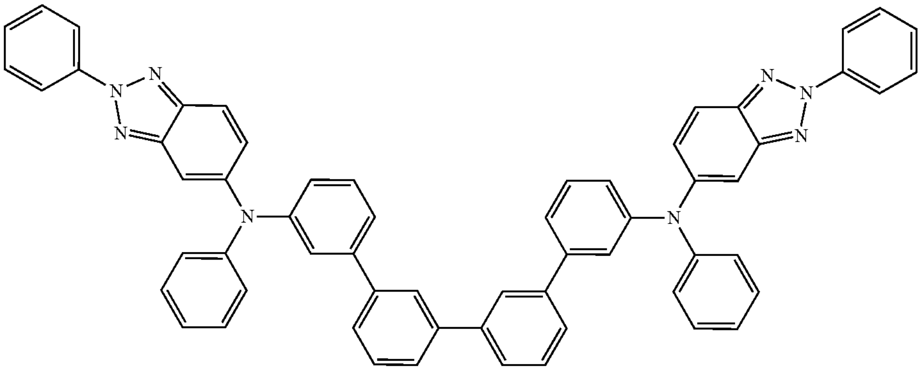
D143
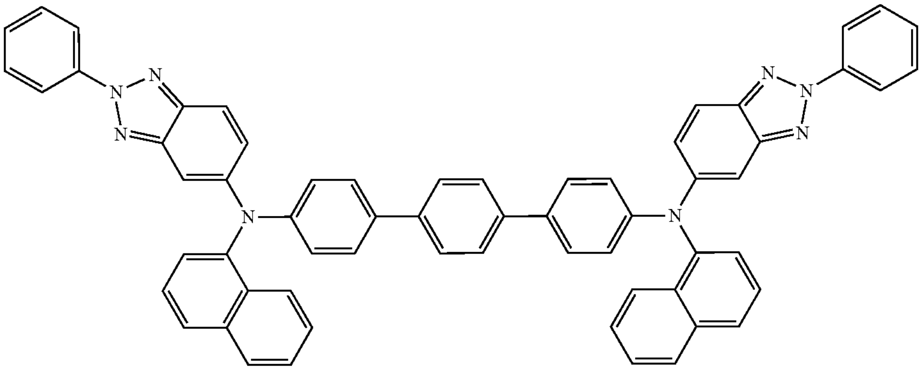
D144
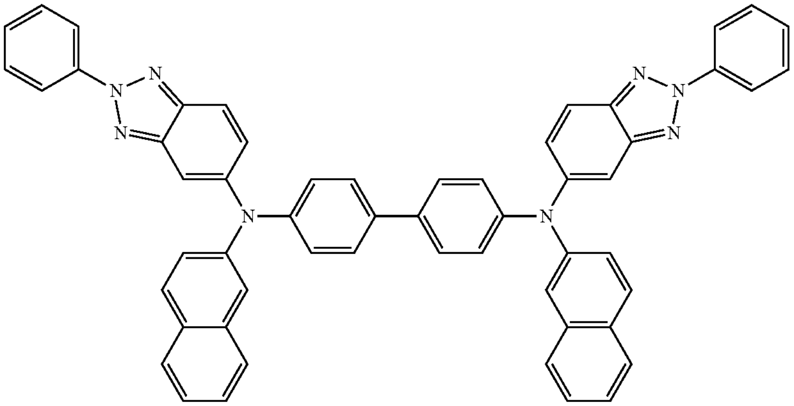

-continued

D145

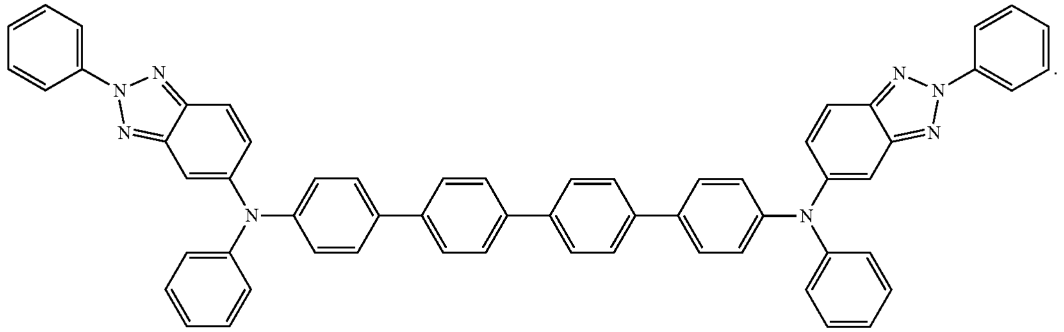

11. The organic electroluminescent device according to claim 1, further comprising a hole transport layer, an electron blocking layer, and a capping layer, each of which comprises a compound represented by Formula F:

(F)

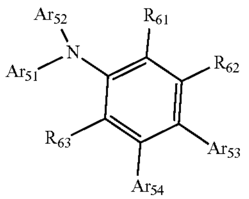

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

12. The organic electroluminescent device according to claim 11, wherein the compound of Formula F is selected from the compounds of Formulae F1 to F33:

F1

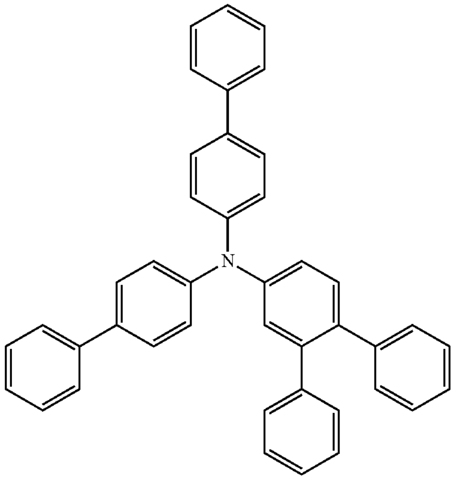

F2

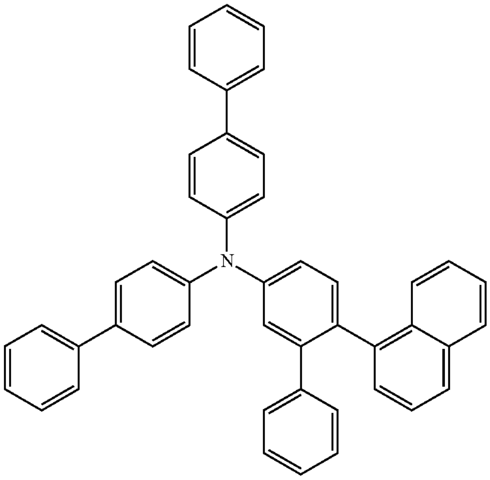

-continued
F3
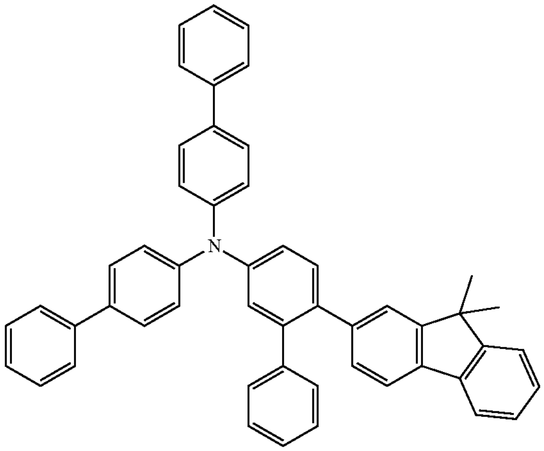
F4
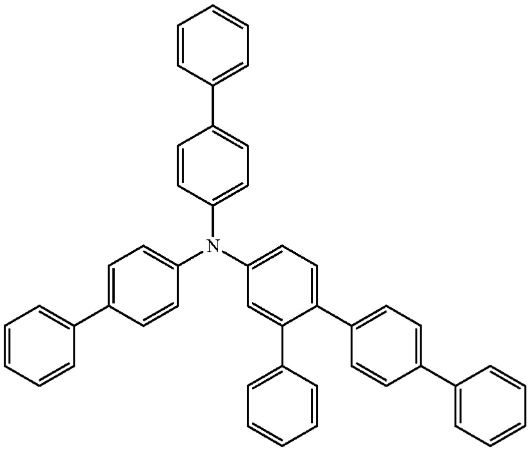
F5
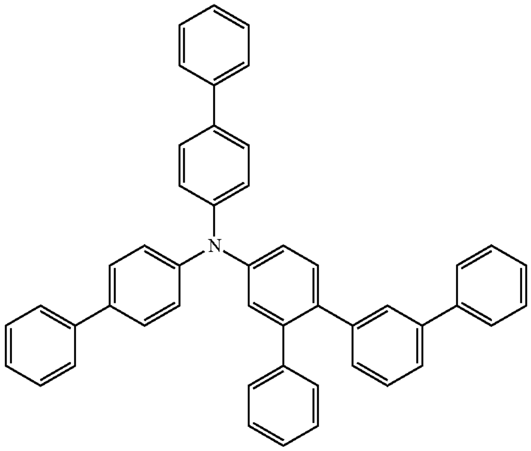
F6
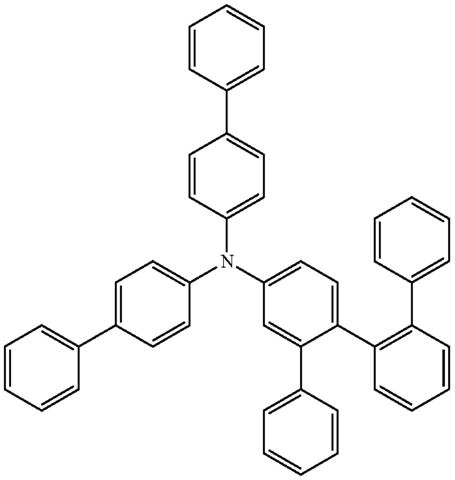
F7
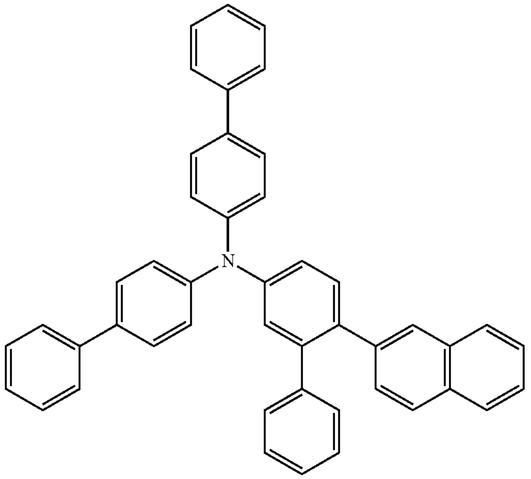
F8
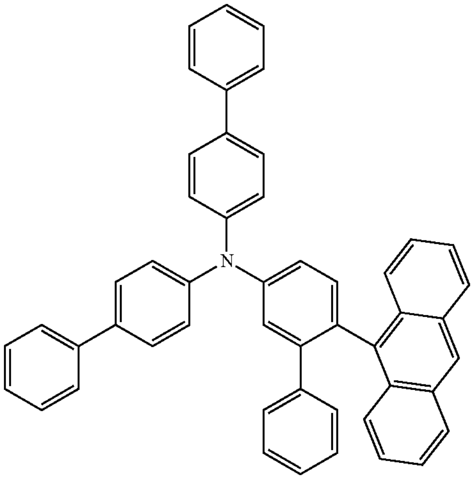

-continued
F9
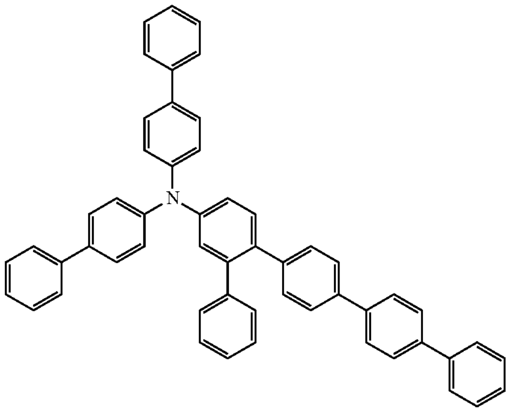
F10
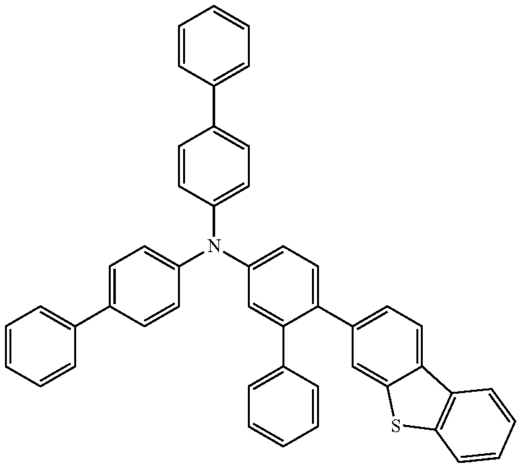
F11
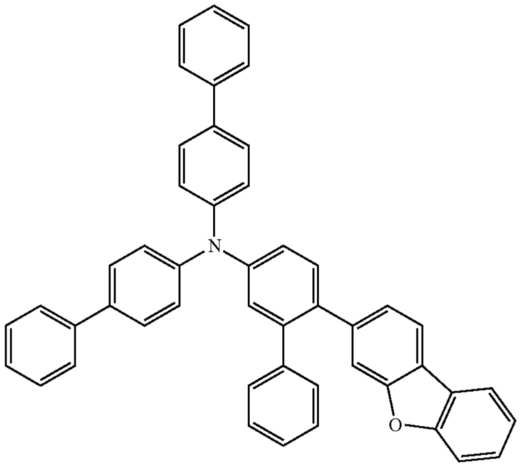
F12
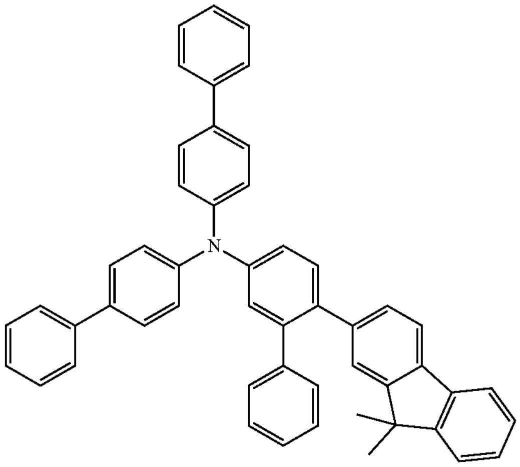
F13
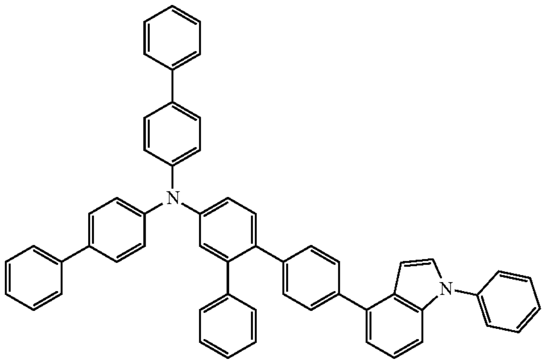
F14
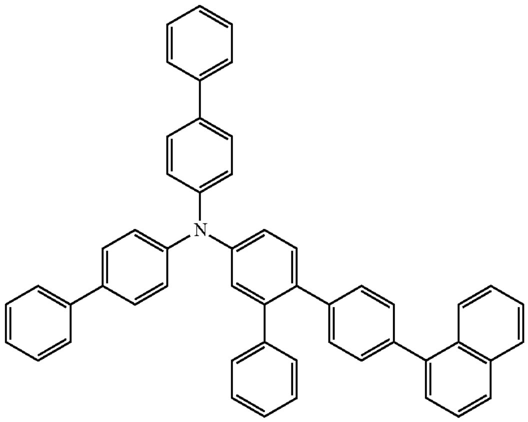

-continued
F15
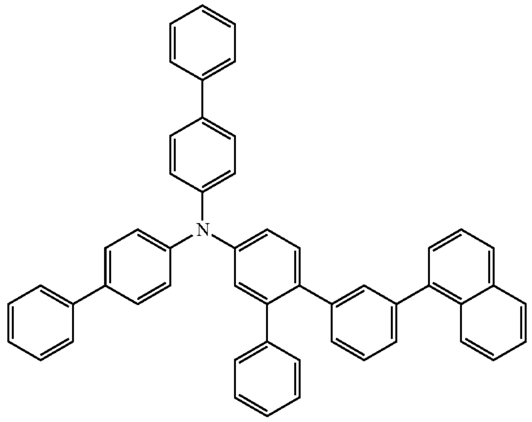
F16
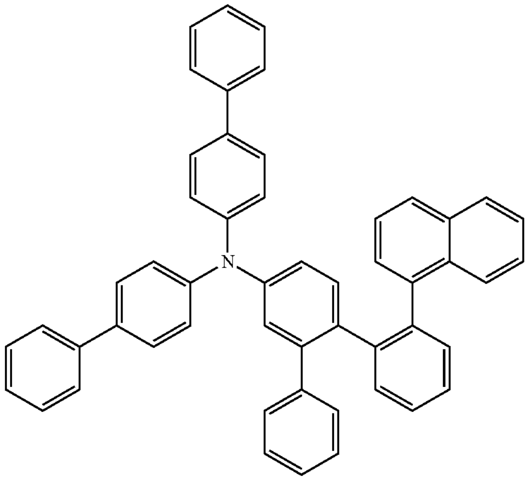
F17
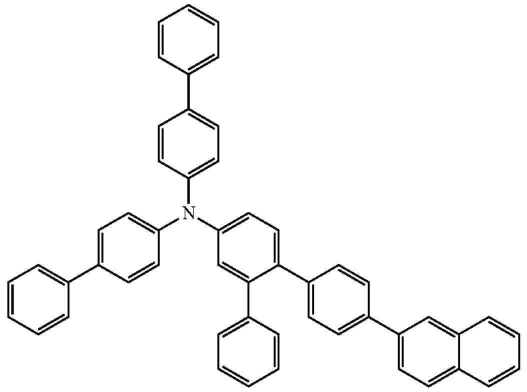
F18
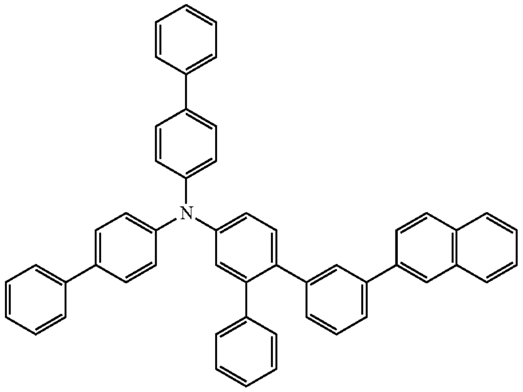
F19
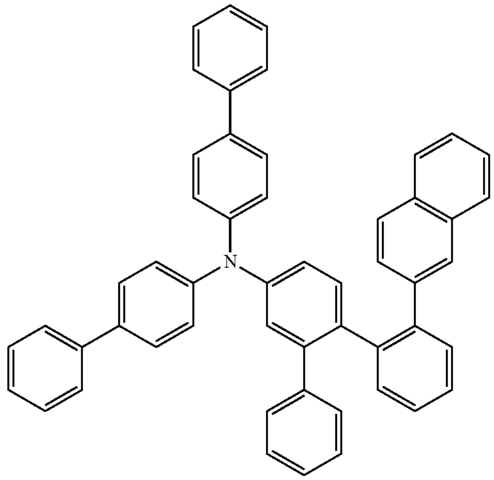
F20
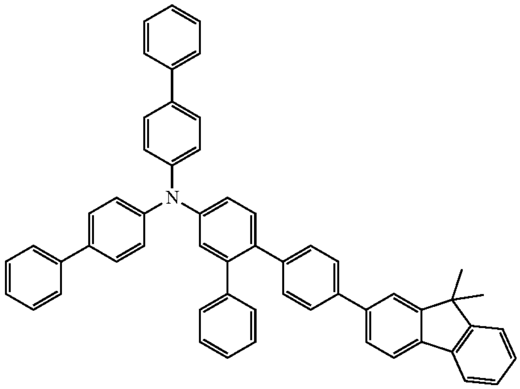

-continued
F21
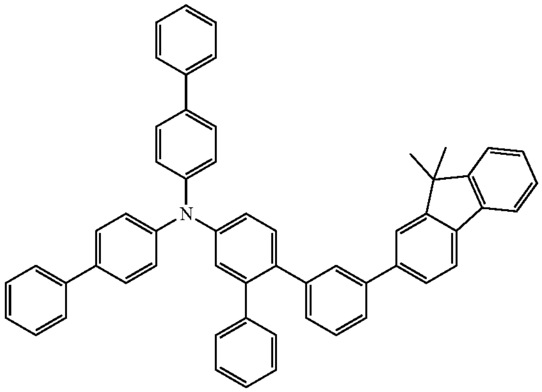
F22
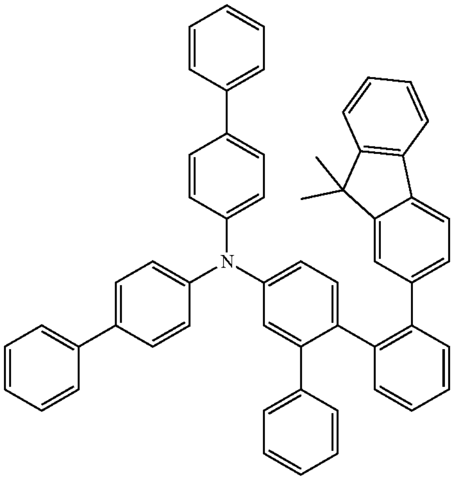
F23
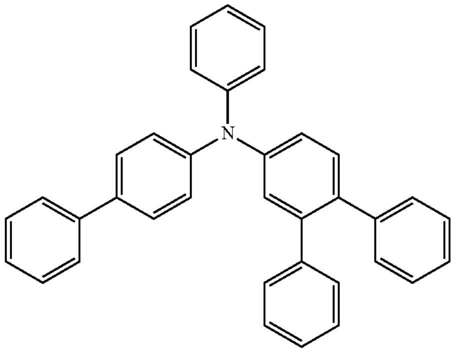
F24
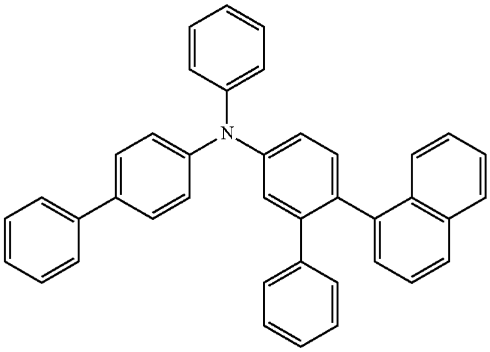
F25
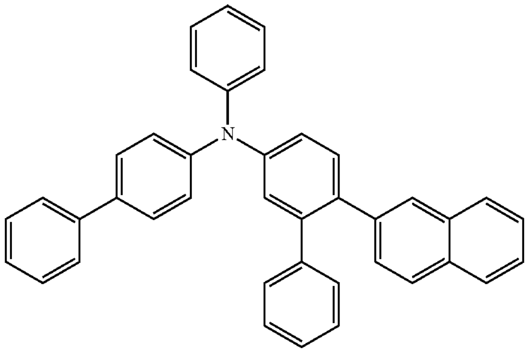
F26
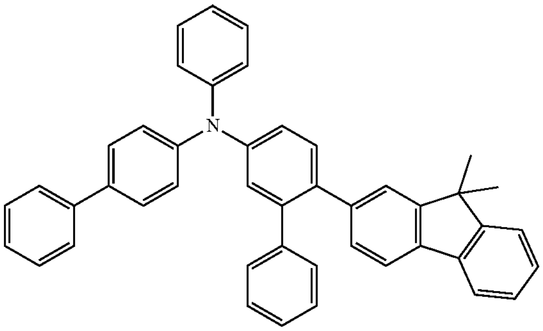

-continued
F27
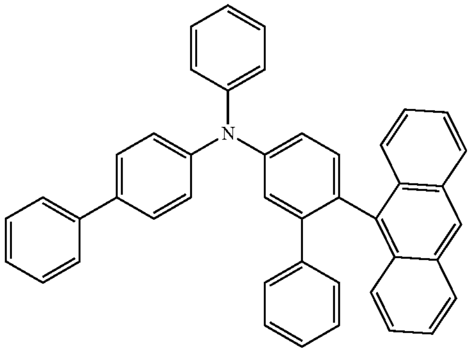
F28
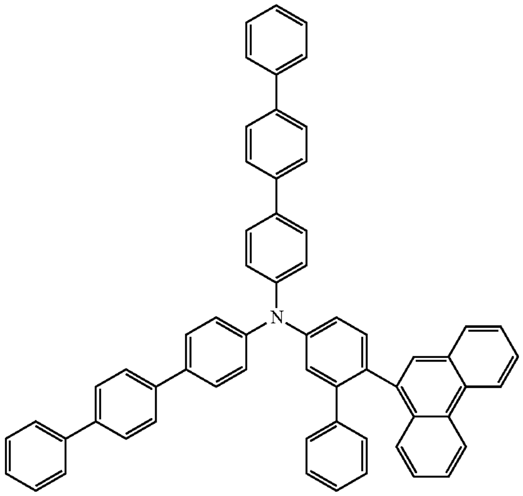
F29
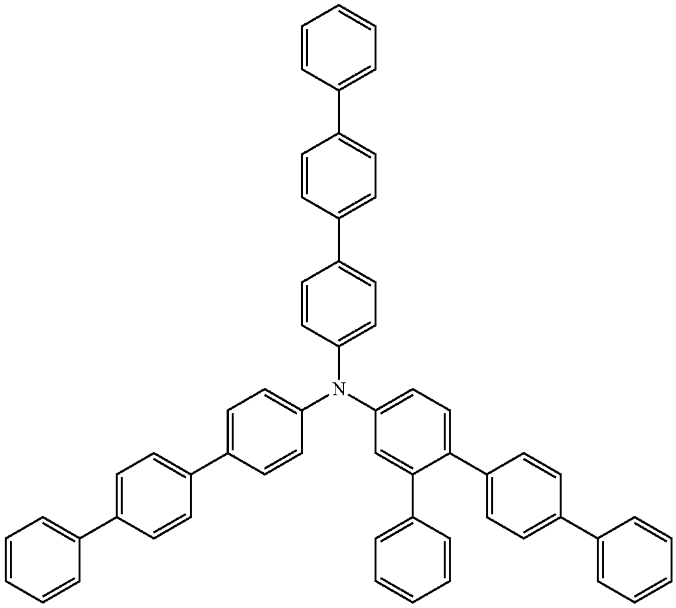

-continued
F30
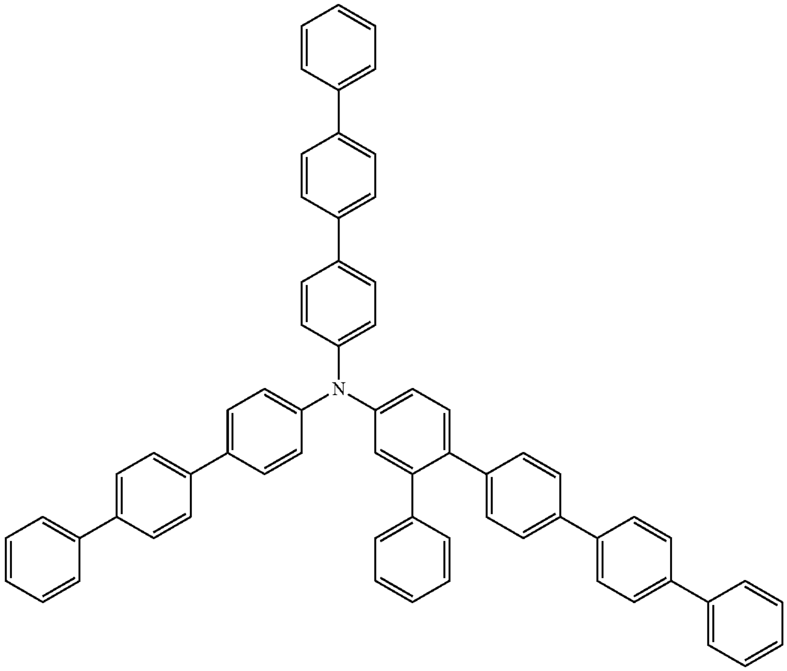
F31
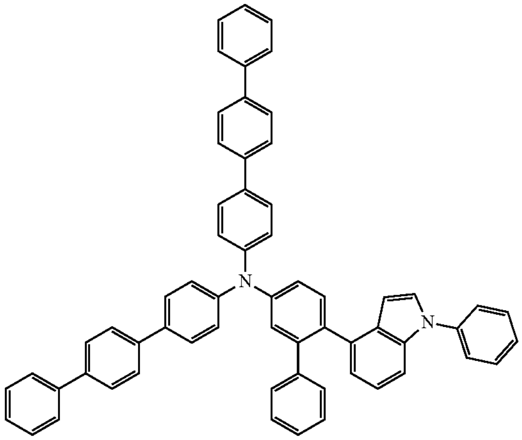
F32
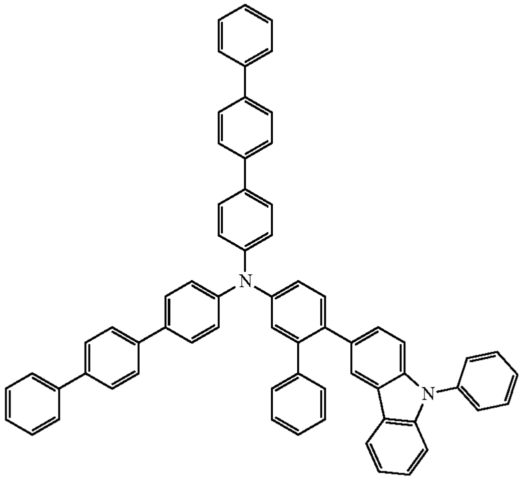

-continued

F33

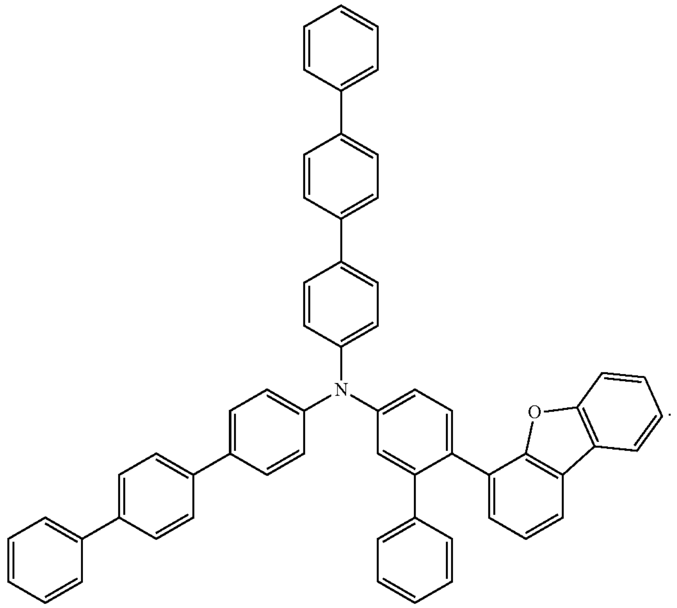

13. An organic electroluminescent device comprising a first electrode, a second electrode opposite to the first electrode, and a light emitting layer interposed between the first and second electrodes wherein the light emitting layer comprises a compound represented by Formula A-1 or A-2:

(A-1)

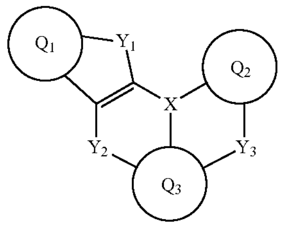

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ heteroaromatic ring;

wherein the linker $Y_1$ is selected from N—$R_1$, $CR_2R_3$, Se, and $SiR_4R_5$, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_1$ to form an alicyclic or aromatic monocyclic or polycyclic ring, $R_2$ and $R_5$ are optionally linked to each other to form an alicyclic or aromatic monocyclic or polycyclic ring, and $R_4$ and $R_5$ are optionally linked to each other to form an alicyclic or aromatic monocyclic or polycyclic ring;

wherein the linkers $Y_2$ and $Y_3$ are identical to or different from each other and are each independently selected from N—$R_1$, $CR_2R_3$, Se, and $SiR_4R_5$, X is selected from B, P, and P═O, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_6$-$C_{50}$ aryl, substituted or unsubstituted $C_3$-$C_{30}$ cycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_2$ or $Q_3$ to form an alicyclic or aromatic monocyclic or polycyclic ring, $R_2$ and $R_5$ are optionally linked to each other to form an alicyclic or aromatic monocyclic or polycyclic ring, and $R_4$ and $R_5$ are optionally linked to each other to form an alicyclic or aromatic monocyclic or polycyclic ring;

(A-2)

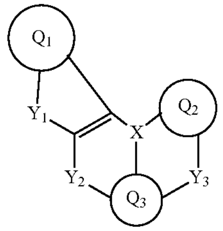

wherein $Q_1$, $Q_2$, $Q_3$, X, and $Y_1$ to $Y_3$ are as defined in Formula A-1; and an anthracene derivative represented by Formula B:

(B)

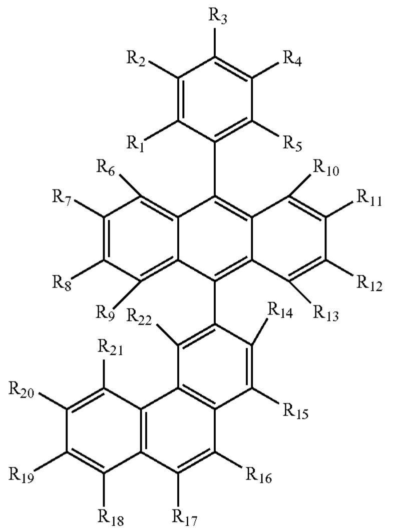

wherein $R_1$ to $R_5$ are each independently hydrogen, deuterium or $C_6$-$C_{24}$ aryl and Re to $R_{22}$ are each independently hydrogen or deuterium, and wherein the compound of Formula A-1 or A-2 has a structure represented by Formula A-5 or A-6:

(A-5)

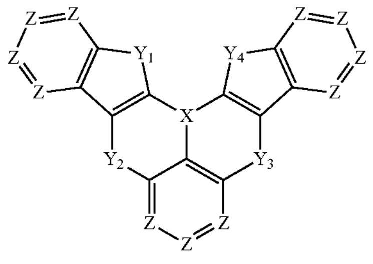

wherein each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_6$-$C_{50}$ aryl, substituted or unsubstituted $C_3$-$C_{30}$ cycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms, and X and $Y_1$ to $Y_3$ are as defined in Formulae A-1 and A-2, wherein the linker $Y_4$ is selected from N—$R_1$, $CR_2R_3$, Se, and $SiR_4R_5$, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_1$ to form an alicyclic or aromatic monocyclic or polycyclic ring, $R_2$ and $R_5$ are optionally linked to each other to form an alicyclic or aromatic monocyclic or polycyclic ring, and $R_4$ and $R_5$ are optionally linked to each other to form an alicyclic or aromatic monocyclic or polycyclic ring;

(A-6)

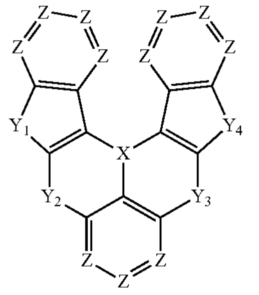

wherein X, $Y_1$ to $Y_4$, and Z are as defined in Formula A-5, and wherein the compound represented by Formula B is selected from the compounds of Formulae B2 to B16:

(B2)

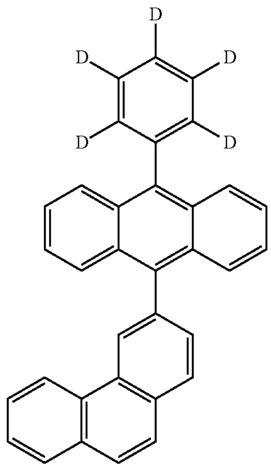

-continued
(B3)
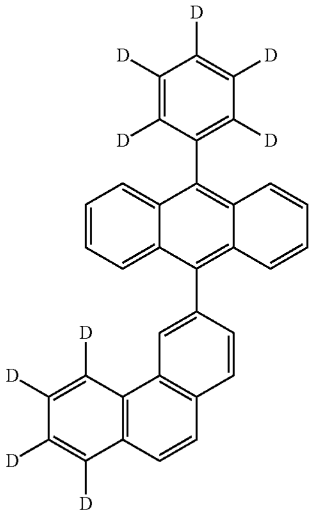
(B4)
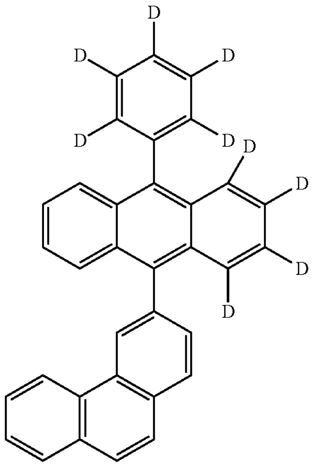
(B5)
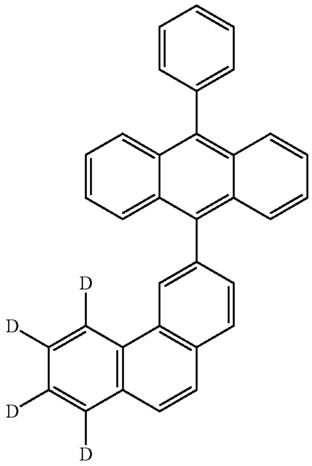
-continued
(B6)
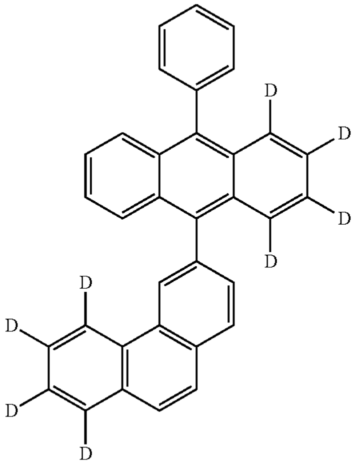
(B7)
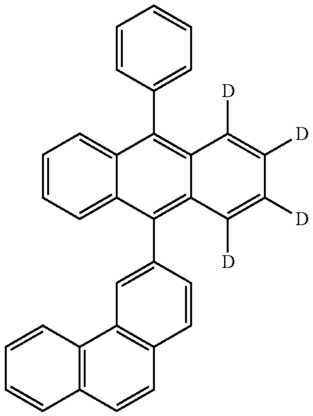
(B8)
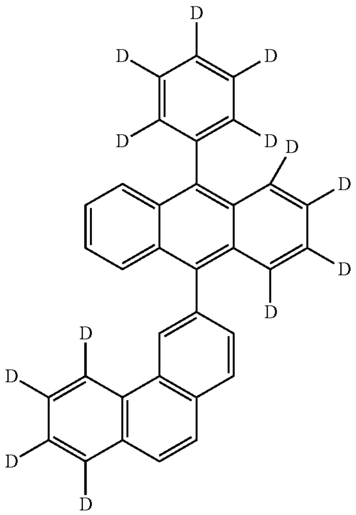

-continued
(B9)
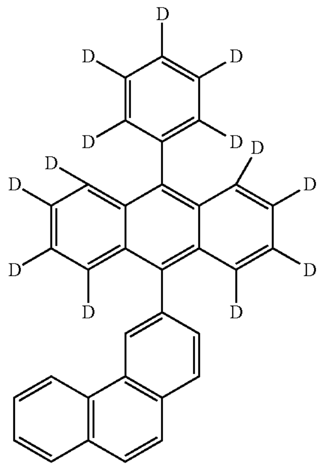
(B10)
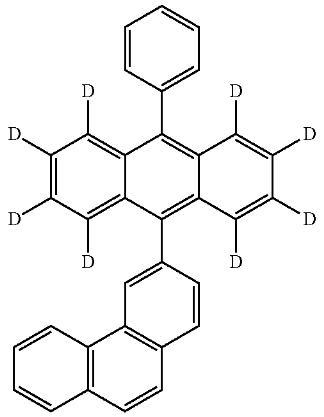
(B11)
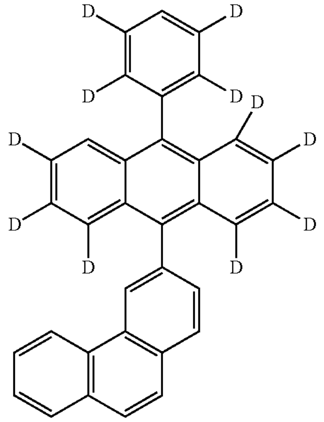
-continued
(B12)
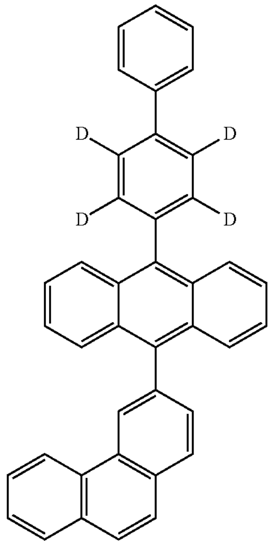
(B13)
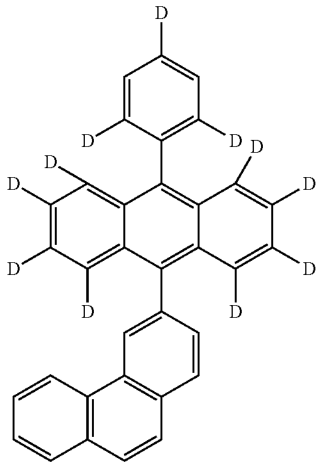
(B14)
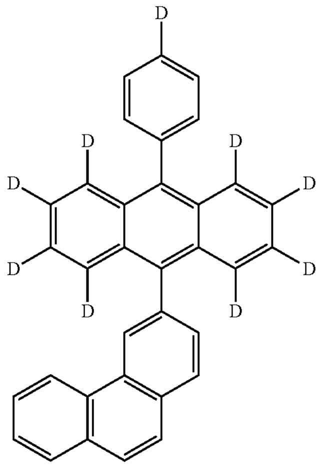

-continued (B15)

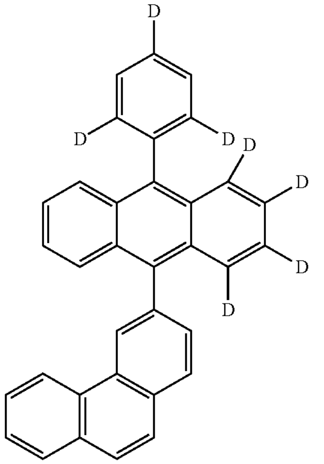

(B16)

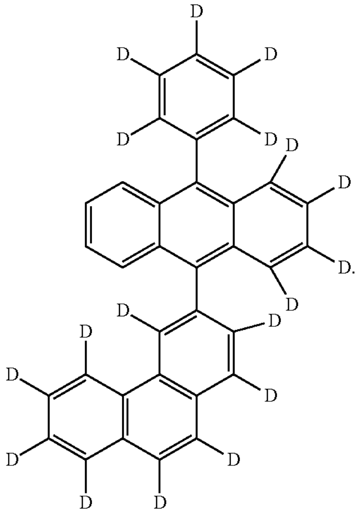

14. The organic electroluminescent device according to claim 13, wherein at least one of $R_6$ to $R_{13}$ in Formula B is deuterium.

15. The organic electroluminescent device according to claim 13, wherein at least one of $R_1$ to $R_5$ in Formula B is deuterium and at least one of $R_6$ to $R_{13}$ in Formula B is deuterium.

16. An organic electroluminescent device comprising a first electrode, a second electrode opposite to the first electrode, and a light emitting layer interposed between the first and second electrodes wherein the light emitting layer comprises a compound selected from the compounds of Formulae A3, A4, A7 to A9, A14, A15, A17 to A105, A107 to A116, and A118 to A176:

(A3)

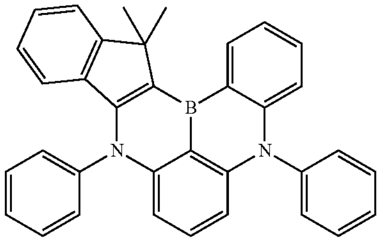

-continued (A4)

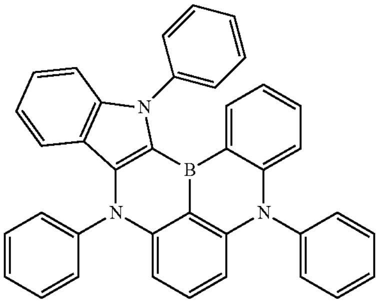

(A7)

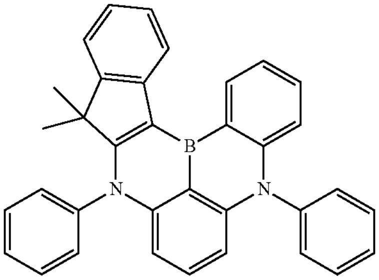

(A8)

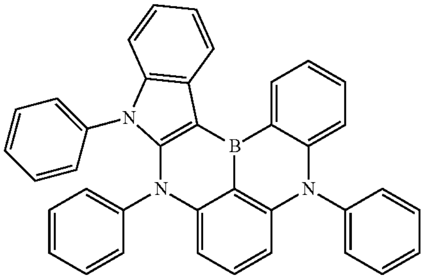

(A9)

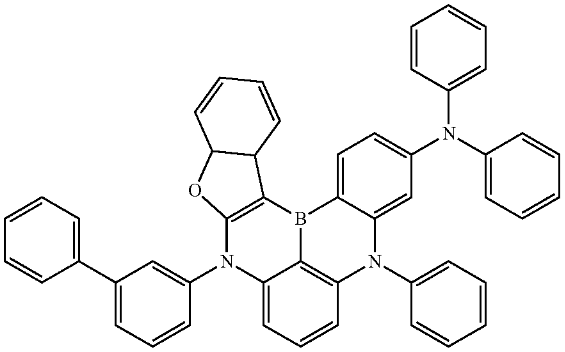

(A14)

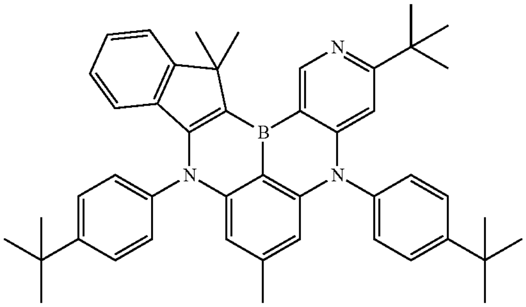

-continued
(A15)
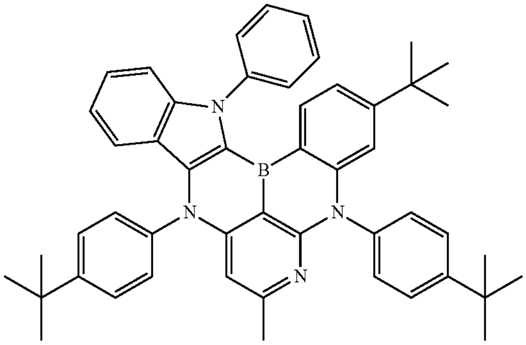
(A17)
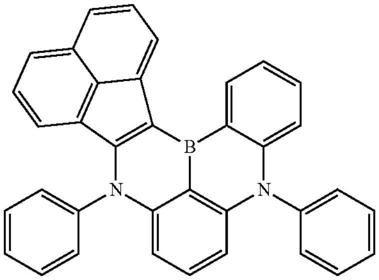
(A18)
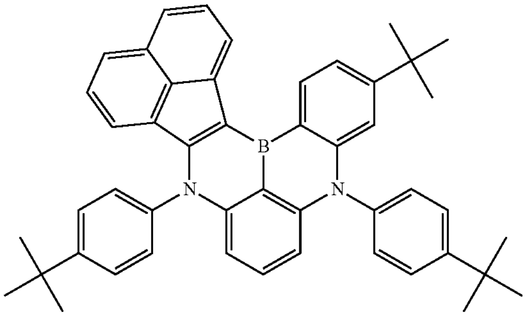
(A19)
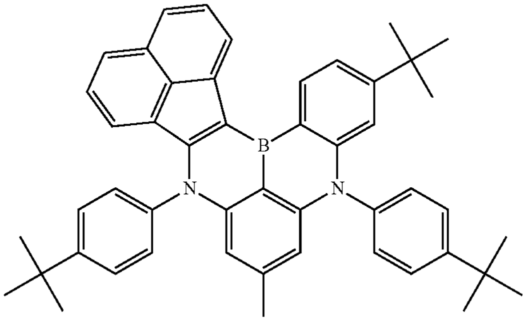
-continued
(A20)
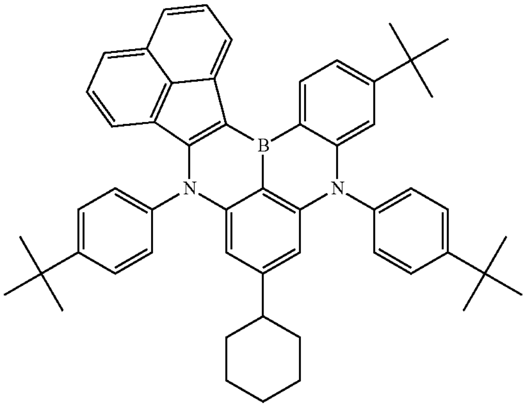
(A21)
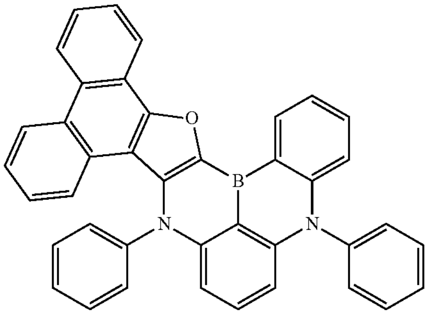
(A22)
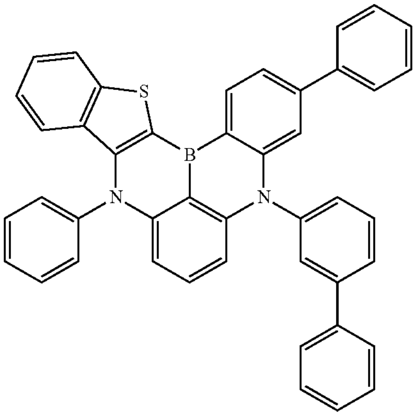
(A23)
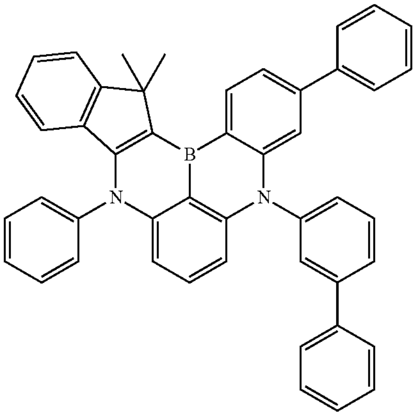

-continued
(A24)
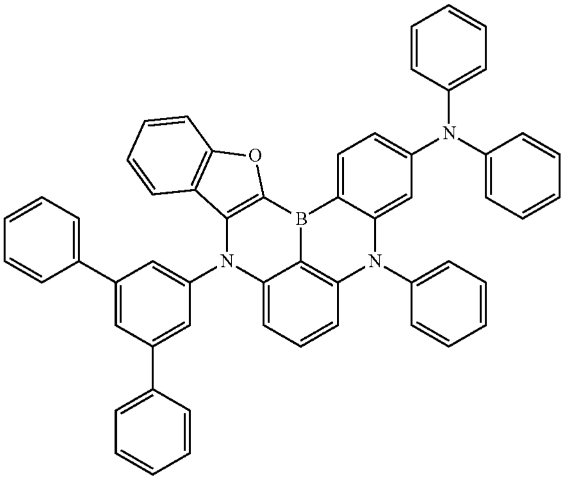
(A25)
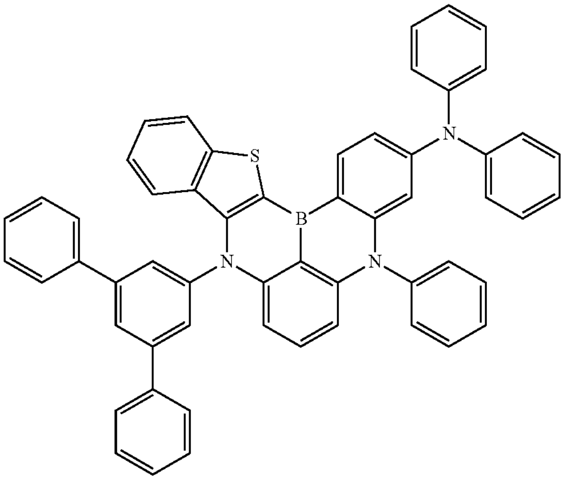
(A26)
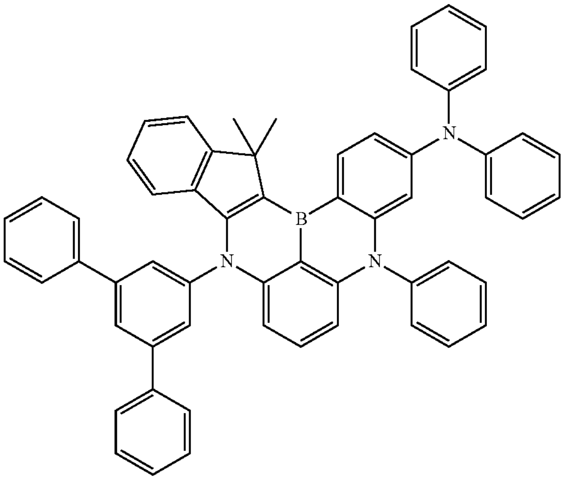
-continued
(A27)
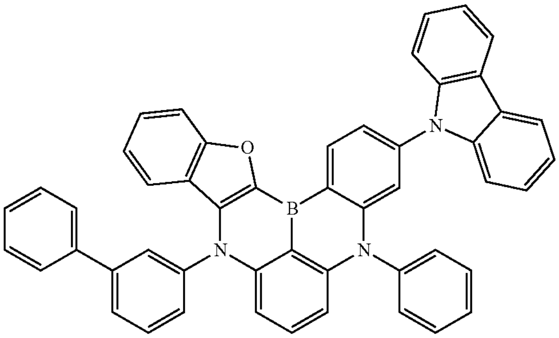
(A28)
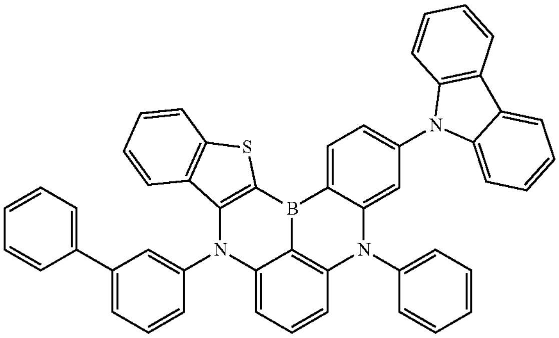
(A29)
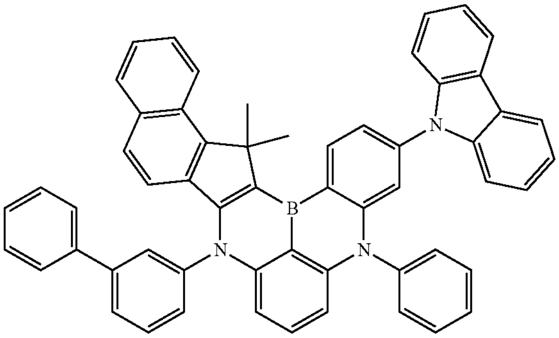
(A30)
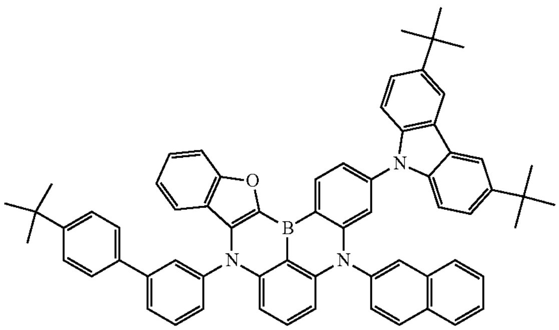

-continued
(A31)
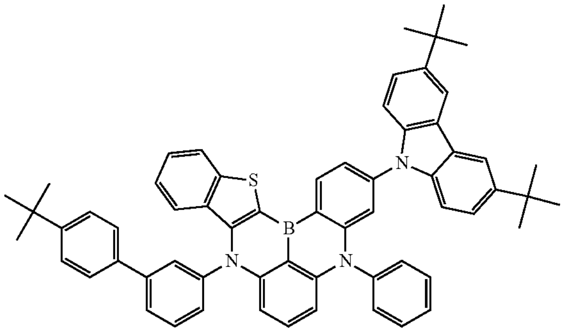
(A32)
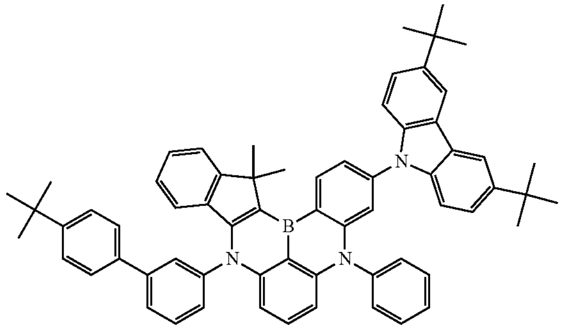
(A33)
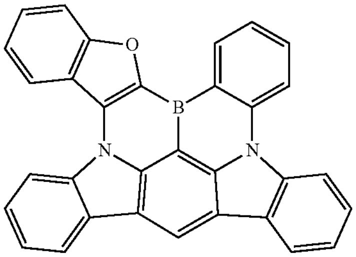
(A34)
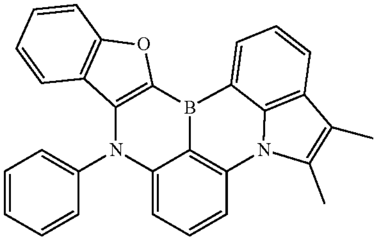
(A35)
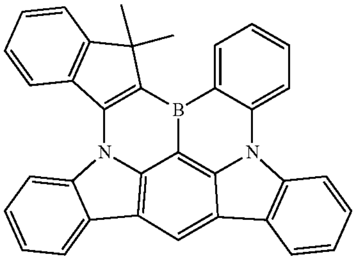
-continued
(A36)
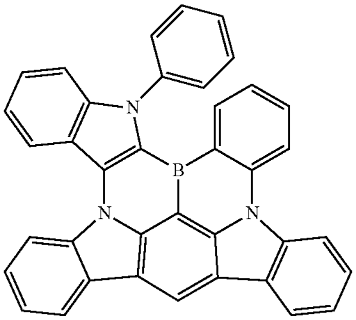
(A37)
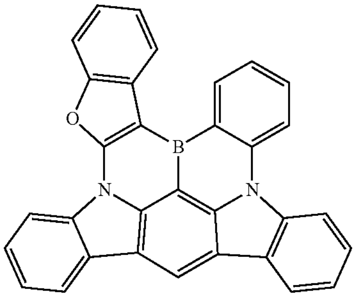
(A38)
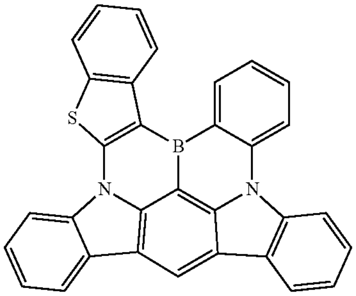
(A39)
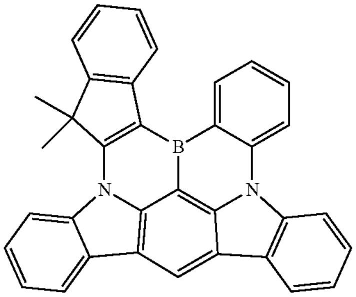
(A40)
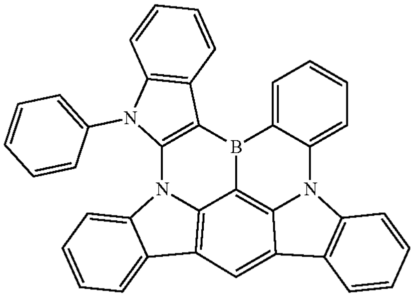

-continued
(A41)
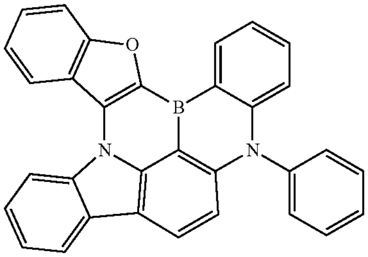
(A42)
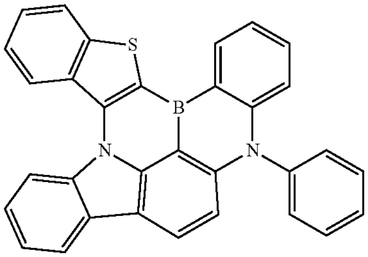
(A43)
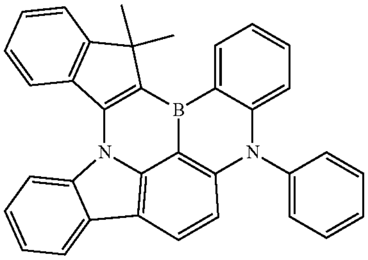
(A44)
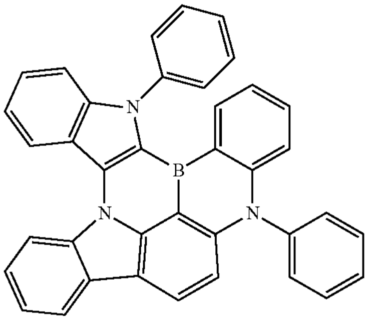
(A45)
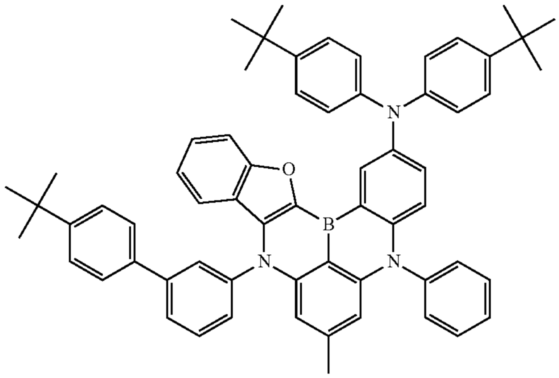
-continued
(A46)
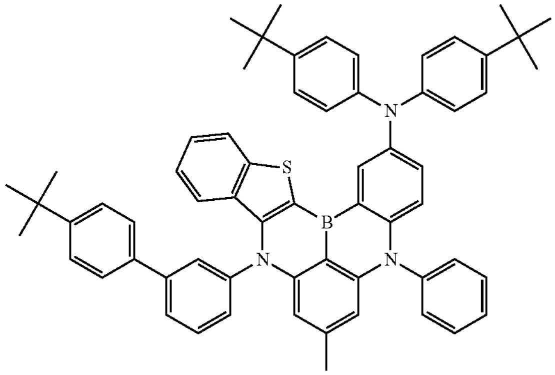
(A47)
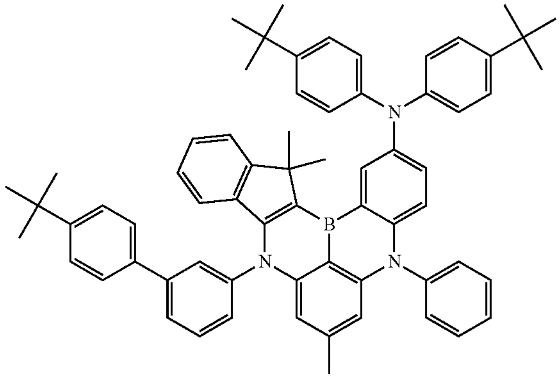
(A48)
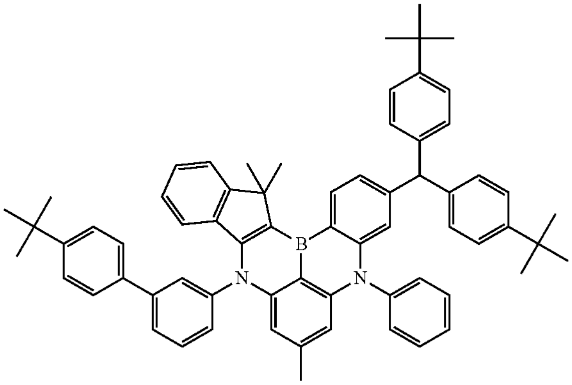
(A49)
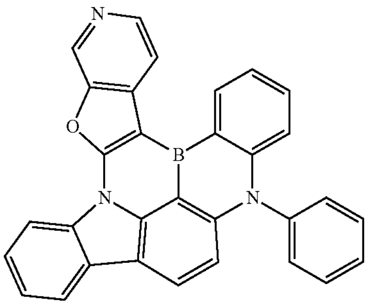

-continued
(A50)
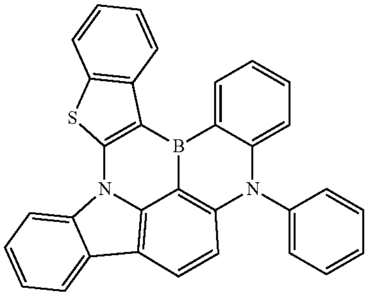
(A51)
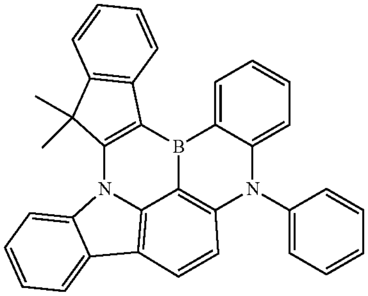
(A52)
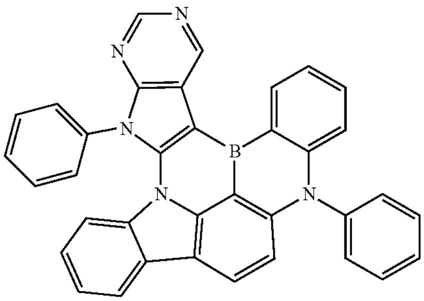
(A53)
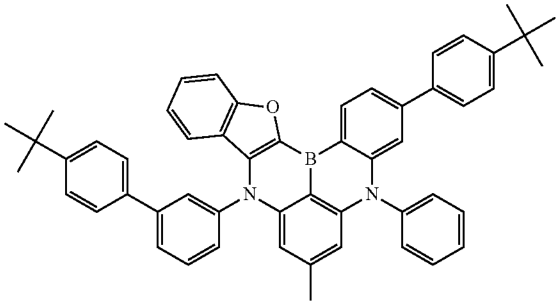
(A54)
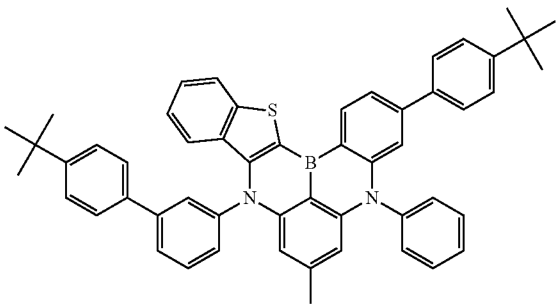
-continued
(A55)
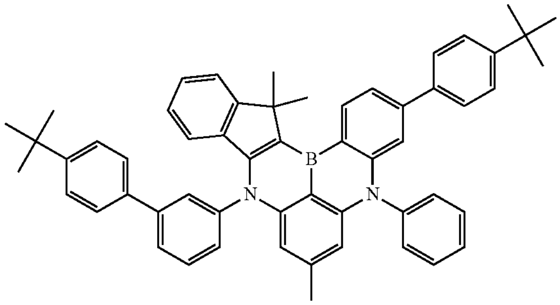
(A56)
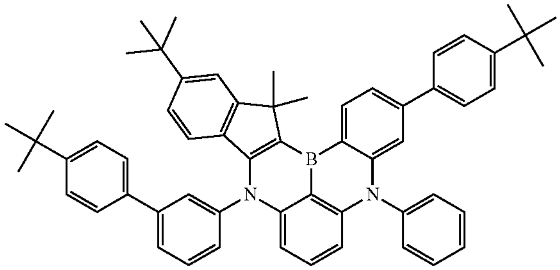
(A57)
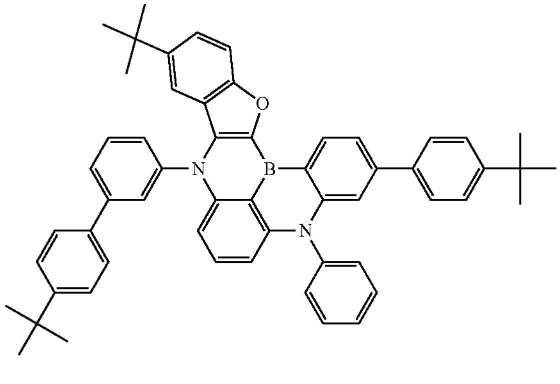
(A58)
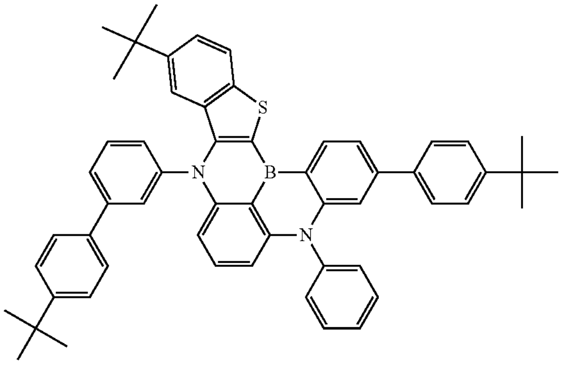

-continued
(A59)
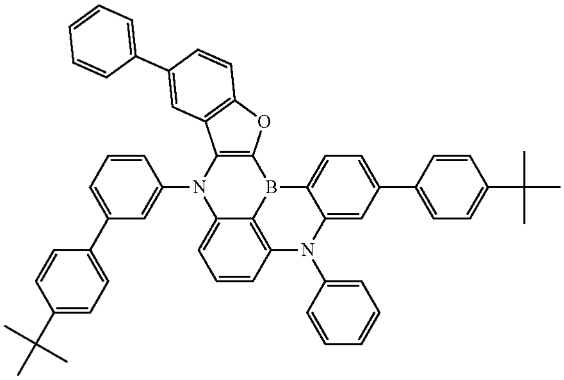
(A60)
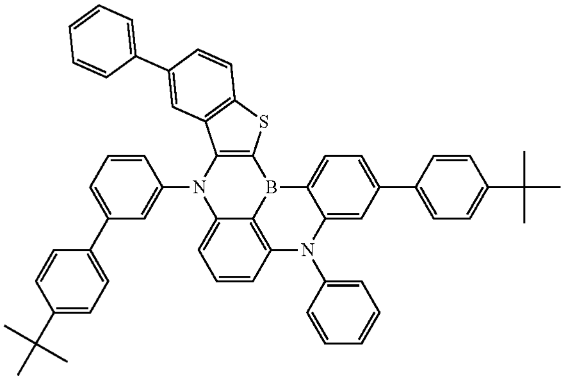
(A61)
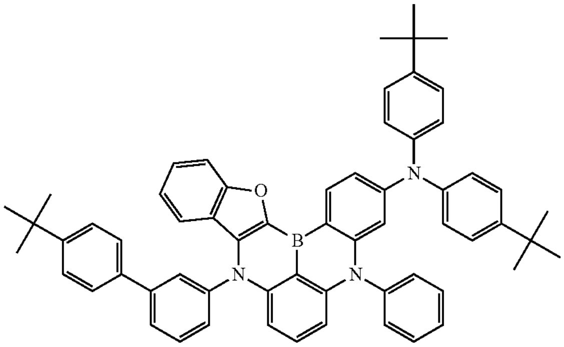
(A62)
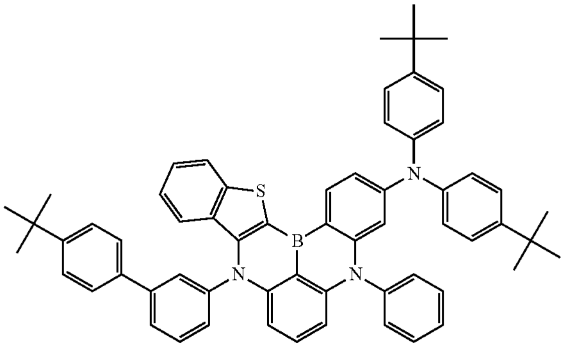
-continued
(A63)
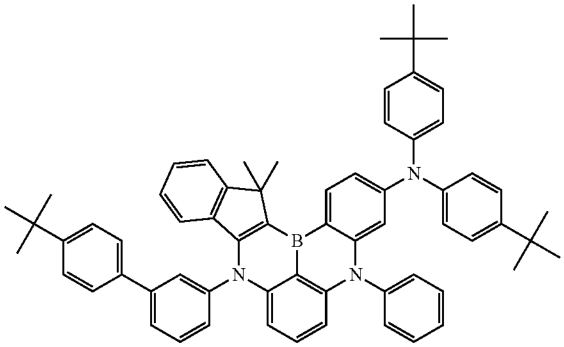
(A64)
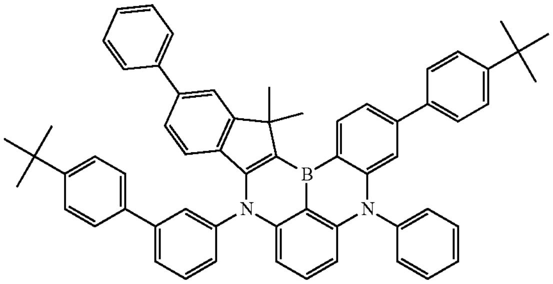
(A65)
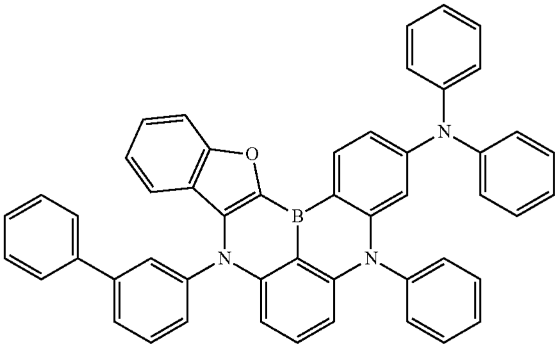
(A66)
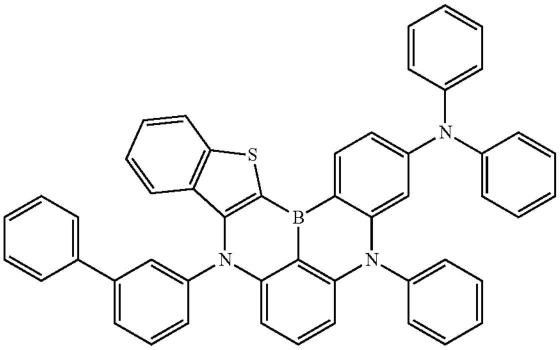

-continued
(A67)
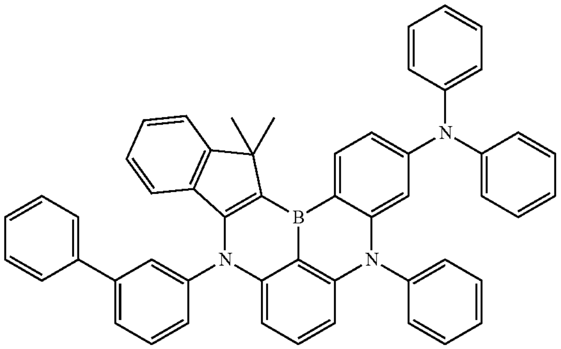
(A68)
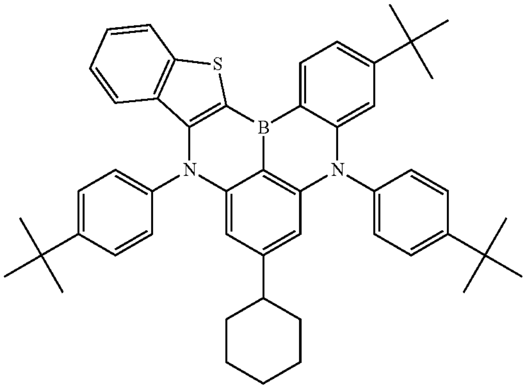
(A69)
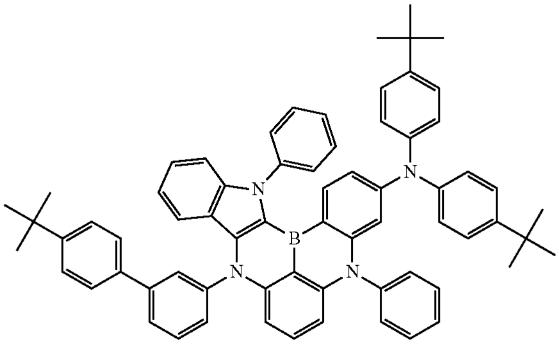
(A70)
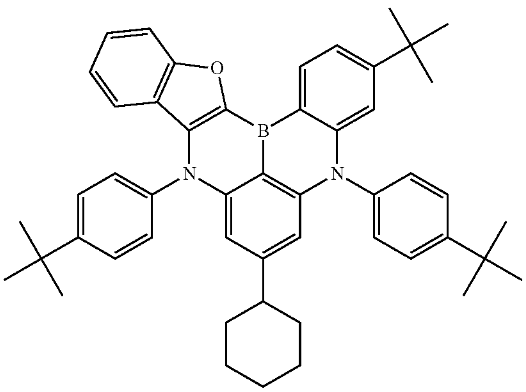
-continued
(A71)
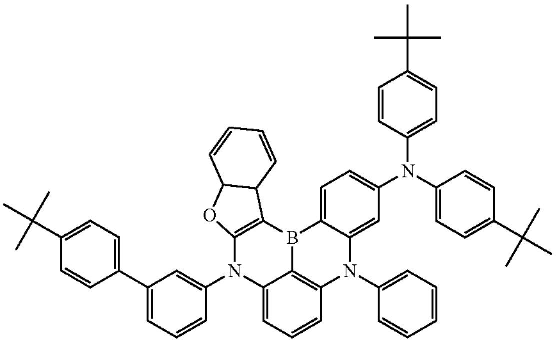
(A72)
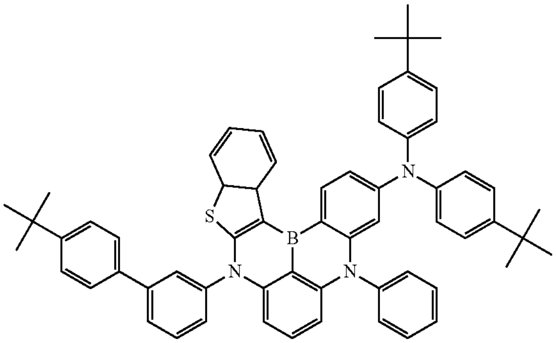
(A73)
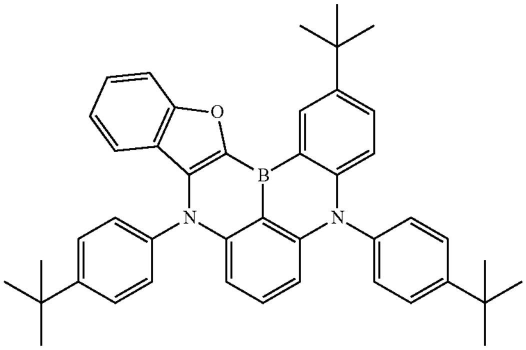
(A74)
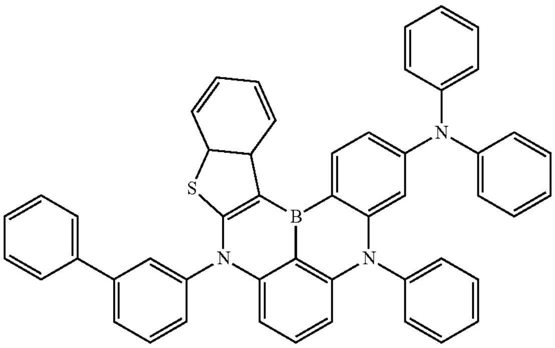

-continued
(A75)
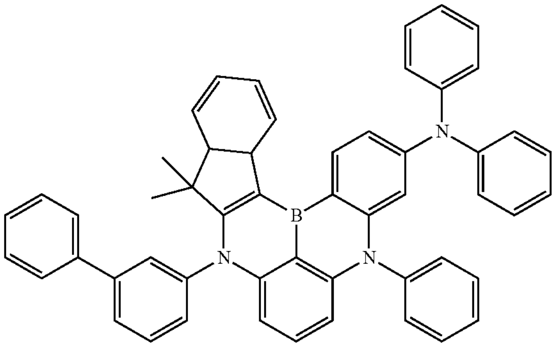
(A76)
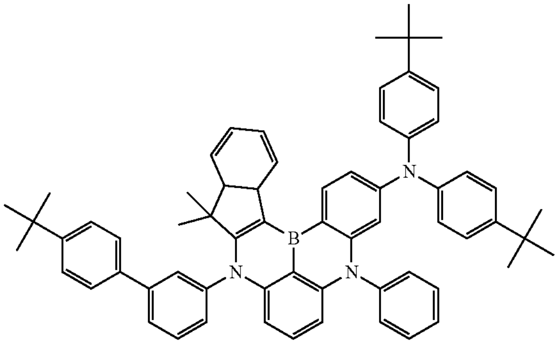
(A77)
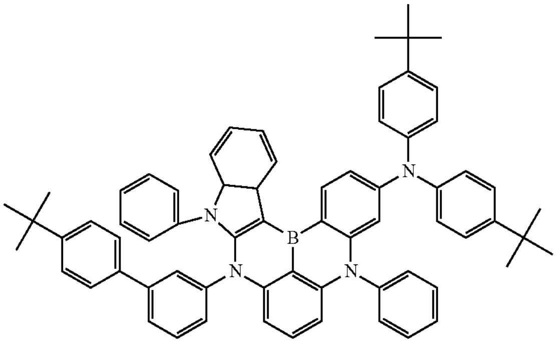
(A78)
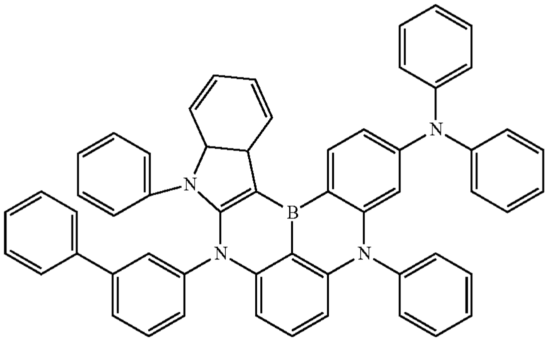
-continued
(A79)
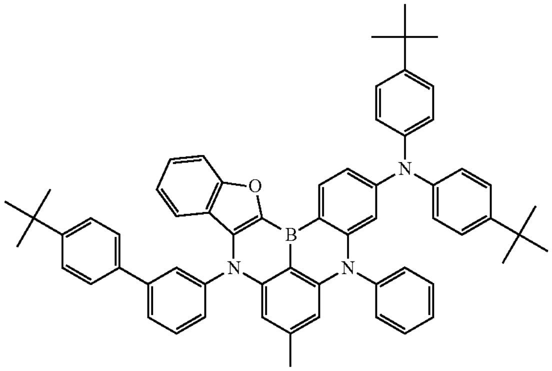
(A80)
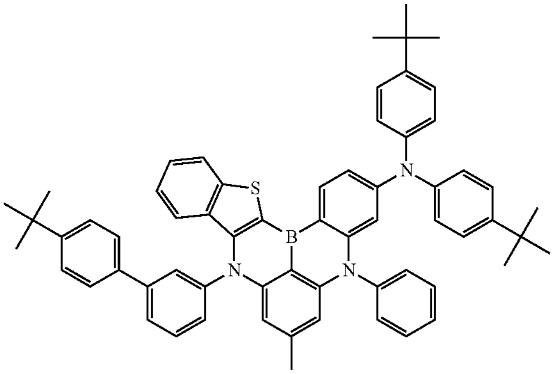
(A81)
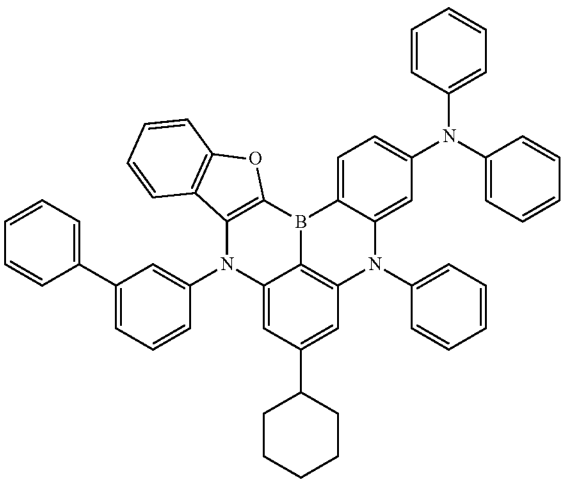

-continued
(A82)
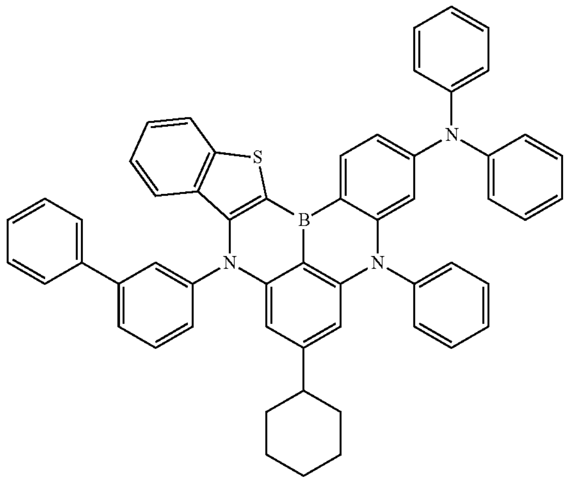
(A83)
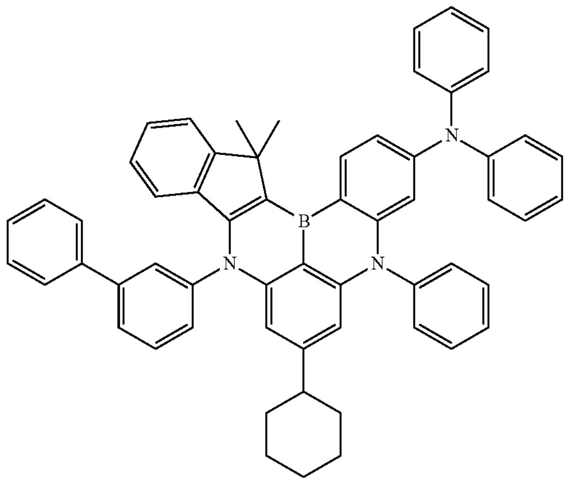
(A84)
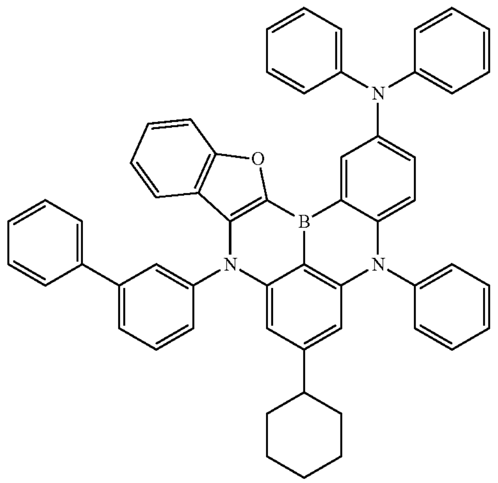
-continued
(A85)
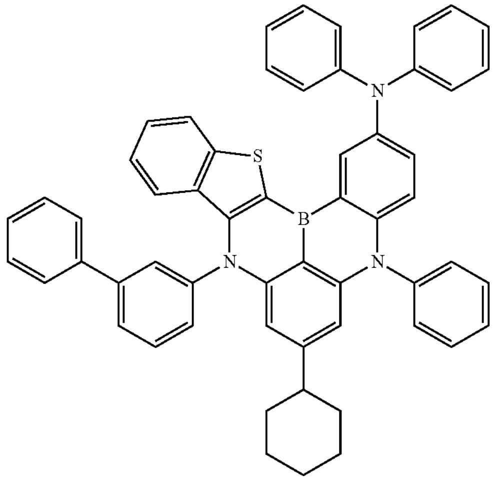
(A86)
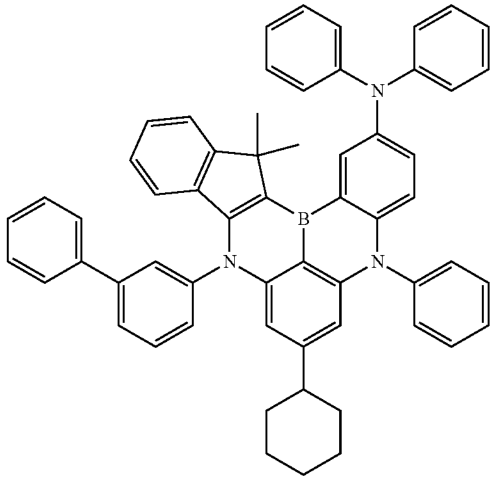
(A87)
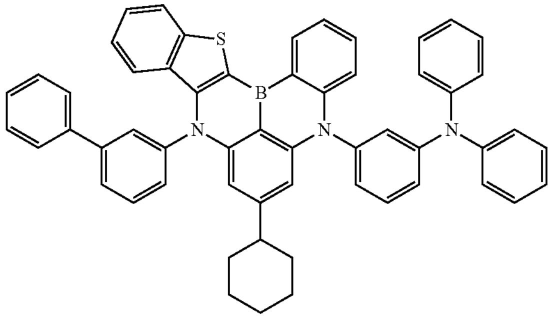

-continued
(A88)
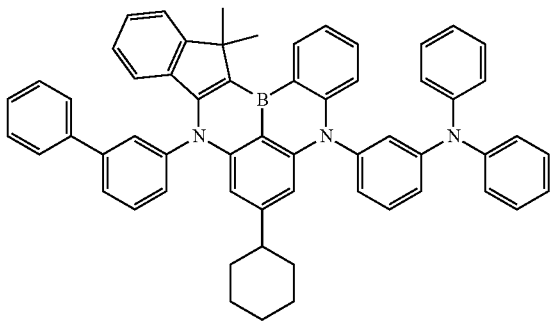
(A89)
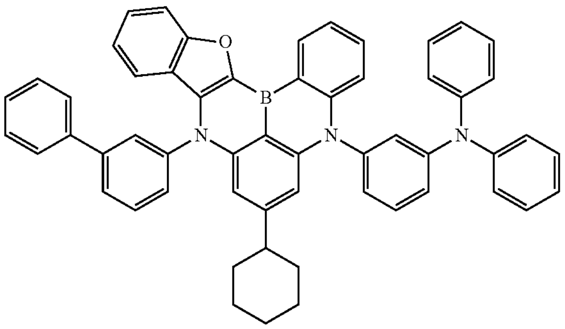
(A90)
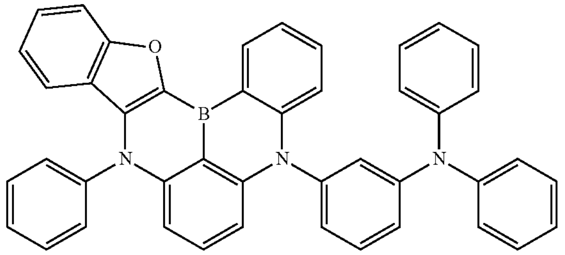
(A91)
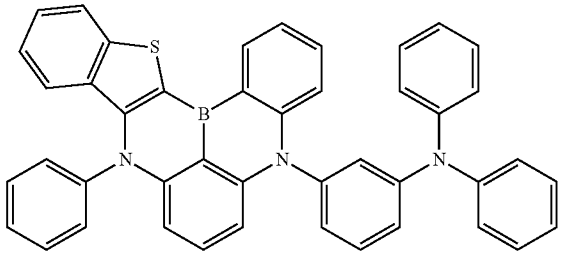
(A92)
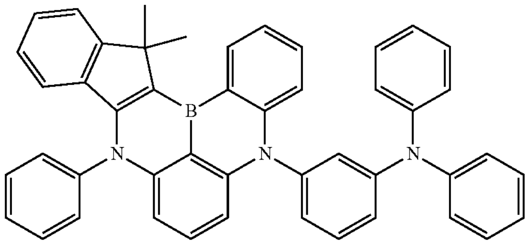
-continued
(A93)
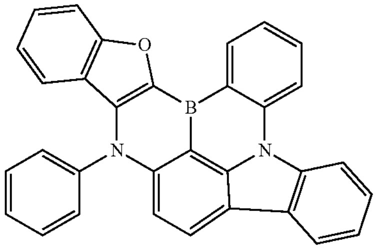
(A94)
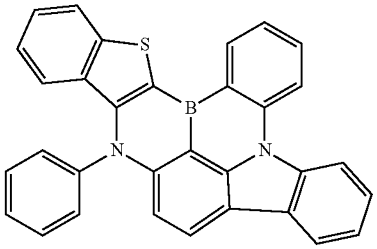
(A95)
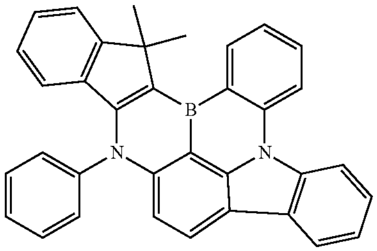
(A96)
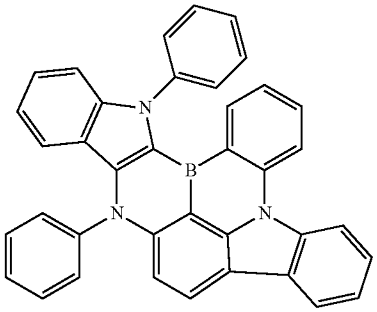
(A97)
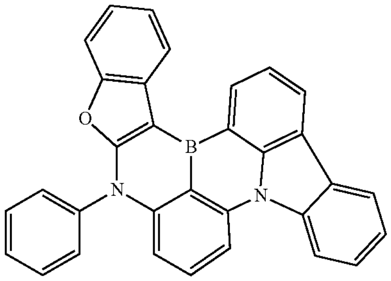

-continued
(A98)
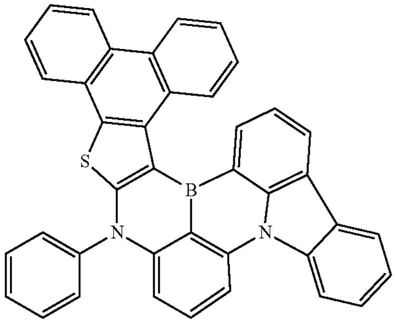
(A99)
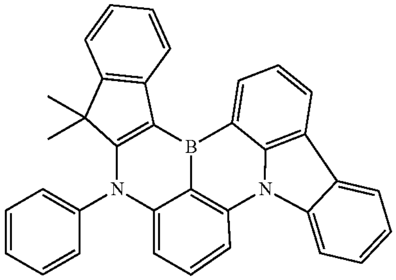
(A100)
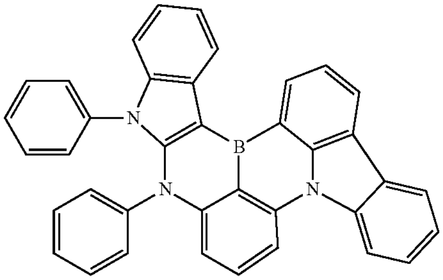
(A101)
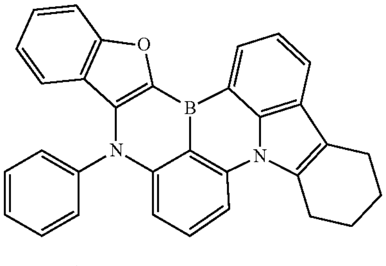
(A102)
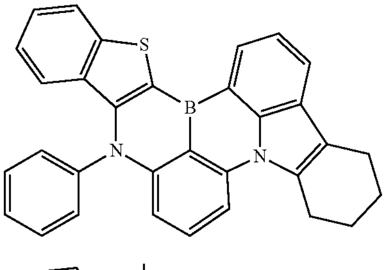
(A103)
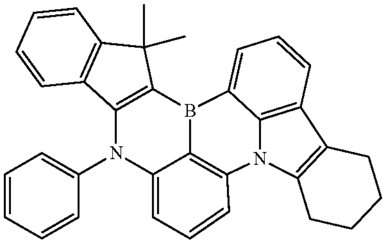
-continued
(A104)
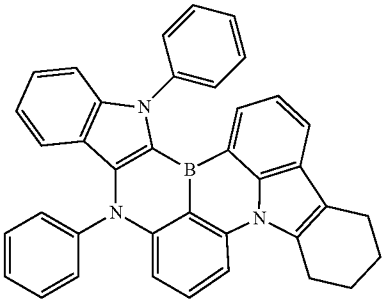
(A105)
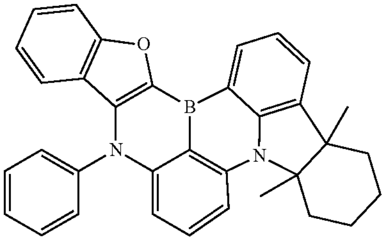
(A107)
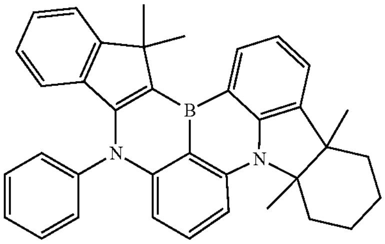
(A108)
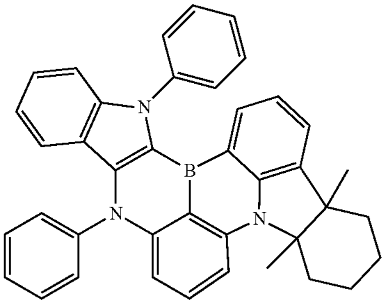
(A109)
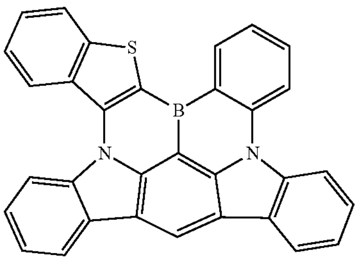
(A110)
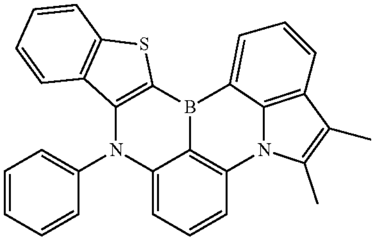

-continued
(A111)
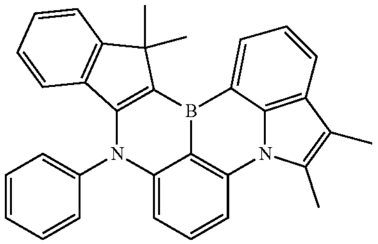
(A112)
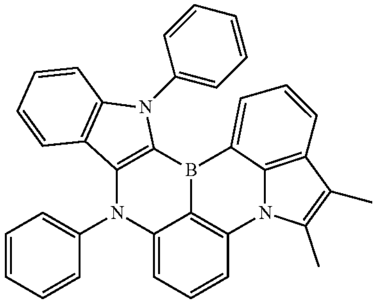
(A113)
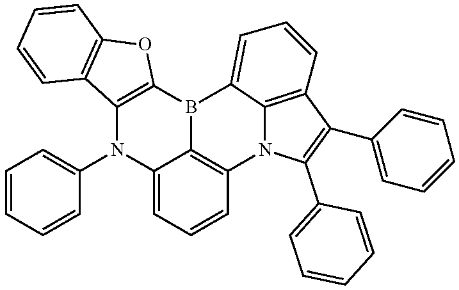
(A114)
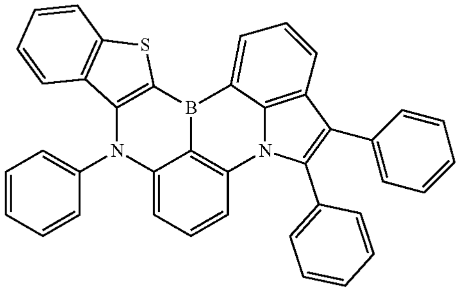
(A115)
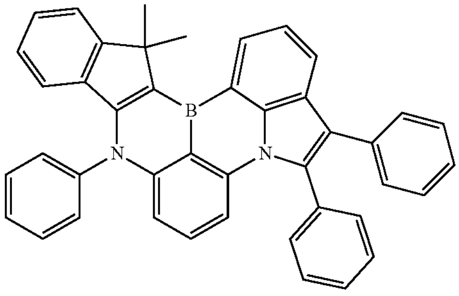
-continued
(A116)
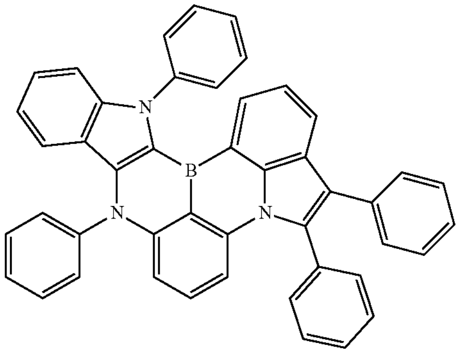
(A117)
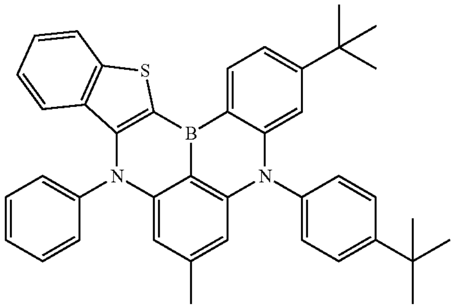
(A118)
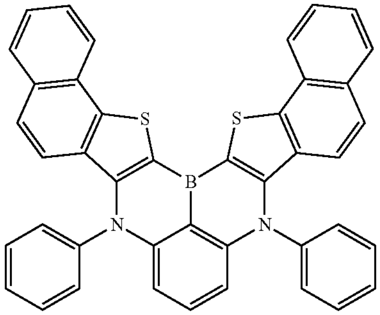
(A119)
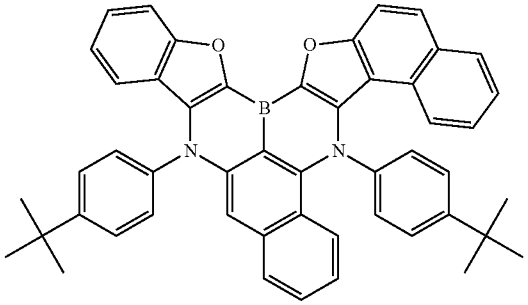

-continued
(A120)
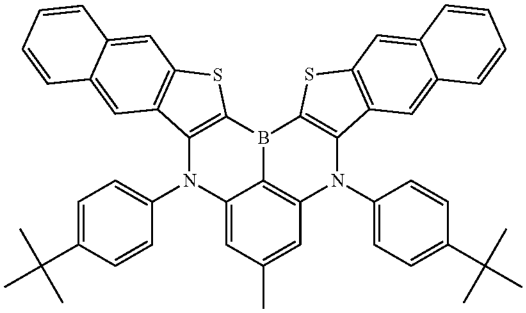
(A121)
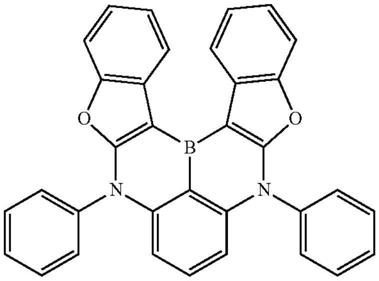
(A122)
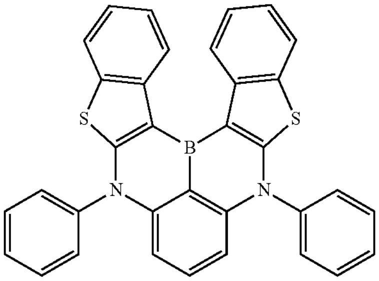
(A123)
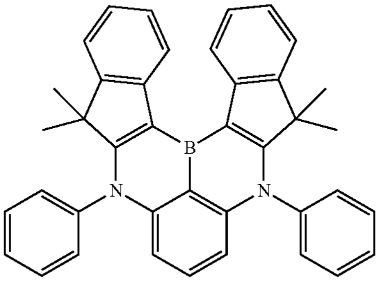
(A124)
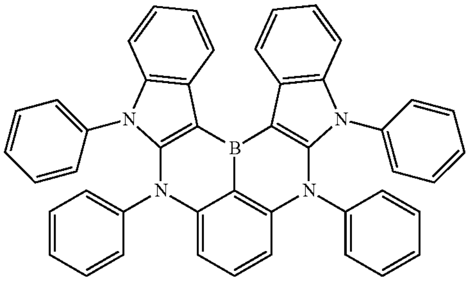
-continued
(A125)
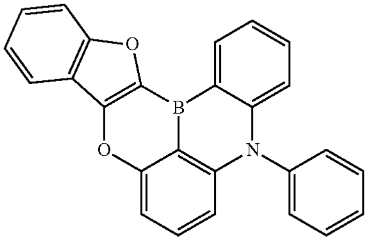
(A126)
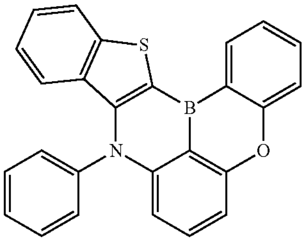
(A127)
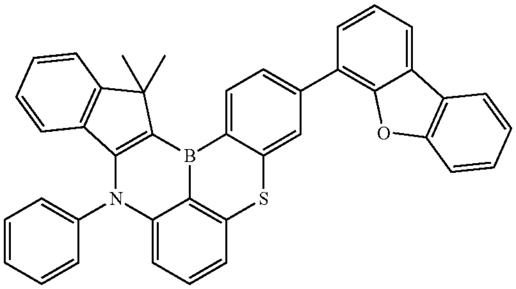
(A128)
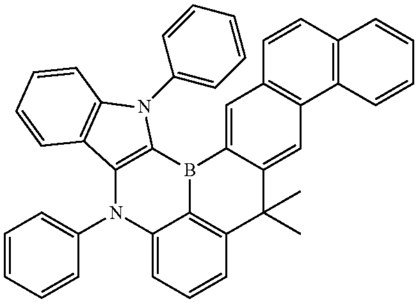
(A129)
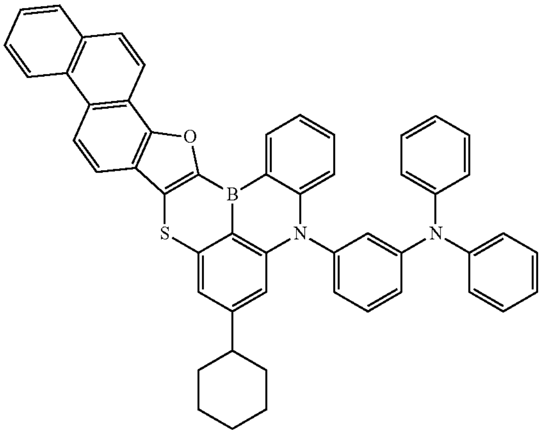

-continued
(A130)
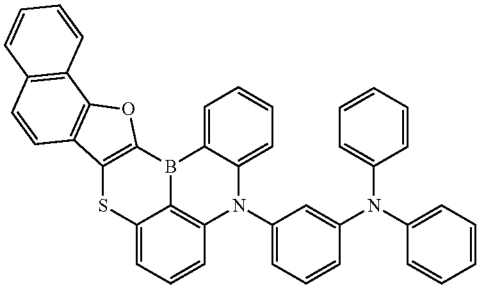
(A131)
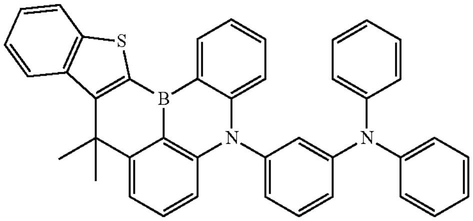
(A132)
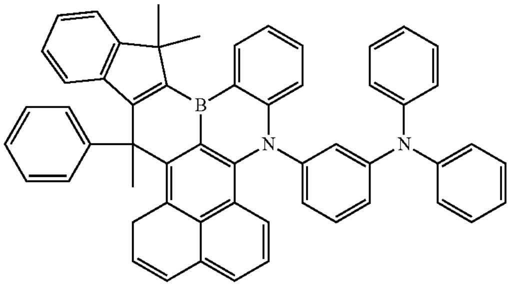
(A133)
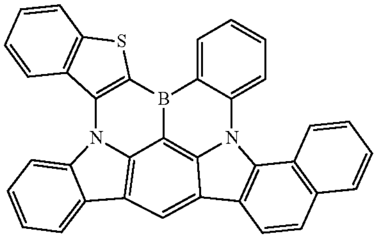
(A134)
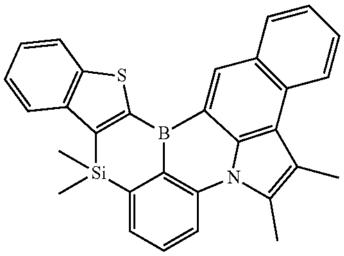
-continued
(A135)
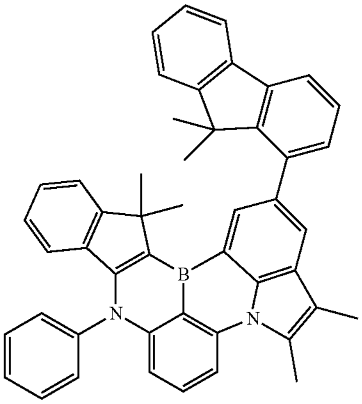
(A136)
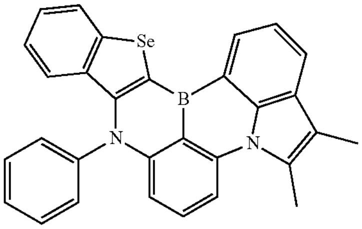
(A137)
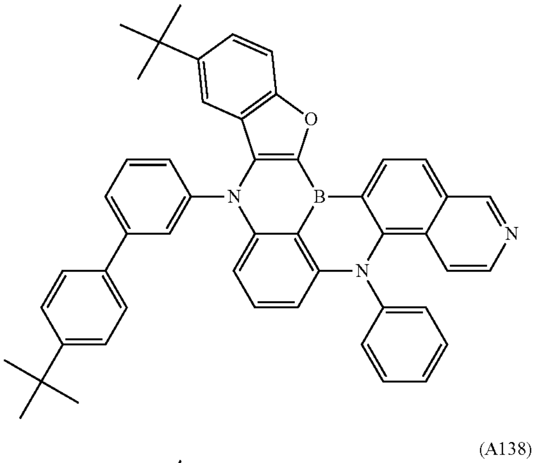
(A138)
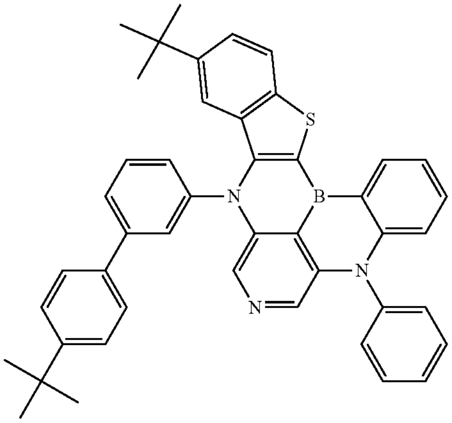

-continued
(A139)
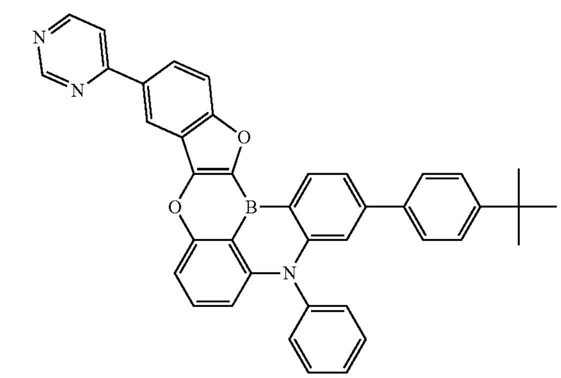
(A140)
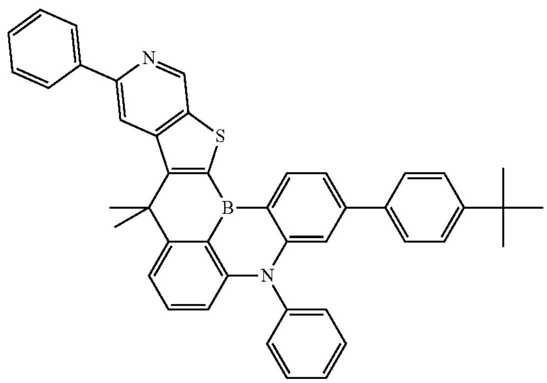
(A141)
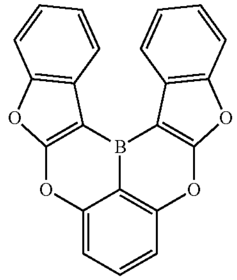
(A142)
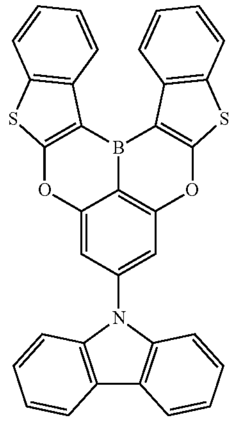
-continued
(A143)
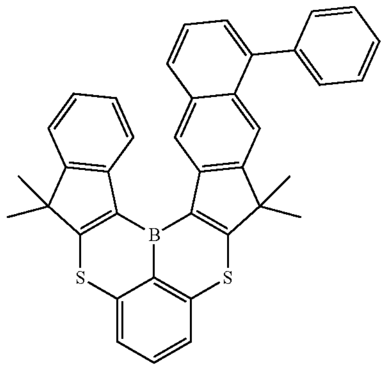
(A144)
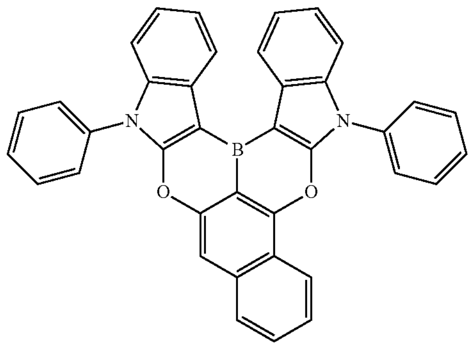
(A145)
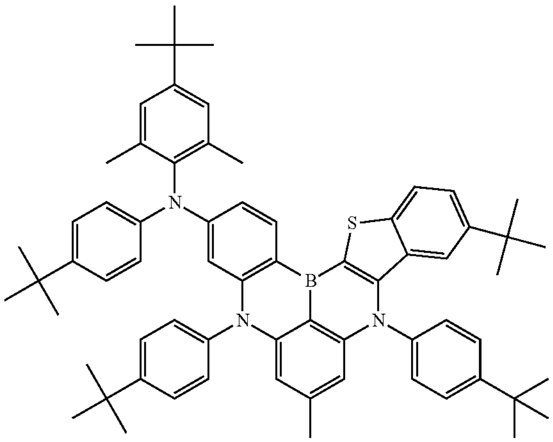
(A146)
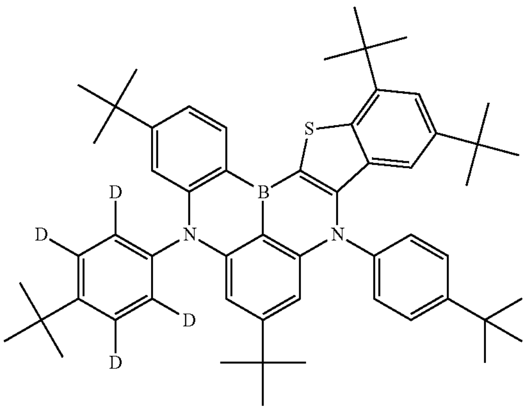

-continued
(A147)
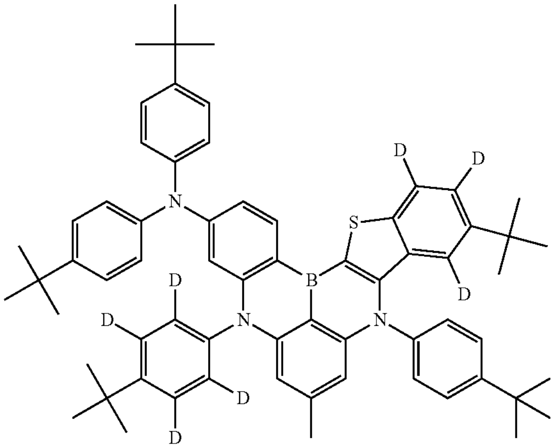
(A148)
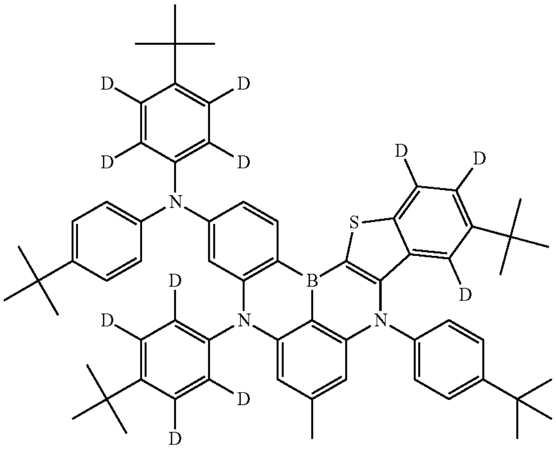
(A149)
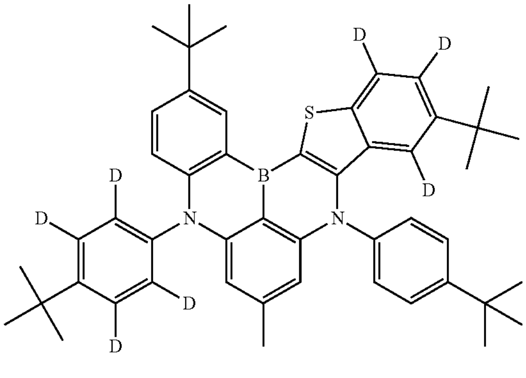
-continued
(A150)
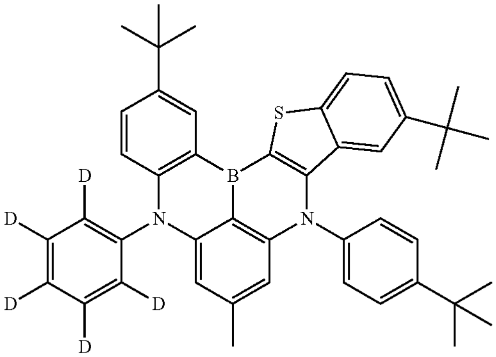
(A151)
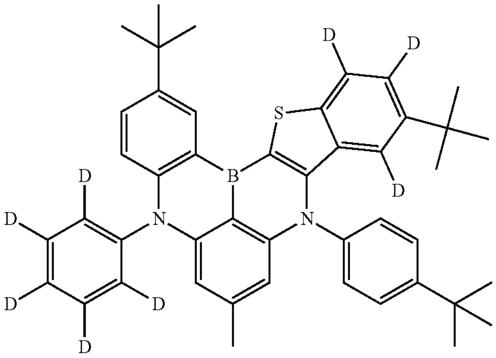
(A152)
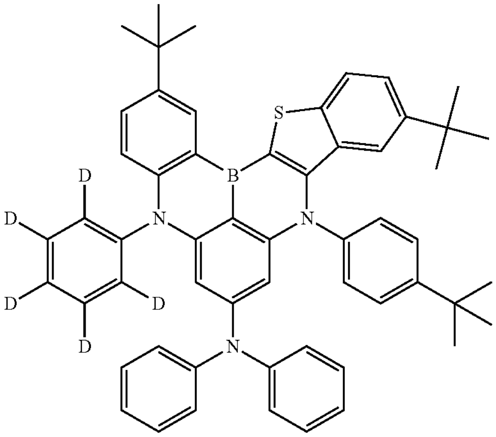
(A153)
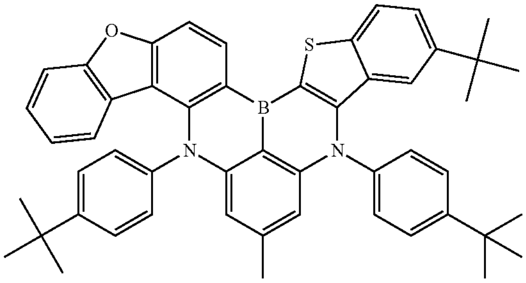

-continued
(A154)
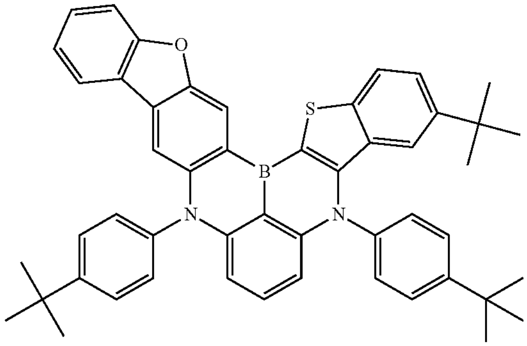
(A155)
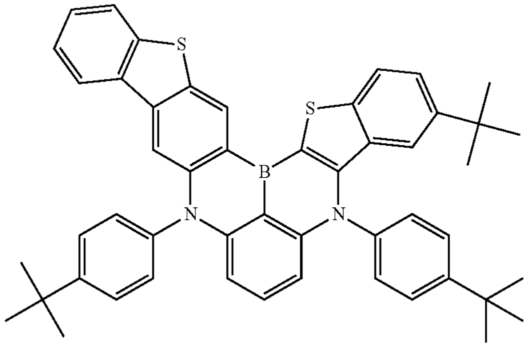
(A156)
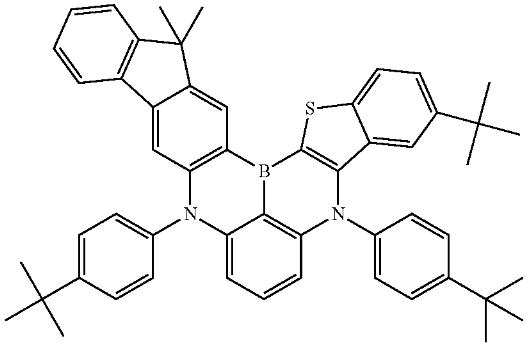
(A157)
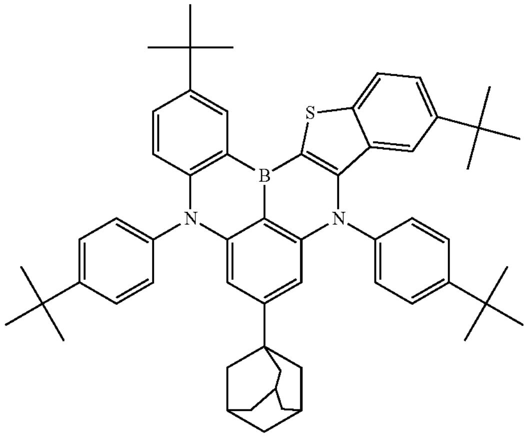
-continued
(A158)
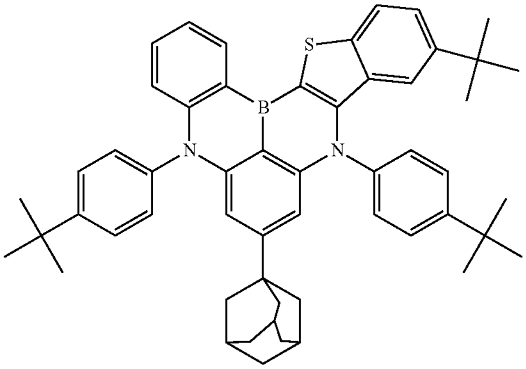
(A159)
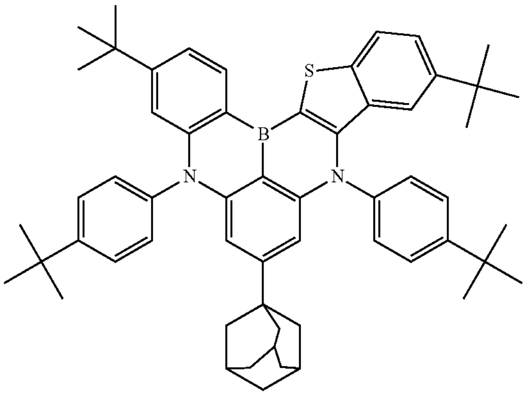
(A160)
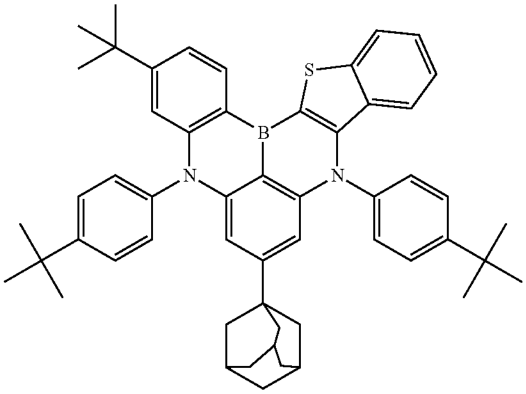
(A161)
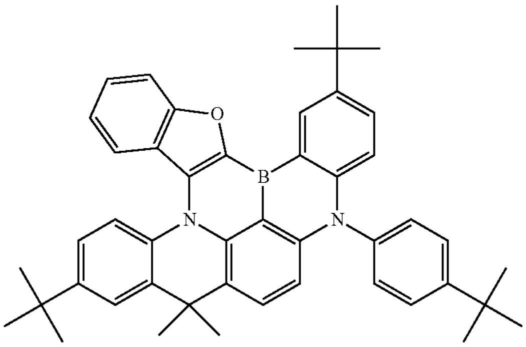

-continued
(A162)
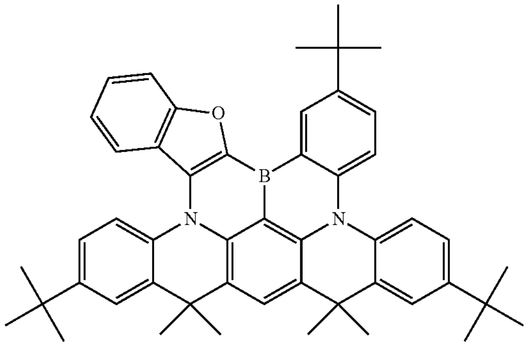
(A163)
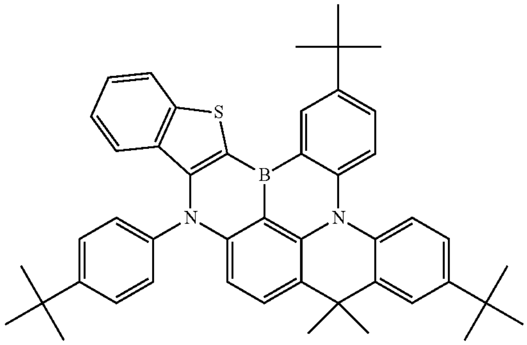
(A164)
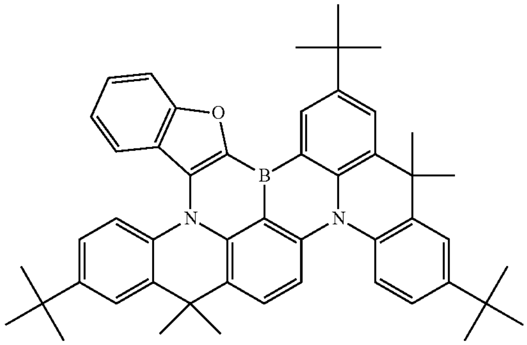
(A165)
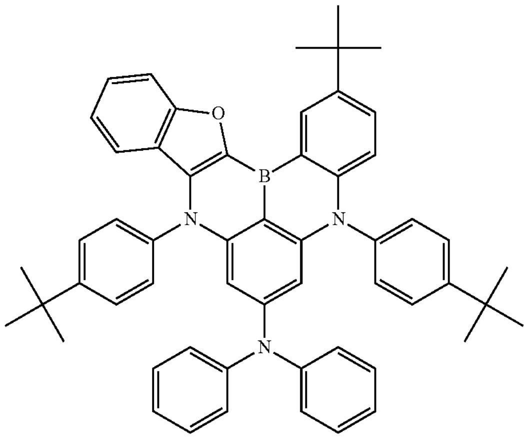
-continued
(A166)
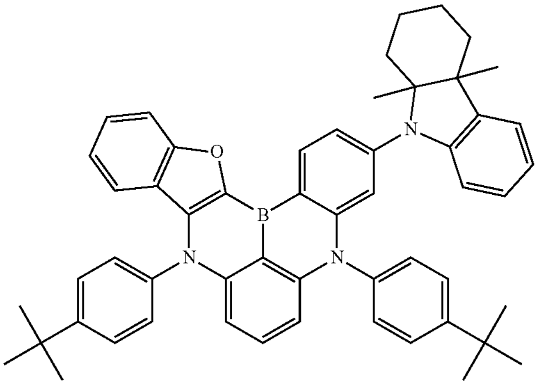
(A167)
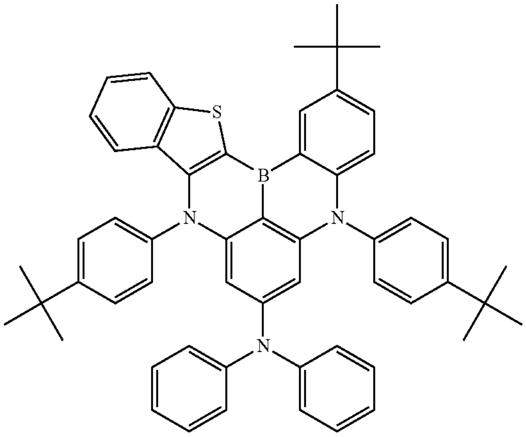
(A168)
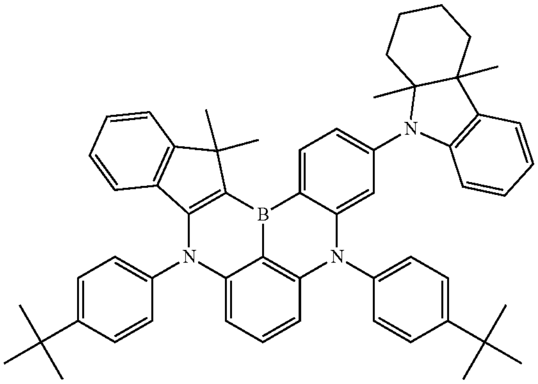
(A169)
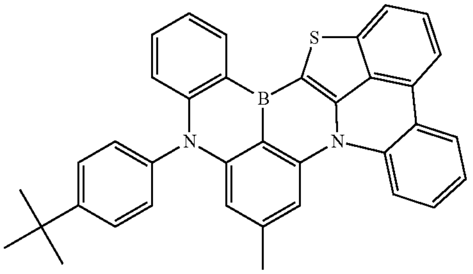

-continued
(A170)
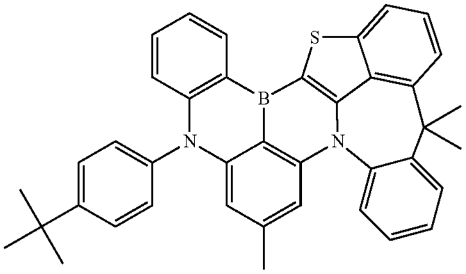
(A171)
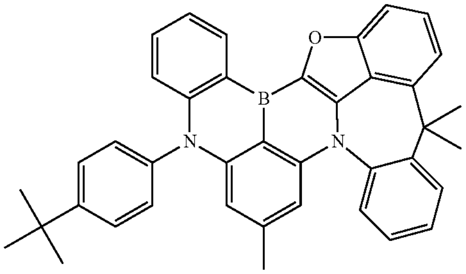
(A172)
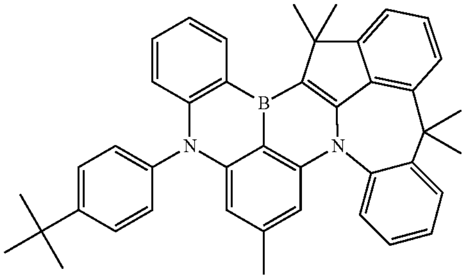
(A173)
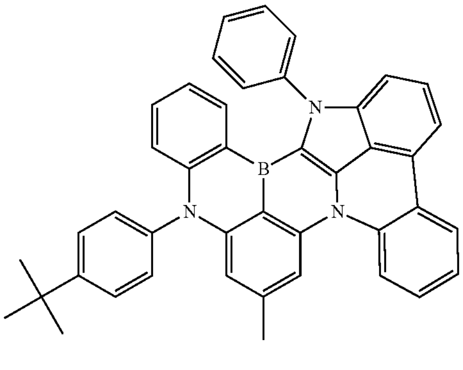
-continued
(A174)
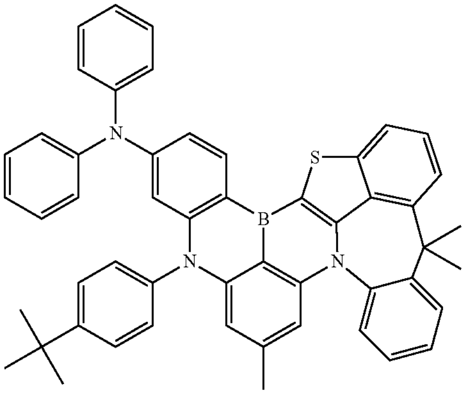
(A175)
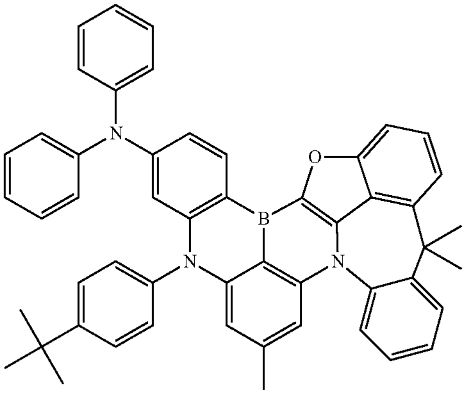
(A176)
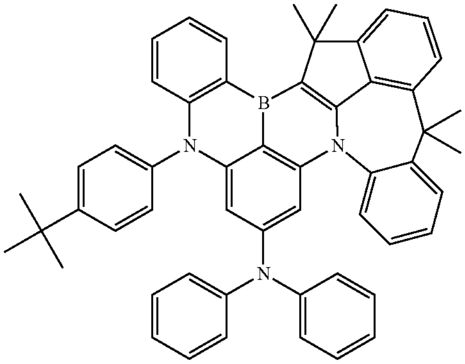
;

and and an anthracene derivative represented by Formula B:
(B)
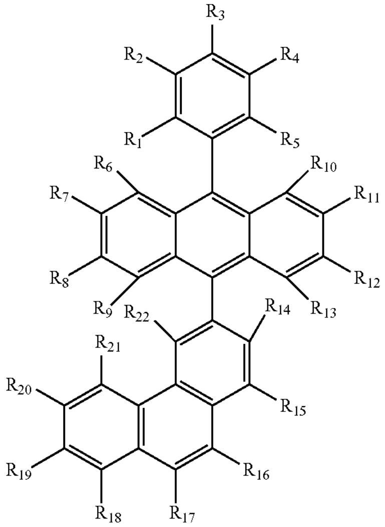
wherein $R_1$ to $R_5$ are each independently hydrogen, deuterium or $C_6$-$C_{24}$ aryl and $R_6$ to $R_{22}$ are each independently hydrogen or deuterium, and
wherein the compound represented by Formula B is selected from the compounds of Formulae B2 to B16:
(B2)
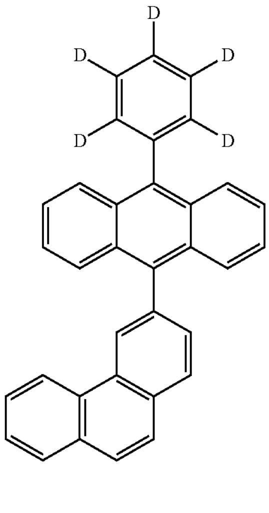
-continued
(B3)
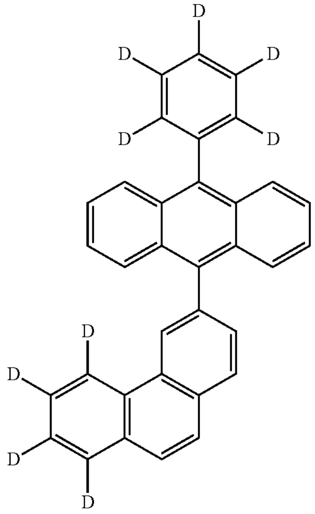
(B4)
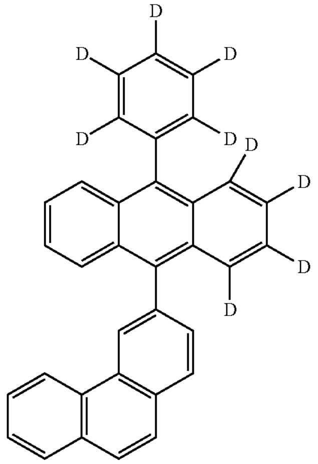
(B5)
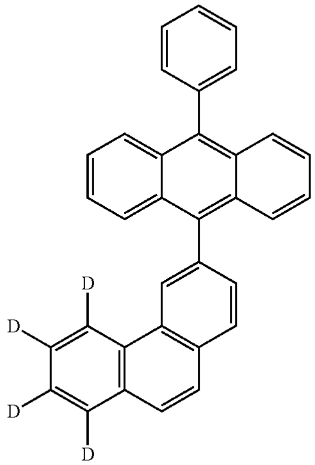

-continued
(B6)
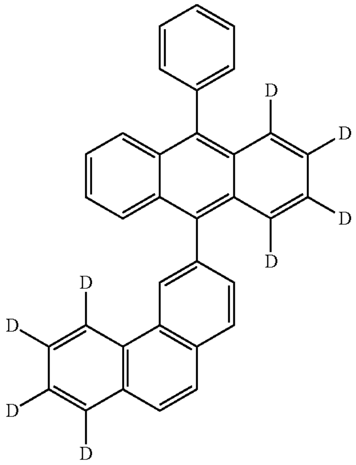
(B7)
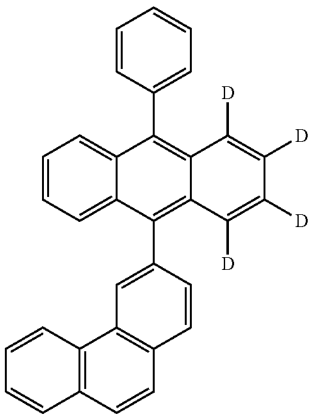
(B8)
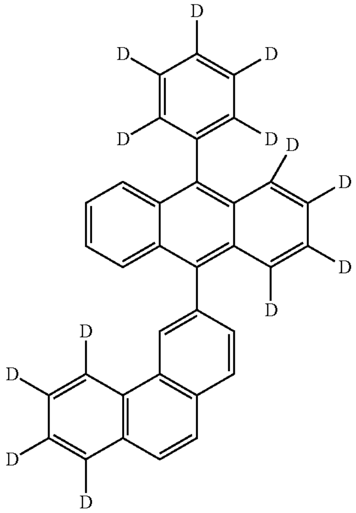
-continued
(B9)
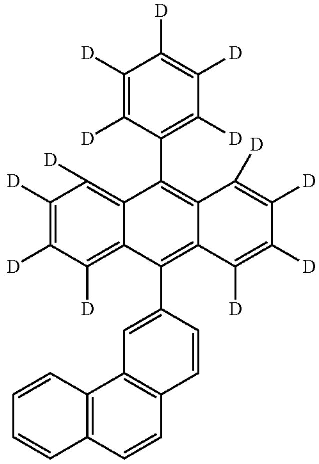
(B10)
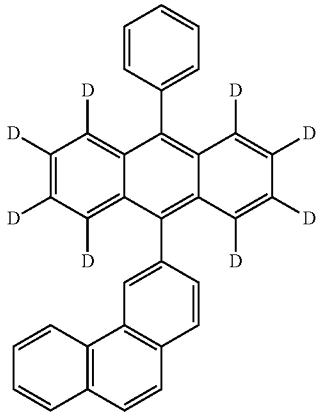
(B11)
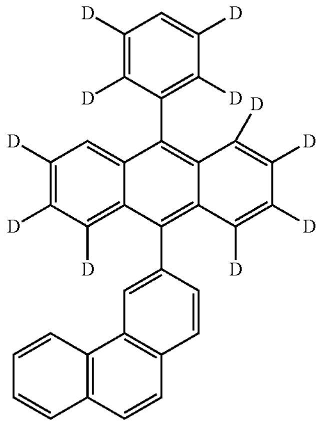

-continued
(B12)
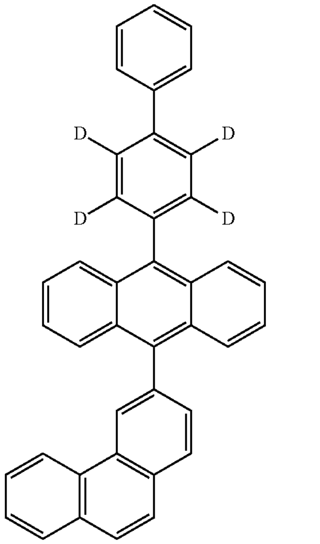
(B13)
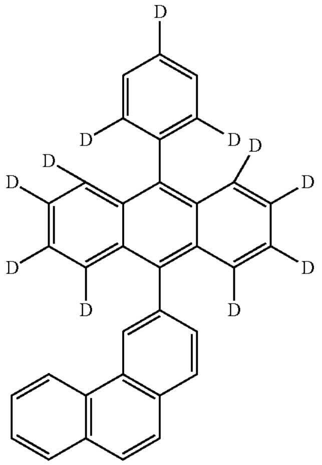
(B14)
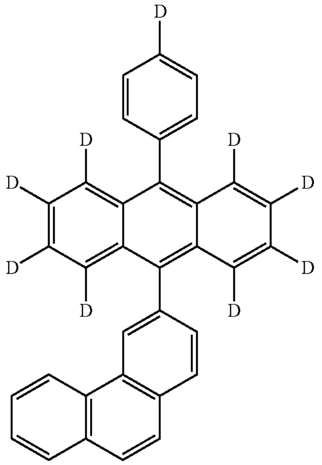
-continued
(B15)
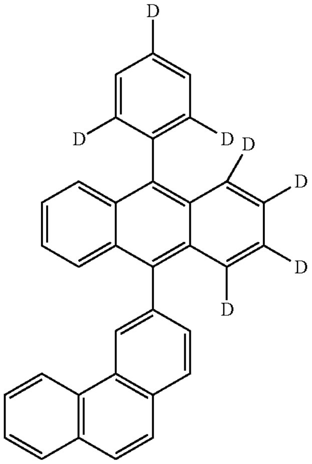
(B16)
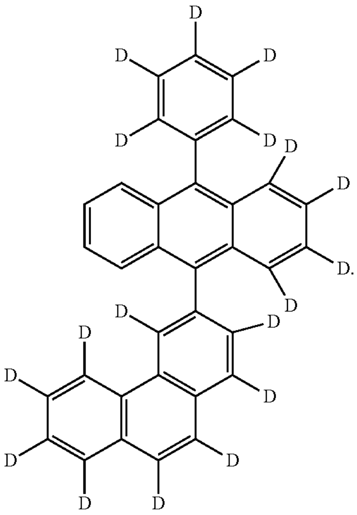
17. The organic electroluminescent device according to claim 16, wherein at least one of Re to $R_{13}$ in Formula B is deuterium.
18. The organic electroluminescent device according to claim 16, wherein at least one of $R_1$ to $R_5$ in Formula B is deuterium and at least one of $R_6$ to $R_{13}$ in Formula B is deuterium.
* * * * *